(12) United States Patent
Kim et al.

(10) Patent No.: US 11,404,347 B2
(45) Date of Patent: Aug. 2, 2022

(54) SEMICONDUCTOR PACKAGE

(71) Applicant: NEPES CO., LTD., Eumseong-gun (KR)

(72) Inventors: Nam Chul Kim, Cheongju (KR); Jong Heon Kim, Seongnam (KR); Eung Ju Lee, Cheongju (KR); Yong Woon Yeo, Cheongju (KR); Chang Woo Lee, Seoul (KR)

(73) Assignee: NEPES CO., LTD., Chungcheongbuk-Do (KR)

( * ) Notice: Subject to any disclaimer, the term of this patent is extended or adjusted under 35 U.S.C. 154(b) by 0 days.

(21) Appl. No.: 17/098,080

(22) Filed: Nov. 13, 2020

(65) Prior Publication Data
US 2021/0066154 A1  Mar. 4, 2021

Related U.S. Application Data

(63) Continuation of application No. PCT/KR2019/004688, filed on Apr. 18, 2019.

(30) Foreign Application Priority Data

May 15, 2018 (KR) .................. KR10-2018-0055660
May 15, 2018 (KR) .................. KR10-2018-0055661
(Continued)

(51) Int. Cl.
*H01L 23/367* (2006.01)
*H01L 23/31* (2006.01)
(Continued)

(52) U.S. Cl.
CPC ...... *H01L 23/3675* (2013.01); *H01L 23/3128* (2013.01); *H01L 23/3135* (2013.01);
(Continued)

(58) Field of Classification Search
CPC ............ H01L 23/3675; H01L 23/3128; H01L 23/3135; H01L 23/4334; H01L 21/561; H01L 21/568
See application file for complete search history.

(56) References Cited

U.S. PATENT DOCUMENTS 8,772,913 B1   7/2014 Muniandy et al.
9,059,072 B2   6/2015 Choi et al.
(Continued)

FOREIGN PATENT DOCUMENTS

JP   2004-260051      9/2004
JP   2005-317962 A   11/2005
(Continued)

OTHER PUBLICATIONS

International Search Report and Written Opinion of PCT/KR2019/004688, dated Jul. 19, 2019.
(Continued)

*Primary Examiner* — Fernando L Toledo
*Assistant Examiner* — Neil R Prasad
(74) *Attorney, Agent, or Firm* — Crowell & Moring, LLP

(57) ABSTRACT

A semiconductor package according to an exemplary embodiment of the present disclosure may comprise a semiconductor chip comprising a chip pad; a redistribution layer electrically connected to the chip pad of the semiconductor chip; an external connection terminal electrically connected to the redistribution layer; a sealing material covering the semiconductor chip and configured to fix the semiconductor chip and the redistribution layer; an adhesive film positioned on the upper surface of the sealing material; and a heat sink formed on the upper surface of the adhesive film and having a stepped portion at the periphery thereof.

17 Claims, 154 Drawing Sheets

(30) Foreign Application Priority Data

| | | |
|---|---|---|
| May 15, 2018 | (KR) | KR10-2018-0055663 |
| Jul. 3, 2018 | (KR) | KR10-2018-0077319 |
| Jul. 9, 2018 | (KR) | KR10-2018-0079579 |
| Jul. 26, 2018 | (KR) | KR10-2018-0087272 |
| Jan. 24, 2019 | (KR) | KR10-2019-0009246 |
| Apr. 5, 2019 | (KR) | KR10-2019-0040299 |
| Apr. 5, 2019 | (KR) | KR10-2019-0040300 |

(51) Int. Cl.
*H01L 23/433* (2006.01)
*H01L 21/56* (2006.01)

(52) U.S. Cl.
CPC ........ *H01L 23/4334* (2013.01); *H01L 21/561* (2013.01); *H01L 21/568* (2013.01)

(56) References Cited

U.S. PATENT DOCUMENTS

| | | | |
|---|---|---|---|
| 9,349,930 B2 | 5/2016 | Lee | |
| 9,905,436 B2 | 2/2018 | Oh et al. | |
| 2005/0253251 A1 | 11/2005 | An et al. | |
| 2015/0021754 A1* | 1/2015 | Lin | H01L 23/5389 257/712 |
| 2015/0117035 A1 | 4/2015 | Ahn et al. | |
| 2016/0035648 A1* | 2/2016 | Zhou | H01L 21/561 257/713 |
| 2016/0225721 A1 | 8/2016 | Choi et al. | |
| 2017/0162550 A1* | 6/2017 | Das | H01L 23/5329 |
| 2017/0373048 A1* | 12/2017 | Yu | H01L 21/565 |

FOREIGN PATENT DOCUMENTS

| | | |
|---|---|---|
| JP | 2010-232471 | 10/2010 |
| KR | 10-1996-0012437 | 4/1996 |
| KR | 10-1998-0073899 | 11/1998 |
| KR | 10-1998-0078723 | 11/1998 |
| KR | 10-2001-0002214 | 1/2001 |
| KR | 10-2001-0061847 | 7/2001 |
| KR | 10-2001-0068505 | 7/2001 |
| KR | 10-2012-0077875 | 7/2012 |
| KR | 10-2013-0103045 | 9/2013 |
| KR | 10 2013-0077564 | 2/2014 |
| KR | 10-2015-0042488 | 4/2015 |
| KR | 10-2016-0094768 | 8/2016 |
| KR | 10-2017-0036236 | 4/2017 |
| KR | 10-2017-0138604 | 12/2017 |
| KR | 10-2018-0002913 | 1/2018 |
| KR | 10-2018-0035206 | 4/2018 |

OTHER PUBLICATIONS

Patent decision for Korean Patent Application No. 10-2019-0040299, dated Sep. 6, 2019.
Patent decision for Korean Patent Application No. 10-2018-0079579, dated Aug. 7, 2020.
Notification of Opinion Submission for Korean Patent Application No. 10-2019-0040299, dated May 7, 2019.
Notification of Opinion Submission for Korean Patent Application No. 10-2019-40300 dated May 7, 2019.
Patent decision for Korean Patent Application No. 10-2019-0040300, dated Sep. 23, 2019.
Notification of Opinion Submission for Korean Patent Application No. 10-2018-0077319, dated May 8, 2020.
Notification of Opinion Submission for Korean Patent Application No. 10-2018-0087272, dated Jan. 12, 2020.
Notification of Opinion Submission for Korean Patent Application No. 10-2018-0077319, dated Nov. 12, 2019.
Notification of Opinion Submission for Korean Patent Application No. 10-2018-0079579, dated Nov. 13, 2019.
Patent Rejection decision for Korean Patent Application No. 10-2019-0040300, dated Aug. 14, 2019.
Notification of Opinion Submission for Korean Patent Application No. 10-2018-0079579, dated Apr. 22, 2020.
Patent decision for Korean Patent Application No. 10-2018-0087272, dated May 28, 2020.
Patent decision for Korean Patent Application No. 10-2018-0077319, dated Jul. 30, 2020.

* cited by examiner

SEMICONDUCTOR PACKAGE

PRIORITY

This application claims priority to and is a continuation of PCT Patent Application No. PCT/KR2019/004688 filed Apr. 18, 2019, entitled "SEMICONDUCTOR PACKAGE", which is incorporated herein by reference in its entirety. PCT Patent Application No. PCT/KR2019/004688 claims priority to Korean Patent Application No. 10-2018-0055660, filed on May 15, 2018, which is also incorporated herein by reference in its entirety. PCT Patent Application No. PCT/KR2019/004688 also claims priority to Korean Patent Application No. 10-2018-0055661, filed on May 15, 2018, which is also incorporated herein by reference in its entirety. PCT Patent Application No. PCT/KR2019/004688 also claims priority to Korean Patent Application No. 10-2018-0055663, filed on May 15, 2018, which is also incorporated herein by reference in its entirety. PCT Patent Application No. PCT/KR2019/004688 also claims priority to Korean Patent Application No. 10-2018-0077319, filed on Jul. 3, 2018, which is also incorporated herein by reference in its entirety. PCT Patent Application No. PCT/KR2019/004688 also claims priority to Korean Patent Application No. 10-2018-0079579, filed on Jul. 9, 2018, which is also incorporated herein by reference in its entirety. PCT Patent Application No. PCT/KR2019/004688 also claims priority to Korean Patent Application No. 10-2018-0087272, filed on Jul. 26, 2018, which is also incorporated herein by reference in its entirety. PCT Patent Application No. PCT/KR2019/004688 also claims priority to Korean Patent Application No. 10-2019-0009246, filed on Jan. 24, 2019, which is also incorporated herein by reference in its entirety. PCT Patent Application No. PCT/KR2019/004688 also claims priority to Korean Patent Application No. 10-2019-0040299, filed on Apr. 5, 2019, which is also incorporated herein by reference in its entirety. PCT Patent Application No. PCT/KR2019/004688 also claims priority to Korean Patent Application No. 10-2019-0040300, filed on Apr. 5, 2019, which is also incorporated herein by reference in its entirety.

TECHNICAL FIELD

The present disclosure relates to a semiconductor package on which a heat sink is mounted, and more particularly, to a semiconductor package on which a heat sink capable of efficiently dissipating heat generated by a semiconductor chip is mounted.

BACKGROUND ART

As storage capacity of semiconductor memory devices increases, electronic devices including the semiconductor memory device are being required to be thin and light-weight. Because a lot of heat is generated by semiconductor chips located in large-capacity downscaled semiconductor packages, the dissipation of heat to the outside of the semiconductor packages is essential for ensuring the operation reliability and product reliability of the semiconductor package and electronic devices including the semiconductor packages.

DETAILED DESCRIPTION

Technical Problem

Provided is a semiconductor package capable of efficiently dissipating heat generated by a semiconductor chip.

Provided is a semiconductor package that provides cutting flexibility in a cutting process of dividing a plurality of semiconductor package into individual semiconductor packages.

Provided is a semiconductor package that may visually provide information about a semiconductor package.

Solution to Problem

According to an aspect of the present disclosure, a semiconductor package includes a semiconductor chip including a chip pad; a redistribution layer electrically connected to the chip pad of the semiconductor chip; an external connection terminal electrically connected to the redistribution layer; a sealing material configured to cover the semiconductor chip and fix the semiconductor chip and the redistribution layer; an adhesive film provided on an upper surface of the sealing material; and a heat sink formed on an upper surface of the adhesive film and having a stepped portion at a periphery thereof.

Advantageous Effects

According to embodiments of the present disclosure, a semiconductor package having excellent heat dissipation performance to effectively dissipate heat generated by a semiconductor chip can be provided.

According to embodiments of the present disclosure, cutting easiness can be provided in a process of cutting semiconductor packages into individual semiconductor packages.

According to embodiments of the present disclosure, due to a small distance between a metal frame and a semiconductor chip in a semiconductor chip, heat dissipation performance can be improved, and a distance between semiconductor chips can be further reduced during a process of manufacturing semiconductor packages, thereby increasing productivity.

According to embodiments of the present disclosure, information about semiconductor chips in a semiconductor package can be visually provided due to the marking of a heat sink mounted in the semiconductor package.

BEST MODE

Figure 1A:
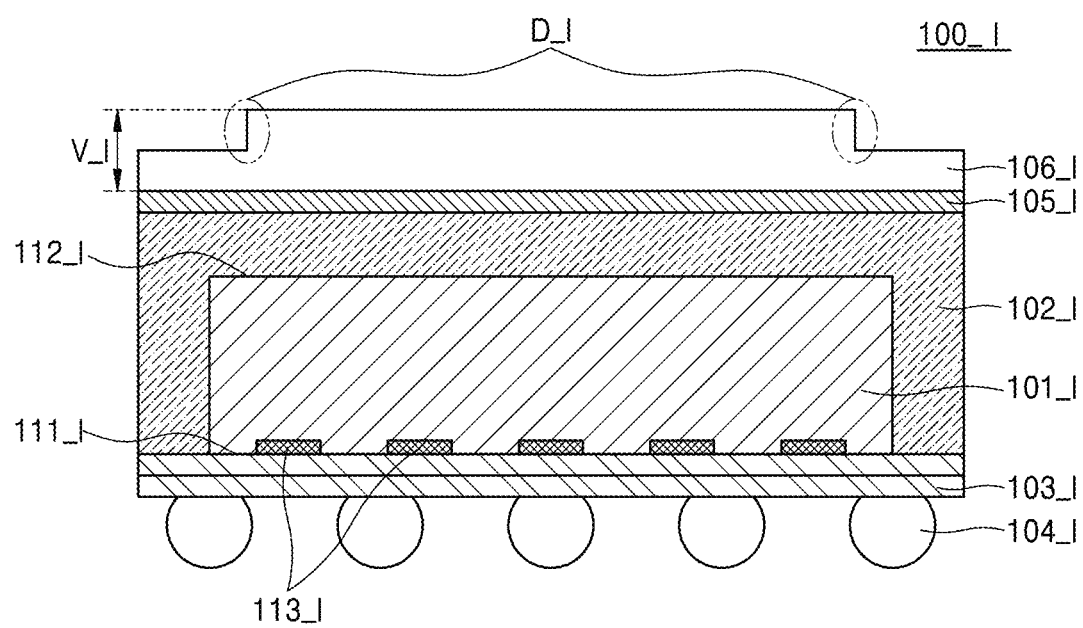
FIGS. 1A and 1B are cross-sectional views of a basic structure of a semiconductor package according to an embodiment of the present disclosure.

A semiconductor package according to an embodiment of the present disclosure may include a semiconductor chip including a chip pad; a redistribution layer electrically connected to the chip pad of the semiconductor chip; an external connection terminal electrically connected to the redistribution layer; a sealing material configured to cover the semiconductor chip and fix the semiconductor chip and the redistribution layer; an adhesive film provided on an upper surface of the sealing material; and a heat sink formed on the upper surface of the adhesive film and having a stepped portion at a periphery thereof.

MODE OF DISCLOSURE

The present disclosure is described more fully hereinafter with reference to the accompanying drawings, in which embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout. Furthermore, various elements and regions are approximately illustrated in the drawings. Accordingly, the scope of the present disclosure is not limited by relative sizes or intervals in the drawings.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein to describe embodiments of the present disclosure is not intended to limit the scope of the present disclosure. The singular forms "a", "an" and "the" are intended to include the plural forms as well, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this present disclosure belongs. It will be further understood that terms in common usage should also be interpreted as is customary in the relevant art and not in an idealized or overly formal sense unless explicitly so defined herein.

Figure 1B:
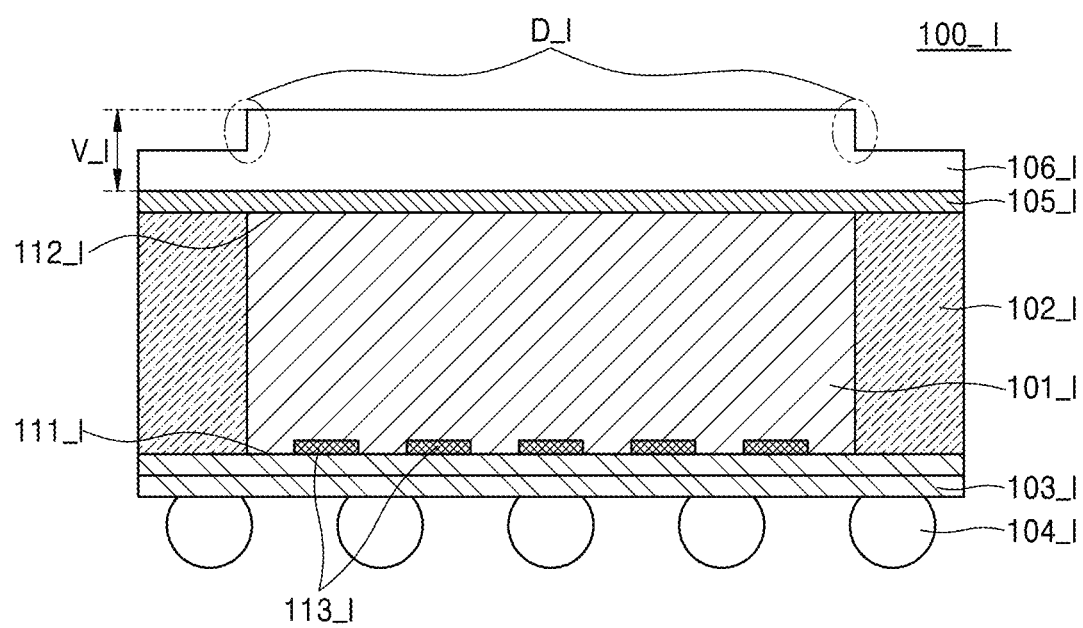

FIGS. 1A and 1B are cross-sectional views of a basic structure of a semiconductor package according to an embodiment of the present disclosure. A semiconductor package 100_I may be a fan-out wafer-level package (FO-WLP) or a panel-level package (PLP).

Referring to FIGS. 1A and 1B, the semiconductor package 100_I according to an embodiment of the present disclosure may include a semiconductor chip 101_I, a sealing material 102_I surrounding the semiconductor chip, a redistribution layer 103_I, an external connection terminal 104_I, an adhesive film 105_I, and a heat sink 106_I.

The semiconductor chip 101_I shown in FIG. 1A may include a plurality of individual devices of various types. The plurality of individual devices may include various microelectronic devices and include, for example, metal-oxide-semiconductor field effect transistors (MOSFETs) (e.g., complementary metal-insulator-semiconductor (CMOS) transistors), system large scale integration (LSI), image sensors (e.g., CMOS imaging sensors (CIS)), micro-electro-mechanical systems (MEMS), active devices, passive devices, and the like.

In example embodiments, the semiconductor chip 101_I may be a memory semiconductor chip. The memory semiconductor chip may be, for example, volatile memory semiconductor chips, such as dynamic random access memory (DRAM) or static RAM (SRAM) chips, or nonvolatile memory semiconductor chips, such as phase-change RAM (PRAM), magneto-resistive RAM (MRAM), ferroelectric RAM (FeRAM), or resistive RAM (RRAM) chips.

Alternatively, in example embodiments, the semiconductor chip 101_I may be a logic chip. For example, the semiconductor chip 101_I may be a central processor unit (CPU), a microprocessor unit (MPU), a graphic processor unit (GPU), or an application processor (AP).

Although the semiconductor package 100_I is illustrated as including one semiconductor chip 101_I in FIGS. 1A and 1B, the semiconductor package 100_I may include at least two semiconductor chips 101_I. The at least two semiconductor chips 101_I in the semiconductor package 100_I may be semiconductor chips of the same type or semiconductor chips of different types. In some embodiments, the semiconductor package 100_I may be a system-in-package (SIP), in which semiconductor chips of different types are electrically connected to each other and operate as a single system.

In an embodiment, the semiconductor chip 101_I may include a lower surface 111_I and an upper surface 112_I, which are opposite to each other. The semiconductor chip 101_I may include a chip pad 113_I mounted on the lower surface 111_I. The chip pad 113_I may be electrically connected to various types of individual devices formed on the semiconductor chip 101_I. The chip pad 113_I may have a thickness of about 0.5 µm to about 1.5 µm. Although not illustrated in FIG. 1A, the semiconductor chip 101_I may include a passivation layer covering the lower surface 111_I.

Referring to FIGS. 1A and 1B, the sealing material 102_I may be used to surround and protect the semiconductor chip 101_I. In addition, the sealing material 102_I may fix the semiconductor chip 101_I and the redistribution layer 103_I that will be described below. The sealing material 102_I may include, for example, a silicon-based material, a thermosetting material, a thermoplastic material, an ultraviolet (UV) treatment material, and the like. As an example, the sealing material 102_I may include a polymer, such as resin, for example, an epoxy molding compound (EMC).

The sealing material 102_I may cover at least a portion of the semiconductor chip 101_I. As shown in FIG. 1A, the sealing material 102_I may cover the upper surface 112_I and the side surface of the semiconductor chip 101_I. Here, a height difference between the upper surface 112_I of the semiconductor chip 101_I and the upper surface of the sealing material 102_I may be in a range of about 1 µm to about 10 µm.

However, in some embodiments of the present disclosure, as shown in FIG. 1B, the sealing material 102_I may cover a side surface of the semiconductor chip 101_I and expose the upper surface 112_I of the semiconductor chip 101_I. By exposing the upper surface 112_I of the semiconductor chip 101_I, a size of the semiconductor package 100_I may be reduced, and heat generated by the semiconductor chip 101_I may not pass through the sealing material 102_I but sequentially pass through the adhesive film 105_I and the heat sink 106_I, which are respectively on the upper surface 112_I of the semiconductor chip 101_I and on the upper surface of the adhesive film 105_I as described below, and be dissipated to the outside.

Referring to FIGS. 1A and 1B, the semiconductor package 100_I may include the adhesive film 105_I. The adhesive film 105_I may be in contact with the upper surface 112_I of the semiconductor chip 101_I or the upper surface of the sealing material 102_I. The adhesive film 105_I may include an epoxy resin having reliable adhesion to the sealing material 102_I and the semiconductor chip 101_I. In addition, the adhesive film 105_I may include a filler material (e.g., silver, aluminum, silicon dioxide, aluminum nitride, and boron nitride) having high thermal conductivity and include thermally conductive aluminum oxide to maintain desired stiffness. The adhesive film 105_I may have a self-adhesive property and be adhered to an additional thermally-conductive adhesive tape. The adhesive tape may be a both-sided adhesive tape. In the semiconductor package 100_I, the thickness of the adhesive film 105_I may be in a range of about 5 µm to about 20 µm, more specifically, from about 10 µm to about 14 µm.

Referring to FIGS. 1A and 1B, the semiconductor package 100_I may include the redistribution layer 103_I. The redistribution layer 103_I may be formed on the lower surface 111_I of the semiconductor chip 101_I to electrically connect the chip pad 113_I of the semiconductor chip 101_I to the external connection terminal 104_I. By using the redistribution layer 103_I, the external connection terminal 104_I may be formed in a region of the semiconductor package 100_I, which is outside the footprint of the lower surface 111_I of the semiconductor chip 101_I. Due to the redistribution layer 103_I, the external connection terminal 104_I may be efficiently arranged in the semiconductor package 100_I.

Although not illustrated in FIGS. 1A and 1B, the redistribution layer 103_I may include a wiring pattern and an insulating pattern. The wiring pattern may be electrically connected to the chip pad 113_I, which is formed on the lower surface 111_I of the semiconductor chip 101_I, and provide an electrical connection path for electrically connecting the chip pad 113_I to an external device. The insulating pattern may protect the wiring pattern, which is electrically connected to the chip pad 113_I, from an external impact and prevent the occurrence of a short. The insulating pattern may include, for example, a photosensitive material (e.g., polyimide) or epoxy. However, the present disclosure is not limited to the above description, and the insulating pattern may include a silicon oxide layer, a silicon nitride layer, an insulating polymer, or a combination thereof.

Referring to FIGS. 1A and 1B, the semiconductor package may include the external connection terminal 104_I. The external connection terminal 104_I may be provided on the lower surface of the redistribution layer 103_I and electrically connected to the redistribution layer 103_I. The semiconductor package 100_I may be electrically connected to an external device (e.g., a system substrate, a main board, and the like) through the external connection terminal 104_I. The external connection terminal 104_I may include a solder ball as shown in FIGS. 1A and 1B. The solder ball may include at least one of tin, silver, copper, and aluminum. In addition, the solder ball may have a ball shape shown in FIGS. 1A and 1B, but the present disclosure is not limited thereto. The solder ball may have various shapes, such as a circular pillar shape, a polygonal pillar shape, and a polyhedral shape.

Referring to FIGS. 1A and 1B, the semiconductor package 100_I may include the heat sink 106_I. The heat sink 106_I may be located on the adhesive film 105_I and mounted in the semiconductor package 100_I. The heat sink 106_I may efficiently dissipate heat generated by the semiconductor chip 101_I of the semiconductor package 100_I to the outside.

More specifically, referring to FIG. 1A, heat generated by the semiconductor chip 101_I in the semiconductor package 100_I may sequentially pass though the upper surface 112_I of the semiconductor chip 101_I, the sealing material 102_I, the adhesive film 105_I, and the heat sink 106_I and be dissipated to the outside. Referring to FIG. 1B, the heat generated by the semiconductor chip 101_I in the semiconductor package 100_I may sequentially pass though the upper surface 112_I of the semiconductor chip 101_I, the adhesive film 105_I, and the heat sink 106_I and be dissipated to the outside. In FIG. 1B, because the sealing material 102_I is not formed between the upper surface 112_I of the semiconductor chip 101_I and the adhesive film 105_I, heat transfer resistance in a transfer path of heat generated by the semiconductor chip 101_I may be lower than in FIG. 1A, and a better heat dissipation effect may be obtained.

The heat sink 106_I mounted in the semiconductor package 100_I may include metal-based, ceramic-based, carbon-based, and polymer-based materials, which have various thermal conductivities.

More specifically, the heat sink 106_I including the metal-based material may include a metal-based material, such as aluminum (Al) having a thermal conductivity of about 200 W/m·K, magnesium (Mg) having a thermal conductivity of about 150 W/m·K, copper (Cu) having a thermal conductivity of about 380 W/m·K, nickel (Ni) having a thermal conductivity of about 90 W/m·K, and silver (Ag) having a thermal conductivity of about 410 W/m·K.

The heat sink 106_I including the ceramic-based material may include a ceramic-based material, such as boron nitride (BN) having a thermal conductivity of about 1800 W/m·K, aluminum nitride (AlN) having a thermal conductivity of about 320 W/m·K, aluminum oxide ($Al_2O_3$) having a thermal conductivity of about 30 W/m K, silicon carbide (SiC) having a thermal conductivity of about 480 W/m·K, and beryllium oxide (BeO) having a thermal conductivity of about 270 W/m·K.

The heat sink 106_I including the carbon-based material may include a carbon-based material, such as diamond having a thermal conductivity of about 2500 W/m·K, carbon fiber having a thermal conductivity of about 100 W/m·K, graphite having a thermal conductivity of about 5 W/m·K to about 1950 W/m·K, carbon nanotube having a thermal conductivity of about 1.5 W/m·K to about 3500 W/m·K, and graphene having a thermal conductivity of about 5000 W/m·K.

The heat sink 106_I including the polymer-based material may include a polymer-based material, such as polyethylene, which has a thermal conductivity of about 45 W/m·K to about 100 W/m·K and has an ultrahigh molecular weight.

However, the heat sink 106_I is not limited to the metal-based, ceramic-based, carbon-based, and polymer-based materials described above and include any combination of the above-described materials or other materials which are not described above.

Referring to FIGS. 1A and 1B, the heat sink 106_I mounted in the semiconductor package 100_I may be formed to have various heights. In an embodiment of the present disclosure, the thickness v_I of the heat sink 106_I may take up about 25% to about 40% of the thickness of the semiconductor package. In an embodiment of the present disclosure, because the thickness of the semiconductor package 100_I may be in a range of about 1.1 mm to about 1.4 mm, the thickness v_I of the heat sink 106_I may be in a range of about 280 μm to about 560 μm.

Referring to FIGS. 1A and 1B, the heat sink 106_I formed in the semiconductor package 100_I may include a region D_I having a stepped portion at a periphery thereof. A plurality of regions D_I, each of which has the stepped portion, may be mounted in one semiconductor package 100_I. The region D_I having the stepped portion will be described in more detail below.

Figure 2A:
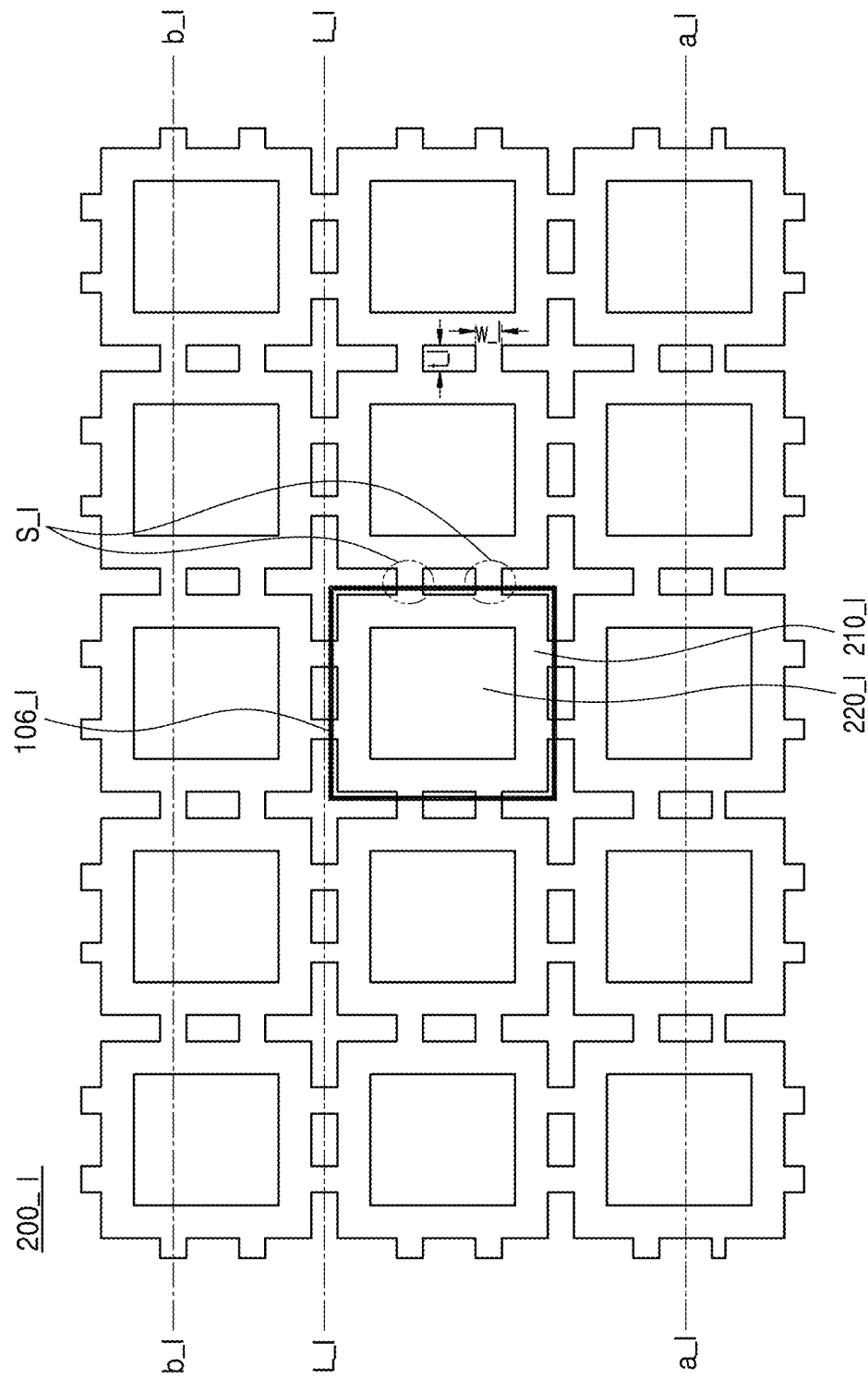
FIG. 2A is a plan view of a heat sink group in which a plurality of heat sinks are connected to each other with a predetermined distance therebetween, according to an embodiment of the present disclosure.

FIG. 2A is a plan view of a heat sink group 200_I in which a plurality of heat sinks 106_I are connected to each other with a predetermined distance therebetween, according to an embodiment of the present disclosure. Referring to FIG. 2A, the individual heat sink 106_I may be connected to other individual heat sinks 106_I, which are spaced a predetermined distance t_I apart from side surfaces of the individual heat sinks 106_I in four directions, thereby forming the heat sink group 200_I. As shown in FIG. 2A, the individual heat sinks 106_I may be connected to each other by a connection region S_I, which has the predetermined distance t_I between the individual heat sink 106_I and has a predetermined width w_I. As shown in FIG. 2A, a pair of connection regions S_I may be mounted on each side of the heat sink 106_I, but the present disclosure is not limited to the number of connection regions. For example, one connection region S_I or at least two connection regions S_I may be formed on each the side surface of the heat sink 106_I.

Before a plurality of semiconductor packages are cut into individual semiconductor packages, the heat sink group 200_I may be fixedly provided on upper surfaces of adhesive films of the plurality of semiconductor packages. The heat sinks 106_I may form the heat sink group 200_I by using the connection region S_I, and thus, the heat sink 106_I may be easily aligned to a desired position on an upper surface of each semiconductor package. After the heat sink group 200_I is provided on an upper surface of the adhesive film 105_I, when heat and pressure are applied to the adhesive film 105_I, the adhesive film 105_I may fix the heat sink group 200_I such that the heat sink group 200_I is stably mounted on the plurality of semiconductor packages.

When the heat sink group 200_I is stably mounted on the plurality of semiconductor packages, the plurality of semiconductor packages may be cut into individual semiconductor packages through a cutting process. Referring to FIG. 2A, a cutting line L_I may be formed in a straight line, on the connection region S_I of the heat sink group 200_I, which has the predetermined distance t_I and the predetermined width w_I. Because the cutting line L_I is formed on the connection region S_I with the predetermined distance t_I and the predetermined width w_I, the smaller the thickness and the width w_I of the connection region S_I, the easier the cutting process of cutting the plurality of semiconductor packages on which the heat sink group 200_I is mounted, into individual semiconductor packages (e.g., 100_I of FIG. 1A).

Figure 2B:
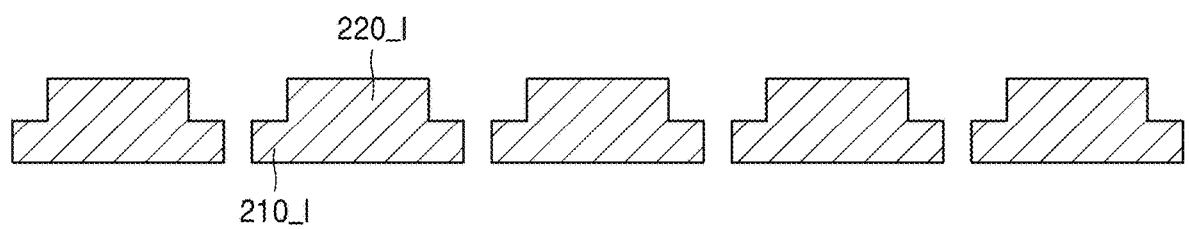
FIGS. 2B and 2C are respectively side cross-sectional views taken along lines a_I and b_I, illustrating the heat sink group of FIG. 2A, according to the embodiment of the present disclosure.
Figure 2C:
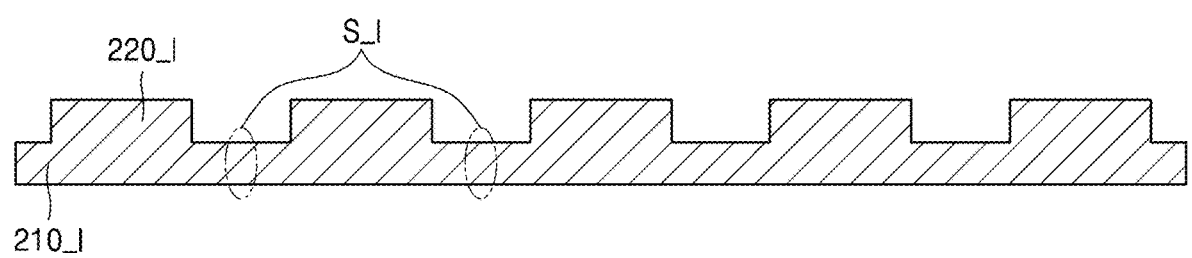

FIG. 2B is a side sectional view taken along line a_I, illustrating the heat sink group 200_I of FIG. 2A according to an embodiment of the present disclosure, and FIG. 2C is a side sectional view of the heat sink group 200_I taken along line b_I, illustrating FIG. 2A according to an embodiment of the present disclosure.

Referring to FIGS. 2A to 2C, the heat sink group 200_I according to an embodiment of the present disclosure may include a first heat dissipation layer 210_I, which is formed on an upper surface of the adhesive film, and a second heat dissipation layer 220_I, which is formed on the first heat dissipation layer 210_I.

The first heat dissipation layers 210_I may be connected to each other by the connection region S_I having the predetermined distance t_I and the predetermined width w_I. The connection region S_I may include the same material as the first heat dissipation layer 210_I. However, to facilitate the cutting process, the connection region S_I may include other materials. For example, the connection region S_I may include a metal-based material, a ceramic-based material, a carbon-based material, and a polymer-based material. Also, the thickness of the connection region S_I may be substantially equal to the thickness of the first heat dissipation layer 210_I. The first heat dissipation layer 210_I may have a rectangular parallelepiped shape as shown in FIG. 2A. However, the first heat dissipation layer 210_I is not limited thereto and may have various shapes.

The second heat dissipation layer 220_I may be formed on the first heat dissipation layer 210_I. The second heat dissipation layer 220_I may include substantially the same heat dissipation material as the first heat dissipation layer 210_I. In addition, referring to FIGS. 2A to 2C, a footprint of the second heat dissipation layer 220_I may be less than a footprint of the first heat dissipation layer 210_I.

The first heat dissipation layer 210_I and the second heat dissipation layer 220_I may have substantially the same height. However, the present disclosure is not limited thereto, and the first heat dissipation layer 210_I and the second heat dissipation layer 220_I may have different heights. A sum of the heights of the first heat dissipation layer 210_I and the second heat dissipation layer 220_I may be in a range of about 280 μm to about 560 μm and be about 25% to about 40% of the total thickness of the semiconductor package.

Figure 3A:
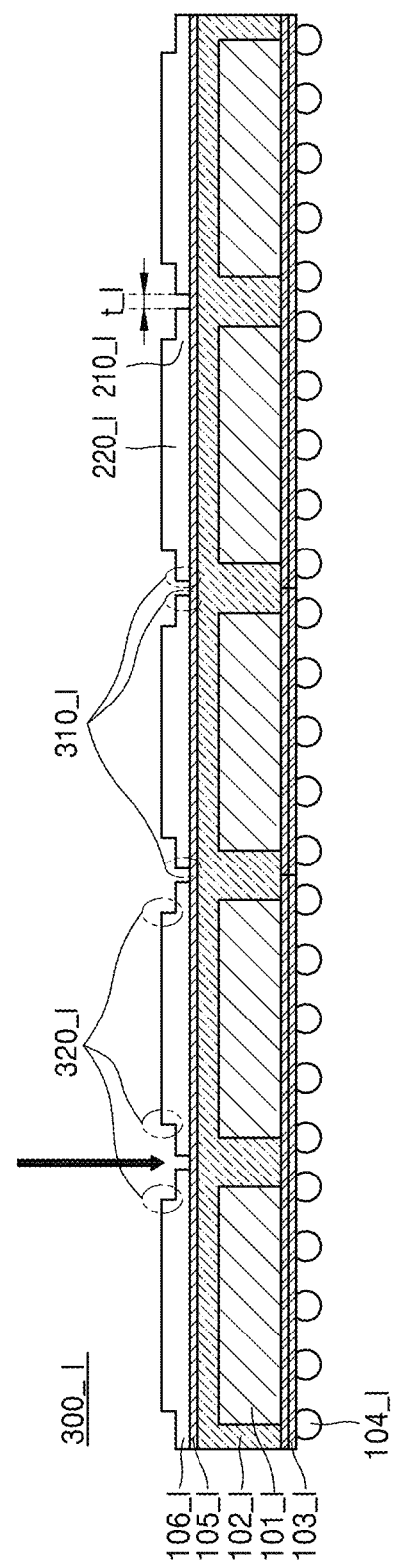
FIGS. 3A and 3B are respectively side cross-sectional views taken along lines a_I and b_I of FIG. 2A, illustrating a plurality of semiconductor packages on which the heat sink group of FIG. 2A according to the embodiment of the present disclosure is mounted.
Figure 3B:
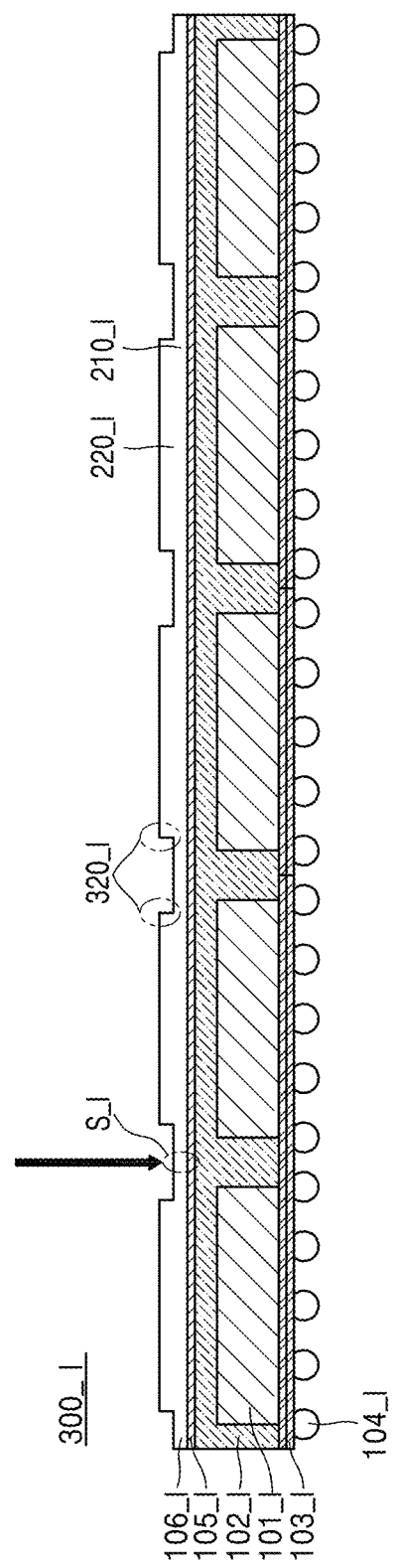

FIG. 3A is a side sectional view taken along line a of FIG. 2A, illustrating a plurality of semiconductor packages on which the heat sink group 200_I of FIG. 2A according to an embodiment of the present disclosure is mounted. FIG. 3B is a side sectional view taken along line b of FIG. 2A, illustrating a plurality of semiconductor packages on which the heat sink group 200_I of FIG. 2A according to an embodiment of the present disclosure is mounted.

Referring to FIGS. 3A and 3B, the heat sink 106_I may include a first stepped portion 3101 and a second stepped portion 320_I.

The first stepped portion 310_I may be formed at a portion of the side surface of the first heat dissipation layer 210_I, where the connection region S (e.g., see FIG. 2A) is not formed, due to a height difference between the adhesive film 105_I and the first heat dissipation layer 210_I.

More specifically, referring to FIG. 3A, when a plurality of semiconductor packages 300_I on the heat sink group 200_I is mounted are taken along line a_I passing through a portion where the connection region S_I is not formed, the heat sinks 106_I may be spaced a predetermined distance t_I apart from each other. Due to the predetermined distance t_I caused by the absence of the connection region S_I, a footprint of the first heat dissipation layer 210_I may be less than a footprint of the adhesive film 105_I. Thus, due to a difference in footprint between the first heat dissipation layer 210_I and the adhesive film 105_I and a height of the first heat dissipation layer 210_I, the first stepped portion 3101 may be formed between the adhesive film 105_I and the first heat dissipation layer 210_I.

Referring to FIG. 3B, when the plurality of semiconductor packages 300_I on which the heat sink group 200_I is mounted are taken along line b_I (e.g., see FIG. 2A) passing through a portion where the connection region S_I is formed, the individual heat sinks may be connected to each other by the connection region S_I. Thus, the first stepped portion 310_I may not be formed in the portion where the connection region S_I is formed.

Referring to FIGS. 3A and 3B, the second stepped portion 320_I may be formed due to a difference in footprint between the first heat dissipation layer 210_I and the second heat dissipation layer 220_I and a height of the second heat dissipation layer 220_I. Due to the second stepped portion 320_I that is formed due to the difference in footprint between the first heat dissipation layer 210_I and the second heat dissipation layer 220_I and the height of the second heat dissipation layer 220_I, the heat sink 106_I may have a shape of an inverted letter "T".

Referring to FIGS. 3A and 3B, the plurality of semiconductor packages 300_I on which a plurality of heat sinks 106_I are mounted may be cut in an arrow direction shown in FIGS. 3A and 3B. More specifically, the cutting line L_I (e.g., see FIG. 2A) of the plurality of semiconductor packages 300_I may be formed at a center of the predetermined distance t_I of FIG. 3A and a center of the connection region S_I of FIG. 3B and, along the cutting line L_I, the plurality of semiconductor packages 300_I may be divided into individual semiconductor packages.

Referring to FIG. 3A, in a portion where the connection region S_I is not formed, the cutting of the plurality of semiconductor package 300_I may be sequentially performed on the adhesive film 105_I, the sealing material 102_I, and the redistribution layer 103_I. Accordingly, because it is unnecessary to cut the connection region S_I, the individual packages may be formed by a small external force in a cutting process on the semiconductor package. More specifically, because materials of the sealing material 102_I and the redistribution layer 103_I include an EMC having a lower stiffness than a material of the connection region S_I, cutting blades including a wide variety of materials may be chosen in the cutting process on the semiconductor package.

Referring to FIG. 3B, in the portion where the connection region S_I is formed, the cutting of the plurality of semiconductor packages 300_I may be performed by sequentially cutting the connection region S_I, the adhesive film 105_I, the sealing material 102_I, and the redistribution layer 103_I. As the stiffness of the material of the connection region S_I is reduced and a width w_I and thickness of the connection region S_I are reduced, the connection region S_I may be more easily cut by a cutting blade in the cutting process on the semiconductor package.

In an embodiment of the present disclosure, the heat sink group 200_I may be formed by connecting the plurality of heat sinks 106_I to each other through the connection region S_I located on the side surface of the heat sink 106_I, and thus, a large number of heat sinks 106_I may be produced by using a single process. Also, because the large number of heat sinks 106_I produced using the above-described process are integrally combined with each other, the heat sinks 106_I may be stably mounted on upper surfaces of the plurality of semiconductor packages on which semiconductor chips are mounted, and combined with each other. In addition, because it is possible to integrally handle the heat sink group 200_I, processes of processing, delivering, and cutting the heat sink group 200_I may be facilitated.

Referring to FIGS. 3A and 3B, the connection region S_I may be in only a portion of the side surface of the heat sink 106_I. Thus, the footprint of the first heat dissipation layer 210_I may be less than that of the side surface of the heat sink 106_I, and due to the height of the first heat dissipation layer 210_I, the first stepped portion 310_I may be formed between the adhesive film 105_I and the first heat dissipation layer 210_I.

Figure 4A:
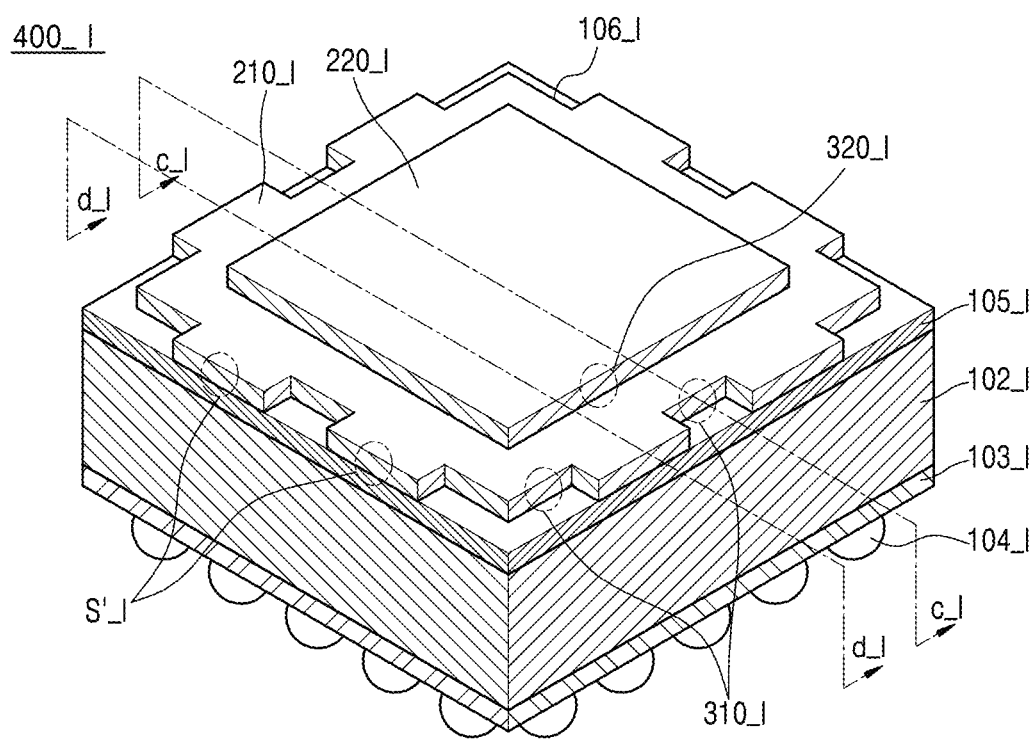
FIG. 4A is a perspective view of an individual semiconductor package formed by cutting a plurality of semiconductor packages on which the heat sink group of FIG. 2A according to the embodiment of the present disclosure is mounted, by using a cutting process.
Figure 4B:
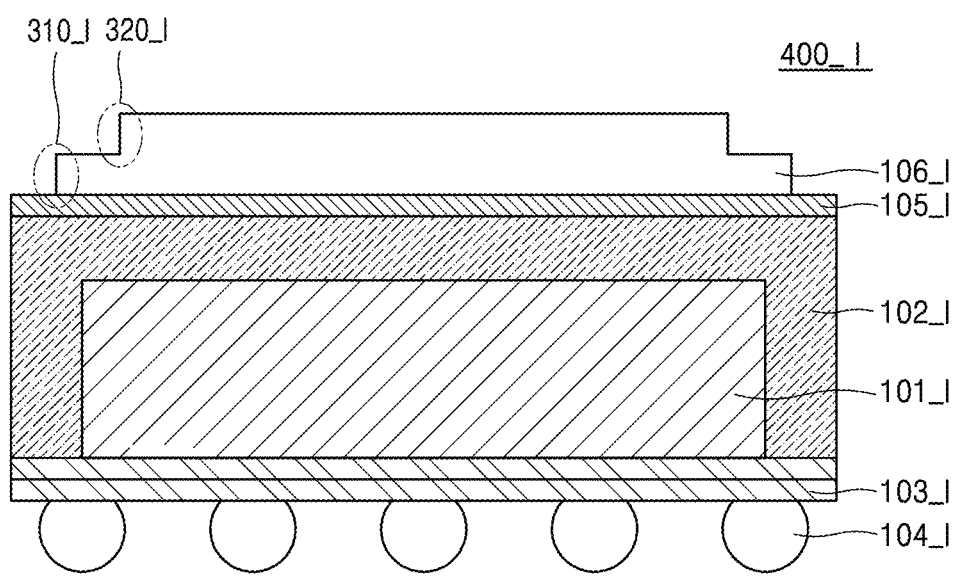
FIGS. 4B and 4C are respectively side cross-sectional views taken along lines c_I and d_I of FIG. 4A, illustrating a semiconductor package according to an embodiment of the present disclosure.
Figure 4C:
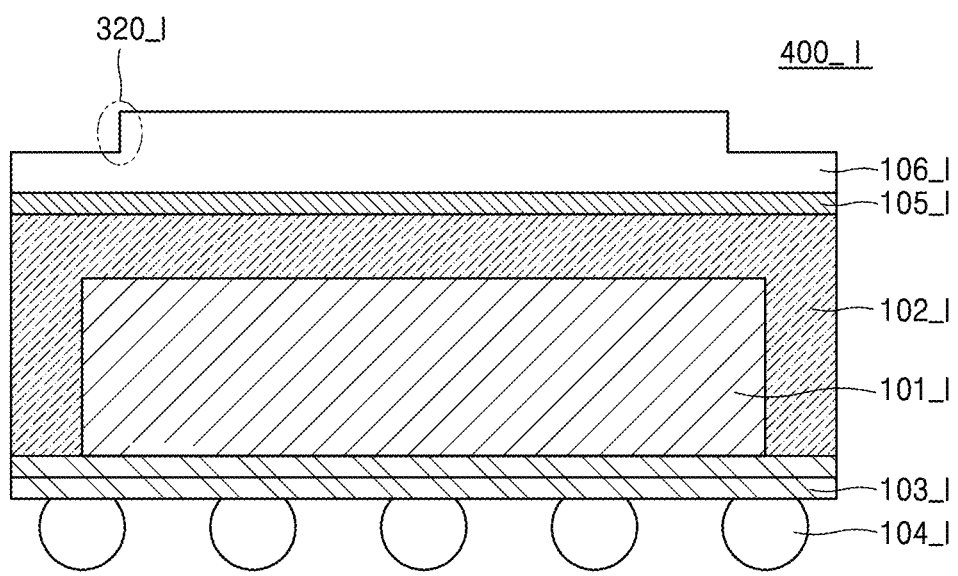

FIG. 4A is a perspective view of an individual semiconductor package 400_I formed by cutting a plurality of semiconductor packages on which the heat sink group 200_I of FIG. 2A according to an embodiment of the present disclosure is mounted, by using a cutting process. FIG. 4B is a side sectional view taken along line c_I of FIG. 4A, illustrating the semiconductor package 400_I according to an embodiment of the present disclosure. FIG. 4C is a side sectional view taken along line d_I of FIG. 4A, illustrating the semiconductor package 400_I according to an embodiment of the present disclosure.

Referring to FIGS. 4A to 4C, the semiconductor package 400_I may include a semiconductor chip 101_I, an external connection terminal 104_I, a redistribution layer 103_I, a sealing material 102_I, a connection film 105_I, and a heat sink 106_I, as described with reference to FIGS. 1A and 1B.

Descriptions of the semiconductor chip 101_I, the external connection terminal 104_I, the redistribution layer 103_I, and the sealing material 102_I, and the connection film 105_I may be the same as those presented above with reference to FIGS. 1A and 1B.

The heat sink 106_I may be formed on the upper surface of the connection film 105_I. The heat sink 106_I may include a first heat dissipation layer 210_I, which is formed on the upper surface of the adhesive film 105_I, and a second heat dissipation layer 220_I, which is formed on the upper surface of the first heat dissipation layer 210_I. Also, the heat sink 106_I may include a protrusion S'_I, which is formed by cutting the connection region S_I of FIG. 2A and is mounted on the side surface of the first heat dissipation layer 210_I. Here, because the heat sink group 200_I is mounted on a plurality of semiconductor packages and then a plurality of semiconductor packages are cut by the cutting process, the protrusion S'_I may be self-aligned to the side surface of the semiconductor package 400_I.

Referring to FIG. 4A, the heat sink 106_I may include a first stepped portion 310_I formed between the adhesive film 105_I and the first heat dissipation layer 210_I and in a region, which not includes the protrusion S'_I.

Here, a footprint of the first heat dissipation layer 210_I may be greater than a footprint of the second heat dissipation layer 220_I. The second stepped portion 320_I may be formed between the first heat dissipation layer 210_I and the second heat dissipation layer 220_I due to a difference in footprint between the first heat dissipation layer 210_I and the second heat dissipation layer 220_I and a height of the second heat dissipation layer 220_I.

The first stepped portion 310_I may have substantially the same height as the first heat dissipation layer 210_I, and the second stepped portion 320_I may have substantially the same height as the second heat dissipation layer 220_I.

The first stepped portion 310_I may have a smaller height than the second stepped portion 320_I. In addition, the protrusion S'_I may have substantially the same height as the first stepped portion 310_I. When the protrusion S'_I, which may be formed to have substantially the same height as the first stepped portion 310_I, has a reduced height, external force required for a cutting process may be reduced, thereby increasing flexibility in the cutting process. However, heights of the first stepped portion 310_I and the second stepped portion 320_I are limited to the above description and may be variously changed. The first stepped portion 310_I may have a smaller height than the second stepped portion 320_I. Alternatively, the first stepped portion 3101 and the second stepped portion 320_I may have substantially the same height.

In addition, a sum of the heights of the first stepped portion 310_I and the second stepped portion 320_I may be about 25% to about 40% of a total thickness of the semiconductor package 400_I. Accordingly, because the total thickness of the semiconductor package 400_I may be in a range of about 1.1 mm to about 1.4 mm, the sum of the heights of the first stepped portion 310_I and the second stepped portion 320_I may be in a range of about 280 μm to about 560 μm.

Furthermore, the heat sink 106_I including the first heat dissipation layer 210_I and the second heat dissipation layer 220_I may include metal-based, ceramic-based, carbon-based, and polymer-based materials, which have various thermal conductivities, as described with reference to FIGS. 1A and 1B.

By using the heat sink 106_I, heat generated by the semiconductor chip 101_I in the semiconductor package 400_I may sequentially pass through the semiconductor chip 101_I, the sealing material 102_I, the adhesive film 105_I, and the heat sink 106_I and be efficiently dissipated to the outside.

Figure 5A:
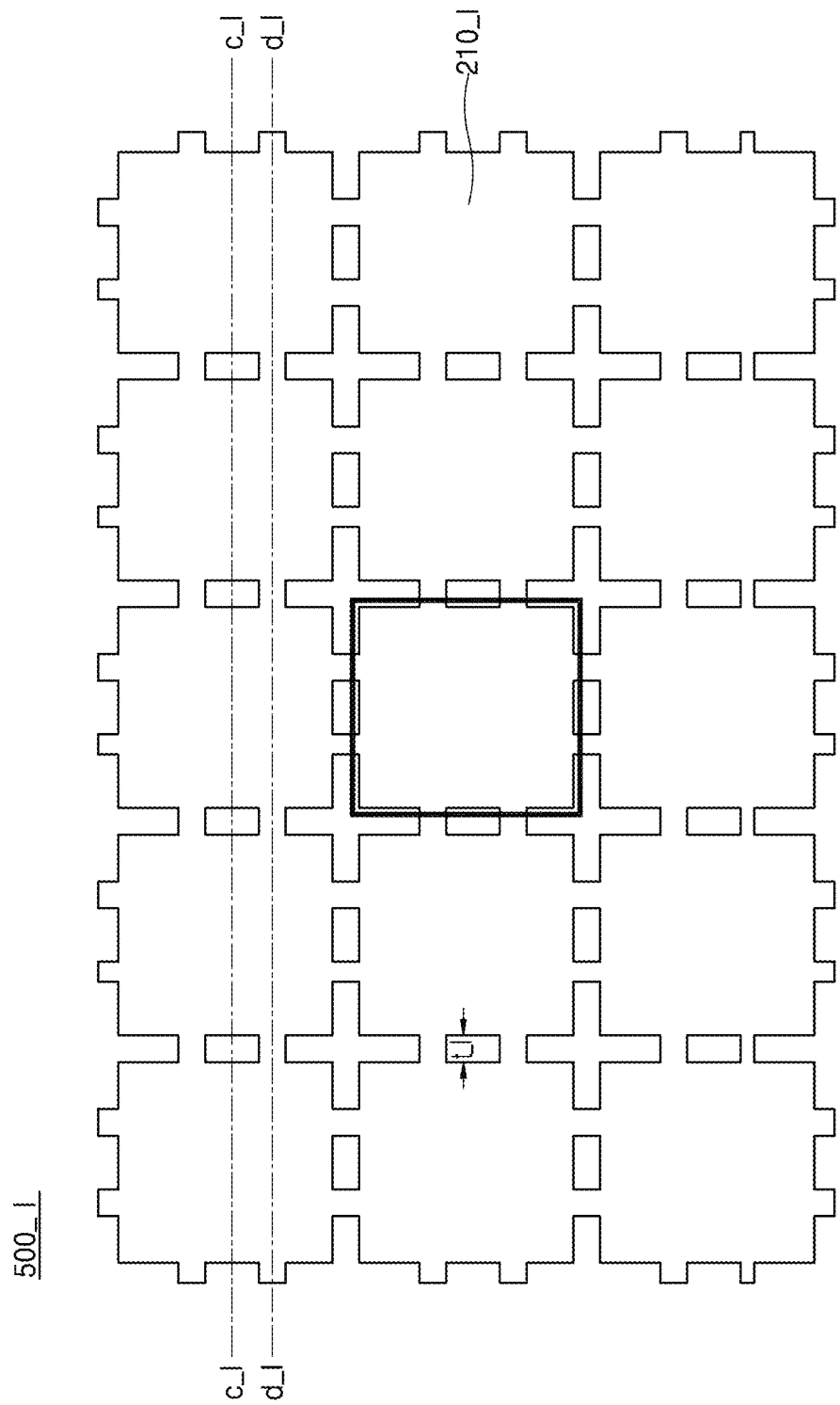
FIG. 5A is a plan view of a heat sink group in which a plurality of heat sinks are connected to each other with a predetermined distance therebetween, according to an embodiment of the present disclosure.
Figure 5B:
FIGS. 5B and 5C are respectively side cross-sectional views taken along lines c_I and d_I of FIG. 5A, illustrating the heat sink group of FIG. 5A according to the embodiment of the present disclosure.
Figure 5C:
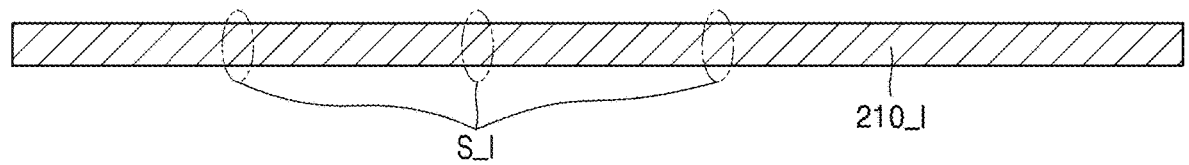

FIG. 5A is a plan view of a heat sink group 500_I in which a plurality of heat sinks are connected to each other with a predetermined distance therebetween, according to an embodiment of the present disclosure. FIG. 5B is a side sectional view taken along line c_I of FIG. 5A, illustrating the heat sink group 500_I of FIG. 5A according to an embodiment of the present disclosure. FIG. 5C is a side sectional view taken along line d_I of FIG. 5, illustrating the heat sink group 500_I of FIG. 5A according to an embodiment of the present disclosure.

Referring to FIGS. 5A to 5C, unlike the heat sink group 200_I illustrated in FIGS. 2A to 2C, the heat sink group 500_I according to an embodiment of the present disclosure may include only a first heat dissipation layer 210_I and may not include a second heat dissipation layer 220_I that is formed on an upper surface of the first heat dissipation layer 210_I as shown in FIGS. 2A to 2C. Thus, the first heat dissipation layer 210_I may have substantially the same height as the heat sink 106_I. A height of the first heat dissipation layer 210_I may be in a range of about 280 µm to about 560 µm and be about 25% to about 40% of a total thickness of the semiconductor package.

Characteristics of the heat sink group 500_I illustrated in FIGS. 5A to 5C except for the above description may be the same as those of the heat sink group 200_I illustrated in FIGS. 2A to 2C.

Figure 6A:
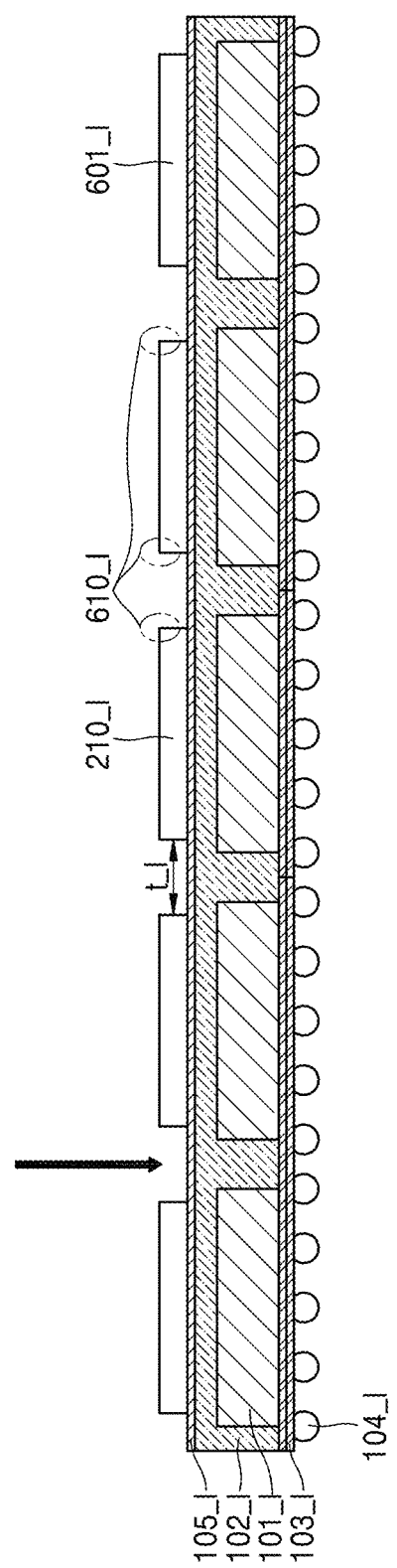
FIGS. 6A and 6B are respectively side cross-sectional views taken along lines c_I and d_I of FIG. 5A, illustrating a plurality of semiconductor packages on which the heat sink group according to the embodiment of the present disclosure is mounted.
Figure 6B:
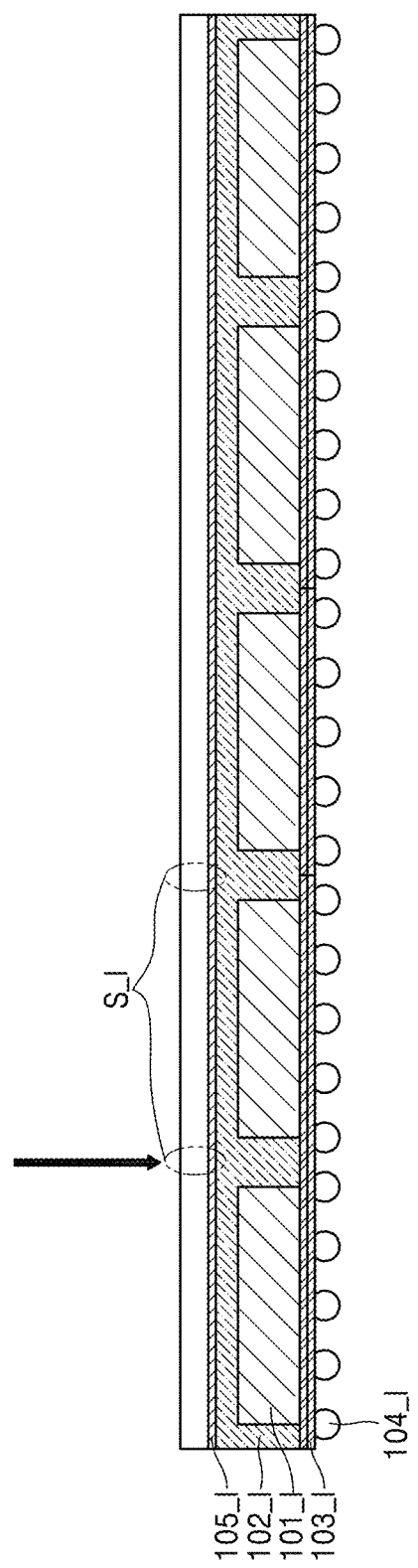

FIG. 6A is a side sectional view taken along line c_I of FIG. 5A, illustrating a plurality of semiconductor packages on which the heat sink group 500_I according to an embodiment of the present disclosure is mounted. FIG. 6B is a side sectional view taken along line d_I of FIG. 5A, illustrating a plurality of semiconductor packages on which the heat sink group 500_I according to an embodiment of the present disclosure is mounted.

Referring to FIGS. 6A and 6B, a heat sink 601_I may include a first stepped portion 610_I. The first stepped portion 610_I may be formed in a portion of a side surface of the first heat dissipation layer 210_I in which the connection region S_I (e.g., see FIG. 2A) is not formed. The first stepped portion 610_I may be formed due to a difference in footprint between the adhesive film 105_I and the first heat dissipation layer 210_I and a height of the first heat dissipation layer 210_I.

More specifically, referring to FIG. 6A, when the heat sink group 500_I is taken along line c_I of FIG. 5A passing through the portion in which the connection region S_I is not formed, the individual heat sinks 601_I may be spaced the predetermined distance t_I apart from each other. Due to the predetermined distance t_I, a footprint of the first heat dissipation layer 210_I may be less than a footprint of the adhesive film 105_I. Accordingly, the first stepped portion 610_I may be formed between the adhesive film 105_I and the first heat dissipation layer 210_I, due to a difference in footprint between the first heat dissipation layer 210_I and the adhesive film 105_I and a height of the first heat dissipation layer 210_I.

Referring to FIG. 6B, when the plurality of semiconductor packages on which the heat sink group 500_I is mounted are taken along line d_I of FIG. 5A passing through along the portion, in which the connection region S_I is formed, the individual heat sinks 601_I may be connected to each other by the connection region S_I. Thus, near the line d_I, the first stepped portion 610_I may not be formed between the first heat dissipation layer 210_I and the adhesive film 105_I. Thus, the heat sink 601_I may include the first stepped portion 610_I at only a portion of the side surface thereof.

Figure 7A:
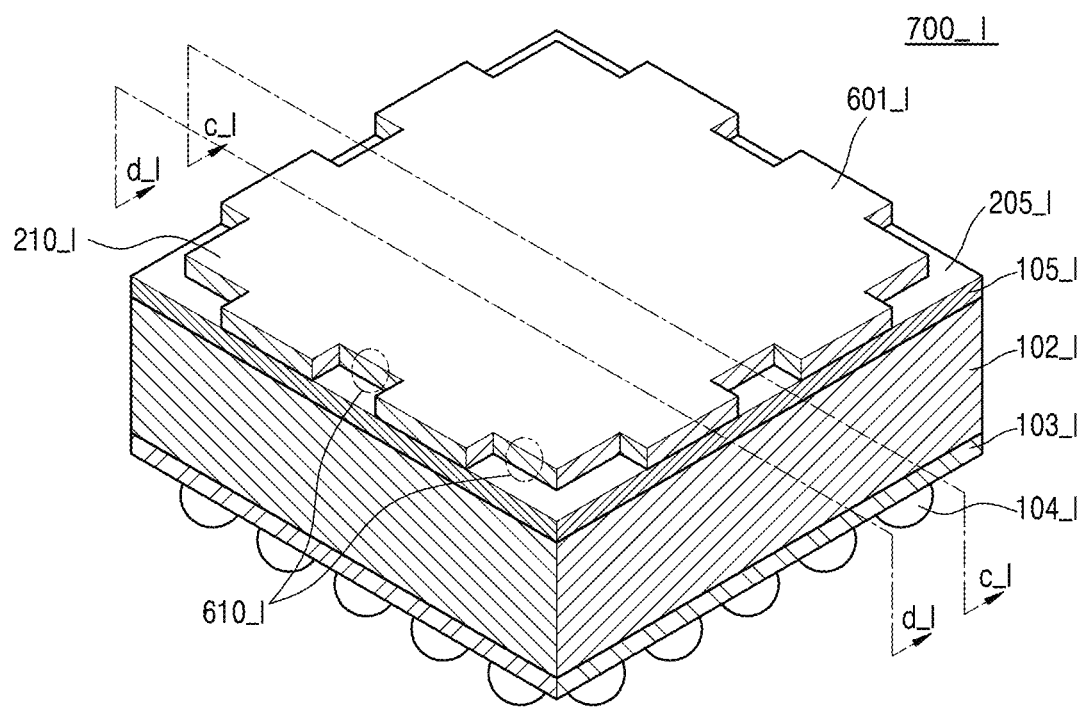
FIG. 7A is a perspective view of an individual semiconductor package formed by cutting a plurality of semiconductor packages on which the heat sink group of FIG. 5A according to the embodiment of the present disclosure is mounted, by using a cutting process.
Figure 7B:
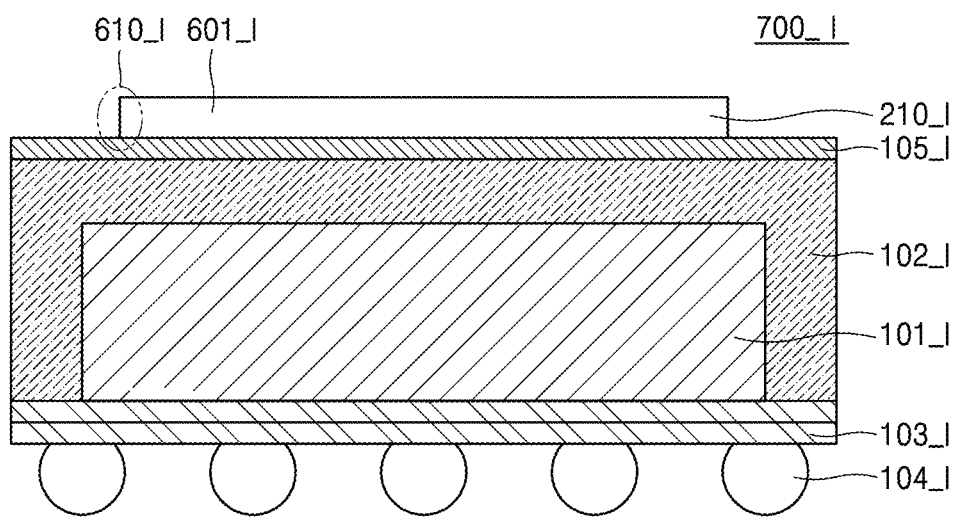
FIGS. 7B and 7C are respectively side cross-sectional views taken along lines e_I and f_I of FIG. 7A, illustrating a semiconductor package according to an embodiment of the present disclosure.
Figure 7C:
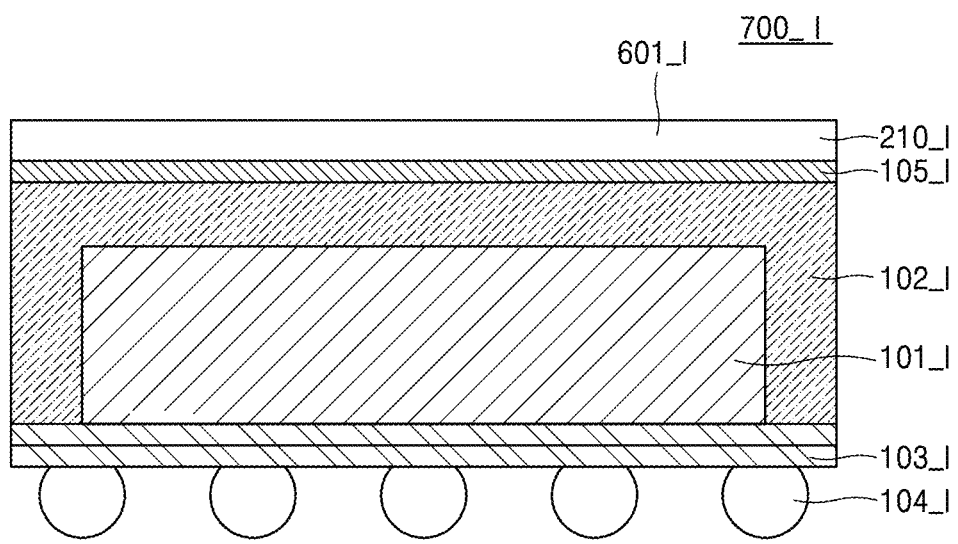

FIG. 7A is a perspective view of an individual semiconductor package 700_I formed by cutting a plurality of semiconductor packages on which the heat sink group 500_I of FIG. 5A according to an embodiment of the present disclosure is mounted, by using a cutting process. FIG. 7B is a side sectional view taken along line e_I of FIG. 7A, illustrating the semiconductor package 700_I according to an embodiment of the present disclosure. FIG. 7C is a side sectional view taken along line f_I of FIG. 7A, illustrating the semiconductor package 700_I.

Referring to FIGS. 7A to 7C, the semiconductor package 700_I may include a semiconductor chip 101_I, an external connection terminal 104_I, a redistribution layer 103_I, a sealing material 102_I, a connection film 105_I, and the heat sink 601_I, as described with reference to FIGS. 1A and 1B.

Descriptions of the semiconductor chip 101_I, the external connection terminal 104_I, the redistribution layer 103_I, and the sealing material 102_I, and the connection film 105_I, which are included in the semiconductor package 700_I, may be the same as those presented above with reference to FIGS. 1A and 1B.

The heat sink 601_I according to an embodiment of the present disclosure may be formed on an upper surface of the connection film 105_I, and a side surface of the heat sink 601_I may partially include a protrusion S'_I. In addition, the heat sink 601_I may include a first heat dissipation layer 210_I formed on an upper surface of the adhesive film 105_I.

The heat sink 601_I may include a first stepped portion 610_I formed between the adhesive film 105_I and the first heat dissipation layer 210_I and in a region which not includes the protrusion S'_I.

A height of the first stepped portion 610_I may be substantially equal to a height of the first heat dissipation layer 210_I and be about 25% to about 40% of a total thickness of the semiconductor package 700_I. Accordingly, because the total thickness of the semiconductor package 700_I may be in a range of about 1.1 mm to about 1.4 mm, the height of the first stepped portion 610_I may be in a range of about 280 µm to about 560 µm.

By using the heat sink 601_I shown in FIGS. 7A to 7C, heat generated by the semiconductor chip 101_I in the semiconductor package 700_I may sequentially pass though the semiconductor chip 101_I, the sealing material 102_I, the adhesive film 105_I, and the heat sink 601_I and be efficiently dissipated to the outside.

Figure 8A:
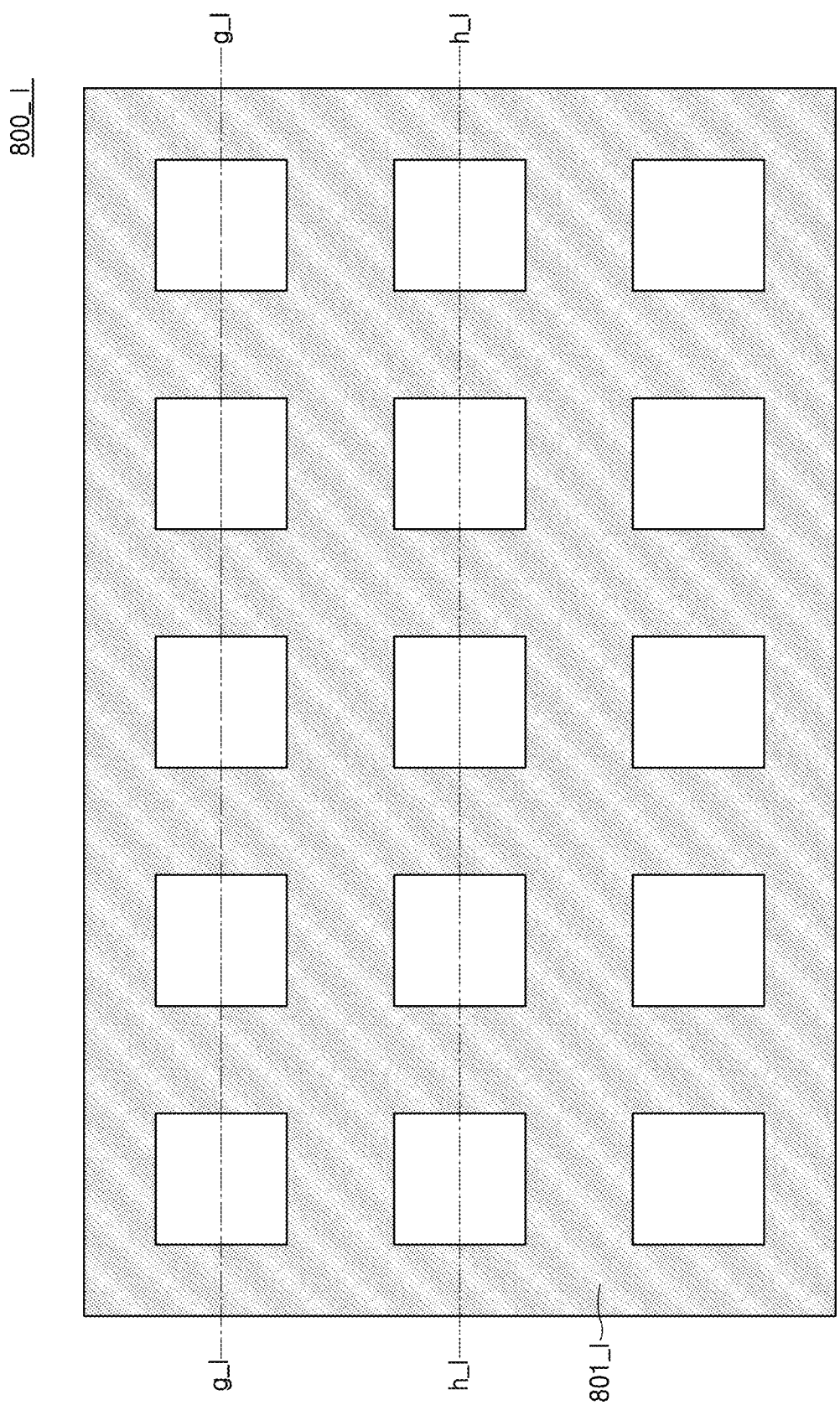
FIG. 8A is a plan view of a heat sink group in which the heat sink group of FIG. 2A is filled with a heat-dissipation molding unit, according to an embodiment of the present disclosure.
Figure 8B:
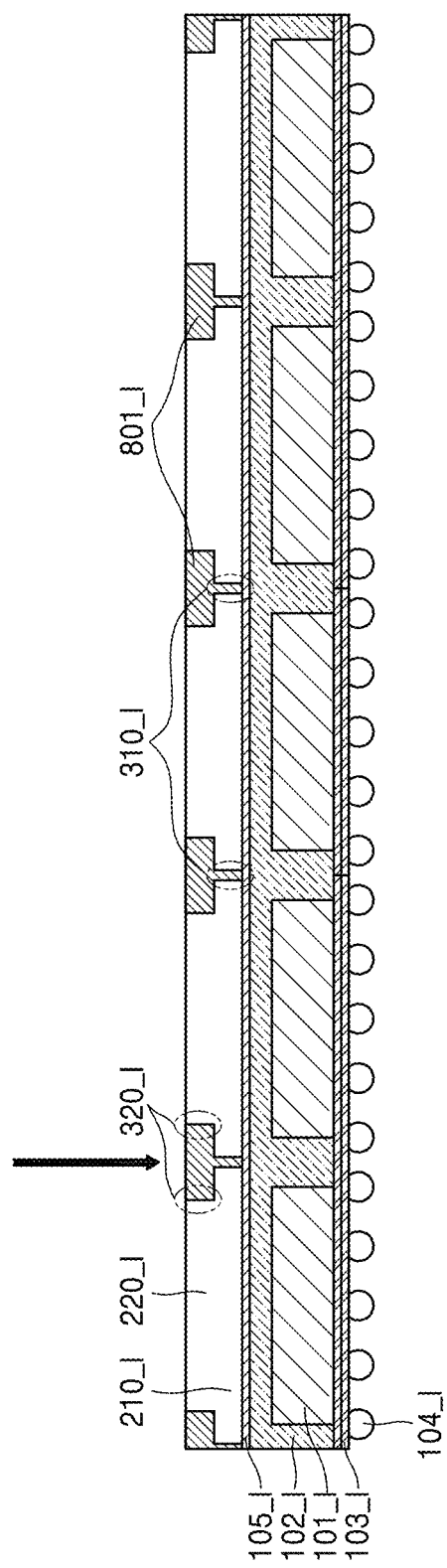
FIGS. 8B and 8C are respectively side cross-sectional views taken along lines g_I and h_I of FIG. 8A, illustrating a plurality of semiconductor packages on which the heat sink group of FIG. 8A according to an embodiment of the present disclosure is mounted.
Figure 8C:
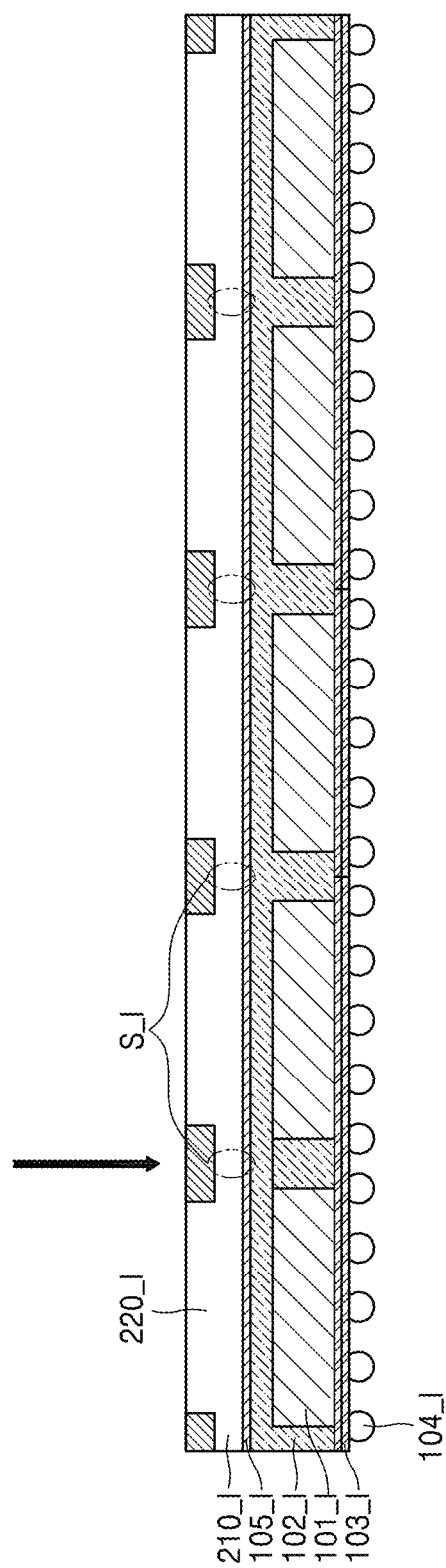

FIG. 8A is a plan view of a heat sink group 800_I, in which the heat sink group 200_I of FIG. 2A is filled with a heat-dissipation molding unit, according to an embodiment of the present disclosure. FIG. 8B is a side sectional view taken along line g_I of FIG. 8A, illustrating a plurality of semiconductor packages on which the heat sink group 800_I of FIG. 8A is mounted, according to an embodiment of the present disclosure. FIG. 8C is a side sectional view taken along line h_I of FIG. 8A, illustrating a plurality of semiconductor packages on which the heat sink group of FIG. 8A is mounted, according to an embodiment of the present disclosure.

Referring to FIGS. 8A to 8C, an empty space, which is formed by a first stepped portion 310_I formed between a adhesive film 105_I and a first heat dissipation layer 210_I and a second stepped portion 320_I formed between a first heat dissipation layer 210_I and a second heat dissipation layer 220_I, may be filled with a heat-dissipation molding unit 801_I.

The heat-dissipation molding unit 801_I may be formed on an upper surface of the adhesive film 105_I to cover an upper surface and a side surface of the first heat dissipation layer 210_I. The heat-dissipation molding unit 801_I may cover the side surface of the second heat dissipation layer 220_I and expose the upper surface of the second heat dissipation layer 220_I to the outside. In addition, the heat-dissipation molding unit 801_I may cover an upper surface of a connection region S_I.

A largest thickness of the heat-dissipation molding unit 801_I may be substantially equal to a sum of thicknesses of the first heat dissipation layer 210_I and the second heat dissipation layer 220_I. A thickness of the heat-dissipation molding unit 801_I may be in a range of about 280 µm to about 560 µm and be about 25% to about 40% of a total thickness of the semiconductor package.

The heat sink group 800_I in which the empty space formed by the first stepped portion 310_I and the second stepped portion 320_I is filled with the heat-dissipation molding unit 801_I may have a rectangular parallelepiped shape as shown in FIG. 8A. Due to the rectangular parallelepiped shape, the heat sink group 800_I may be easily handled, and processes of processing, delivering, and cutting the heat sink group 800_I may be easily performed.

The heat-dissipation molding unit 801_I may include various materials, such as a metal-based material, a ceramic-based material, a carbon-based material, and a polymer-based material. In an embodiment, the heat-dissipation molding unit 801_I may be an EMC.

Referring to FIG. 8B, in a portion where the connection region S_I is not formed, the cutting of the semiconductor packages may be performed by sequentially cutting the heat-dissipation molding unit 801_I, the adhesive film 105_I, the sealing material 102_I, and the redistribution layer 103_I. Thus, because there is no need to cut the connection region S_I, the plurality of semiconductor packages may be divided into individual packages with a relatively low external force during the cutting process. More specifically, because materials of the heat-dissipation molding unit 801_I, the sealing material 102_I, and the redistribution layer 103_I may include EMCs having relatively low stiffnesses, a great external force may not be required for the cutting process on the semiconductor package. Thus, a cutting blade including diverse materials with various stiffnesses may be chosen.

Referring to FIG. 8C, in a portion where the connection region S_I is formed, the cutting of the semiconductor packages may be performed by sequentially cutting the heat-dissipation molding unit 801_I, the connection region S_I, the adhesive film 105_I, the sealing material 102_I, and the redistribution layer 103_I.

Here, the material of the heat-dissipation molding unit 801_I may have a lower stiffness than the material of the connection region S_I. As the stiffness of the connection region S_I and a width w_I and a thickness of the connection region S_I are reduced, the connection region S_I may be easily cut by a cutting blade with less external force during the cutting process on the semiconductor package.

Figure 9A:
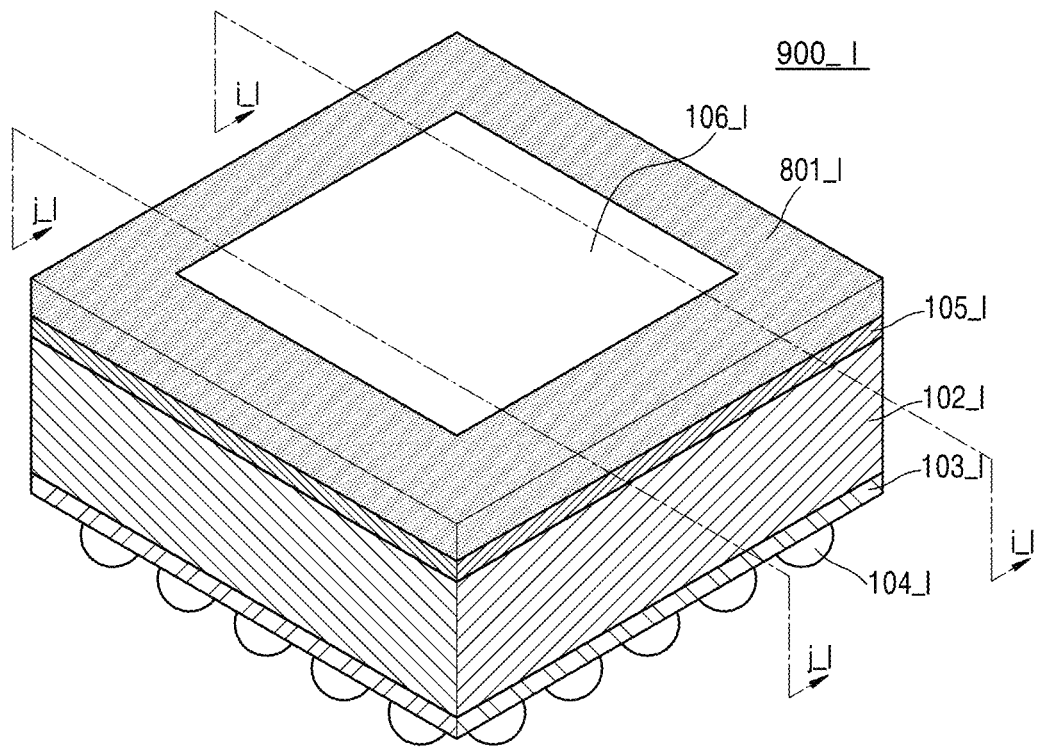
FIG. 9A is a perspective view of an individual semiconductor package formed by cutting a plurality of semiconductor packages on which the heat sink group of FIG. 8A according to an embodiment of the present disclosure is mounted, by using a cutting process.
Figure 9B:
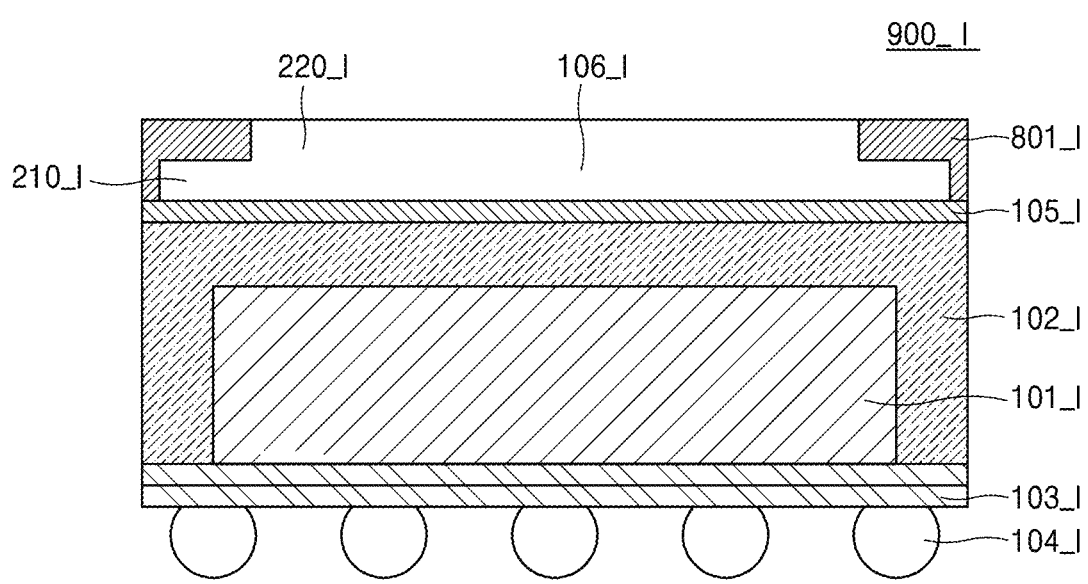
FIGS. 9B and 9C are respectively side cross-sectional views respectively taken along lines i_I and j_I of FIG. 9A, illustrating a semiconductor package according to an embodiment of the present disclosure.
Figure 9C:
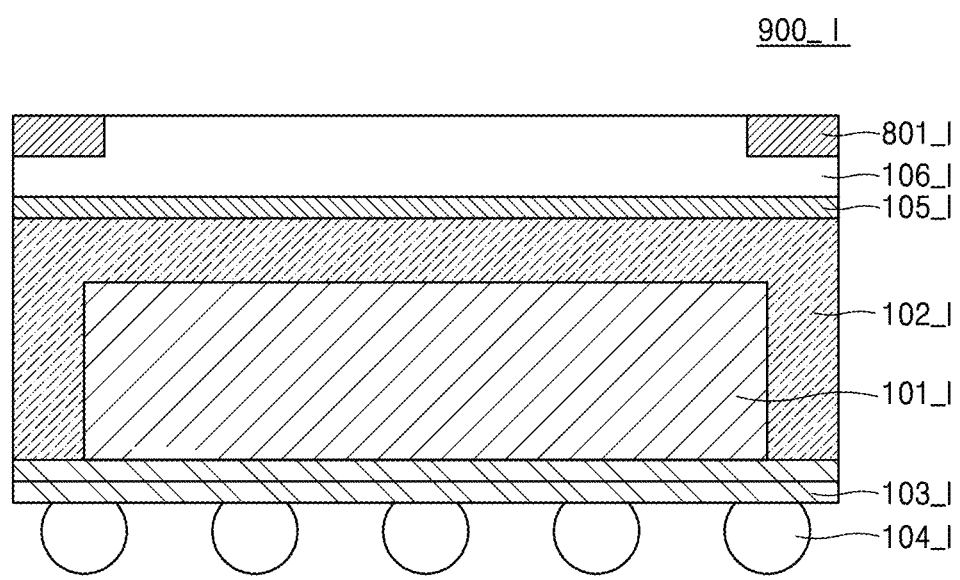

FIG. 9A is a perspective view of an individual semiconductor package 900_I formed by cutting a plurality of semiconductor packages on which the heat sink group 800_I of FIG. 8A is mounted, by using a cutting process, according to an embodiment of the present disclosure. FIG. 9B is a side sectional view taken along line i_I of FIG. 9A, illustrating the semiconductor package 900_I according to an embodiment of the present disclosure. FIG. 9C is a side sectional view taken along line j_I of FIG. 9A, illustrating the semiconductor package 900_I according to an embodiment of the present disclosure.

Referring to FIGS. 9A to 9C, the semiconductor package 900_I may include a semiconductor chip 101_I, an external connection terminal 104_I, a redistribution layer 103_I, a sealing material 102_I, a connection film 105_I, a heat sink 106_I, and a heat-dissipation molding unit 801_I.

Descriptions of the semiconductor chip 101_I, the external connection terminal 104_I, the redistribution layer 103_I, and the sealing material 102_I, and the connection film 105_I, and the heat sink 106_I, which are included in the semiconductor package 900_I, may be the same as those presented above with reference to FIGS. 7A to 7C.

Referring to FIGS. 9A to 9C, the heat-dissipation molding unit 801_I may be formed on an upper surface of the adhesive film 105_I to cover a side surface and an upper surface of the first heat dissipation layer 210_I. The heat-dissipation molding unit 801_I may cover a side surface of the second heat dissipation layer 220_I but may expose an upper portion of the second heat dissipation layer 220_I to the outside. In addition, the heat-dissipation molding unit 801_I may cover an upper surface of a protrusion S'_I shown in FIG. 4A. Alternatively, the heat-dissipation molding unit 801_I may expose a side surface of the protrusion S'_I, which is self-aligned to a side surface of the semiconductor package 900_I, to the outside.

In the semiconductor package 900_I, because the upper surface of the second heat dissipation layer 220_I is exposed to the outside, the heat dissipation effect of the semiconductor package 900_I may be improved.

Because a plurality of semiconductor packages are cut by the cutting process after the heat sink group 800_I is mounted on the plurality of semiconductor packages, a footprint formed by the heat sink 106_I and the heat-dissipation molding unit 801_I may be substantially equal to the footprint of the semiconductor package 900_I.

As described above, the material of the heat-dissipation molding unit 801_I may have a lower stiffness than the material of the protrusion S'_I, which is formed by cutting the connection region S_I. In an embodiment, the material of the heat-dissipation molding unit 801_I may include an EMC.

Figure 10A:
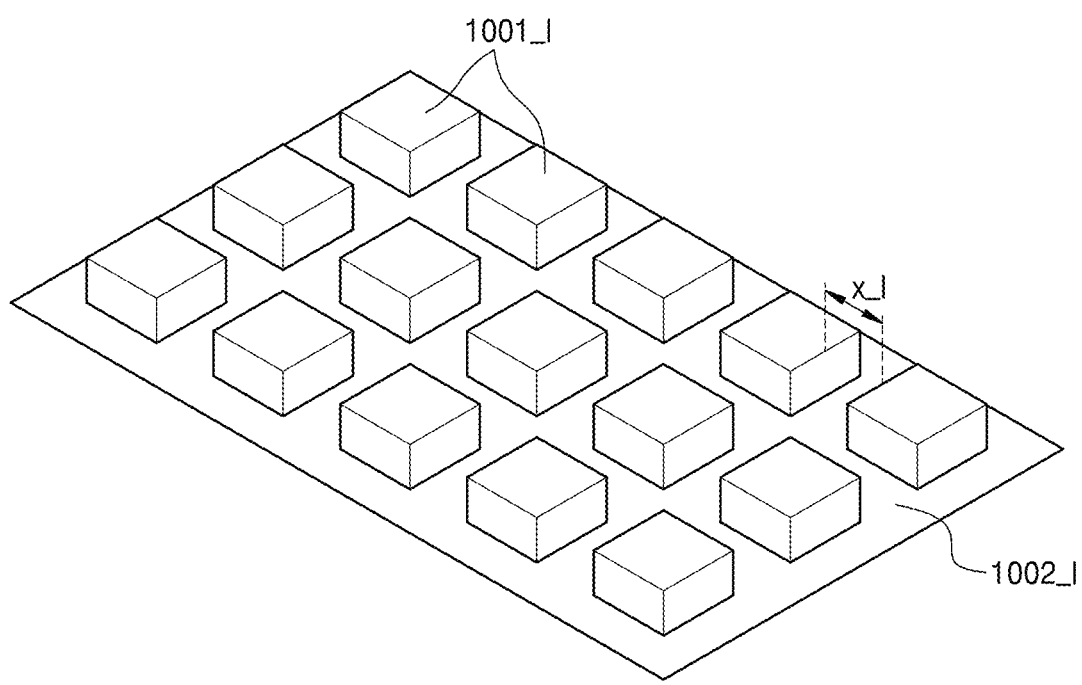
FIG. 10A is a perspective view of a plurality of heat sinks according to an embodiment of the present disclosure.
Figure 10B:
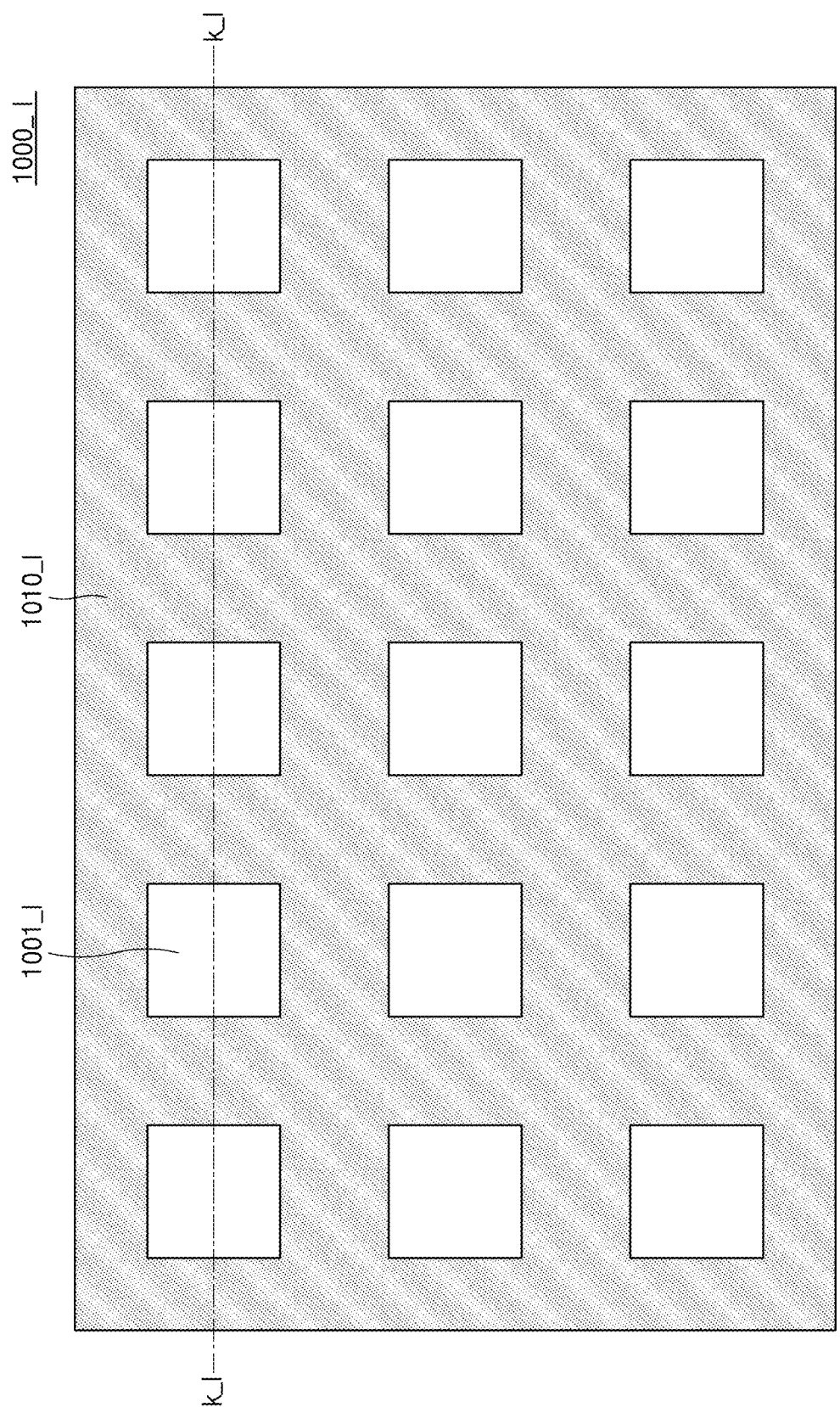
FIG. 10B is a plan view of a heat sink group in which the heat sinks of FIG. 10A is filled with a heat-dissipation molding unit, according to an embodiment of the present disclosure.

FIG. 10A is a perspective view of a plurality of heat sinks 1001_I according to an embodiment of the present disclosure, and FIG. 10B is a plan view of a heat sink group 1000_I, in which the heat sinks of FIG. 10A is filled with a heat-dissipation molding unit, according to an embodiment of the present disclosure.

Referring to FIG. 10A, the plurality of heat sinks 1001_I may be arranged a predetermined distance x_I apart from each other but, unlike the plurality of heat sinks in FIG. 2A, the plurality of heat sinks 1001_I may not be connected to each other. Thus, there may be an empty space 1002_I between the plurality of heat sinks 1001_I.

Referring to FIG. 10B, the empty space 1002_I between the plurality of heat sinks 1001_I may be filled with a heat-dissipation molding unit 1010_I. The heat-dissipation molding unit 1010_I may fill the empty space 1002_I up to the upper surface of the heat sinks 1001_I. Thus, the heat sink group 1000_I may form a single unit having a rectangular parallelepiped shape by using the heat-dissipation molding unit 1010_I. Accordingly, the heat sink group 1000_I, which is formed as the single unit, may be easily handled, and processes of processing, delivering, and cutting the heat sink group 1000_I may be easily performed.

Figure 11A:
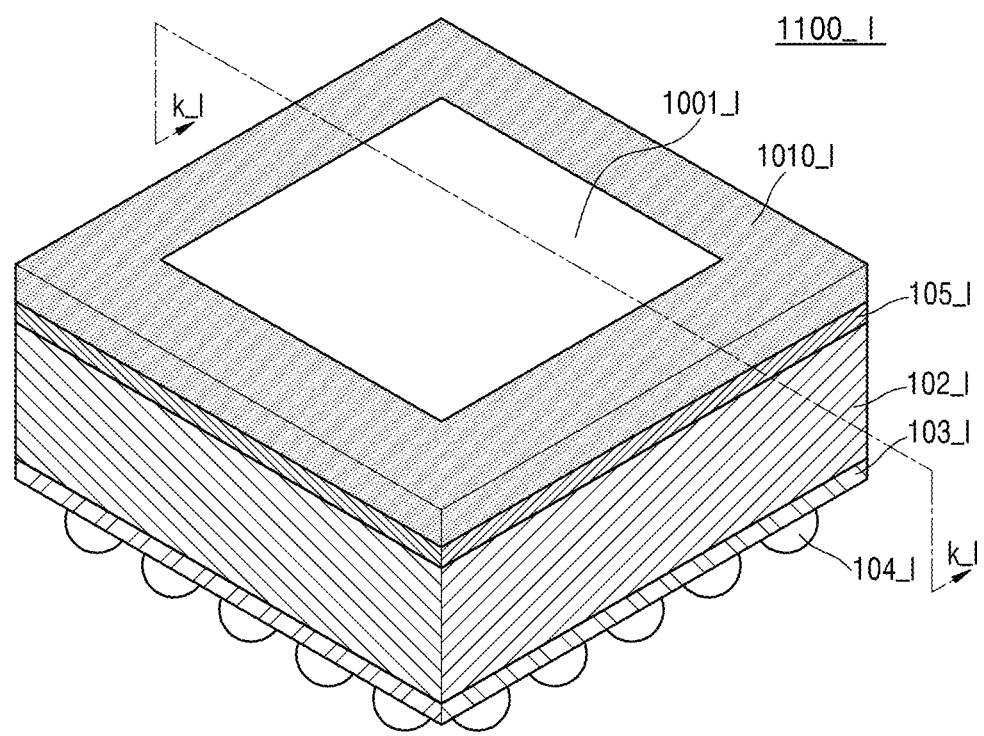
FIG. 11A is a perspective view of an individual semiconductor package formed by cutting a plurality of semiconductor packages on which the heat sink group of FIG. 10A according to an embodiment of the present disclosure is mounted, by using a cutting process.
Figure 11B:
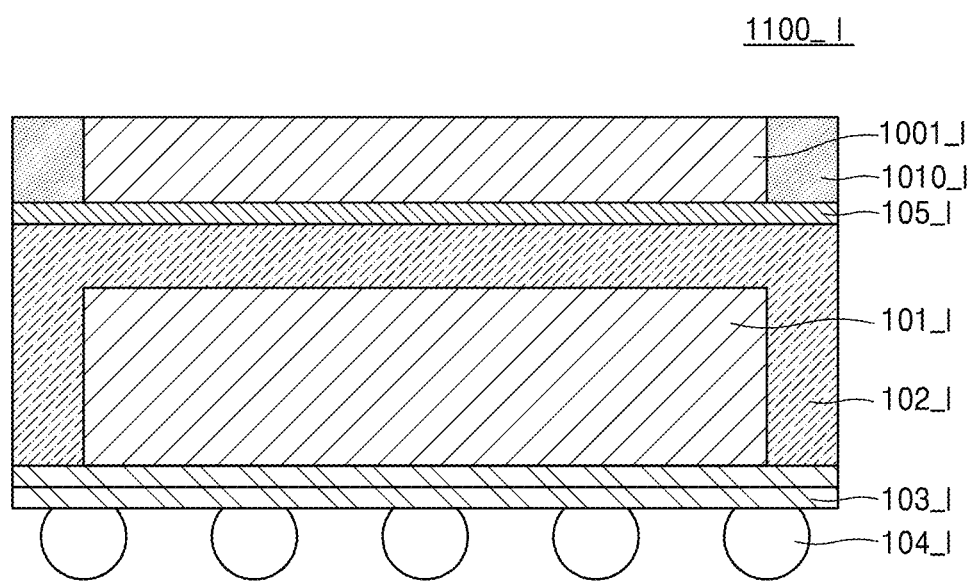
FIG. 11B is a side sectional view taken along line k_I of FIG. 11A, illustrating a semiconductor package according to an embodiment of the present disclosure.

FIG. 11A is a perspective view of an individual semiconductor package 1100_I formed by cutting a plurality of semiconductor packages on which the heat sink group 1000_I of FIG. 10A according to an embodiment of the present disclosure is mounted, by using a cutting process. FIG. 11B is a side sectional view taken along line k_I of FIG. 11A, illustrating the semiconductor package 1100_I according to an embodiment of the present disclosure.

Referring to FIGS. 11A and 11B, the semiconductor package 1100_I may include a semiconductor chip 101_I, an external connection terminal 104_I, a redistribution layer 103_I, a sealing material 102_I, an adhesive film 105_I, a heat sink 1001_I, and a heat-dissipation molding unit 1010_I.

Descriptions of the semiconductor chip 101_I, the external connection terminal 104_I, the redistribution layer 103_I, and the sealing material 102_I, and the adhesive film 105_I, which are included in the semiconductor package 1100_I, may be the same as those presented above with reference to FIGS. 7A to 7C.

Referring to FIGS. 11A and 11B, the heat sink 1001_I may be formed on an upper surface of the adhesive film 105_I. Furthermore, in an embodiment of the present disclosure, a footprint of the heat sink 1001_I may be substantially equal to a footprint of the semiconductor chip 101_I. In addition, the heat sink 1001_I may have a rectangular parallelepiped shape. However, the heat sink 1001_I is not limited thereto and may have various other shapes.

The footprint formed by the heat sink 1001_I may be substantially less than a footprint formed by the adhesive film 105_I. Thus, a stepped portion may be formed at a periphery of the heat sink 1001_I, due to a difference in footprint between the heat sink 1001_I and the adhesive film 105_I and a height of the heat sink 1001_I.

The heat-dissipation molding unit 1010_I may be formed on the upper surface of the adhesive film 105_I and surround the side surface of the heat sink 1001_I and fill an empty space that is formed due to the stepped portion. In addition, the heat-dissipation molding unit 1010_I may be self-aligned to an upper surface of the heat sink 1001_I to expose the upper surface of the heat sink 1001_I to the outside. By exposing the upper surface of the heat sink 1001_I having relatively high thermal conductivity to the outside, the heat dissipation effect in the semiconductor package may be further improved.

Referring to FIG. 11B, the side surface of the heat-dissipation molding unit 1010_I may be self-aligned to the side surface of the semiconductor package 1100_I by the cutting process. Also, a footprint formed by the heat-dissipation molding unit 1010_I and the heat sink 1001_I may be substantially equal to a footprint of the semiconductor package 1100_I.

A thickness of the heat sink 1001_I may be about 25% to about 40% of a thickness of the semiconductor package 1100_I.

Figure 12A:
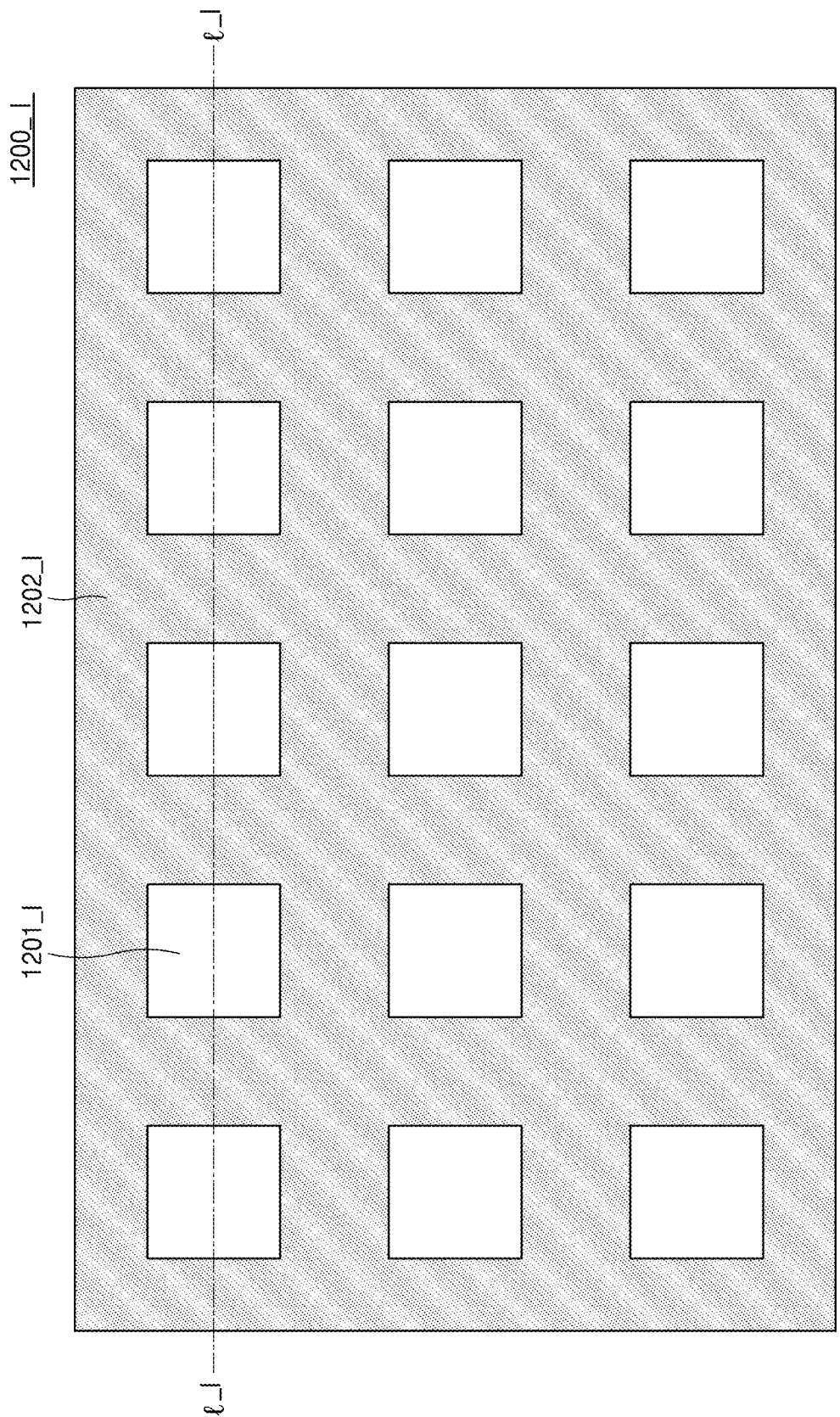
FIG. 12A is a plan view of a heat sink group according to an embodiment of the present disclosure.
Figure 12B:
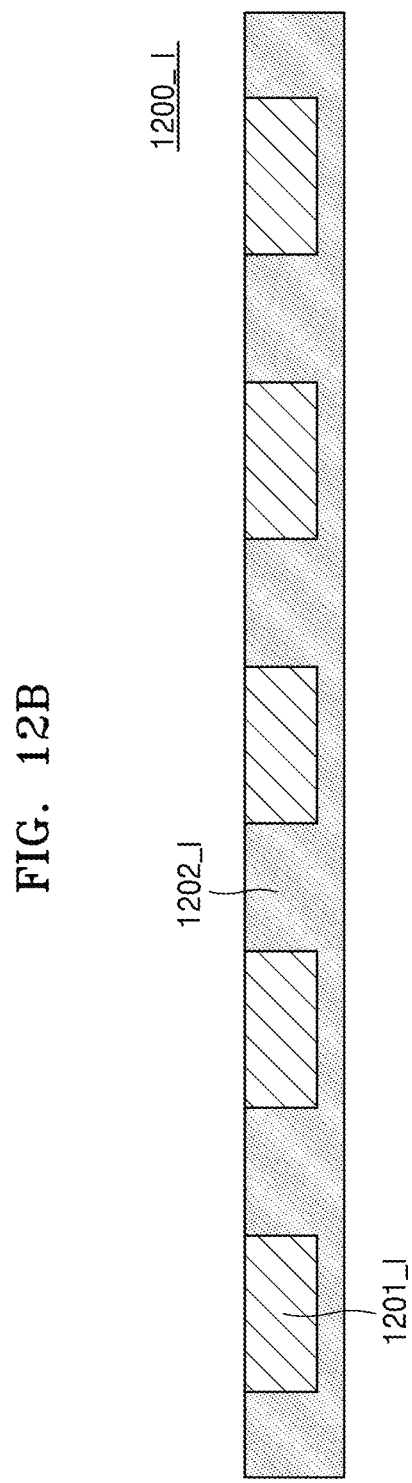
FIG. 12B is a side sectional view taken along line l_I of FIG. 12A, illustrating the heat sink group of FIG. 12A according to an embodiment of the present disclosure.

FIG. 12A is a plan view of a heat sink group 1200_I according to an embodiment of the present disclosure. FIG. 12B is a side sectional view taken along line I_I of FIG. 12A, illustrating the heat sink group 1200_I of FIG. 12A according to an embodiment of the present disclosure.

Referring to FIGS. 12A and 12B, a plurality of heat sinks 1201_I may be spaced a predetermined distance apart from each other and may not be connected to each other unlike the plurality of heat sinks 106_I of FIG. 2A. Thus, there may be an empty space between the plurality of heat sinks 1201_I.

Referring to FIGS. 12A and 12B, the empty space between the plurality of heat sinks 1201_I may be filled with an adhesive film 1202_I.

The adhesive film 1202_I may cover a side surface of the heat sinks 1001_I and expose an upper surface of the heat sinks 1001_I to the outside. The heat sink group 1200_I may form a single unit having a rectangular parallelepiped shape by using the adhesive film 1202_I. Due to the rectangular parallelepiped shape, the heat sink group 1200_I may be easily handled, and processes of processing, delivering, and cutting the heat sink group 1200_I may be easily performed.

Figure 13:
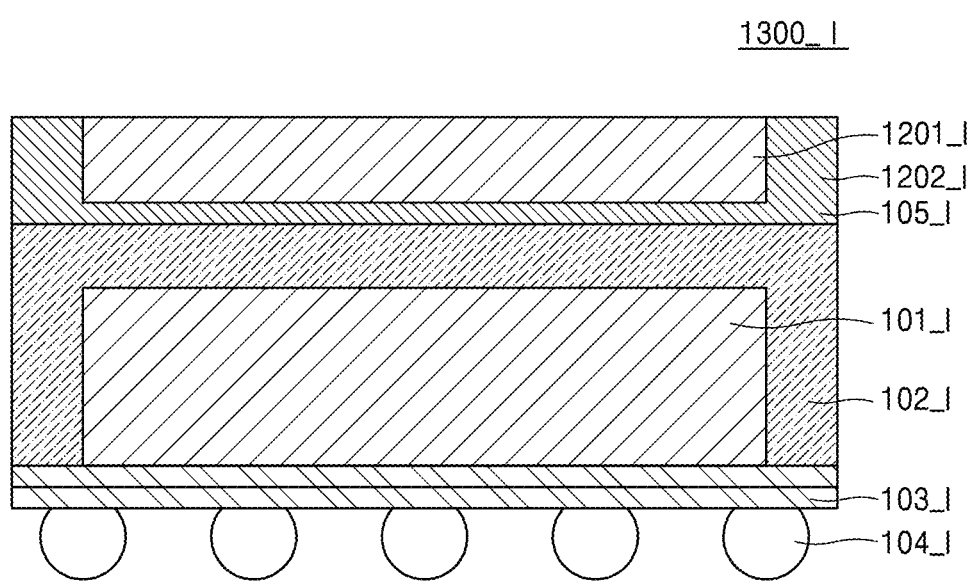
FIG. 13 is a side sectional view taken along line l_I of FIG. 12A, illustrating a semiconductor package according to an embodiment of the present disclosure.

FIG. 13 is a side sectional view taken along line I_I of FIG. 12A, illustrating a semiconductor package 1300_I according to an embodiment of the present disclosure. Referring to FIG. 13, the semiconductor package 1300_I may include a semiconductor chip 101_I, an external connection terminal 104_I, a redistribution layer 103_I, a sealing material 102_I, an adhesive film 1202_I, and a heat sink 1201_I.

Descriptions of the semiconductor chip 101_I, the external connection terminal 104_I, the redistribution layer 103_I, and the sealing material 102_I, which are included in the semiconductor package 1300_I, may be the same as those presented above with reference to FIGS. 7A to 7C.

As shown in FIG. 13, in an embodiment of the present disclosure, a footprint of the heat sink 1201_I may be substantially equal to a footprint of the semiconductor chip 101_I.

In addition, the footprint of the heat sink 1201_I may be substantially less than a footprint of the adhesive film 1202_I located on an upper surface of the sealing material 102_I. Thus, due to a height of the heat sink 1201_I, a stepped portion may be formed between the adhesive film 1202_I and the heat sink 1201_I. A thickness formed by the heat sink 1201_I and the adhesive film may be about 25% to about 40% of a thickness of the semiconductor package 1300_I.

As shown in FIG. 13, the adhesive film 1202_I may extend to the side surface of the heat sink 1201_I and cover a side surface of the heat sink 1201_I and thereby to fill an empty space formed due to the stepped portion.

Furthermore, the adhesive film 1202_I may be self-aligned to the upper surface of the heat sink 1201_I, and thus, the upper surface of the heat sink 1201_I may be exposed to the outside. By exposing the upper surface of the heat sink 1201_I having relatively high thermal conductivity to the outside, the heat dissipation effect in the semiconductor package may be further improved.

A footprint formed by the heat sink 1201_I and the adhesive film 1202_I extending to the side surface of the heat sink 1201_I may be substantially equal to a footprint of the semiconductor package 1300_I.

Figure 14:
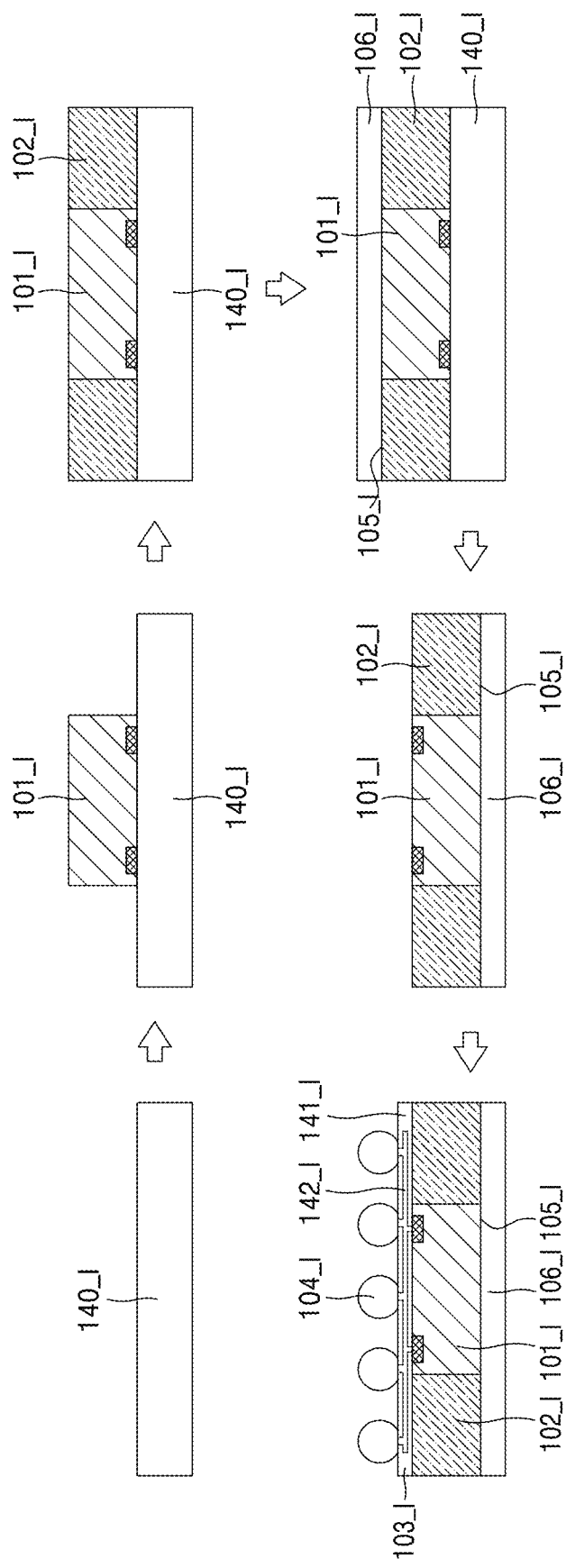
FIG. 14 is a flow chart illustrating a method of manufacturing a semiconductor package, according to an embodiment of the present disclosure.

FIG. 14 is a flow chart illustrating a method of manufacturing a semiconductor package, according to an embodiment of the present disclosure.

Referring to FIG. 14, the method of manufacturing a semiconductor package according to an embodiment of the present disclosure may include adhering a semiconductor chip 101_I to an upper surface of a glass substrate 140_I. The semiconductor chip 101_I may be physically adhered to the upper surface of the glass substrate 140_I.

Referring to FIG. 14, the method of manufacturing a semiconductor package according to an embodiment of the present disclosure may include forming a sealing material 102_I to surround the semiconductor chip 101_I. For example, the formation of the sealing material 102_I may include bring a molding control film (MCF) into contact with an upper surface of the semiconductor chip 101_I and filling a space between the MCF and the glass substrate 140_I with the sealing material 102_I. The sealing material 102_I may entirely cover a side surface and the upper surface of the semiconductor chip 101_I. Alternatively, the sealing material 102_I may cover only the side surface of the semiconductor chip 101_I while exposing the upper surface thereof to outside.

Referring to FIG. 14, the method of manufacturing a semiconductor package according to an embodiment of the present disclosure may include adhering a heat sink 106_I. The heat sink 106_I may be adhered to the upper surface of the semiconductor chip 101_I or an upper surface of the sealing material 102_I. A method of adhering the heat sink 106_I to the upper surface of the semiconductor chip 101_I may include a thermal compression bonding method. In the thermal compression bonding method, a compression apparatus may be used to apply heat and pressure to an adhesive film 105_I mounted under the heat sink 106_I. By using the thermal compression bonding method, the heat sink 106_I may be stably adhered to the upper surfaces of the semiconductor chip 101_I and the sealing material 102_I by the adhesive film 105_I.

Referring to FIG. 14, the method of manufacturing a semiconductor package according to an embodiment of the present disclosure may include separating the glass substrate 140_I and inverting the semiconductor package.

Referring to FIG. 14, the method of manufacturing a semiconductor package according to an embodiment of the present disclosure may include forming a redistribution layer 103_I. The redistribution layer 103_I may include an insulating pattern 141_I and a wiring pattern 142_I. In an example embodiment, the insulating pattern 141_I may include a non-photosensitive material, and the insulating pattern 141_I may be formed on a lower surface of the semiconductor chip 101_I and then partially removed to expose a chip pad 113_I of a semiconductor chip 110_I. After the insulating pattern 141_I is formed, the wiring pattern 142_I may be connected to the chip pad 113_I exposed through an opening of the insulating pattern 141_I. The wiring pattern 142_I may be formed by using a plating process, an electroless plating process, an electroplating process, or a combination thereof. The wiring pattern 142_I may be formed on the insulating pattern 141_I by using a plating process. After the wiring pattern 142_I is formed, an additional wiring pattern 142_I may be formed on the wiring pattern 142_I. In this case, a portion of the wiring pattern 142_I may be exposed and connected to an external connection terminal.

Referring to FIG. 14, the method of manufacturing a semiconductor package according to an embodiment of the present disclosure may include adhering the external connection terminal 104_I. The external connection terminal may be a solder ball. The external connection terminal 104_I may be adhered to the exposed wiring pattern 142_I through a soldering process.

Although not shown in FIG. 14, the method of manufacturing a semiconductor package according to an embodiment of the present disclosure may include a cutting process to perform a singulation process. The cutting process may be performed to divide a plurality of semiconductor packages into individual semiconductor packages. The semiconductor package according to the embodiment of the present disclosure may facilitate a process of cutting semiconductor packages by using a stepped structure of a heat sink at a cut portion, a structure including a heat-dissipation molding unit at a cut portion, and a structure including an adhesive film at a cut portion as described above. Examples of a cutting device for the cutting process may include a cutting blade, a laser device, and the like.

Figure 15:
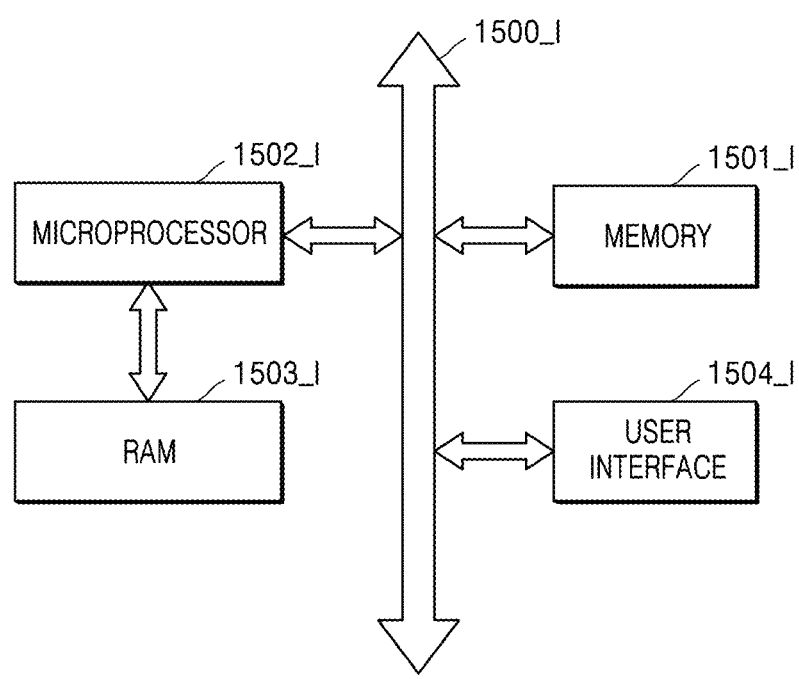
FIG. 15 is a schematic block diagram of an electronic system including a semiconductor package, according to an embodiment of the present disclosure.

FIG. 15 is a schematic block diagram of an electronic system including a semiconductor package, according to an embodiment of the present disclosure.

Referring to FIG. 15, an electronic system 1500_I may include at least one of semiconductor packages according to various embodiments disclosed in the present specification. The electronic system 1500_I may be included in a mobile device or a computer. For example, the electronic system 1500_I may include a memory system 1501_I, a microprocessor 1502_I, a RAM 1503_I, and a user interface 1504_I for data communication.

Figure 16:
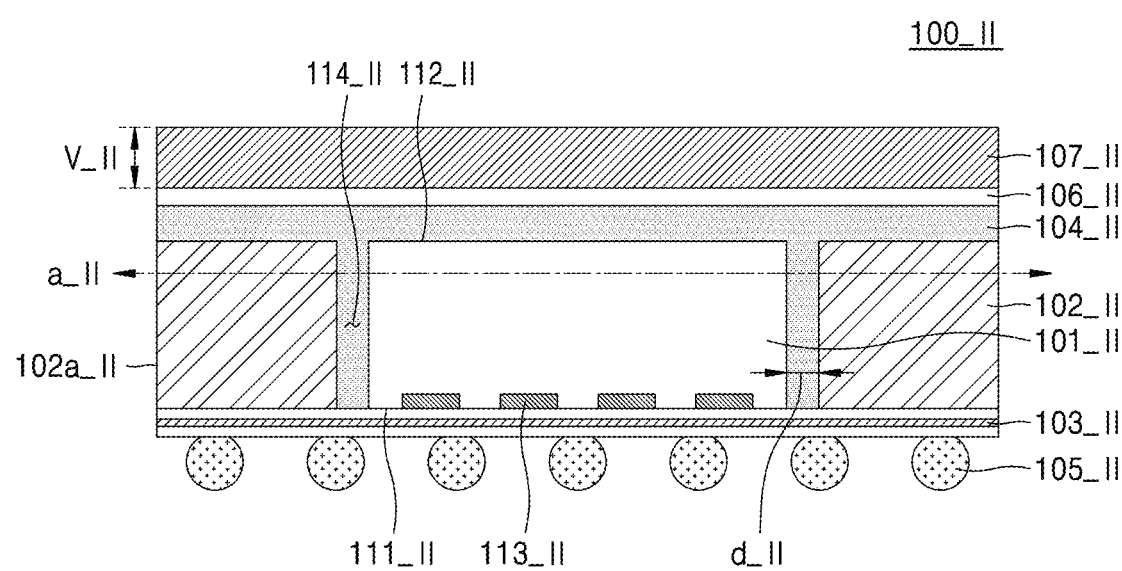
FIG. 16 is a cross-sectional view of a basic structure of a semiconductor package according to an embodiment of the present disclosure.

FIG. 16 is a cross-sectional view of a basic structure of a semiconductor package according to an embodiment of the present disclosure. A semiconductor package 100_II may be an FO-WLP or a PLP.

Referring to FIG. 16, the semiconductor package 100_II according to an embodiment of the present disclosure may include a semiconductor chip 101_II, a metal frame 102_II, a redistribution layer 103_II, a sealing material 104_II, an external connection terminal 105_II, an adhesive film 106_II, and a heat sink 107_II. The semiconductor package 100_II may be a WLP-type semiconductor package, specifically, an FO-WLP-type semiconductor package. A total thickness of the semiconductor package 100_II may be in a range of about 0.8 mm to about 1.8 mm. More specifically, in an embodiment of the present disclosure, the total thickness of the semiconductor package 100_II may be in a range of about 1.1 mm to about 1.4 mm. However, the thickness of the semiconductor package 100_II is not limited to the range and may be variously changed.

The metal frame 102_II may have a cavity 114_II therein. The semiconductor chip 101_II may be provided inside the cavity 114_II of the metal frame 102_II and surrounded by the metal frame 102_II. Also, an inner wall of the metal frame 102_II may be spaced a predetermined distance d_II apart from the semiconductor chip 101_II, which is located inside the cavity 114_II of the metal frame 102_II, to prevent an electric short from occurring therebetween.

An empty space formed due to the predetermined distance d_II may be filled with the sealing material 104_II that will be described below. The sealing material 104_II may prevent an electric short between the semiconductor chip 101_II and the metal frame 102_II and fix the semiconductor chip 101_II and the metal frame 102_II to the upper surface of the redistribution layer 103_II.

As shown in FIG. 16, an outer wall 102a_II of the metal frame 102_II may be coplanar with the side surface of the semiconductor package 100_II. Thus, the outer wall 102a_II of the metal frame 102_II may be exposed to the outside.

In addition, as shown in FIG. 16, the metal frame 102_II may have substantially the same height as the semiconductor chip 101_II. However, the present disclosure is not limited thereto, and the height of the metal frame 102_II may be lessor greater than the height of the semiconductor chip 101_II.

A change in heat dissipation effect due to the shape of the metal frame 102_I, the length of the predetermined distance d_II, and the length of the predetermined distance d_II will be described in more detail below.

Referring to FIG. 16, the semiconductor package 100_II may include the sealing material 104_II. The sealing material 104_II may be used to surround and protect the semiconductor chip 101_II. As described above, the sealing material 104_II may fill a space formed due to the predetermined distance d_II between the semiconductor chip 101_II and the metal frame 102_II to prevent an electric short between the semiconductor chip 101_II and the metal frame 102_II, and fix the semiconductor chip 101_II and the metal frame 102_II to the upper surface of the redistribution layer 103_II, which will be described below.

Referring to FIG. 16, the sealing material 104_II may cover the side surface and the upper surface 112_II of the semiconductor chip 101_II and an inner wall and the upper surface of the metal frame 102_II. When the semiconductor chip 101_II and the metal frame 102_II have substantially the same height and the upper surfaces thereof are coplanar, a height between the upper surfaces of the semiconductor chip 101_II and the metal frame 102_II and the upper surface of the sealing material 104_II may be in a range of about 1 μm to about 10 μm.

Referring to FIG. 16, due to the metal frame 102_II and the heat sink 107_II, the semiconductor package 100_II may efficiently dissipate heat generated by the semiconductor chip 101_II in the semiconductor package 100_II.

More specifically, heat generated by the semiconductor chip 101_II may be dissipated to the upper surface 112_II and the side surface (not shown) of the semiconductor chip 101_II. The heat dissipated to the upper surface of the semiconductor chip 101_II may sequentially pass though the upper surface 112_II of the semiconductor chip 101_II, the sealing material 104_II, the adhesive film 106_II, and the heat sink 107_II be dissipated to the outside. In addition, the heat dissipated to the side surface (not shown) of the semiconductor chip 101_II may sequentially pass though the side surface of the semiconductor chip 101_II, the sealing material 104_II, and the metal frame 102_II and be dissipated to the outside.

Here, in the semiconductor package 100_II, the heat sink 107_II, which has relatively high thermal conductivity, and the inner wall 102a_II of the metal frame 102_II may be exposed to the outside. Thus, the heat generated by the semiconductor chip 101_II may be efficiently dissipated through a convection process.

Figure 17:
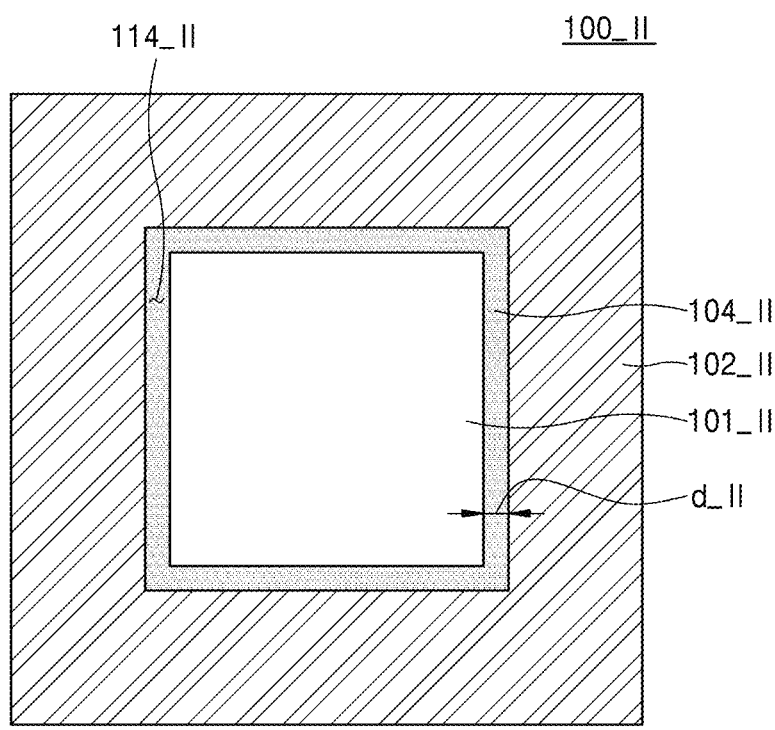
FIG. 17 is a plan view taken along line a of FIG. 16, illustrating a_II semiconductor package according to another embodiment of the present disclosure.

FIG. 17 is a plan view taken along line a_II of FIG. 16, illustrating the semiconductor package 100_II according to another embodiment of the present disclosure.

Referring to FIG. 17, the metal frame 102_II of the semiconductor package 100_I may include the cavity 114_II therein. The semiconductor chip 101_II may be arranged inside the cavity 114_II of the metal frame 102_II. To prevent an electrical short with the metal frame 102_I, the semiconductor chip 101_II may be arranged a predetermined distance d_II apart from an inner wall of the metal frame 102_II. The sealing material 104_II may be formed in an empty space formed due to the predetermined distance d_II to prevent an electric short between the metal frame 102_II and the semiconductor chip 101_II and fix the metal frame 102_II and the semiconductor chip 101_II to the redistribution layer 103_II.

As shown in FIG. 17, the metal frame 102_II may have a rectangular parallelepiped shape having the cavity 114_II therein. However, the metal frame 102_II is not limited to this shape and may have various shapes. For example, the metal frame 102_II may have a circular pillar shape or polygonal pillar shape including the cavity 114_II.

As predetermined distance d_II between the semiconductor chip 101_II and the inner wall of the metal frame 102_II is reduced, a heat dissipation effect of the semiconductor package 100_II may be further improved. This is due to the fact that, because a thickness formed by the sealing material 104_II having lower thermal conductivity than the metal frame 102_II is reduced with a reduction in the predetermined distance d_II, heat transfer resistance in a transfer path of heat generated by the semiconductor chip 101_II may be reduced.

Conventionally, a printing mold method was used to fill a space between the semiconductor chip 101_II and the metal frame 102_II with the sealing material 104_II. In the printing mold method, the air may be trapped in the space between the semiconductor chip 101_II and the metal frame 102_II of the semiconductor package 100_II, and thus, an additional process of exhausting the trapped air was required. Accordingly, to perform the additional process of exhausting the trapped air, the distance d_II between the semiconductor chip 101_II and the inner wall of the metal frame 102_II had to be maintained to be at least 250 μm.

However, in an embodiment of the present disclosure, the space between the semiconductor chip 101_II and the metal frame 102_II may be filled with the sealing material 104_II by using a vacuum compression mold method. The vacuum compression mold method includes vacuumizing the space between the semiconductor chip 101_II and the metal frame 102_II and filling the space with the sealing material 104_II by applying pressure to the sealing material 104_II. Thus, unlike a conventional printing mold method, the vacuum compression mold method is extremely unlikely to trap air in the space between the semiconductor chip 101_II and the metal frame 102_II, and thus, an additional process of exhausting the air is not required. Thus, in an embodiment of the present disclosure, the predetermined distance d_II between the inner wall of the metal frame and the semiconductor chip may be about 50 μm to about 150 μm. In an embodiment of the present disclosure, the predetermined distance d_II may be about 100 μm, which is at least twice less than that of the conventional case.

According to an embodiment of the present disclosure, as a distance between the semiconductor chip 101_II and the metal frame 102_II is reduced to about 100 μm, a heat dissipation effect may be improved as described above. In addition, as a predetermined distance between the semiconductor chip 101_II and the metal frame 102_II is reduced, a distance between semiconductor chips may be reduced in a process of forming the semiconductor chips on a semiconductor wafer. Accordingly, a larger number of semiconductor chips may be arranged on the semiconductor wafer than in a conventional case, and thus, the yield of forming semiconductor packages may be further increased.

Figure 18:
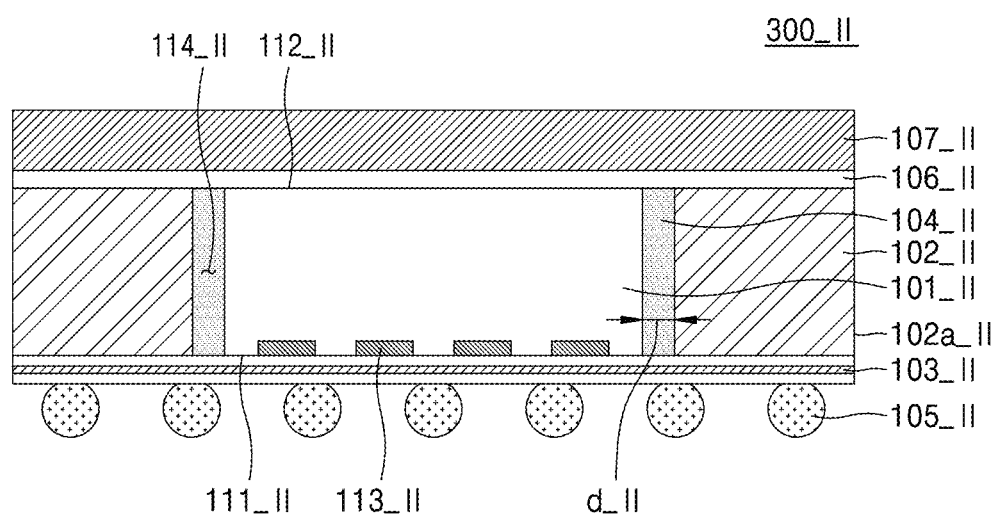
FIG. 18 is a cross-sectional view of a structure of a semiconductor package according to still other embodiment of the present disclosure.

FIG. 18 is a cross-sectional view of a structure of a semiconductor package 300_II according to another embodiment of the present disclosure.

Referring to FIG. 18, the semiconductor package 300_II may include a semiconductor chip 101_II, a metal frame 102_II, a redistribution layer 103_II, a sealing material 104_II, an external connection terminal 105_II, an adhesive film 106_II, and a heat sink 107_II. Descriptions of the semiconductor chip 101_II, the metal frame 102_II, the redistribution layer 103_II, the external connection terminal 105_II, the adhesive film 106_II, and the heat sink 107_II may be the same as those presented above with reference to FIG. 16.

Referring to FIG. 18, the sealing material 104_II in the semiconductor package 300_II may cover a side surface of the semiconductor chip 101_II and an inner wall of the metal frame 102_II but may expose an upper surface 112_II of the semiconductor chip 101_I and an upper surface of the metal frame 102_II from the sealing material 104_II. By exposing the upper surface 112_II of the semiconductor chip 101_II and the upper surface of the metal frame 102_II, a thickness of the semiconductor package 300_II may be reduced, and heat generated by the semiconductor chip 101_II may not pass through the sealing material 104_II but sequentially pass through the adhesive film 106_II located on the upper surface 112_II of the semiconductor chip 101_II and the heat sink 107_II located on an upper surface of the adhesive film 106_II and be dissipated to the outside. Accordingly, because heat does not pass through the sealing material 104_II having a relatively low thermal conductivity, resistance may be reduced in a heat transfer path, and heat dissipation efficiency may be improved.

Figure 19:
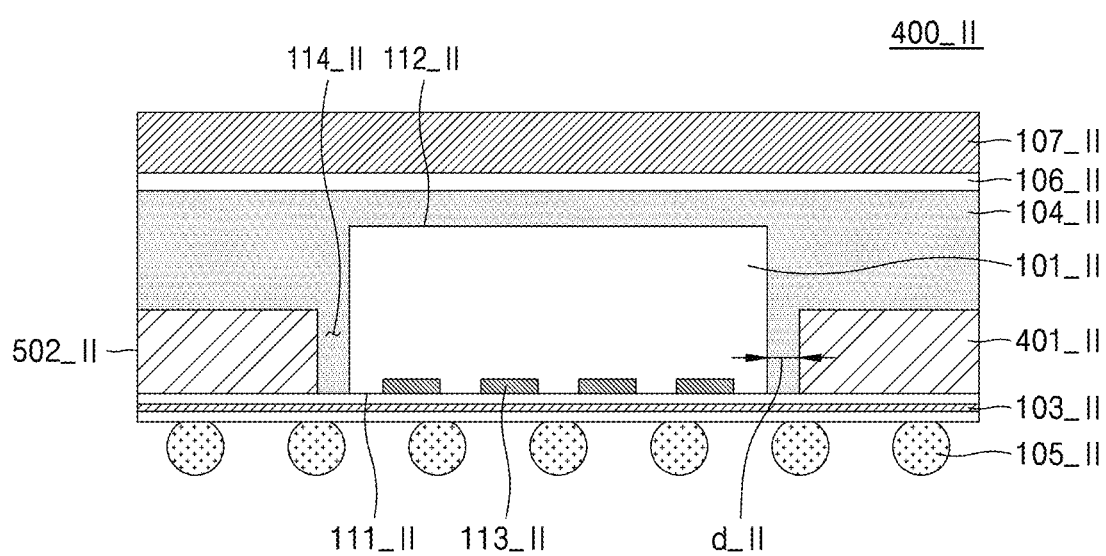
FIG. 19 is a cross-sectional view of a structure of a semiconductor package according to still other embodiment of the present disclosure.

FIG. 19 is a cross-sectional view of a structure of a semiconductor package 400_II according to still other embodiment of the present disclosure.

Referring to FIG. 19, the semiconductor package 400_II may include a semiconductor chip 101_II, a metal frame 401_II, are distribution layer 103_II, a sealing material 104_II, an external connection terminal 105_II, an adhesive film 106_II, and a heat sink 107_II. Descriptions of the semiconductor chip 101_II, the redistribution layer 103_II, the sealing material 104_I, the external connection terminal 105_II, the adhesive film 106_II, and the heat sink 107_II may be the same as those presented above with reference to FIG. 16.

Referring to FIG. 19, the metal frame 401_II of the semiconductor package 400_II may be formed to have a smaller height than the semiconductor chip 101_II. Thus, an empty space formed due to the height difference of the metal frame 401_II and the semiconductor chip 101_II may be filled with the sealing material 104_II.

In a process of cutting a plurality of semiconductor packages into individual packages, a cutting process on the semiconductor package 400_II may be easily performed due to the small height of the metal frame 401_II having a higher stiffness than the sealing material 104_II. Thus, in the process of cutting the plurality of semiconductor packages into the individual packages, the choice of a cutting blade may be widened, and the cutting process may be performed rapidly.

Figure 20:
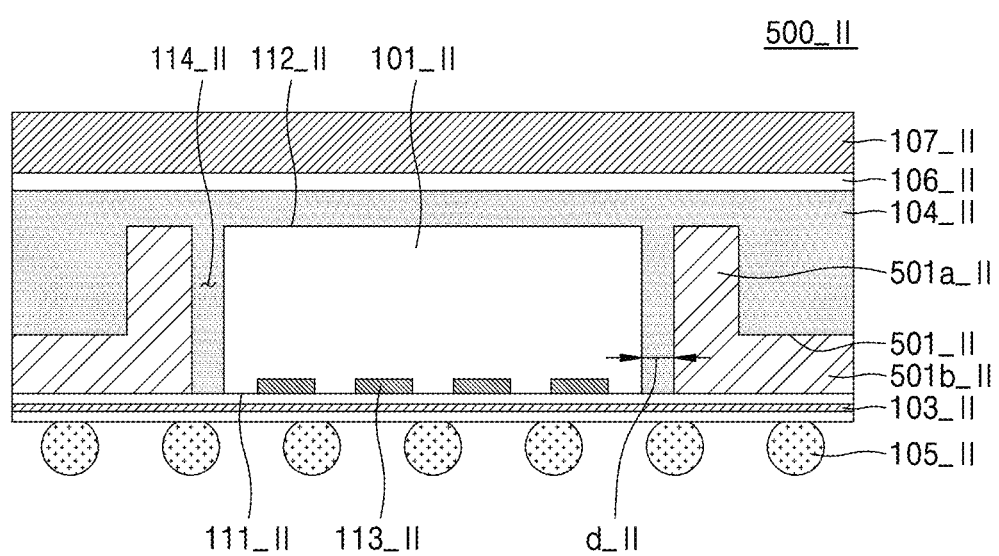
FIG. 20 is a cross-sectional view of a structure of a semiconductor package according to yet other embodiment of the present disclosure.

FIG. 20 is a cross-sectional view of a structure of a semiconductor package 500_II according to yet other embodiment of the present disclosure.

Referring to FIG. 20, the semiconductor package 500_II may include a semiconductor chip 101_II, a metal frame 501_II, a redistribution layer 103_II, a sealing material 104_II, an external connection terminal 105_II, an adhesive film 106_II, and a heat sink 107_II. Descriptions of the semiconductor chip 101_II, the redistribution layer 103_II, the sealing material 104_I, the external connection terminal 105_II, the adhesive film 106_II, and the heat sink 107_II may be the same as those presented above with reference to FIG. 16.

Referring to FIG. 20, the metal frame 501_II may include a first region 501a_II, which has an inner wall spaced a predetermined distance d_II apart from the semiconductor chip 101_II, and a second region 501b_II, which laterally extends from the first region 501a_II. An outer wall of the first region 501a_II and an inner wall of the second region 501b_II may be in contact with each other and integrated with each other or separate from each other on the upper surface of the redistribution layer 103_II.

A largest height of the first region 501a_I may be greater than a largest height of the second region 501b_II. The empty space formed due to a height difference between the first region 501a_II and the second region 501b_II may be filled with the sealing material 104_II.

In a process of cutting a plurality of semiconductor packages into individual packages, a cutting process on the semiconductor package 500_II may be easily performed due to the small height of the second region 501b_II including a material having a higher stiffness than a material of the sealing material 104_II. By choosing a material having a lower stiffness than the material of the first region 501a_II as the material of the second region 501b_II, the choice of a cutting blade may be widened, and the cutting process may be performed rapidly.

Referring to FIG. 20, an outer wall 502_II of the second region 501b_II of the metal frame 501_II may be coplanar with the side surface of the semiconductor package 500_II. Thus, the outer wall 502_II of the second region 501b_II may be exposed to the outside of the semiconductor package. Heat generated by the semiconductor chip 101_II may be efficiently dissipated to the outside of the semiconductor package 500_II through the outer wall 502_II of the second region 501b_II exposed to the outside.

Furthermore, referring to FIG. 20, the largest height of the first region 501a_II of the metal frame 501_II may be substantially equal to a height of the semiconductor chip. Thus, heat generated by the side surface of the semiconductor chip 101_II may be more easily transferred to the first region 501a_II of the metal frame 501_II and then may be dissipated to the outside.

Figure 21:
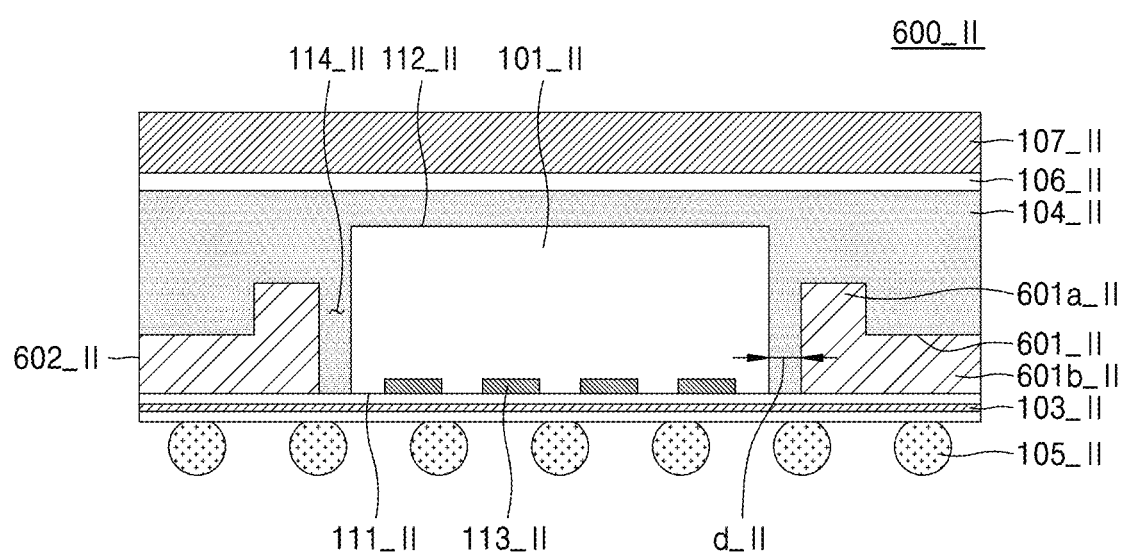
FIG. 21 is a cross-sectional view of a structure of a semiconductor package according to yet other embodiment of the present disclosure.

FIG. 21 is a cross-sectional view of a structure of a semiconductor package 600_II according to yet other embodiment of the present disclosure.

Referring to FIG. 21, the semiconductor package 600_II may include a semiconductor chip 101_II, a metal frame 601_II, a redistribution layer 103_II, a sealing material 104_II, an external connection terminal 105_II, an adhesive film 106_II, and a heat sink 107_II. Descriptions of the semiconductor chip 101_II, the redistribution layer 103_II, the sealing material 104_II, the external connection terminal 105_II, the adhesive film 106_II, and the heat sink 107_II may be the same as those presented above with reference to FIG. 16.

Referring to FIG. 21, the metal frame 601_II may include a first region 601a_II, which has an inner wall spaced a predetermined distance d_II apart from the semiconductor chip 101_II, and a second region 601b_II, which laterally extends from the first region 601a_II. An outer wall of the first region 601a_II and an inner wall of the second region 601b_II may be in contact with each other and integrated with each other or separate from each other on the upper surface of the redistribution layer 103_II.

Referring to FIG. 21, the largest height of the first region 601a_II may be greater than the largest height of the second region 501b_II. The empty space formed due to the height difference of the first region 601a_I and the second region 601b_II may be filled with the sealing material 104_II. In addition, the largest height of the first region 601a_II may be less than the height of the semiconductor chip 101_II. By forming the first region 601a_I to have the largest height less than the height of the semiconductor chip 101_II, as described below, the semiconductor chip 101_II may be aligned onto a glass substrate more rapidly due to the small height of the first region 601a_II of the metal frame 601_II in a semiconductor package manufacturing process.

In a process of cutting a plurality of semiconductor packages into individual packages, a cutting process on the semiconductor package 600_II may be easily performed due to the small height of the second region 601b_II including a material having a higher stiffness than a material of the sealing material 104_II. Because a material having a lower stiffness than the material of the first region 601a_II is chosen as the material of the second region 601b_II, the choice of a cutting blade may be widened, and the cutting process may be performed rapidly.

Referring to FIG. 21, an outer wall 602_II of the second region 601b_II of the metal frame 601_II may be coplanar with the side surface of the semiconductor package 600_II. Thus, the outer wall 602_II of the second region 601b_II may be exposed to the outside of the semiconductor package. Heat generated by the semiconductor chip 101_II may be efficiently dissipated to the outside of the semiconductor package 600_II through the exposed outer wall 602_II of the second region 601b_II.

FIGS. 22 to 32 are diagrams illustrating a method of manufacturing a semiconductor package, according to an embodiment of the present disclosure.

Figure 22:
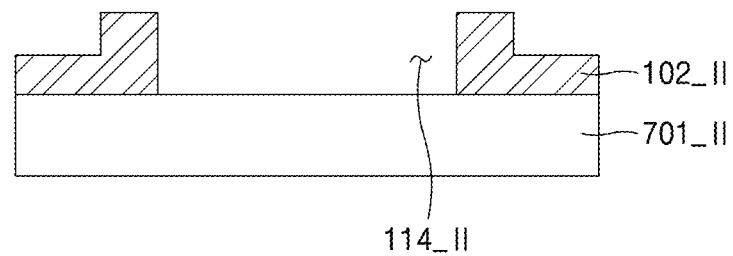
FIG. 22 is a diagram of an operation of adhering a metal frame to a glass substrate, in a method of manufacturing a semiconductor package, according to an embodiment of the present disclosure.

FIG. 22 illustrates an operation of adhering a metal frame to a glass substrate, in a method of manufacturing a semiconductor package, according to an embodiment of the present disclosure. Referring to FIG. 22, the method of manufacturing a semiconductor package according to an embodiment of the present disclosure may include adhering the metal frame 102_II to the upper surface of a glass substrate 701_II. An adhesive layer (not shown) may be formed on the upper surface of the glass substrate 701_II. The metal frame 102_II may be physically adhered to the upper surface of the glass substrate 701_II by the adhesive layer (not shown).

Figure 23:
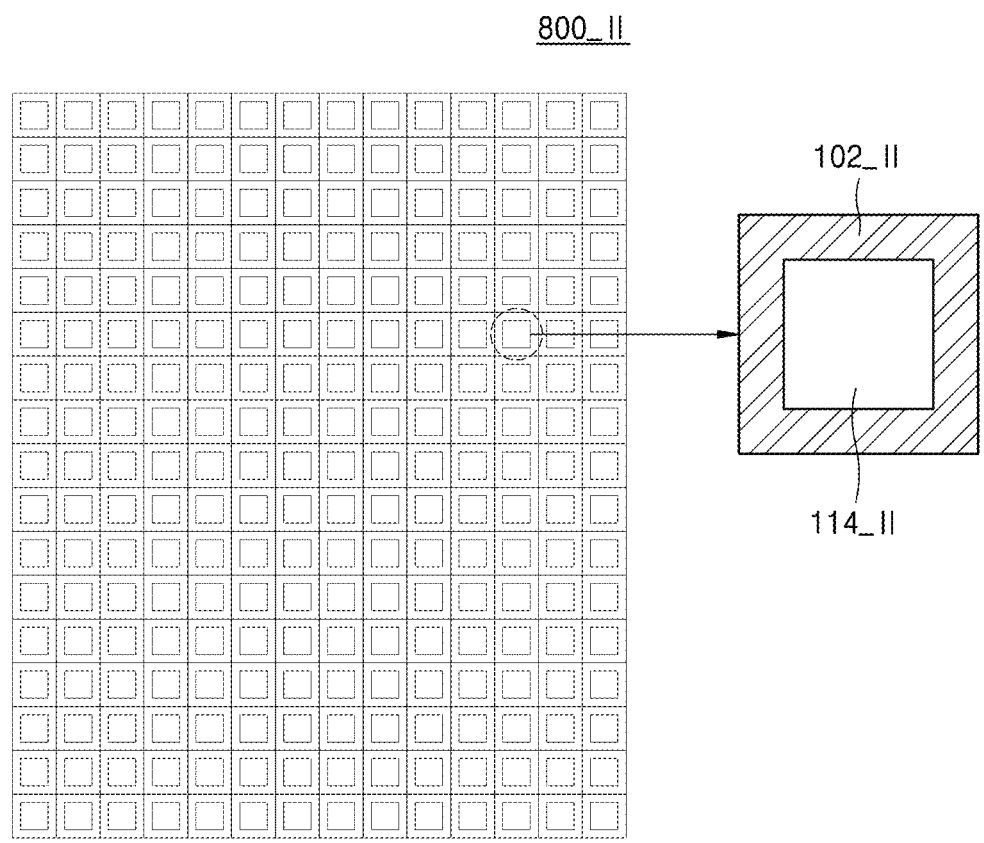
FIG. 23 is a plan view of a plurality of metal frames adhered to a glass substrate, according to an embodiment of the present disclosure.

FIG. 23 is a plan view of a plurality of metal frames 800_II adhered to a glass substrate, according to an embodiment of the present disclosure. The plurality of metal frames 800_II, which are adhered to the upper surface of the glass substrate 701_II, may be formed by connecting side surfaces of individual metal frames 102_II to each other. After a semiconductor package production process is completed, the plurality of metal frames 800_II may be divided into the individual metal frames 102_II through a cutting process for cutting semiconductor packages into individual semiconductor packages. The metal frame 102_II may have the cavity 114_II therein. As described below, a semiconductor chip may be arranged a predetermined distance apart from an inner wall of the metal frame 102_II inside the cavity 114_II.

Figure 24:
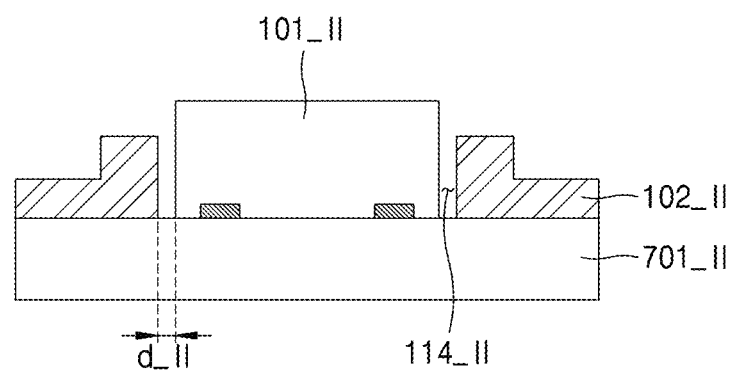
FIG. 24 is a diagram of an operation of mounting a semiconductor chip on a glass substrate, in a method of manufacturing a semiconductor package, according to an embodiment of the present disclosure.

FIG. 24 illustrates an operation of mounting a semiconductor chip on a glass substrate, in a method of manufacturing a semiconductor package, according to an embodiment of the present disclosure. Referring to FIG. 24, the method of manufacturing a semiconductor package according to an embodiment of the present disclosure may include mounting the semiconductor chip 101_II on the glass substrate 701_II. The semiconductor chip 101_II may be located inside the cavity 114_II, which is formed in an inner wall of the metal frame 102_II adhered to the glass substrate 701_II, and mounted on the glass substrate 701_IIi. The semiconductor chip 101_II and the inner wall of the metal frame 102_II may be spaced a predetermined distance d_II apart from each other. The predetermined distance d_II may be about 50 μm to about 150 μm. In an embodiment, the predetermined distance d_II may be about 100 μm. In view of the fact that a predetermined distance d_II between a semiconductor chip 101_II and an inner wall of the metal frame 102_II is about 250 μm in a conventional case, the predetermined distance d_II may be reduced to half or less in the embodiment of the present disclosure. Thus, a plurality of semiconductor chips 101_II may be mounted on the glass substrate 701_II, thereby improving productivity in a process of producing semiconductor packages.

Furthermore, as a height of the metal frame 102_II is reduced, the accuracy of the process of mounting the semiconductor chip 101_II on the glass substrate 701_II may increase, and the speed of the process may increase. Accordingly, as described above, the height of the metal frame 102_II may be less than the height of the semiconductor chip 101_II. However, the present disclosure is not limited to the above description, and the height of the metal frame 102_II may be substantially equal to the height of the semiconductor chip 101_II.

Figure 25:
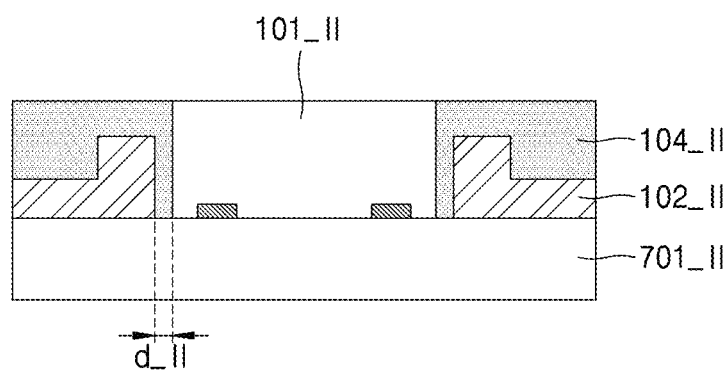
FIG. 25 is a diagram of an operation of covering and hermetically sealing a semiconductor chip and a metal frame with a sealing material, in a method of manufacturing a semiconductor package, according to an embodiment of the present disclosure.

FIG. 25 illustrates an operation of covering and hermetically sealing the semiconductor chip 101_II and the metal frame 102_II with the sealing material 104_II, in a method of manufacturing a semiconductor package, according to an embodiment of the present disclosure. Referring to FIG. 25, the method of manufacturing a semiconductor package according to an embodiment of the present disclosure may include covering and hermetically sealing the semiconductor chip 101_II and the metal frame 102_II with the sealing material 104_II. The sealing material 104_II may fill a space formed due to a predetermined distance d_II between the semiconductor chip 101_II and an inner wall of the metal frame 102_II and integrate the semiconductor chip 101_II with the metal frame 102_II. In addition, the sealing material 104_II may cover the upper surfaces of the semiconductor chip 101_II and the metal frame 102_II. The sealing material 104_II may cover and fix the semiconductor chip 101_II and the metal frame 102_II, using a vacuum compression mold method, and this method will be described in more detail with reference to FIG. 26.

Although not shown in FIG. 25, the method according to an embodiment of the present disclosure may further include grinding an upper portion of the sealing material 104_II covering the upper surfaces of the semiconductor chip 101_II and the metal frame 102_II to expose the upper surface of the semiconductor chip 101_II or the metal frame 102_II.

Figure 26:
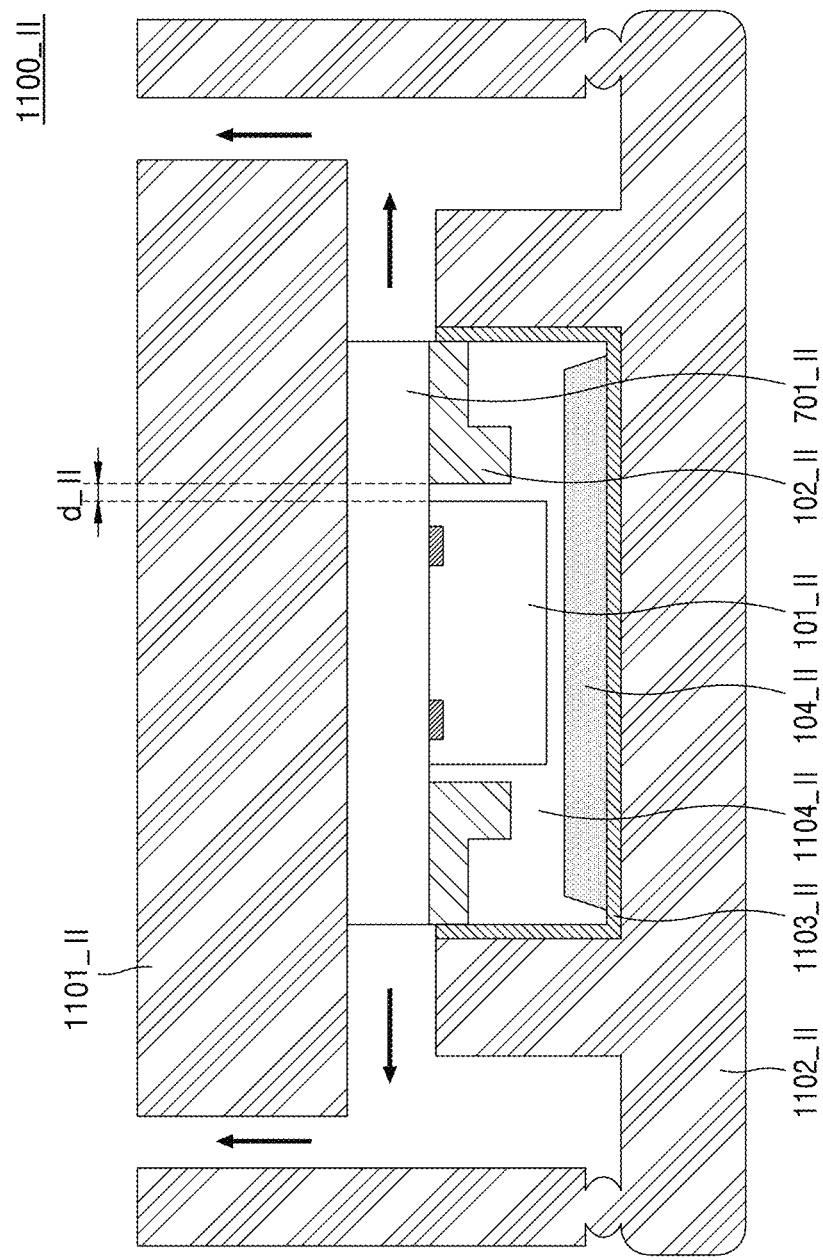
FIG. 26 is a diagram of an operation of mounting a sealing material on a glass substrate using a vacuum compression mold method, in a method of manufacturing a semiconductor package, according to an embodiment of the present disclosure.

FIG. 26 illustrates an operation of mounting the sealing material 104_II on the glass substrate 701_II using a vacuum compression mold method, in a method of manufacturing a semiconductor package, according to an embodiment of the present disclosure. In the method of manufacturing a semiconductor package according to the present disclosure, the sealing material 104_II may be mounted on the glass substrate 701_II by using a vacuum compression mold apparatus 1100_II, and thus, the semiconductor chip 101_II may be integrated with the metal frame 102_II.

Referring to FIG. 26, an upper portion 1101_II of the vacuum compression mold apparatus 1100_II may come in contact with the lower surface of the glass substrate 701_II to fix the glass substrate 701_II upside down. A film 1103_II may be mounted in a lower portion 1102_II of the vacuum compression mold apparatus 1100_II. The sealing material 104_II may be located on the upper surface of the film 1103_II. Before being mounted on the glass substrate 701_II, the sealing material 104_II on the upper surface of the film 1103_II may be a liquid or a solid. When the glass substrate 701_II is fixed to the vacuum compression mold apparatus 1100_II and the sealing material 104_II is arranged, a sealed space 1104_II may be formed between the semiconductor package and the lower portion 1102_II of the vacuum compression mold apparatus by relatively moving the upper portion 1101_II and the lower portion 1102_II of the vacuum compression mold apparatus 1100_II. Here, the vacuum compression mold apparatus 1100_II may vacuumize the sealed space 1104_II by exhausting gases in the sealed space 1104_II to the outside. When the process of vacuumizing the sealed space 1104_II is ended, the vacuum compression mold apparatus 1101_II may apply pressure to the sealing material 104_II toward the glass substrate 701_II. Accordingly, the sealing material 104_II may be fixed to a space formed between the semiconductor chip 101_II and the inner wall of the metal frame 102_II, which are spaced a predetermined distance d_II apart from each other, and also fixed to the upper surfaces of the semiconductor chip 101_II and the metal frame 102_II.

Conventionally, a printing mold method was used to fill a space between the semiconductor chip 101_II and the metal frame 102_II with the sealing material 104_II. More specifically, in a conventional case, after the sealing material 104_II was placed on the space between the semiconductor chip 101_II and the metal frame 102_II, physical pressure was applied to the sealing material 104_II by using a pressing apparatus, and thus, the sealing material 104_II could be inserted into the space between the semiconductor chip 101_II and the metal frame 102_II.

In the printing mold method, during the insertion of the sealing material 104_II, the air in the space between the semiconductor chip 101_II and the metal frame 102_II or a space in the semiconductor package 100_II may not be entirely exhausted to the outside but partially trapped in the semiconductor package 100_II. Thus, an additional process of exhausting the trapped air to the outside was required in the conventional case. To perform the additional process of exhausting the air, the predetermined distance d_II between the semiconductor chip 101_II and the inner wall of the metal frame 102_II had to be maintained to be at least 250 μm.

However, in an embodiment of the present disclosure, when the vacuum compression mold method is used, because the sealing material 104_II may be fixed onto the glass substrate 701_II in a vacuum state, an additional process of exhausting the air may not be needed. Thus, the predetermined distance d_II between the semiconductor chip 101_II and the inner wall of the metal frame 102_II may be reduced to about 50 μm to about 150 μm, which is about a half or less of that of the conventional case. Due to the reduced predetermined distance d_II, heat transfer resistance may be reduced on the semiconductor package, and thus, a heat dissipation effect may be improved. In addition, in a process of forming semiconductor chips on a semiconductor wafer, a relatively large number of semiconductor chips may be arranged on the semiconductor wafer, thereby further increasing the productivity of the semiconductor package.

Moreover, the vacuum compression mold method may be applied without being limited by the shape of the metal frame 102_II, and thus, the metal frame 102_II having various shapes may be applied to an embodiment of the present disclosure. The vacuum compression mold method has a shorter process time than the conventional printing mold method, and thus, the production yield of the semiconductor package may be further increased.

Figure 27:
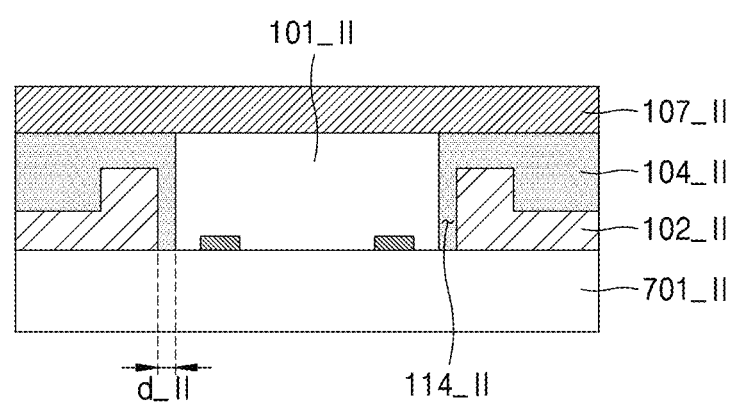
FIG. 27 is a diagram of an operation of adhering a heat sink to a semiconductor package, in a method of manufacturing a semiconductor package, according to an embodiment of the present disclosure.

FIG. 27 illustrates an operation of adhering the heat sink 107_II to a semiconductor package, in a method of manufacturing a semiconductor package, according to an embodiment of the present disclosure. Referring to FIG. 27, the method of manufacturing a semiconductor package according to an embodiment of the present disclosure may include adhering the heat sink 107_II to a semiconductor package.

Referring to FIG. 27, the heat sink 107_II may be adhered to the upper surface of the semiconductor chip 101_II or the upper surface of the sealing material 102_II. A method of locating the heat sink 107_II in close contact with the upper surface of the semiconductor chip 101_I may include a thermal compression bonding method. The thermal compression bonding method includes applying heat and pressure to an adhesive film located under the heat sink 106_II by using a compressor. By using the thermal compression bonding method, the adhesive film may stably adhere the heat sink 107_II to the upper surfaces of the semiconductor chip 101_II and the sealing material 104_II.

Figure 28:
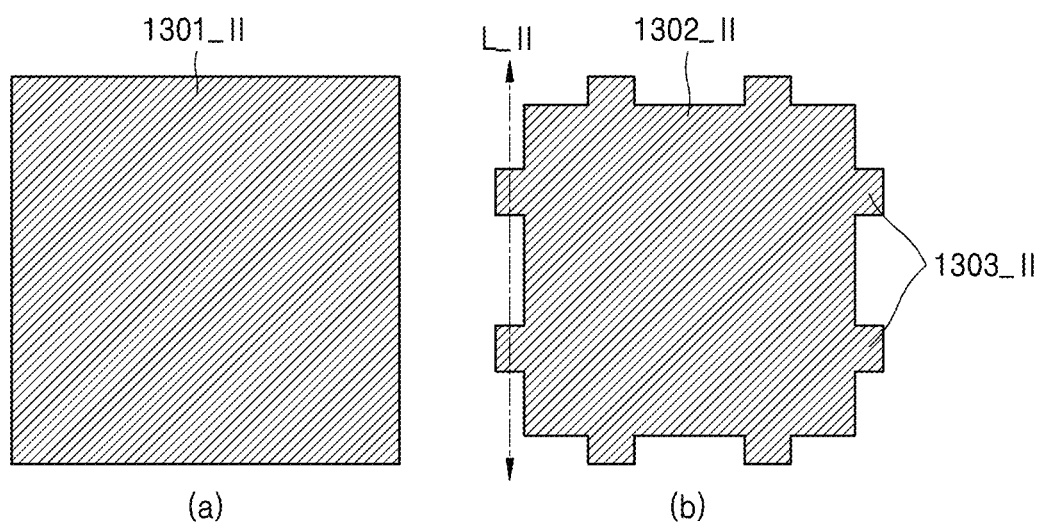
FIG. 28 is a diagram of a shape of a heat sink according to an embodiment of the present disclosure.

FIG. 28 is a diagram of a shape of a heat sink according to an embodiment of the present disclosure. Referring to FIG. 28, the heat sink according to an embodiment of the present disclosure may have a rectangular parallelepiped shape 1301_II, as shown in (a) of FIG. 28, or may have a shape 130211, in which a protrusion 1303_II is mounted on a side surface of a rectangular parallelepiped shape as shown in (b) of FIG. 28. As described below, in a cutting process on a semiconductor package, a cutting line may be formed on the protrusion 1303_II as a straight line L_II shown in (b) of FIG. 28. Thus, a to-be-cut portion of the heat sink may be reduced, thereby facilitating the cutting process.

Figure 29:
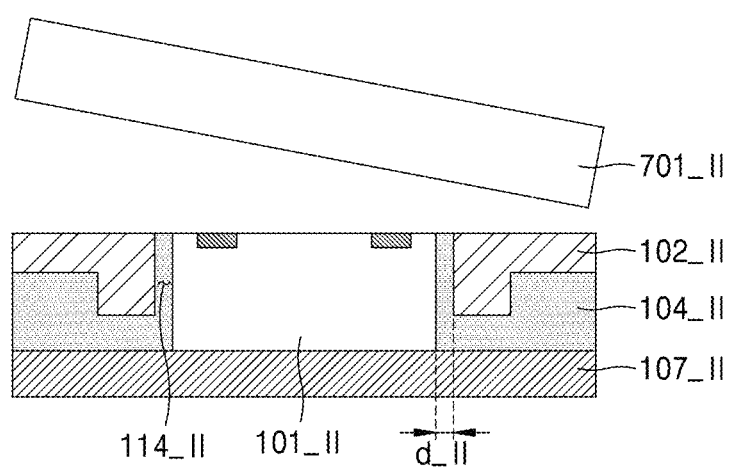
FIG. 29 is a diagram of an operation of removing a glass substrate and inverting a semiconductor package, in a method of manufacturing a semiconductor package, according to an embodiment of the present disclosure.

FIG. 29 illustrates an operation of removing the glass substrate 701_II and inverting the semiconductor package, in a method of manufacturing a semiconductor package, according to an embodiment of the present disclosure. Referring to FIG. 29, the method of manufacturing a semiconductor package according to an embodiment of the present disclosure may include separating the glass substrate 701_II and inverting the semiconductor package.

Figure 30:
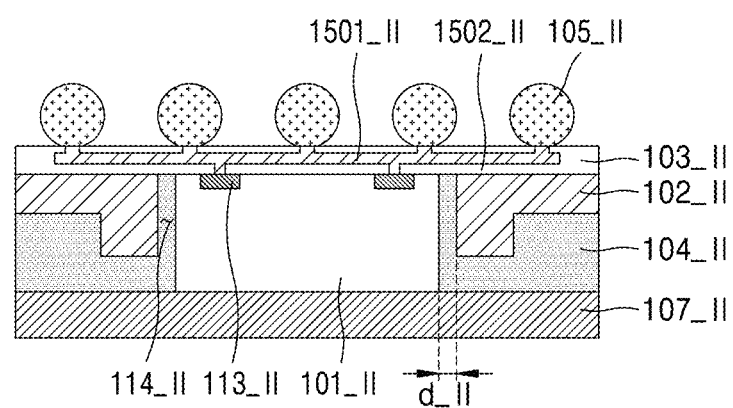
FIG. 30 is a diagram of an operation of forming a redistribution layer and an external connection terminal, in a method of manufacturing a semiconductor package, according to an embodiment of the present disclosure.

FIG. 30 illustrates an operation of forming a redistribution layer and an external connection terminal, in a method of manufacturing a semiconductor package, according to an embodiment of the present disclosure.

Figure 31:
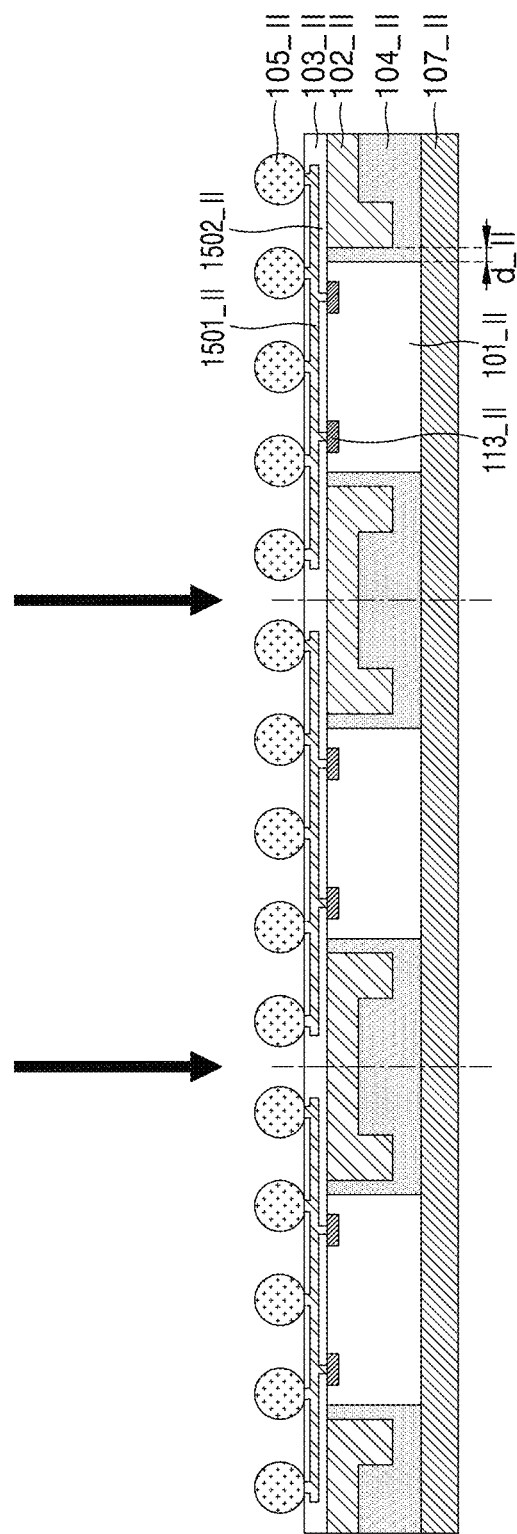
FIGS. 31 and 32 are diagrams illustrating an operation of cutting a plurality of semiconductor packages into individual packages, in a method of manufacturing a semiconductor package, according to an embodiment of the present disclosure.
Figure 32:
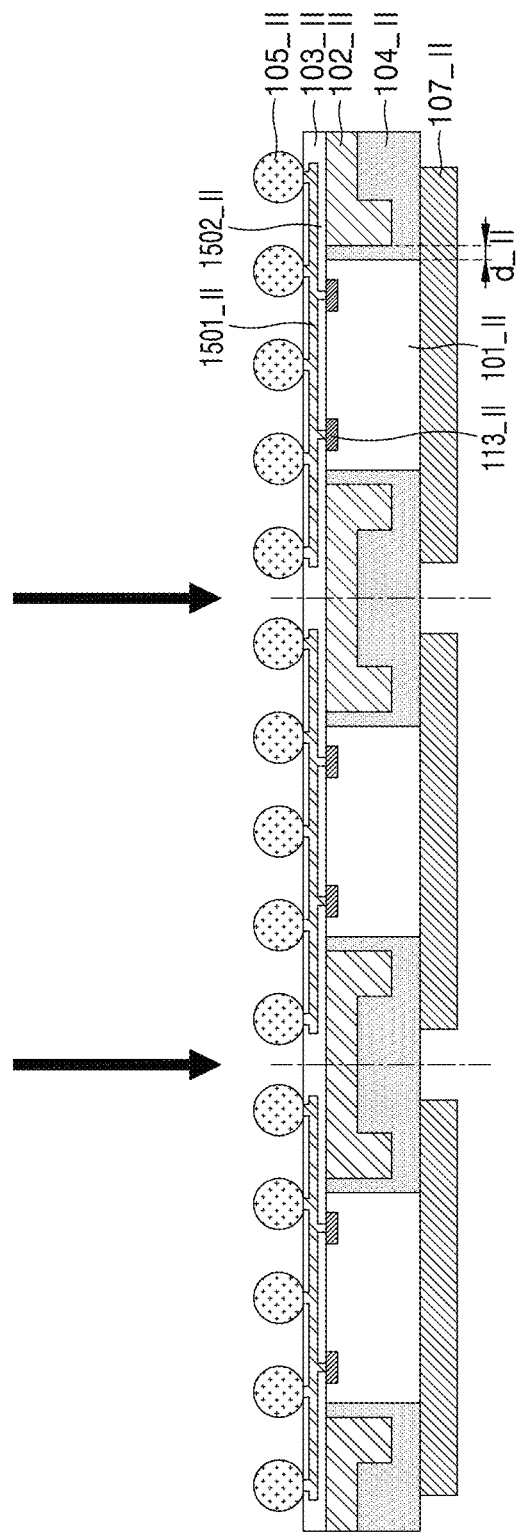

FIGS. 31 and 32 illustrate an operation of cutting the plurality of semiconductor packages into individual packages, in a method of manufacturing a semiconductor package, according to an embodiment of the present disclosure.

Referring to FIGS. 31 and 32, in the process of cutting the plurality of semiconductor packages into individual packages, a cutting blade may be used to sequentially cut the redistribution layer 103_II, the metal frame 102_II, the sealing material 104_II, and the heat sink 107_II of the semiconductor package. Here, a height of the metal frame 102_II having a higher stiffness than the sealing material 104_II may be adjusted, thereby facilitating the cutting process. For example, as described above with reference to FIG. 20, as a height of the second region 501b_II of the metal frame 501_II of FIG. 20 is reduced, a cut depth of the metal frame 501_II due to the cutting blade may be reduced, and thus, the cutting process may be performed quickly.

FIG. 32 illustrates an operation of cutting a plurality of semiconductor packages on which the heat sink 1302_II of FIG. 28B is mounted, into individual package, in a method of manufacturing a semiconductor package. Referring to FIG. 32, a region in which the protrusion 1303_II is not formed may be in one region taken along the cutting line L_II shown in FIG. 28. Thus, semiconductor package cutting process may be performed by sequentially cutting the redistribution layer 103_II, the metal frame 102_II, and the sealing material 104_II without cutting the heat sink 107_II. Accordingly, the cutting process may be performed rapidly and easily without the need of cutting the heat sink 107_II having a higher stiffness than the sealing material 104_II.

Figure 33:
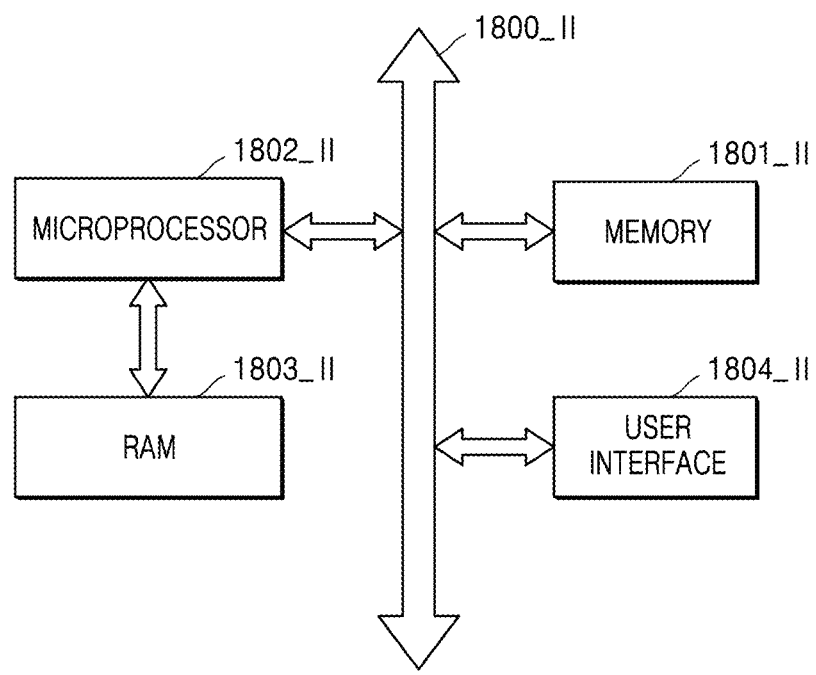
FIG. 33 is a schematic block diagram of an electronic system including a semiconductor package, according to an embodiment of the present disclosure.

FIG. 33 is a schematic block diagram of an electronic system including a semiconductor package, according to an embodiment of the present disclosure.

Figure 34:
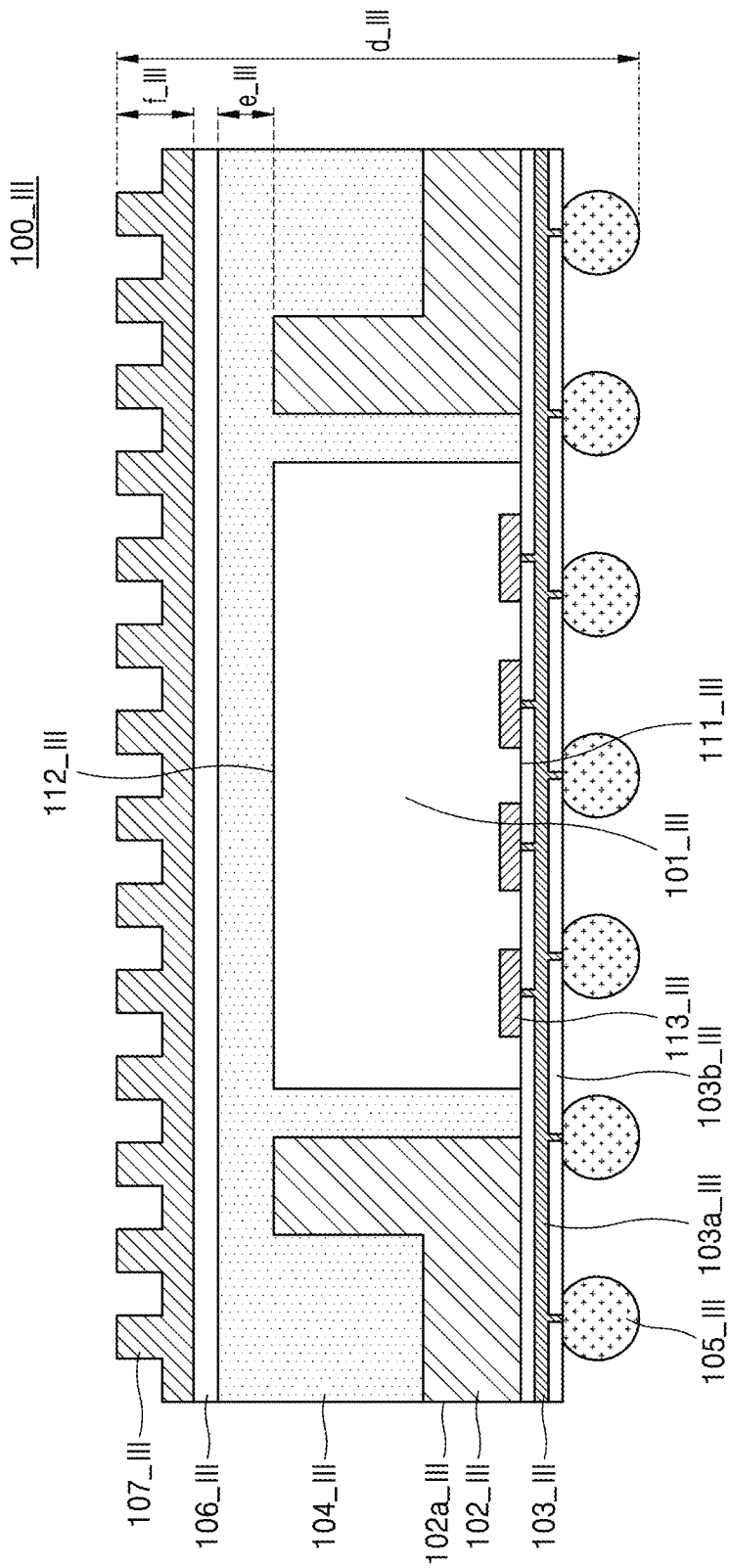
FIG. 34 is a cross-sectional view of a basic structure of a semiconductor package according to an embodiment of the present disclosure.

FIG. 34 is a cross-sectional view of a basic structure of a semiconductor package 100_III according to an embodiment of the present disclosure.

Referring to FIG. 34, the semiconductor package 100_III according to an embodiment of the present disclosure may include a semiconductor chip 101_III, a metal frame 102_III, a redistribution layer 103_III, a sealing material 104_II, an external connection terminal 105_III, an adhesive film 106_III, and a heat sink 107_II. The semiconductor package 100_II may be a WLP-type semiconductor package, specifically, an FO-WLP-type semiconductor package.

A total thickness d_III of the semiconductor package 100_II may be in a range of about 0.8 mm to about 1.8 mm. More specifically, in an embodiment of the present disclosure, the total thickness d_III of the semiconductor package 100_II may be in a range of about 1.1 mm to about 1.4 mm. However, the thickness of the semiconductor package 100_II in the present disclosure is not limited to the thickness d_III and may be variously changed.

The semiconductor package 100_III may include the metal frame 102_III. The metal frame 102_III may be provided on the redistribution layer 103_III and may include a cavity therein. The semiconductor chip 101_III may be located inside the cavity of the metal frame 102_III and surrounded by the metal frame 102_III.

The metal frame 102_III may include various metal-based materials. For example, the metal frame 102_III may include a metal-based material, such as aluminum (Al) having a thermal conductivity of about 200 W/m·K, magnesium (Mg) having a thermal conductivity of about 150 W/m·K, copper (Cu) having a thermal conductivity of about 380 W/m·K, nickel (Ni) having a thermal conductivity of about 90 W/m·K, and silver (Ag) having a thermal conductivity of about 410 W/m·K.

Heat generated by a side surface of the semiconductor chip 101_III may be transferred to the metal frame 102_III and then may be dissipated to the outside. As shown in FIG. 34, an outer wall 102a_III of the metal frame 102_III may be coplanar with the side surface of the semiconductor package 100_III and be exposed to the outside. Thus, the heat dissipation performance of the semiconductor package 100_III may be improved by the metal frame 102_III.

The semiconductor package 100_III may include the sealing material 104_III. The sealing material 104_III may be used to surround and protect the semiconductor chip 101_III. As described above, the sealing material 104_II may fill a space formed between the semiconductor chip 101_III and the metal frame 102_III to prevent an electric short between the semiconductor chip 101_II and the metal frame 102_III. In addition, the sealing material 104_III may cover at least a portion of the semiconductor chip 101_III and at least a portion of the metal frame 102_III. Thus, the semiconductor chip 101_III and the metal frame 102_III may be integrated with each other by the sealing material 104_III, and come in contact with the upper surface of the redistribution layer 103_III, which will be described below.

In example embodiments, the sealing material 104_III may cover the side surface and the upper surface 112_III of the semiconductor chip 101_III and the side surface and the upper surface of the metal frame 102_III. Since a height, which is formed by the semiconductor chip 101_III and the metal frame 102_III, is substantially the same, the upper surface of the semiconductor chip 101_III and the upper surface of the metal frame 102_III may be coplanar. Here, a distance e_III between the upper surfaces of the semiconductor chip 101_III and the metal frame 102_II and the upper surface of the sealing material 104_III may be about 1 μm to about 10 μm.

The heat sink 107_III mounted in the semiconductor package 100_III may have a rough structure as shown in FIG. 1. Due to a shape of the rough structure, a sectional area of the heat sink 107_III in contact with external air may be increased. Thus, the semiconductor package 100_III, which includes the heat sink 107_III according to the present embodiment, may have an improved heat dissipation effect, as compared with a semiconductor package in which a heat sink having no rough structure is mounted. A method of forming the heat sink 107_III having the rough structure and the heat sink 107_III of the rough structure will be described in more detail with reference to FIGS. 36 to 38.

In addition, information about the semiconductor chip 101_III may be marked in a region of the heat sink 107_III of the semiconductor package 100_III. The marking on the heat sink 107_III will be described in more detail below.

The semiconductor package 100_III may quickly dissipate heat generated by the semiconductor chip 101_III to the outside due to the metal frame 102_III and the heat sink 107_III of the rough structure.

More specifically, the heat generated by the semiconductor chip 101_III may be dissipated to the upper surface 112_III and the side surface (not shown) of the semiconductor chip 101_III. The heat dissipated to the upper surface 112_III of the semiconductor chip 101_II, may sequentially pass though the upper surface 112_III of the semiconductor chip 101_III, the sealing material 104_III, the adhesive film 106_III, and the heat sink 107_III and be dissipated to the outside. In addition, the heat dissipated to the side surface (not shown) of the semiconductor chip 101_III may sequentially pass though the side surface of the semiconductor chip 101_III, the sealing material 104_III, and the metal frame 102_III and be dissipated to the outside. Here, as described above, each of the metal frame 102_III and the heat sink 107_III of the semiconductor package 100_III may include a material having relatively high thermal conductivity. Also, the surface of the heat sink 107_III and the outer wall 102a_III of the metal frame 102_III may be exposed to the outside. Thus, the heat generated by the semiconductor chip 101_III may be quickly dissipated to the outside.

Figure 35:
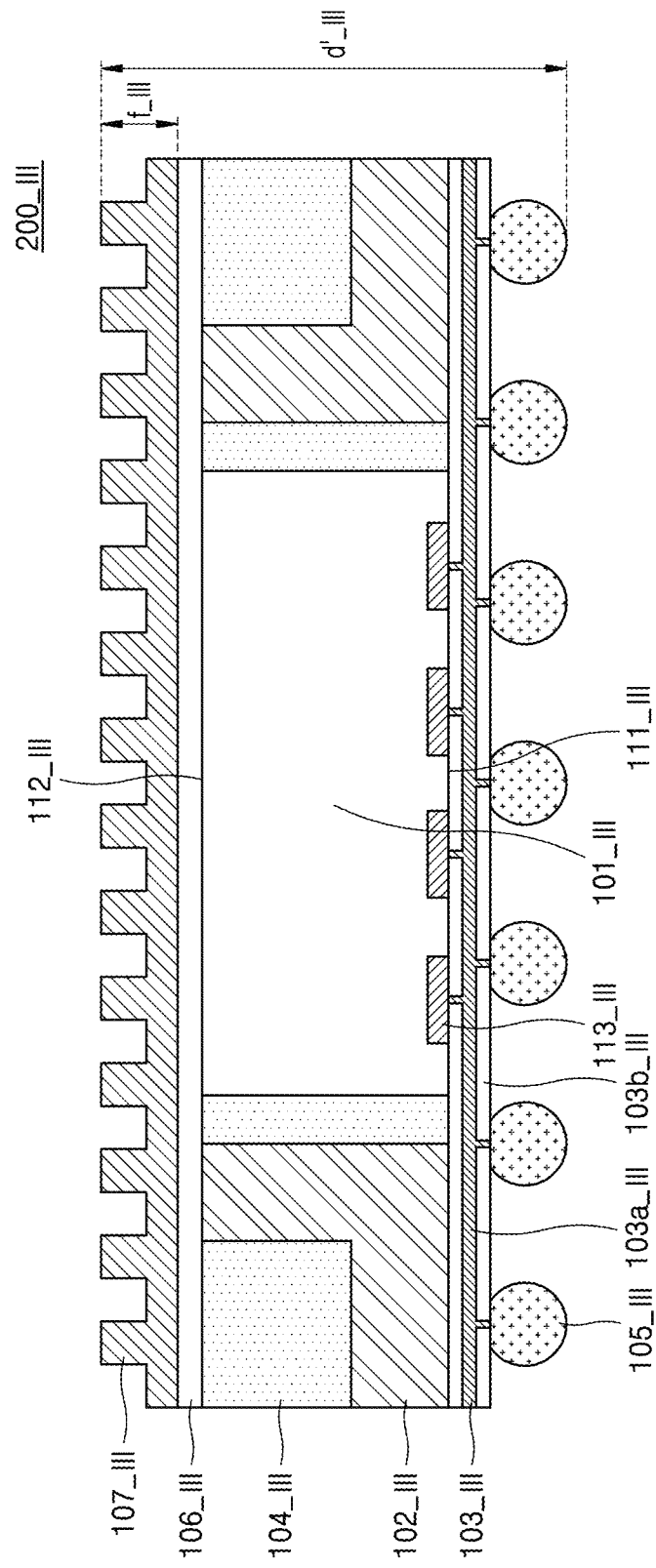
FIG. 35 is a cross-sectional view of a structure of a semiconductor package according to another embodiment of the present disclosure.

FIG. 35 is a cross-sectional view of a structure of a semiconductor package 200_III according to another embodiment of the present disclosure.

Referring to FIG. 35, the semiconductor package 200_III may include a semiconductor chip 101_III, a metal frame 102_III, a redistribution layer 103_III, a sealing material 104_II, an external connection terminal 105_III, an adhesive film 106_III, and a heat sink 107_III. Descriptions of the semiconductor chip 101_III, the metal frame 102_III, the redistribution layer 103_III, the external connection terminal 105_III, the adhesive film 106_III, and the heat sink 107_III may be the same as those presented above with reference to FIG. 34.

The sealing material 104_III of the semiconductor package 200_III may cover the side surface of the semiconductor chip 101_III and an inner wall of the metal frame 102_III but may expose the upper surface 112_III of the semiconductor chip 101_III and the upper surface of the metal frame 102_III. By exposing the upper surface 112_III of the semiconductor chip 101_III and the upper surface of the metal frame 102_III from the sealing material 104_III, a total thickness d'_III of the semiconductor package 200_III may be less than the total thickness d_III of the semiconductor package 100_III of FIG. 34 and thus, the thickness and weight of the semiconductor package 200_III may be reduced.

In addition, heat generated by the upper surface 112_III of the semiconductor chip 101_III of the semiconductor package 200_III may sequentially pass through the adhesive film 106_III located on the upper surface 112_III of the semiconductor chip 101_III and the heat sink 107_III located on the upper surface of the adhesive film 106_III and be dissipated to the outside. Thus, heat generated by the semiconductor chip 101_III may not pass through the sealing material 104_III having relatively low thermal conductivity. Accordingly, heat transfer resistance may be reduced, and thus, the heat dissipation performance of the semiconductor package 200_III may be further improved.

Figure 36:
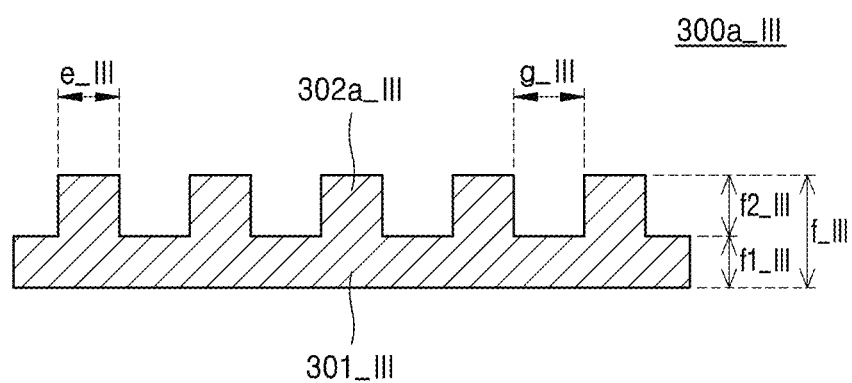
FIGS. 36 and 37 are cross-sectional views, each of which illustrates a structure of a heat sink of a semiconductor package according to an embodiment of the present disclosure.
Figure 37:
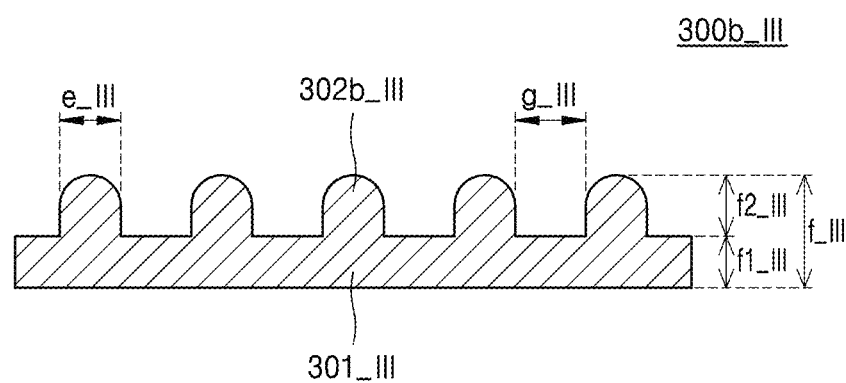
Figure 38:
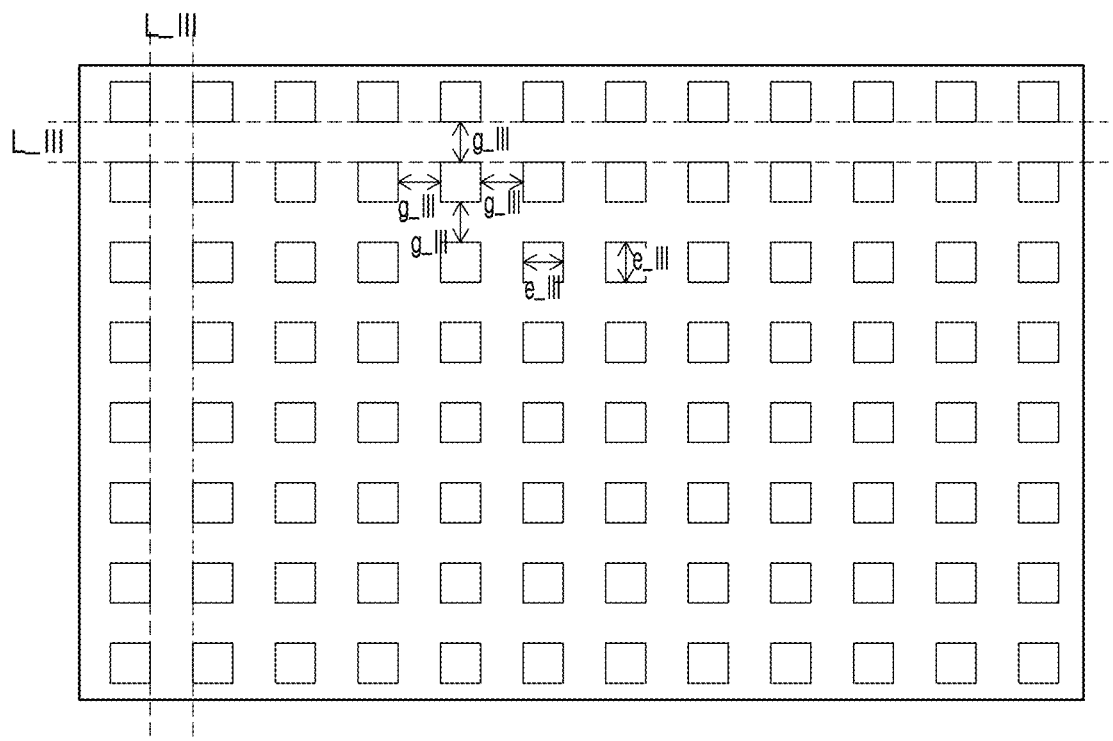
FIG. 38 is a plan view of a structure of a heat sink of a semiconductor package according to an embodiment of the present disclosure.

FIGS. 36 and 37 are cross-sectional views, each of which illustrates a structure of a heat sink of a semiconductor package according to an embodiment of the present disclosure. FIG. 38 is a plan view of the structures of the heat sinks shown in FIGS. 36 and 37.

Referring to FIGS. 36 to 38, heat sinks 300a_III and 300b_III of the semiconductor package according to an embodiment of the present disclosure may have a rough structure. The dictionary meaning of rough (凹凸) may be concave and convex. Each of the heat sinks 300a_III and 300b_III may include a base 301_III and a plurality of projections 302a_III and 302b_III. More specifically, the heat sinks 300a_III and 300b_III may include the plurality of projections 302a_III and 302b_III, which are formed to protrude from an upper surface of the base 301_III having the flat plate shape. Due to its structure, in which the plurality of projections 302a_III and 302b_III are repeatedly arranged a predetermined distance apart from each other, the heat sinks 300a_III and 300b_III may have a rough structure including concave and convex portions that are repeatedly formed on the upper surface of the base 301_III.

A lower surface of the base 301_III of the heat sinks 300a_III and 300b_III may be located on an upper surface of the sealing material of the semiconductor package and fixed by an adhesive film. A thickness $f_1$_III of the base 301_III may take up about 40% to about 60% of a total thickness f_III of the heat sinks 300a_III and 300b_III. In an embodiment of the present disclosure, the thickness $f_1$_III of the base 301_III of the heat sinks 300a_III and 300b_III may be half of the total thickness f_III of the heat sinks 300a_III and 300b_III. Thus, when the total thickness f_III of the heat sinks 300a_III and 300b_III is about 400 μm, the thickness $f_1$_III of the base 301_III of the heat sinks 300a_III and 300b_III may be about 200 μm.

The projections 302a_III and 302b_III of the heat sinks 300a_III and 300b_III may be formed a predetermined distance g_III apart from other projections 302a_III and 302b_III, which are adjacent thereto in four directions. In an embodiment of the present disclosure, the distance g_III between the projections 302a_III and 302b_III may be about 100 μm to about 300 μm. More specifically, the distance g_III between the projections 302a_III and 302b_III may be about 200 μm.

A width e_III, which is formed by each of the projections 302a_III and 302b_III of the heat sinks 300a_III and 300b_III, may be about 100 μm to about 300 μm. More specifically, the width e_III, which is formed by the projections 302a_III and 302b_III, may be about 200 μm.

A thickness $f_2$_II, which is formed by each of the projections 302a_III and 302b_III of the heat sinks 300a_III and 300b_II, may take up about 40% to about 60% of the total thickness f_III of the heat sinks 300a_III and 300b_III. In an embodiment of the present disclosure, the thickness $f_2$_II of the projections 302a_III and 302b_III of the heat sinks 300a_III and 300b_III may be half of the total thickness f_III of the heat sinks 300a_III and 300b_III. Thus, when the total thickness f_III of the heat sinks 300a_III and 300b_III is about 400 μm, the thickness $f_2$_III of each of the projections 302a_III and 302b_III of the heat sinks 300a_III and 300b_III may be about 200 μm.

The total thickness f_III of the heat sinks 300a_III and 300b_III may be equal to a sum of the thickness $f_1$_III of the base 301_III and the thickness $f_2$_III of the projections 302a_III and 302b_III (i.e., f_III=$f_1$_III+$f_2$_III). In an embodiment of the present disclosure, when the total thickness f_III of the heat sinks 300a_III and 300b_III is about 400 μm, the thickness $f_1$_III of the base 301_III may be about 160 μm, which is about 40% of the total thickness f_III of the heat sinks 300a_III and 300b_III, and in this case, the thickness $f_2$_III of the projections 302a_III and 302b_III may be about 240 μm, which is about 60% of the thickness f_III of the heat sinks 300a_III and 300b_III. Also, when the thickness $f_1$_III of the base 301_III is about 240 μm that is about 60% of the thickness f_III of the heat sinks 300a_III and 300b_III, the thickness $f_2$_III of the projections 302a_III and 302b_III may be about 160 μm, which is about 40% of the thickness f_III of the heat sinks 300a_III and 300b_III. In the present disclosure, the thickness $f_1$_III of the base 301_III of the heat sinks 300a_III and 300b_III may be substantially equal to the thickness $f_2$_III of the projections 302a_III and 302b_III. In an embodiment, each of the thickness $f_1$_III and the thickness $f_2$_III may be about 200 μm.

Referring to FIG. 36, an upper portion of the projection 302a_III of the heat sink 300a_III may include a planar surface. Referring to FIG. 37, an upper portion of the projection 302b_III of the heat sink 300b_III may include a convexly curved surface. The projections 302a_III and 302b_III of the heat sinks 300a_III and 300b_III are not limited to the shapes of FIGS. 36 and 37 and may have various other shapes.

The heat sink 300a_III of the FIG. 36 may include a plurality of projections 302a_III by sawing a portion of a heat sink having a rectangular parallelepiped shape with a predetermined thickness f_III by using a sawing device. A sawing blade of the sawing device may have a cutting width corresponding to a distance g_III between the plurality of projections 302a_III and a cutting depth corresponding to the thickness $f_2$_III of the projection 302a_III. The sawing device may saw the portion of the heat sink while moving along a cutting lane (e.g., L_III) shown in FIG. 38. Thus, the heat sink 300a_III of FIG. 36 may include the plurality of projections 302a_III described above.

After the projections 302a_III are formed using the above-described sawing device, an additional sawing process for smoothly cutting upper portions of the projections 302a_III may be performed, and thus, the heat sink 300b_III of FIG. 37 may include the projections 302b_III of which the upper portions have a convexly curved shape.

In addition, the heat sinks 300a_III and 300b_III shown in FIGS. 36 and 37 may be formed using an injection molding process other than the sawing process described above.

More specifically, a material for forming the heat sinks 300a_III and 300b_III may be into an injection molding heating chamber. The material for the heat sinks 300a_III and 300b_III, which is injected into the heating chamber, may melt due to a high temperature of the heating chamber. The molten material may be injected into an injection molding apparatus including injection spaces having shapes corresponding to the heat sinks 300a_III and 300b_III of FIGS. 36 and 37. The injection spaces having the shapes corresponding to the heat sinks 300a_III and 300b_III may be completely filled with the injected molten material. Subsequently, the injection molding apparatus may cool the molten material in the injection space, and thus, the heat sinks 300a_III and 300b_III of FIGS. 36 and 37 may be finally formed. By using the injection molding process, rough structures of the heat sinks 300a_III and 300b_III are not limited to shapes shown in FIGS. 36 and 37 and may have various other shapes according to the shape of the injection space of the injection molding apparatus.

The present disclosure is not limited to the above-described sawing process and injection molding process, and the rough structures of the heat sinks 300a_III and 300b_III of FIGS. 36 to 38 may be formed using various other processes. As an embodiment, the rough structures of the heat sinks 300a_III and 300b_III may be formed due to a chemical reaction. In an embodiment, the rough structures of the heat sinks 300a_III and 300b_III may be formed using a process of physically bonding a plurality of projections 301a_III and 301b_III, which are separately formed, to the base 301_III. In this case, the projections 301a_III and 301b_III and the base 301_III of the heat sinks 300a_III and 300b_III may include different materials.

Due to the rough structures of the heat sinks 300a_III and 300b_III, the heat dissipation performance of each of the semiconductor packages may be improved. More specifically, by forming the rough structures of the heat sinks 300a_III and 300b_III, surface areas of the heat sinks 300a_III and 300b_III, which are in contact with external air, may be increased. Thus, the semiconductor packages on which the heat sinks 300a_III and 300b_III are mounted may dissipate heat dissipated by the semiconductor chips in the semiconductor packages may be quickly dissipated to the outside.

Figure 39:
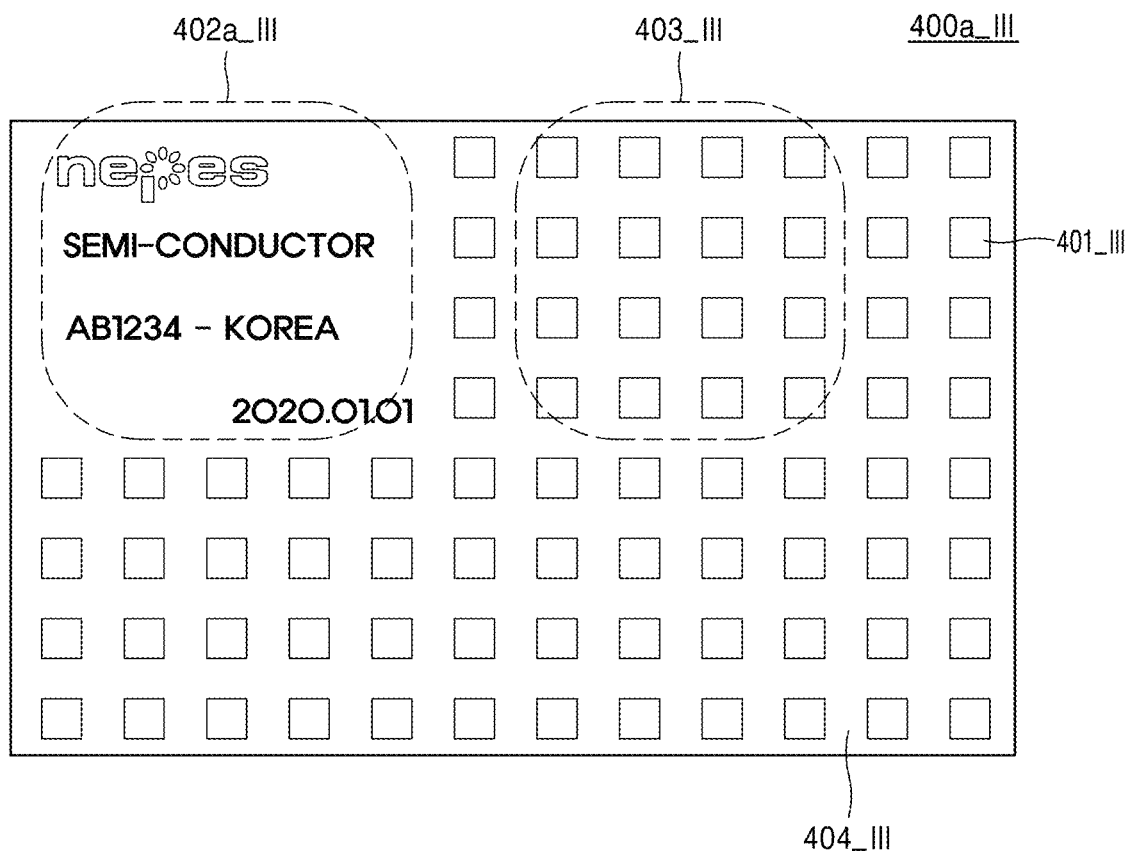
FIGS. 39 and 40 are plan views of heat sinks in which information about a semiconductor chip is marked, according to an embodiment of the present disclosure.
Figure 40:
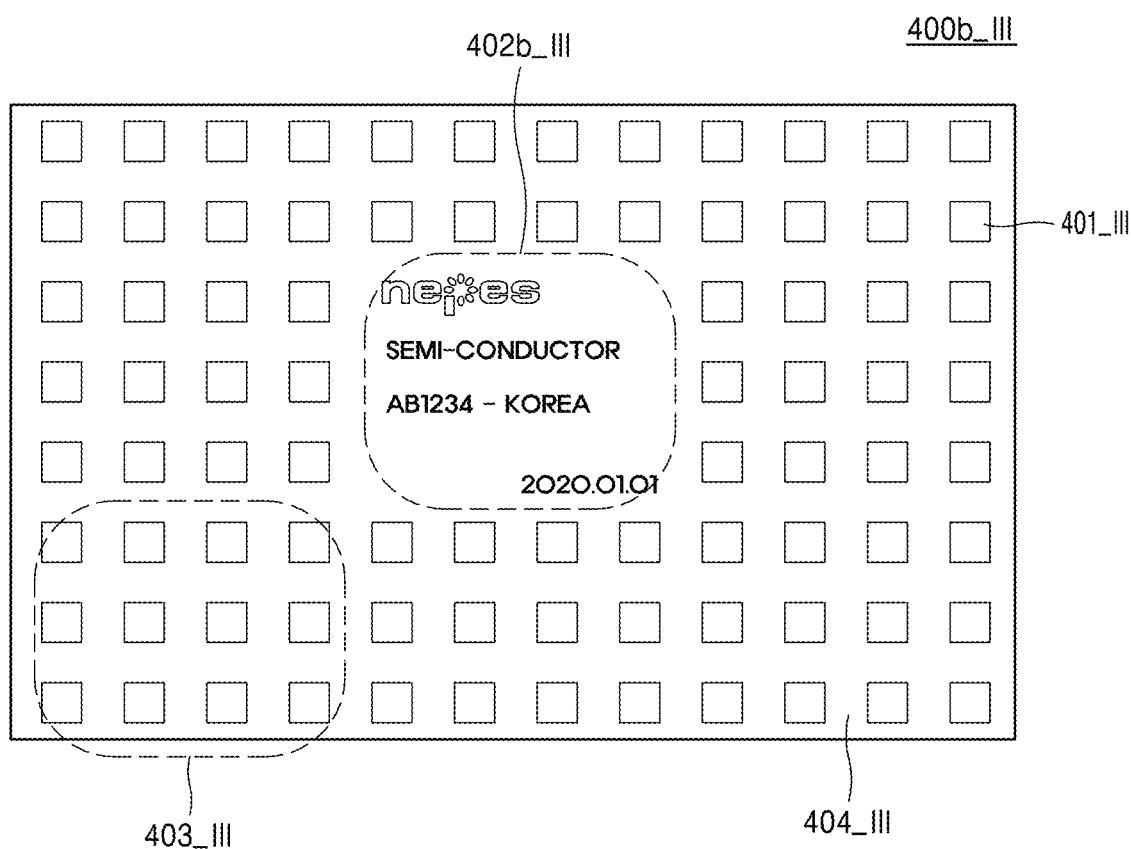

FIGS. 39 and 40 are respectively plan views of heat sinks 400a_III and 400b_III in which information about semiconductor chips are marked, according to an embodiment of the present disclosure.

Referring to FIGS. 39 and 40, the heat sinks 400a_III and 400b_III may include a base 404_III located on an upper surface of a sealing material, marking regions 402a_III and 402b_III located on the base 404_III and including markings for information about the semiconductor chips, and a projection region 403_III including a plurality of projections 401_III protruding from the base 404_III.

As shown in FIGS. 39 and 40, the projections 401_III may not be formed in the marking regions 402a_III and 402b_III in which the information about the semiconductor chips are expressed. In other words, portions of the heat sinks 400a_III and 400b_III may include not rough structures but planar surfaces. Thus, the marking regions 402a_III and 402b_III may be formed to have a smaller height than an upper surface of the projection 401_III. In an embodiment, a marking region may be formed in a portion of an upper surface of the base 404_III.

A planar surface of an upper left portion of the heat sink 400a_III shown in FIG. 39 on which the projections 401_III are not formed may include the marking region 402a_III, and the information about the semiconductor chip mounted in the semiconductor package may be marked in the marking region 402a_III. In addition, a planar surface of a central portion of the heat sink 400_III shown in FIG. 40 on which the projections 401_III are not formed may include the marking region 402b_III, and the information about the semiconductor chip may also be marked in the marking region 402b_III. The marking regions 402a_III and 402b_III in which the projections 401_III are not formed are not limited to positions shown in FIGS. 39 and 40 and may be formed at various other positions of heat sinks.

In an embodiment, the information about the semiconductor chip, such as the type, number, and performance of the semiconductor chip, the name and/or logo of a manufacturing company, a manufacturing date, and a serial number, may be marked in the marking regions 402a_III and 402b_III of the semiconductor package.

In an embodiment, an ink marking method or a laser marking method may be used to mark semiconductor information in the marking regions 402a_III and 402b_III.

More specifically, the information about the semiconductor chip may be marked in the marking regions 402a_III and 402b_III of the heat sinks 400a_III and 400b_III by using a pad printing method, which is one ink marking method. In the pad printing method, a palette filled with ink may be pushed with a silicone rubber pad in which an embossed or engraved pattern is formed, and brought into contact with surfaces of the marking regions 402a_III and 402b_III to mark semiconductor information. In the pad printing method, the information about the semiconductor package may be marked at low cost. Also, because the silicone rubber pad has elasticity, the semiconductor information may be clearly marked even in an uneven surface of a heat sink.

In addition, the information about the semiconductor chip may be marked in the marking regions 402a_III and 402b_III of the heat sinks 400a_III and 400b_III by using a laser marking method. In the laser marking method, laser light emitted from a laser device may be condensed on the marking regions 402a_III and 402b_III of the heat sinks 400a_III and 400b_III by using the laser device. Thus, letters or numbers may be engraved by hollowing portions of the marking regions 402a_III and 402b_III to express the information about the semiconductor chip. Furthermore, the laser device may adjust the intensity of laser light by adjusting the intensity of electric power supplied to the laser device. Thus, thicknesses of the letters and numbers formed in the marking regions 402a_III and 402b_III of the heat sinks 400a_III and 400b_III may be adjusted.

The laser marking method may use a conventional $CO_2$ laser device, an yttrium aluminum garnet (YAG) laser device, and a diode laser device. The $CO_2$ laser device may include a resonator, which includes nitrogen ($N_2$), carbon dioxide ($CO_2$), and helium (He). When high-frequency energy is applied to the resonator, nitrogen molecules may stimulate carbon dioxide molecules, and thus, the stimulated carbon dioxide molecules may be excited. The excited carbon dioxide molecules release energy to return to a ground state. In this case, the excited carbon dioxide molecules emit infrared (IR) laser light having a wavelength of about 9 μm to about 11 μm.

The YAG laser device may use an YAG crystal as a laser medium. The YAG crystal may include ytterbium (Yb) and aluminum (Al) as main components and have a similar crystal structure to garnet. The YAG laser device may emit laser light by adding various rare-earth elements, such as neodymium (Nd) and ytterbium (Yb), to the YAG crystal.

In the diode laser device, when a forward bias is applied to a diode, electrons and holes may be injected into a p-layer of the diode. The electrons may jump to a valence band and emit laser light when the electrons return to a ground state.

In the present disclosure, the laser devices, which are used to mark information about a semiconductor chip on the marking regions 402a_III and 402b_III of the heat sinks 400a_III and 400b_III, are not limited to the $CO_2$ laser device, the YAG laser device, and the diode laser device described above and may further include various other laser devices.

Figure 41:
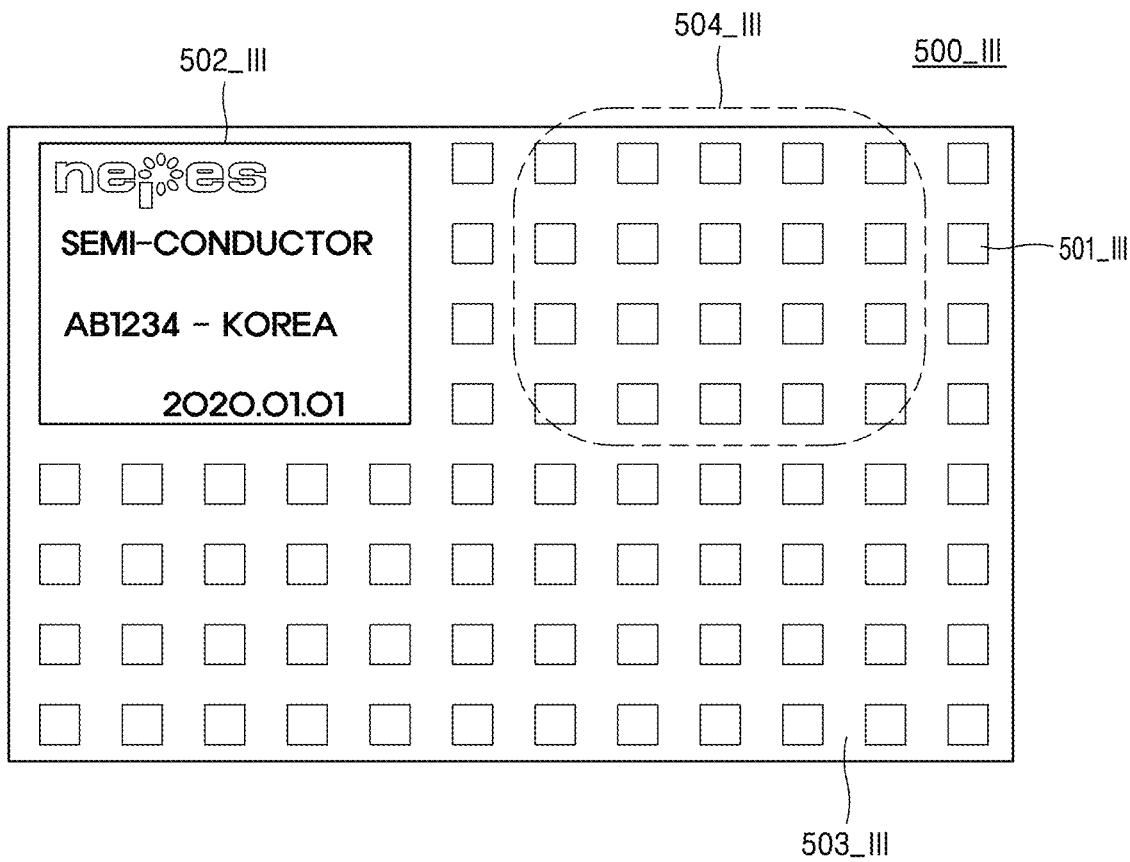
FIG. 41 is a plan view of a heat sink in which information about a semiconductor chip is marked, according to another embodiment of the present disclosure.

FIG. 41 is a plan view of a heat sink 500_III in which information about a semiconductor package is marked, according to another embodiment of the present disclosure.

Referring to FIG. 41, the heat sink 500_III may include a base 503_III, a projection region 504_III, which includes a plurality of projections 501_III protruding from the base 503_III, and a marking region 502_III, which is provided on the base 503_III, and on which information about the semiconductor chip is written. Technical characteristics of the projection 501_III may be substantially the same as those of the projections 301a_III and 301b_III of FIGS. 36 to 38, and thus, descriptions thereof will be omitted.

The marking region 502_III may be formed to protrude from an upper surface of the base 503_III of the heat sink 500_III. More specifically, the marking region 502_III may protrude from the upper surface of the base 503_III, and the protruding upper surface of the marking region 502_III may have a flat shape. An area of the upper surface of the marking region 502_III may be greater than an area of an upper surface of each projection 501_III and be less than a footprint of the heat sink 500_III. In an embodiment, the marking region 502_III of the heat sink 500_III may take up about 10% to about 80% of the footprint of the heat sink 500_III.

In addition, a height of the marking region 502_III protruding from the base 503_III may be substantially equal to a height of the projection 501_III. Thus, the upper surface of the marking region 502_III may be coplanar with the upper surfaces of the projections 501_III of the projection region 504_III. The height of the marking region 502_III protruding from the base 503_III and the height of the projections 501_III protruding from the base 503_III may be about 40% to about 60% of the total thickness of the heat sink 500_III.

Information about the semiconductor chip may be represented on the upper surface of the marking region 502_III by the ink marking method or the laser marking method.

The heat sink 500_III may include the plurality of projections 501_III, which are formed by sawing portions of the heat sink 500_III having a rectangular parallelepiped shape with a predetermined thickness by using a sawing device, and the remaining portion of the heat sink 500_III, which is not sawn, may include the marking region 502_III.

Although FIG. 41 illustrates a case in which the marking region 502_III is formed in an upper left portion of the heat sink 500_III, the marking region 502_III is not limited thereto and may be formed at various other positions of the heat sink 500_III.

Due to a protruding shape of the marking region 502_III, a sectional area of the heat sink 500_III of FIG. 41 in contact with external air may be greater than those of the heat sinks 400a_III and 400b_III of FIGS. 39 and 40, and thus, a heat dissipation effect may be excellent.

Figure 42:
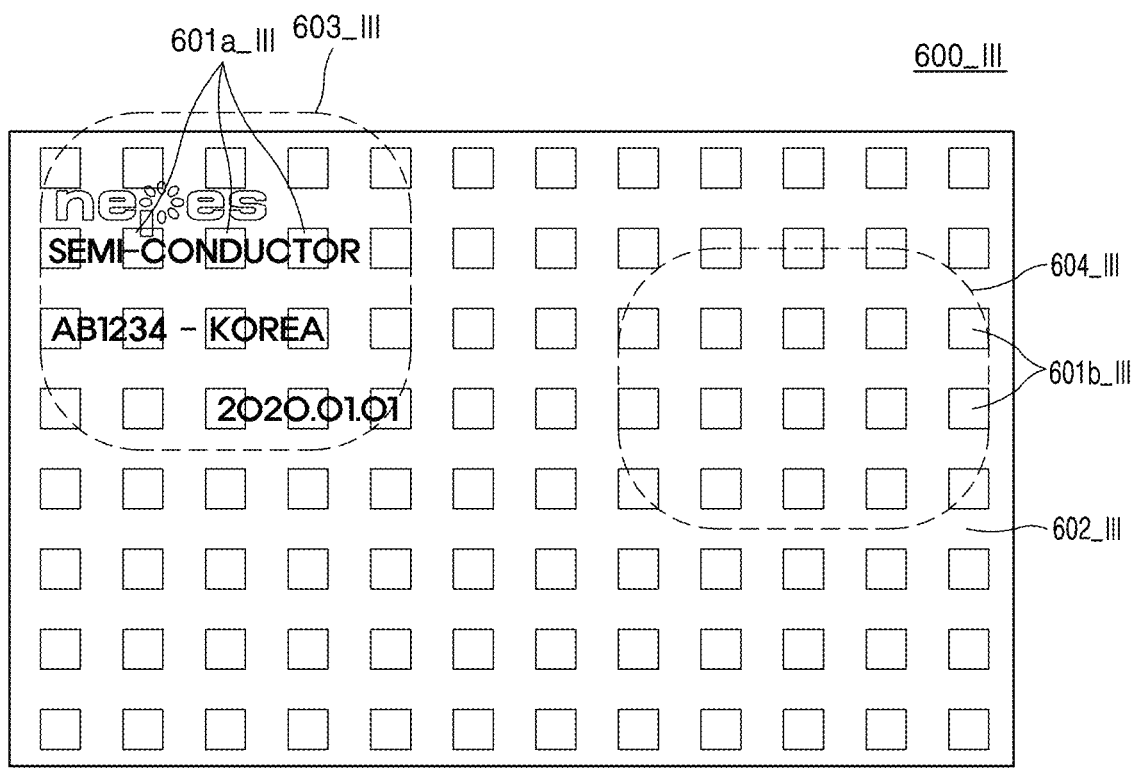
FIG. 42 is a plan view of a heat sink in which information about a semiconductor chip is marked, according to still other embodiment of the present disclosure.

FIG. 42 is a plan view of a heat sink 600_III in which information about a semiconductor package is marked, according to still other embodiment of the present disclosure.

The heat sink 600_III may include a base 602_III, which will be provided on the upper surface of the sealing material of the semiconductor package, a first region 603_III, which includes first projections 601a_III protruding from the base 602_III, and a second region 604_III, which include second projections 601b_III protruding from the base 602_III. The first projection 601a_III, the second projection 601b_III, and the base 602_II may be substantially the same as the projections 302a_III and 302b_III and the base 301_III of the heat sinks 300a_III and 300b_III shown in FIG. 38 in terms of technical characteristics. However, a thickness of the first and second projections 601a_III and 601b_III formed in the heat sink 600_II may be different from a thickness $f_2$_III of the projections 302a_III and 302b_III of the heat sinks 300a_III and 300b_III of FIG. 36 as will be described below.

As shown in FIG. 42, the heat sink 600_III may include the first projections 601a_II protruding over the base 602_III, in the first region 603_III, and the second projections 601b_III protruding over the base 602_III, in the second region 604_III.

The first region 603_III may include continuous letters and numbers indicting the information about the semiconductor package in the upper surfaces of the base 602_III and the first projections 601a_III. More specifically, the information about the semiconductor chip may be expressed in the upper surface of the base 602_III and the upper surface of the first projection 601a_III, which are located in a lower portion of the first region 603_III. The information about the semiconductor chip may be marked by hollowing a portion of the base 602_III and a portion of the first projection 601a_III by using a laser device. In addition, the information about the semiconductor chip may be marked by painting the portion of the base 602_III and the portion of the first projection 601a_III with ink.

The thickness formed by the first projections 601a_III may be as small as possible so that the first region 603_III includes continuous letters and numbers in the upper surfaces of the first projections 601a_III and the base 602_III. In this case, as the thickness of the first projections 601_III is reduced, in a laser marking method, a change in height of a point on which laser light is condensed may be reduced, and engraved letters and numbers may have orderly shapes. Also, in an ink marking method, a change in length by which a silicone rubber pad should stretch due to elasticity may be reduced.

Accordingly, in the first region 603_III of the heat sink 600_III according to the present disclosure, a height of the first projections 601a_III may be substantially less than a height of the second projections 601b_III of the second region 604_III in which the marking region 603_III is not formed. In an embodiment, the height of the first projections 601a_III may be between about ¼ and about ½ of the height of the second projections 601b_III. In an embodiment of the present disclosure, when the total thickness of the heat sink 600_III is about 400 µm, the thickness of the base 602_III is about 200 µm, and the height of the second projections 601b_III is about 200 µm, the height of the first projections 601a_III may be about 2 times to about 4 times less than the height of the second projections 601b_III. Accordingly, the height of the first projections 601a_III may be about 50 µm to about 100 µm.

Due to the small height of the first projections 601a_III formed in the first region 603_III of the heat sink 600_III, the heat sink 600_III may form continuous letters and numbers in the upper surfaces of the base 602_III and the first projections 601a_III in the first region 603_III and indicate information about the semiconductor package. In the laser marking method, the change in height of the point on which laser light is condensed in the first region 603_III may be in a range of about 50 µm to about 100 µm. Thus, the letters and numbers may be continuously marked in orderly shapes in the first region 603_III without separately controlling the height of the point on which the laser light is condensed. In addition, even when the height of the point on which the laser light is condensed is controlled, it may be only necessary to control a position of the laser device in a range of about 50 µm to about 100 µm. Accordingly, energy consumption may be low during the driving of the laser device, and time taken to control the driving of the laser device may be reduced.

In the ink marking method, because a change in length by which the silicone rubber pad should stretch due to elasticity may be as small as about 50 µm to about 100 µm, letters and numbers indicating semiconductor information may be marked in more orderly shapes in the upper surfaces of the first projections 601a_III of the first region 603_III and the base 602_III.

FIGS. 43 to 49 are diagrams illustrating a method of manufacturing a semiconductor package, according to an embodiment of the present disclosure.

Figure 43:
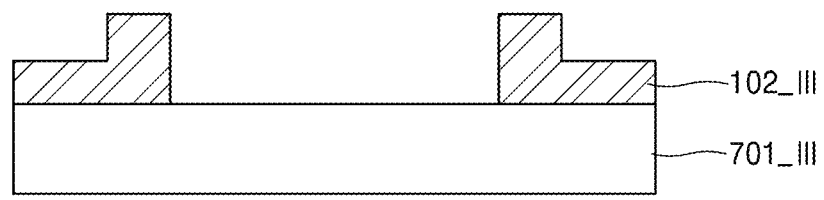
FIG. 43 is a diagram of an operation of adhering a metal frame to a glass substrate, in a method of manufacturing a semiconductor package, according to an embodiment of the present disclosure.

FIG. 43 illustrates an operation of adhering a metal frame to a glass substrate, in a method of manufacturing a semiconductor package, according to an embodiment of the present disclosure. Referring to FIG. 43, the method of manufacturing a semiconductor package according to an embodiment of the present disclosure may include adhering the metal frame 102_III to an upper surface of a glass substrate 701_III. An adhesive layer (not shown) may be formed on the upper surface of the glass substrate 701_III. The metal frame 102_III may be physically adhered to the upper surface of the glass substrate 701_III by the adhesive layer (not shown).

Figure 44:
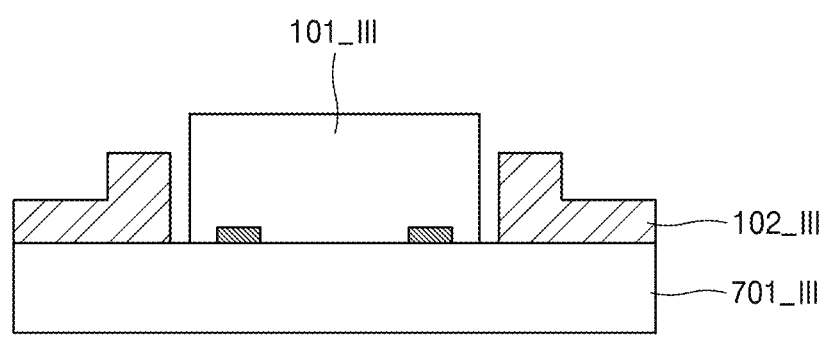
FIG. 44 is a diagram of an operation of mounting a semiconductor chip on a glass substrate, in a method of manufacturing a semiconductor package, according to an embodiment of the present disclosure.

FIG. 44 illustrates an operation of mounting a semiconductor chip on the glass substrate, in a method of manufacturing a semiconductor package, according to an embodiment of the present disclosure. The method of manufacturing a semiconductor package according to an embodiment of the present disclosure may include mounting the semiconductor chip 101_III on the glass substrate 701_III. The semiconductor chip 101_III may be located inside a cavity of the metal frame 102_III adhered onto the glass substrate 701_III and mounted on the glass substrate 701_III.

Figure 45:
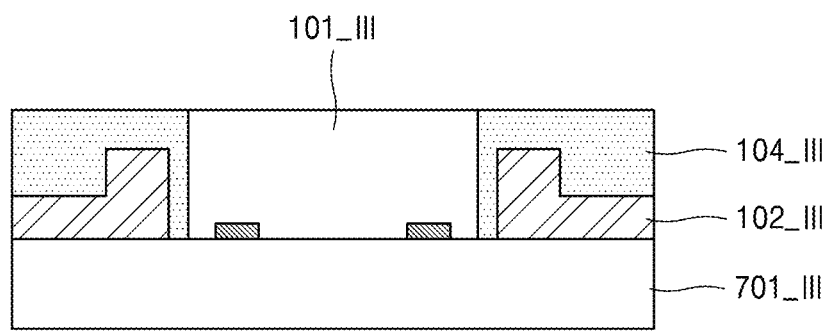
FIG. 45 is a diagram of an operation of covering and hermetically sealing a semiconductor chip and a metal frame with a sealing material, in a method of manufacturing a semiconductor package, according to an embodiment of the present disclosure.

FIG. 45 illustrates an operation of covering and hermetically sealing the semiconductor chip 101_III and the metal frame 102_III with the sealing material 104_III, in a method of manufacturing a semiconductor package, according to an embodiment of the present disclosure. The method of manufacturing a semiconductor package according to an embodiment of the present disclosure may include covering and hermetically sealing the semiconductor chip 101_III and the metal frame 102_III with the sealing material 104_III. The sealing material 104_III may fill a space between the semiconductor chip 101_III and the inner wall of the metal frame 102_III to integrate the semiconductor chip 101_III with the metal frame 102_III. In addition, the sealing material 104_III may cover upper surfaces of the semiconductor chip 101_III and the metal frame 102_III.

In an embodiment, the method may further include a process of grinding an upper portion of the sealing material 104_III covering the upper surfaces of the semiconductor chip 101_III and the metal frame 102_III to expose the upper surface of the semiconductor chip 101_III or the metal frame 102_III.

Figure 46:
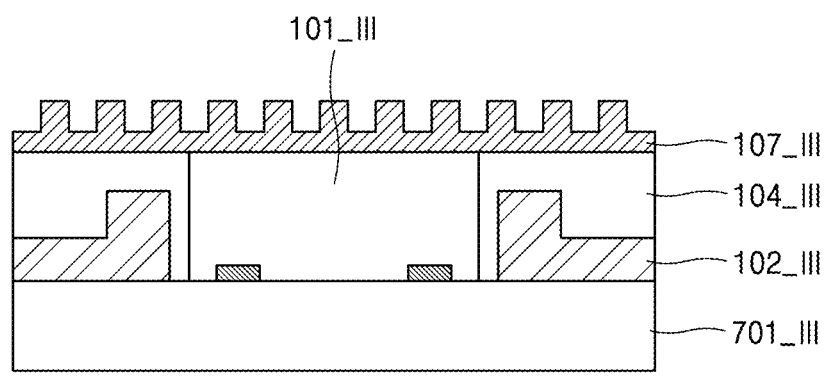
FIG. 46 is a diagram of an operation of adhering a heat sink to a semiconductor package, in a method of manufacturing a semiconductor package, according to an embodiment of the present disclosure.

FIG. 46 illustrates an operation of adhering the heat sink 107_III to a semiconductor package, in a method of manufacturing a semiconductor package, according to an embodiment of the present disclosure. The method of manufacturing a semiconductor package according to an embodiment of the present disclosure may include adhering the heat sink 107_III to a semiconductor package. As described above, the heat sink 107_III may have a rough structure, and the heat sink 107_III of the rough structure may include the heat sinks according to the above-described embodiments of the present disclosure. Thus, the heat sink 107_III may include a marking region, in which letters and numbers representing information about the semiconductor package described above are formed.

The heat sink 107_III may be adhered to the upper surface of the semiconductor chip 101_III or the upper surface of the sealing material 104_III. A method of adhering the heat sink 107_III to the upper surface of the semiconductor chip 101_III may include a thermal compression bonding method. The thermal compression bonding method may be a method of applying heat and pressure to the adhesive film below the heat sink 107_III using a compression apparatus. As a result of the thermal compression bonding method, the adhesive film may stably adhere the heat sink 107_III to the upper surfaces of the semiconductor chip 101_III and the sealing material 104_III.

Figure 47:
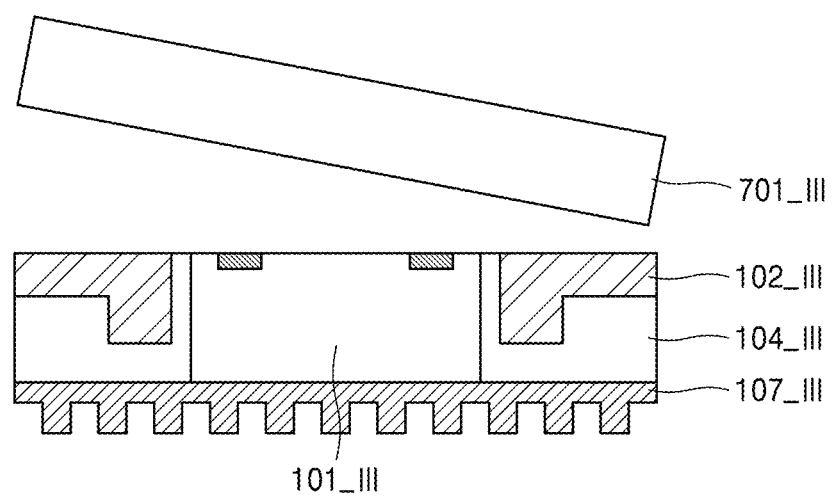
FIG. 47 is a diagram of an operation of removing a glass substrate and inverting a semiconductor package, in a method of manufacturing a semiconductor package, according to an embodiment of the present disclosure.
Figure 48:
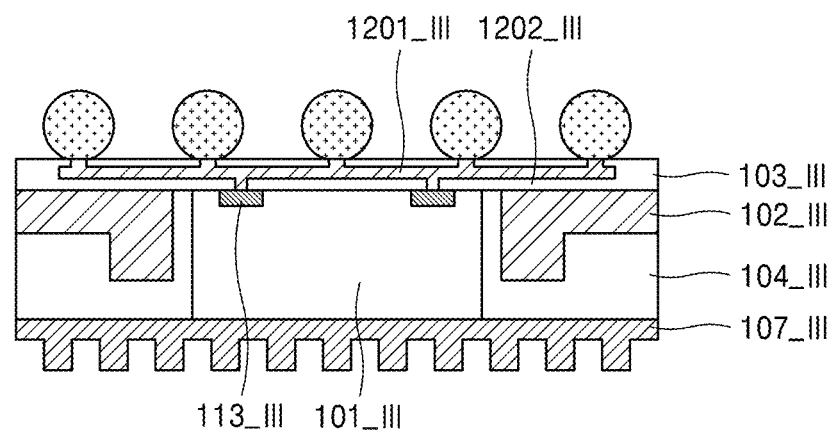
FIG. 48 is a diagram of an operation of forming a redistribution layer and an external connection terminal, in a method of manufacturing a semiconductor package, according to an embodiment of the present disclosure.

FIG. 47 illustrates an operation of removing the glass substrate 701_III and inverting the semiconductor package, in a method of manufacturing a semiconductor package, according to an embodiment of the present disclosure. The method of manufacturing a semiconductor package according to an embodiment of the present disclosure may include separating the glass substrate 701_III and inverting the semiconductor package.

Figure 49:
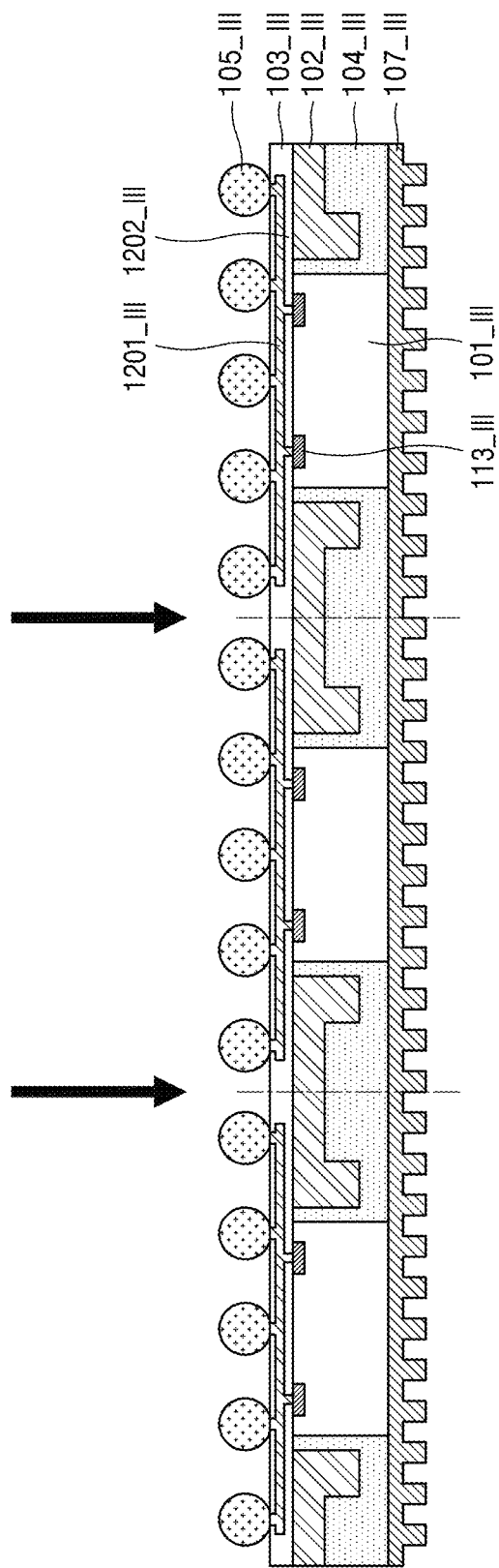
FIG. 49 is a diagram of an operation of cutting a plurality of semiconductor packages into individual packages, in a method of manufacturing a semiconductor package, according to an embodiment of the present disclosure.

FIG. 49 illustrates an operation of cutting a plurality of semiconductor packages into individual packages, in a method of manufacturing a semiconductor package, according to an embodiment of the present disclosure. In the process of cutting the plurality of semiconductor packages into the individual packages, a cutting blade may be used to sequentially cut the redistribution layer 103_III, the metal frame 102_III, the sealing material 104_III, and the heat sink 107_III of the semiconductor package.

Figure 50:
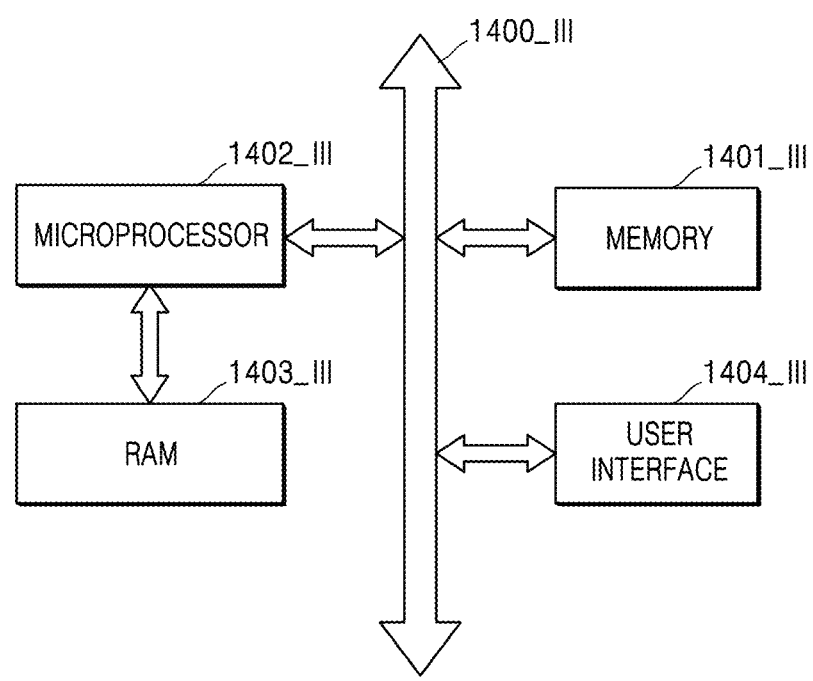
FIG. 50 is a schematic block diagram of an electronic system including a semiconductor package, according to an embodiment of the present disclosure.

FIG. 50 is a schematic block diagram of an electronic system 1400_III including a semiconductor package, according to an embodiment of the present disclosure. The electronic system 1400_III may include at least one of semiconductor packages according to various embodiments disclosed in the present specification. The electronic system 1400_III may be included in a mobile device or a computer. For example, electronic system 1400_III may include a memory system 1401_III, a micro-processor 1402_III, a RAM 1403_III, and a user interface 1404_II for data communication.

Hereinafter, in the accompanying cross-sectional views of the semiconductor package, a length of an element in a vertical direction Z may be defined as a thickness of the element, whereas a length of an element in a horizontal direction X, which is perpendicular to the vertical direction Z may be defined as a width of the element.

In addition, the term "footprint", which will be mentioned in the following description, may be defined as a region in an X-Y plane occupied by an element, when the element is viewed from above (i.e., from +Z direction to −Z direction).

Figure 51:
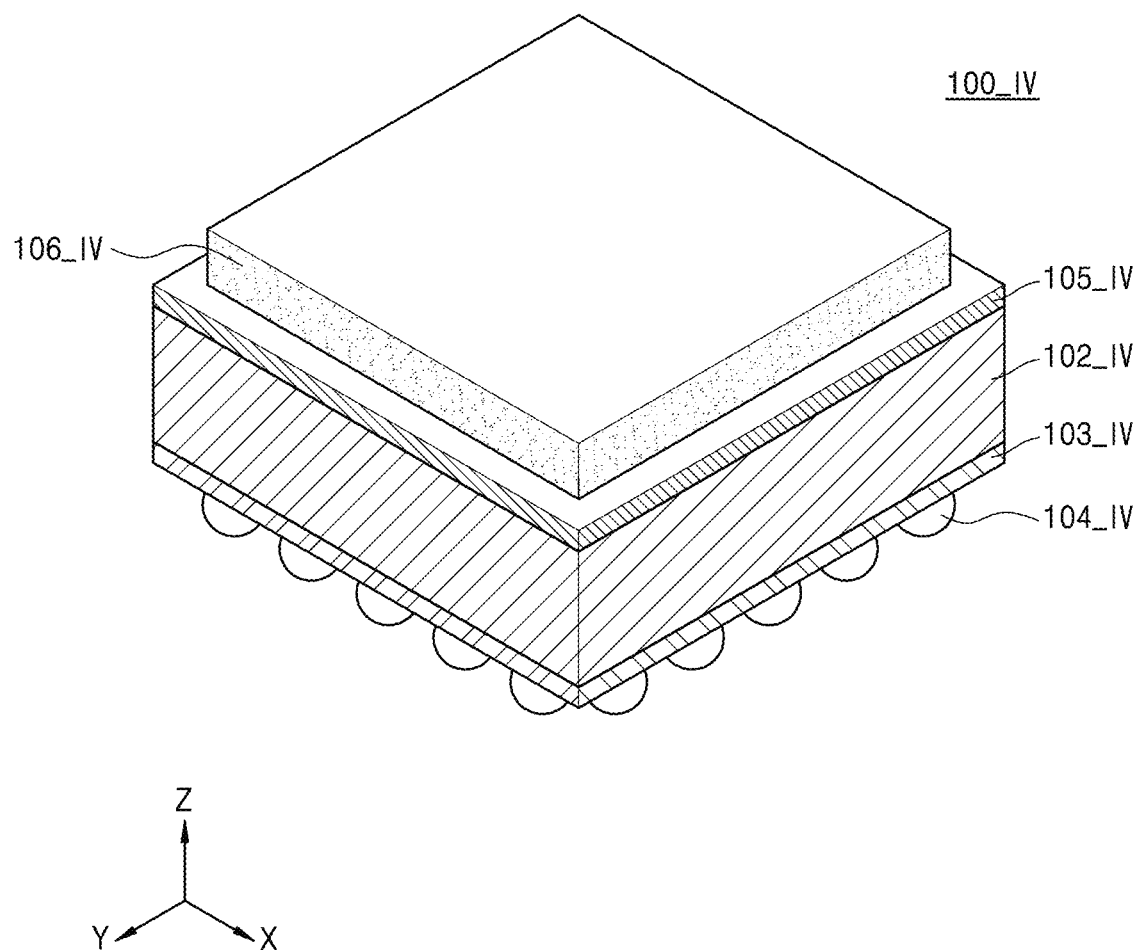
FIG. 51 is a perspective view of a semiconductor package according to an embodiment of the present disclosure.
Figure 52:
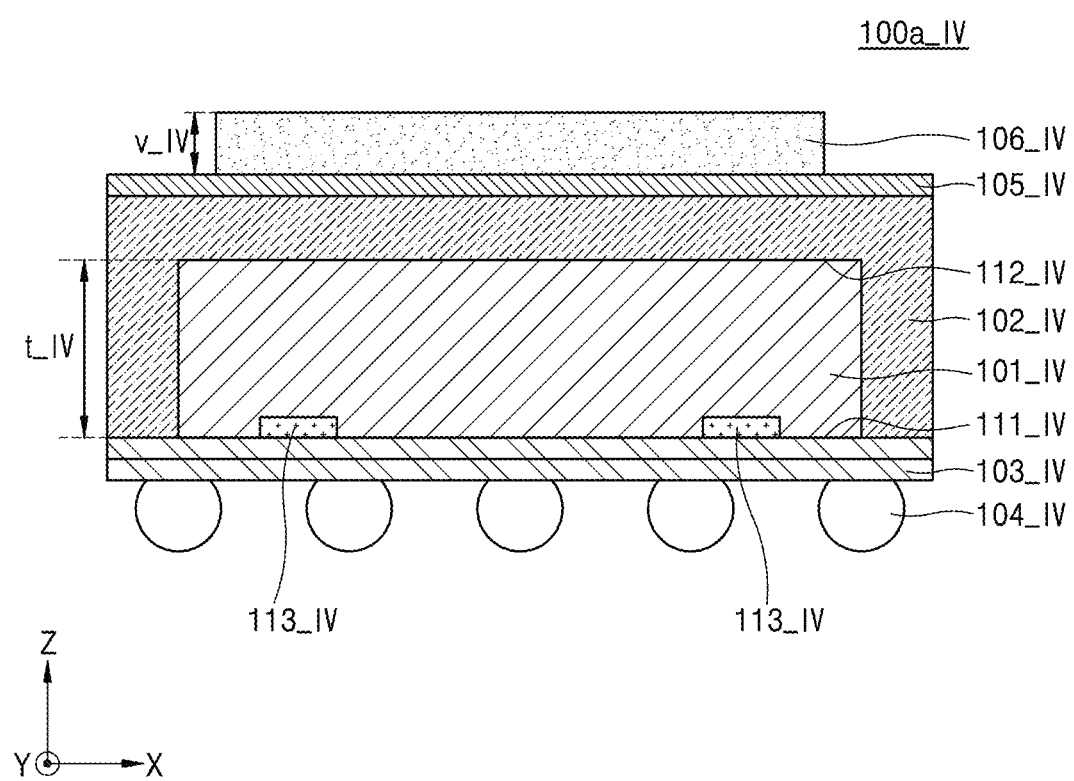
FIGS. 52 and 53 are cross-sectional views of a semiconductor package according to an embodiment of the present disclosure.
Figure 53:
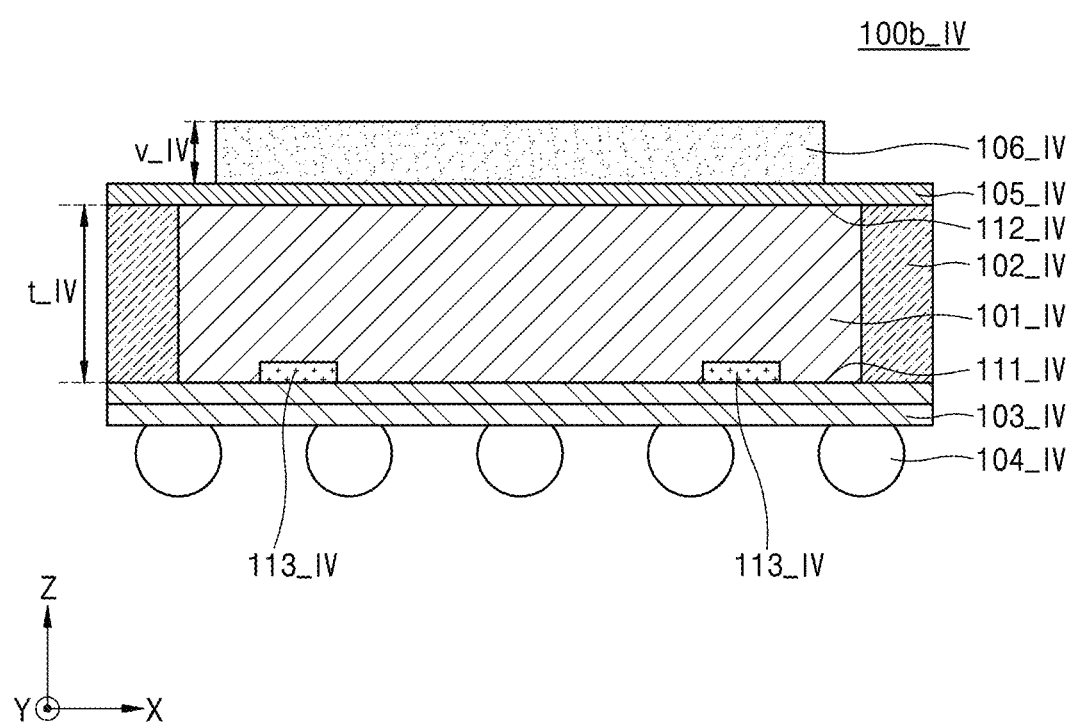

FIG. 51 is a perspective view of a semiconductor package 100_IV according to an embodiment of the present disclosure, and FIGS. 52 and 53 are cross-sectional views of semiconductor packages 100a_IV and 100b_IV according to an embodiment of the present disclosure. Each of the semiconductor packages 100_IV, 100a_IV, and 100b_IV may be an FO-WLP or a PLP.

Referring to FIGS. 51 to 53, each of the semiconductor packages 100_IV, 100a_IV, and 100b_IV according to an embodiment of the present disclosure may include a semiconductor chip 101_IV, a sealing material 102_IV, a redistribution layer 103_IV, an external connection terminal 104_IV, an adhesive film 105_IV, and a heat sink 106_IV. Each of the semiconductor packages 100_IV, 100a_IV, and 100b_IV may be a WLP-type semiconductor package, specifically, an FO-WLP-type semiconductor package. A thickness of each of the semiconductor packages 100_IV, 100a_IV, and 100b_IV may be in a range of about 1.1 mm to about 1.4 mm. However, a thickness of each of the semiconductor packages 100_IV, 100a_IV, and 100b_IV is not limited to the range and may be variously changed.

Referring to FIGS. 51 to 53, the sealing material 102_IV may surround the semiconductor chip 101_IV and protect the semiconductor chip 101_IV. In addition, the sealing material 102_IV may cover the semiconductor chip 101_IV and fix the semiconductor chip 101_IV to the redistribution layer 103_IV, which will be described below. The sealing material 102_IV may include, for example, a silicon-based material, a thermosetting material, a thermoplastic material, an UV treatment material, and the like. As an example, the sealing material 102_IV may include a polymer, such as resin, for example, an EMC.

In an embodiment, as shown in FIG. 53, the sealing material 102_IV may cover the side surface of the semiconductor chip 101_IV and expose the upper surface 112_IV of the semiconductor chip 101_IV. By exposing the upper surface 112_IV of the semiconductor chip 101_IV, the thickness of the semiconductor package 100b_IV may be reduced. In addition, heat generated by the semiconductor chip 101_IV may not pass through the sealing material 102_IV but sequentially pass through the adhesive film 105_IV and the heat sink 106_IV, which are on the upper surface 112_IV of the semiconductor chip 101_IV as described below, and be dissipated to the outside. Thus, the heat dissipation performance of the semiconductor package 100b_IV may be improved.

Referring to FIGS. 51 to 53, each of the semiconductor packages 100_IV, 100a_IV, and 100b_IV may include the adhesive film 105_IV. The adhesive film 105_IV may be in contact with at least one of the upper surface 112_IV of the semiconductor chip 101_IV and the upper surface of the sealing material 102_IV. The adhesive film 105_IV may include an epoxy resin having reliable adhesion to the sealing material 102_IV and the semiconductor chip 101_IV. The adhesive film 105_IV may include a conductive material and a non-conductive material. For example, the adhesive film 105_IV may include an epoxy resin. Furthermore, the adhesive film 105_IV may include a filler material (e.g., silver, aluminum, silicon dioxide, aluminum nitride, and boron nitride) having high thermal conductivity and may include thermally conductive aluminum oxide to maintain desired stiffness. The adhesive film 105_IV may have a self-adhesive property and be adhered to an additional thermally-conductive adhesive tape. The adhesive tape may be a both-sided adhesive tape. In each of the semiconductor packages 100_IV, 100a_IV, and 100b_IV, the thickness of the adhesive film 105_IV may be in a range of about 5 μm to about 20 μm, more specifically, from about 10 μm to about 14 μm.

In an embodiment, a width of the adhesive film 105_IV in a first direction X may be greater than a width of the heat sink 106_IV. However, the present disclosure is not limited to the above description, and unlike the structure illustrated in the drawings, the width of the adhesive film 105_IV in the first direction X may be substantially equal to the width of the heat sink 106_IV.

In an embodiment, as shown in the drawings, the width of the adhesive film 105_IV in the first direction X may be substantially equal to the width of the semiconductor package 100_IV in the first direction X. However, the present disclosure is not limited to the above description, the width of the adhesive film 105_IV in the first direction X may be less than the width of the semiconductor package 100_IV in the first direction X.

In an embodiment, the width of the adhesive film 105_IV in the first direction X may be greater than the width of the heat sink 106_IV in the first direction X and may be less than the width of the semiconductor package 100_IV in the first direction X. In addition, the width of the adhesive film 105_IV in the first direction X may be greater than the width of the heat sink 106_IV in the first direction X and may be substantially equal to the width of the semiconductor package 100_IV in the first direction X. Also, the width of the adhesive film 105_IV in the first direction X may be substantially equal to the width of the heat sink 106_IV in the first direction X and may be less than the width of the semiconductor package 100_IV in the first direction X. In addition, the width of the adhesive film 105_IV in the first direction X may be substantially equal to the width of the heat sink 106_IV in the first direction X and the width of the semiconductor package 100_IV in the first direction X.

In an embodiment, when the footprint of the adhesive film 105_IV is less than the footprint of the semiconductor package 100_IV and the footprint of the heat sink 106_IV is less than the footprint of the adhesive film 105_IV, the upper surface of the sealing material 102_IV and the upper surface of the adhesive film 105_IV may be exposed, when the semiconductor package 100_IV is viewed from above. When the semiconductor package 100_IV is viewed from above, the exposed area of the upper surface of the sealing material 102_IV and the upper surface of the adhesive film 105_IV may be about 5% to about 40% of an area of the upper surface of the semiconductor package 100_IV.

In an embodiment, when the footprint of the adhesive film 105_IV is substantially equal to the footprint of the semiconductor package 100_IV and the footprint of the heat sink 106_IV is less than the footprint of the adhesive film 105_IV, when the semiconductor package 100_IV is viewed from above, the upper surface of the sealing material 102_IV may not be exposed and the upper surface of the adhesive film 105_IV may be exposed. When the semiconductor package 100_IV is viewed from above, the exposed area of the upper surface of the adhesive film 105_IV may be about 5% to about 40% of the area of the upper surface of the semiconductor package 100_IV.

Referring to FIG. 52, heat generated by the semiconductor chip 101_IV in the semiconductor package 100a_IV may sequentially pass though the upper surface 112_IV of the semiconductor chip 101_IV, the sealing material 102_IV, the adhesive film 105_IV, and the heat sink 106_IV and be dissipated to the outside. In addition, the thickness of the sealing material 102_IV may be greater than the thickness of the semiconductor chip 101_IV, the upper surface of the semiconductor chip 101_IV may be covered with the sealing material 102_IV, and the upper surface of the sealing material 102_IV may be in contact with the adhesive film 105_IV.

Referring to FIG. 53, heat generated by the semiconductor chip 101_IV in the semiconductor package 100b_IV may sequentially pass though the upper surface 112_IV of the semiconductor chip 101_IV, the adhesive film 105_IV, and the heat sink 106_IV and be dissipated to the outside. Because the sealing material 102_IV may not be formed between the upper surface 112_IV of the semiconductor chip 101_IV and the adhesive film 105_IV, a heat transfer resistance in a transfer path of heat generated by the semiconductor chip 101_IV may be lower than a heat transfer resistance of the semiconductor package 100a_IV of FIG. 52. Thus, heat dissipation performance of the semiconductor package 100b_IV may be improved. In addition, the thickness of the sealing material 102_IV may be substantially equal to the thickness of the semiconductor chip 101_IV, and the upper surface of the semiconductor chip 101_IV may be exposed by the sealing material 102_IV, and the upper surface of the semiconductor chip 101_IV and the upper surface of the sealing material 102_IV may be in contact with the adhesive film 105_IV.

In an embodiment, as shown in FIGS. 52 and 53, the thickness t_IV of the semiconductor chip 101_IV may be equal to or greater than the thickness v_IV of the heat sink 106_IV. However, the present disclosure is not limited to the above description, and the thickness t_IV of the semiconductor chip 101_IV may be less than the thickness v_IV of the heat sink 106_IV.

Figure 54:
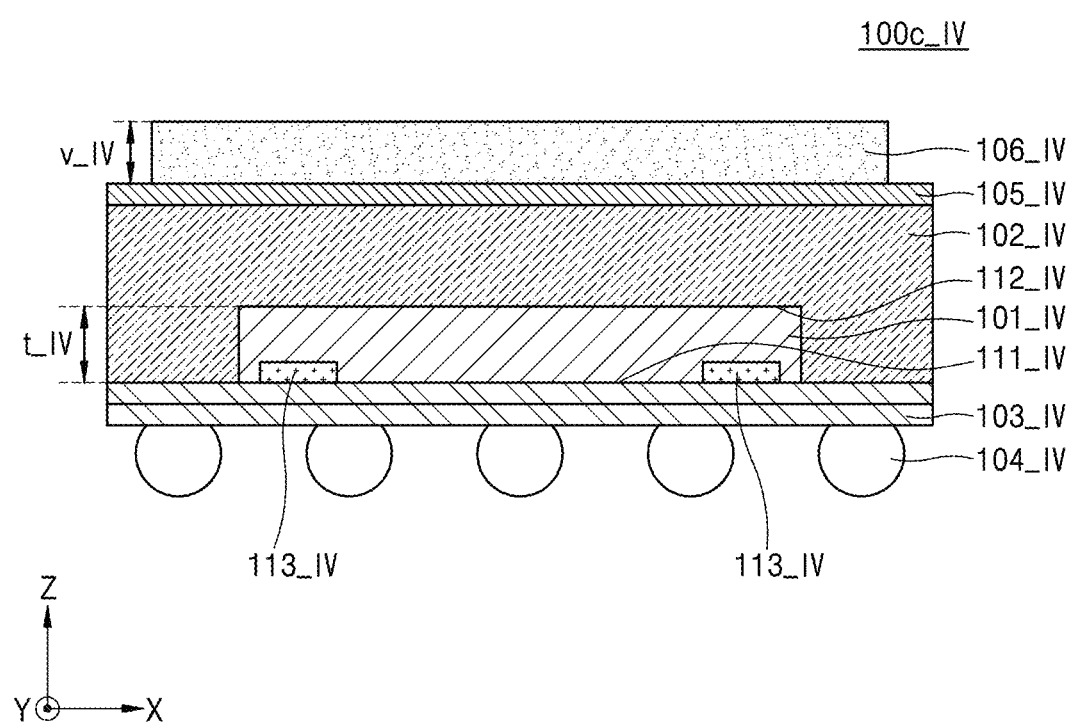
FIG. 54 is a cross-sectional view of a semiconductor package according to an embodiment of the present disclosure.

FIG. 54 is a cross-sectional view of a semiconductor package 100c_IV according to an embodiment of the present disclosure. Referring to FIG. 54, a width of the heat sink 106_IV in a first direction X may be equal to or greater than a width of the semiconductor chip 101_IV in the first direction X. In addition, a footprint of the heat sink 106_IV may be equal to or greater than the footprint of the semiconductor chip 101_IV. Accordingly, the heat sink 106_IV may efficiently dissipate heat generated by the semiconductor chip 101_IV to the outside.

In an embodiment of the present disclosure, the width of the semiconductor chip 101_IV of the semiconductor package 100c_IV in the first direction X may be less than the width of the heat sink 106_IV in the first direction X. Also, the width of the heat sink 106_IV in the first direction X may be less than the width of the semiconductor package 100c_IV in the first direction. For example, the width of the semiconductor chip 100c_IV may be less than the width of the heat sink 106_IV, and the width of the heat sink 106_IV may be less than the width of the semiconductor package 100c_IV. However, the present disclosure is not limited thereto, and the width of the semiconductor chip 101_IV may be substantially equal to the width of the heat sink 106_IV. Because the width of the heat sink 106_IV is greater than or substantially equal to the width of the semiconductor chip 101_IV, heat generated by the semiconductor chip 101_IV may be easily transferred to the lower surface of the heat sink 106_IV, and thus, the heat dissipation effect may be improved.

The thickness v_IV of the heat sink 106_IV may be less than or substantially equal to the thickness t_IV of the semiconductor chip 101_IV. However, the present disclosure is not limited thereto, and the thickness v_IV of the heat sink 106_IV may be greater than the thickness t_IV of the semiconductor chip 101_IV. In an embodiment, a sum of the thicknesses of the semiconductor chip 101_IV and the heat sink 106_IV (i.e., v_IV+t_IV) may take up about 60% to 95% of the total thickness of the semiconductor package.

Figure 55:
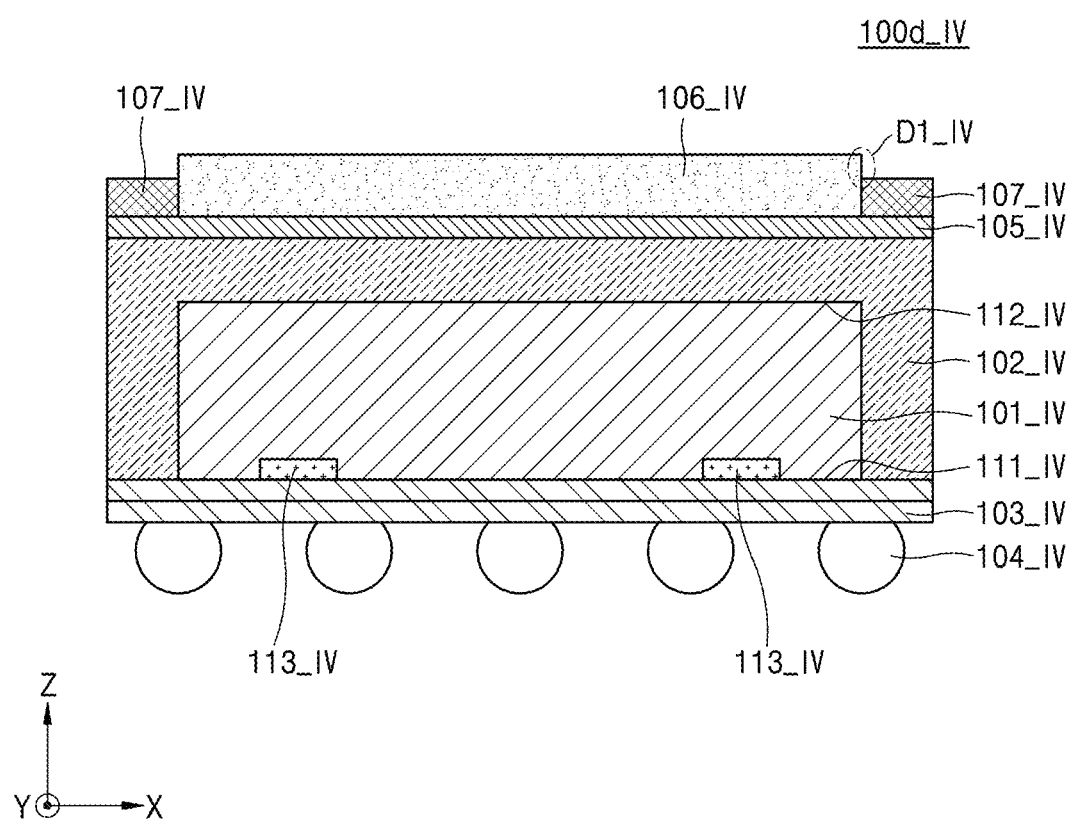
FIGS. 55 and 56 are cross-sectional views of a semiconductor package according to an embodiment of the present disclosure.
Figure 56:
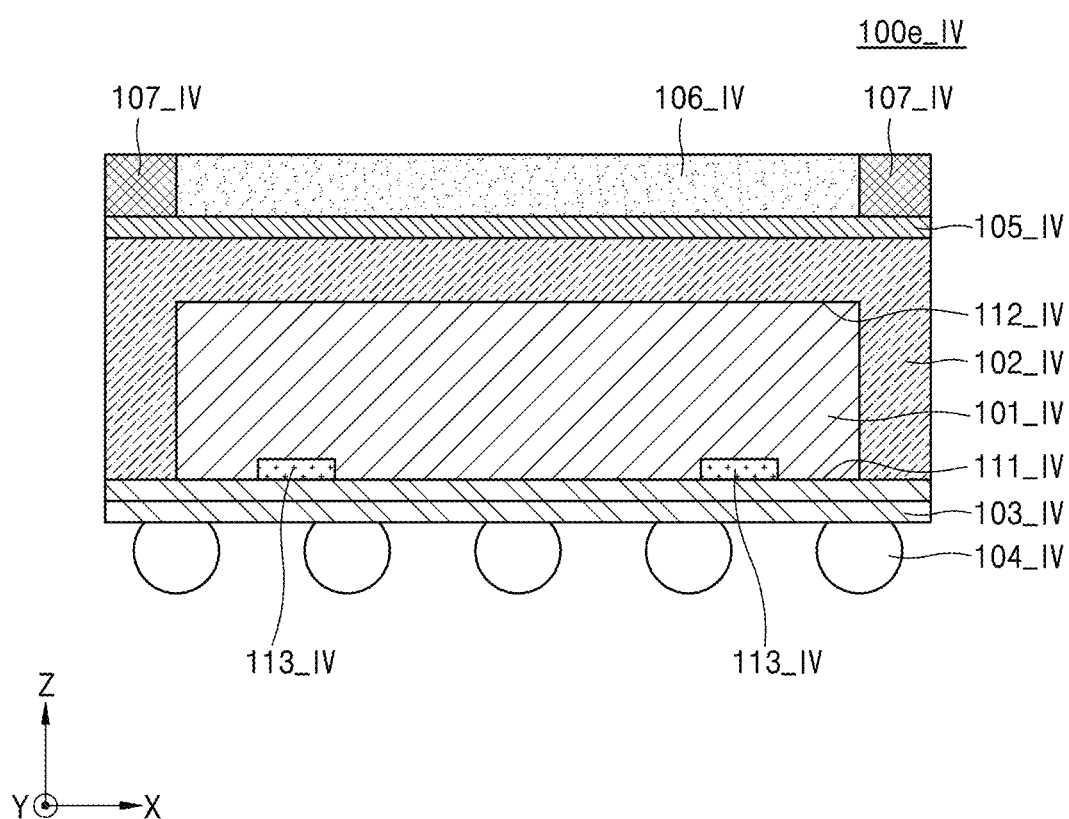

FIGS. 55 and 56 are cross-sectional views of semiconductor packages 100d_IV and 100e_IV according to an embodiment of the present disclosure. Referring to FIGS. 55 and 56, a heat-dissipation molding unit 107_IV may surround the heat sink 106_IV, on the sealing material 102_IV (more specifically, on the upper surface of the adhesive film 105_IV on the sealing material 102_IV), to cover at least a portion of the side surface of the heat sink 106_IV. The heat-dissipation molding unit 107_IV may include various materials, such as a metal-based material, a ceramic-based material, a carbon-based material, and a polymer-based material. In an embodiment, the heat-dissipation molding unit 107_IV may be an EMC. By covering at least a portion of the side surface of the heat sink 106_IV with the heat-dissipation molding unit 107_IV, heat generated by the semiconductor chip 101_IV may concentrate into a center region of the heat sink 106_IV. Furthermore, before the semiconductor packages 100d_IV and 100e_IV are singulated into individual semiconductor packages, the processes of processing, delivering, and cutting the heat sinks 106_IV may be facilitated due to the heat-dissipation molding unit 107_IV surrounding the heat sink 106_IV.

Referring to FIG. 55, the heat-dissipation molding unit 107_IV may be provided on the sealing material 102_IV and may surround the heat sink 106_IV to cover only a portion of the side surface of the heat sink 106_IV. Accordingly, a portion of the side surface of the heat sink 106_IV may be exposed to the outside. In addition, there may be a height difference between the upper surface of the heat sink 106_IV and the upper surface of the heat-dissipation molding unit 107_IV. Accordingly, a stepped portion D1_IV may be formed at a periphery of the heat sink 106_IV.

Referring to FIG. 56, the heat-dissipation molding unit 107_IV may be provided on the sealing material 102_IV to surround the heat sink 106_IV and cover the entire side surface of the heat sink 106_IV. Accordingly, the side surface of the heat sink 106_IV may not be exposed to the outside. In addition, the upper surface of the heat sink 106_IV and the upper surface of the heat-dissipation molding unit 107_IV may be provided at substantially the same height.

Figure 57:
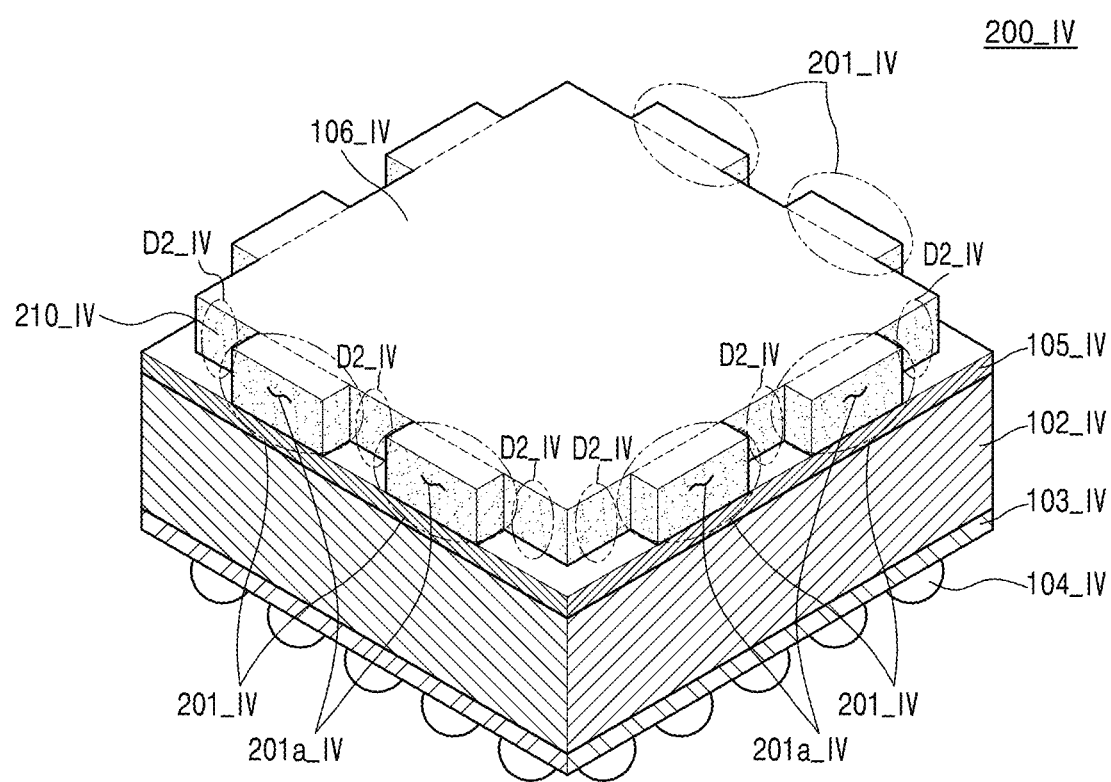
FIG. 57 is a perspective view of a semiconductor package according to an embodiment of the present disclosure.

FIG. 57 is a diagram of a semiconductor package 200_IV according to an embodiment of the present disclosure. The semiconductor package 200_IV may include a semiconductor chip 101_IV, a sealing material 102_IV, a redistribution layer 103_IV, an external connection terminal 104_IV, an adhesive film 105_IV, and a heat sink 106_IV. Technical characteristics of the semiconductor chip 101_IV, the sealing material 102_IV, the redistribution layer 103_IV, the external connection terminal 104_IV, the adhesive film 105_IV, and the heat sink 106_IV may be substantially the same as those described with reference to FIGS. 51 to 53, and thus, detailed descriptions thereof will be omitted.

In an embodiment, the semiconductor package 200_IV may further include a protrusion 201_IV, which extends from a side surface of the heat sink 106_IV to a side surface of the semiconductor package 200_IV. The protrusion 201_IV may be a portion of a connection region S_IV, which is left after cutting the connection region S_IV of a heat sink group 250_IV (e.g., see FIG. 58) to be described below, through the singulation process on the semiconductor package 200_IV.

In an embodiment, an upper surface of the protrusion 201_IV may have the same height as an upper surface of the heat sink 106_IV. Also, an outer side surface 201a_IV of the protrusion 201_IV may be self-aligned to the side surface of the semiconductor package 200_IV. In addition, the protrusion 201_IV may be integrated with the heat sink 106_IV.

In an embodiment, the plurality of protrusions 201_IV may be formed to extend from one side surface of the heat sink 106_IV to one side surface of the semiconductor package 200_IV. For example, as shown in FIG. 57, a pair of protrusion 201_IV may be formed to extend from the one side surface of the heat sink 106_IV to the one side surface of the semiconductor package 200_IV. However, the number of protrusions 201_IV, which are formed to extend from the one side surface of the heat sink 106_IV to the one side surface of the semiconductor package 200_IV, is not limited thereto and may be variously changed.

In an embodiment, when a plurality of protrusions 201_IV are formed to extend from the one side surface of the heat sink 106_IV to the one side surface of the semiconductor package 200_IV, a stepped portion D2_IV may be formed between the plurality of protrusions 201_IV due to a height difference between the upper surface of the heat sink 106_IV and the upper surface of the adhesive film 105_IV. The number of stepped portions D2_IV formed at the one side surface of the heat sink 106_IV may vary according to the number of projections 201_IV formed at the one side surface of the heat sink 106_IV. For example, referring to FIG. 57, when two protrusions 201_IV are formed at the one side surface of the heat sink 106_IV, three stepped portions D2_IV may be formed at the one side surface of the heat sink 106_IV.

In an embodiment, one protrusion 201_IV may be formed to extend from the one side surface of the heat sink 106_IV to the one side surface of the semiconductor package 200_IV. When one protrusion 201_IV is formed at the one side surface of the heat sink 106_IV, two stepped portions D2_IV may be formed at the one side surface of the heat sink 106_IV.

In an embodiment, a material of the protrusion 201_IV may be different from a material of the heat sink 106_IV. For example, the material of the protrusion 201_IV may have a lower stiffness than the material of the heat sink 106_IV. In an embodiment, the protrusion 201_IV may include a metal-based material, a ceramic-based material, a carbon-based material, and a polymer-based material. Accordingly, the cutting of the connection region S_IV may be easily performed in a singulation process on the semiconductor package 200_IV, which will be described below.

Figure 58:
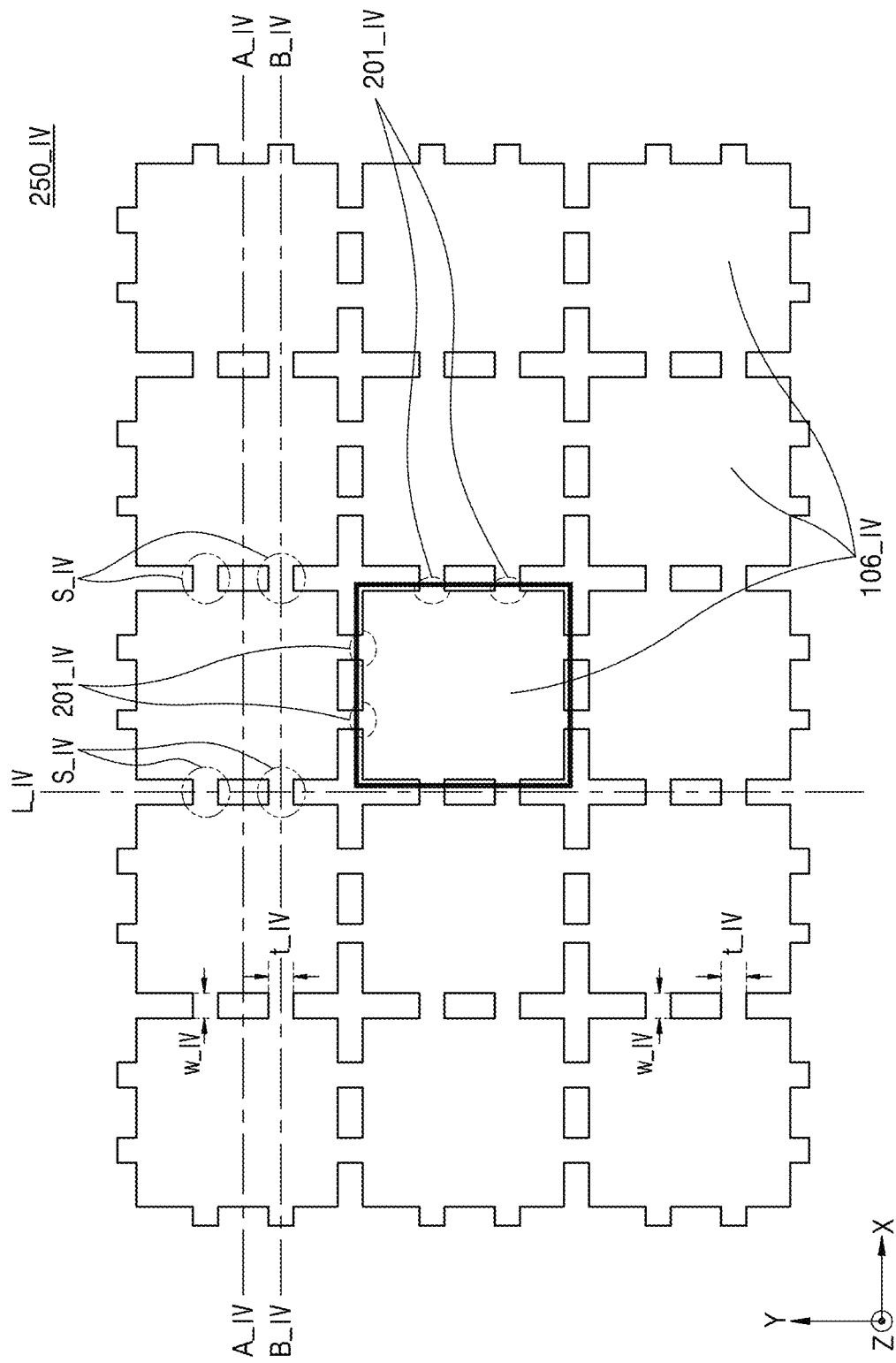
FIG. 58 is a plan view of a heat sink group in which a plurality of heat sinks are connected to each other, according to an embodiment of the present disclosure.
Figure 59:
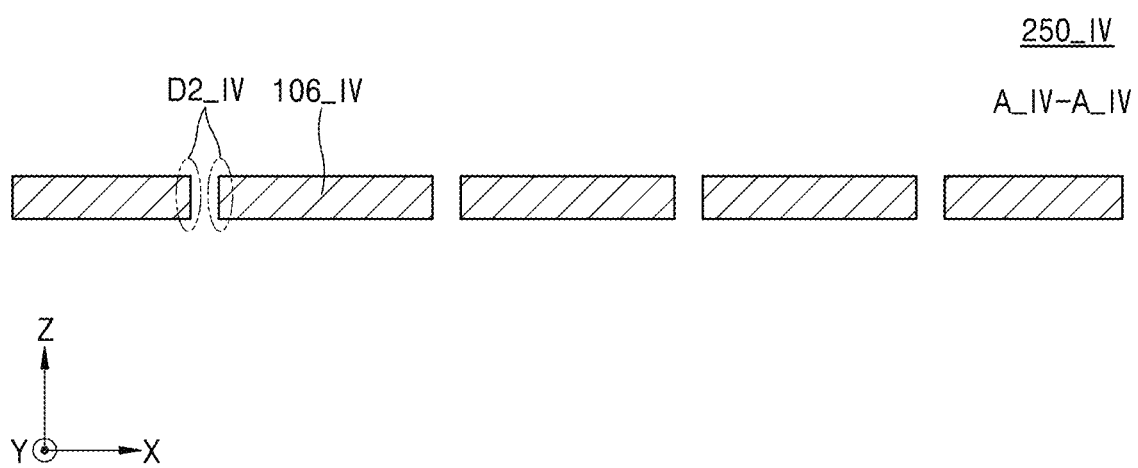
FIG. 59 is a cross-sectional view taken along line A_IV-A_IV of FIG. 58, illustrating a heat sink group according to an embodiment of the present disclosure.
Figure 60:
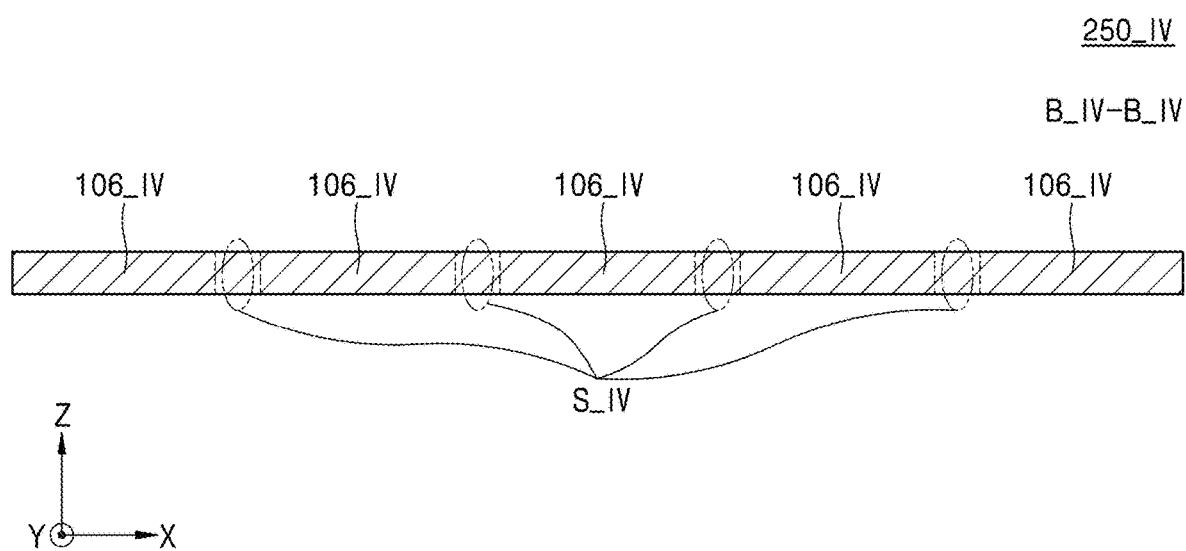
FIG. 60 is a cross-sectional view taken along line B_IV-B_IV of FIG. 58, illustrating a heat sink group according to an embodiment of the present disclosure.

FIG. 58 is a plan view of a heat sink group 250_IV in which the plurality of heat sinks 106_IV are connected to each other, according to an embodiment of the present disclosure. FIG. 59 is a cross-sectional view taken along line A_IV-A_IV of FIG. 58, illustrating the heat sink group 250_IV according to an embodiment of the present disclosure. FIG. 60 is a cross-sectional view taken along line B_IV-B_IV of FIG. 58, illustrating the heat sink group 250_IV according to an embodiment of the present disclosure.

Referring to FIGS. 58 to 60, heat sinks 106_IV may be connected to other heat sinks 106_IV by connection regions S_IV to form a heat sink group 250_IV. More specifically, the heat sink 106_IV may be connected to the other heat sinks 106_IV by the connection regions S_IV in four directions of side surfaces of the heat sink 106_IV to form the heat sink group 250_IV.

In an embodiment, the connection region S_IV may have a first length w_IV, which is a length value obtained in a first direction X, and a second length t_IV, which is a length value obtained in a second direction Y perpendicular to the first direction X. The first length w_IV and the second length t_IV may be determined as various values.

In an embodiment, before a plurality of semiconductor packages 200_IV is cut into individual semiconductor package 200_IV, the heat sink group 250_IV may be fixedly located on an upper surface of the adhesive film 105_IV of the plurality of semiconductor packages 200_IV. The heat sinks 106_IV may form the heat sink group 250_IV due to the connection region S_IV, and thus, the heat sink group 250_IV may be easily arranged and mounted on upper surfaces of the semiconductor packages 200_IV. After the heat sink group 250_IV is located on the adhesive film 105_IV, heat and pressure may be applied to the adhesive film 105_IV. The adhesive film 105_IV may stably fix the heat sink group 250_IV over the plurality of semiconductor packages 200_IV.

In an embodiment, when the heat sink group 250_IV is stably mounted on the plurality of semiconductor packages 200_IV, the plurality of semiconductor packages 200_IV may be cut into individual semiconductor packages 200_IV through a cutting process. Referring to FIG. 58, a cutting line L_IV may be formed on the plurality of connection regions S_IV. The cutting line L_IV may be formed on the connection region S_IV having the first length w_IV and the second length t_IV. Thus, as the first length w_IV and the second length t_IV of the connection region S_IV are reduced, the cutting process of cutting the plurality of semiconductor packages 200_IV on which the heat sink group 250_IV is mounted, into the individual semiconductor packages 200_IV may be further facilitated.

In addition, because it is possible to integrally handle the heat sink group 250_IV, an embodiment of the present disclosure may facilitate processes of processing, delivering, and cutting the heat sink group 250_IV.

Figure 61:
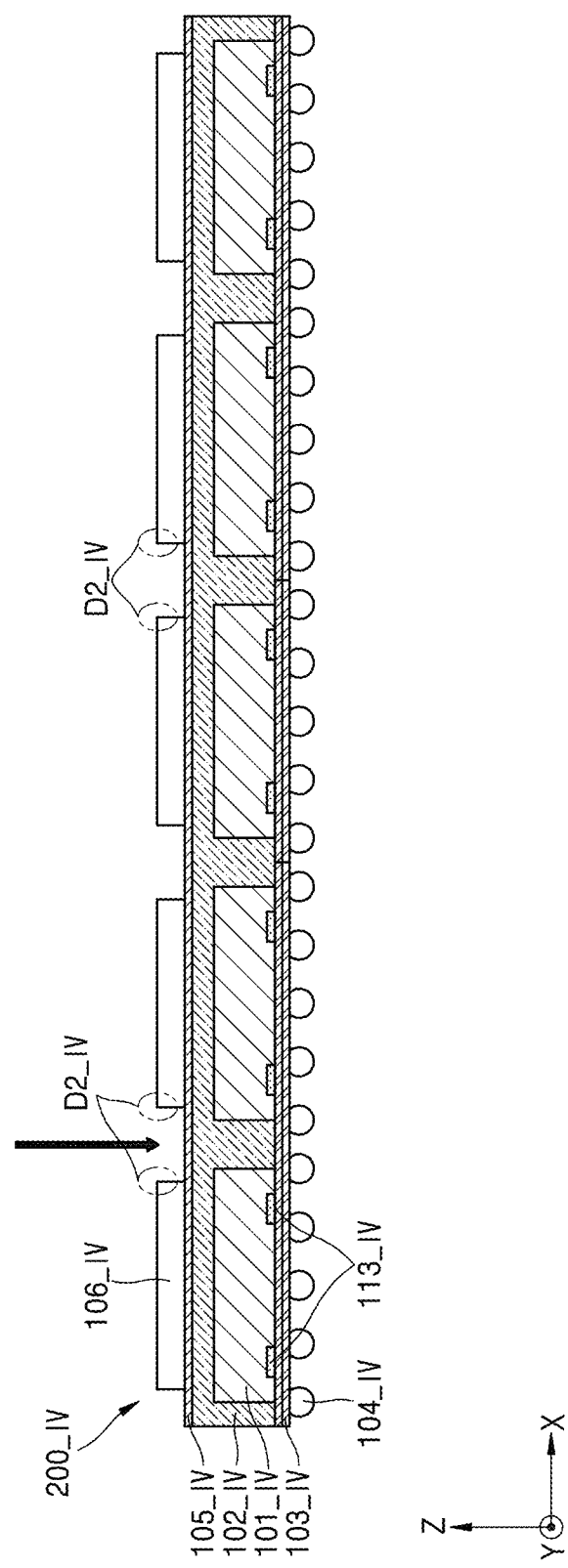
FIG. 61 is a cross-sectional view taken along line A_IV-A_IV of FIG. 58, illustrating a plurality of semiconductor packages on which a heat sink group according to an embodiment of the present disclosure is mounted.
Figure 62:
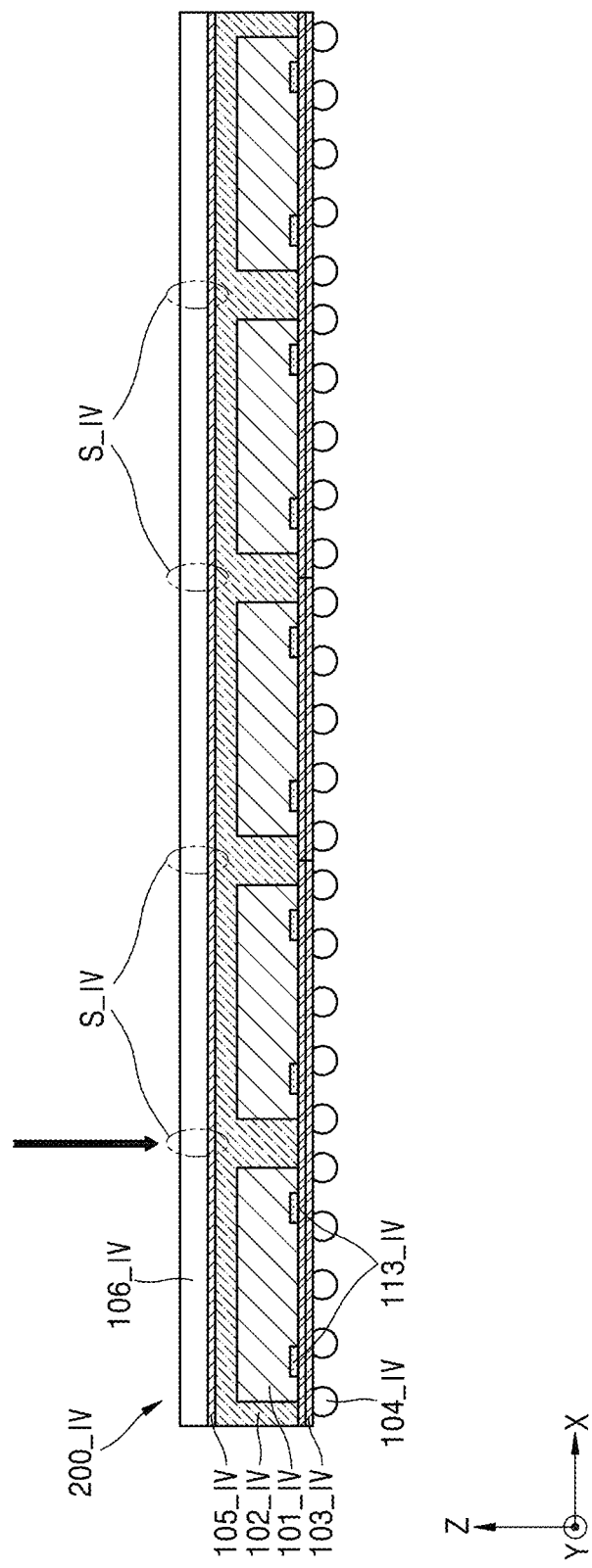
FIG. 62 is a cross-sectional view taken along line B_IV-B_IV of FIG. 58, illustrating a plurality of semiconductor packages on which a heat sink group according to an embodiment of the present disclosure is mounted.

FIG. 61 is a cross-sectional view taken along line A_IV-A_IV of FIG. 58, illustrating the plurality of semiconductor packages 200_IV on which the heat sink group 250_IV is mounted, according to an embodiment of the present disclosure. FIG. 62 is a cross-sectional view taken along line B_IV-B_IV of FIG. 58, illustrating the plurality of semiconductor packages 200_IV on which the heat sink group 250_IV is mounted, according to an embodiment of the present disclosure.

Referring to FIG. 61, in a portion (i.e., a space between the connection regions S_IV) where the connection region S_IV is not formed, a stepped portion D2_IV may be formed due to a height difference between an upper surface of the heat sink 106_IV and an upper surface of the adhesive film 105_IV.

Referring to FIG. 62, the stepped portion D2_IV may not be formed in the portion where the connection region S_IV is formed.

Referring to FIG. 61, the cutting process on the semiconductor packages 200_IV may include sequentially cutting the adhesive film 105_IV, the sealing material 102_IV, and the redistribution layer 103_IV in the portion where the connection region S_IV is not formed. In addition, referring to FIG. 62, the cutting process on the semiconductor packages 200_IV may include sequentially cutting the connection region S_IV, the adhesive film 105_IV, the sealing material 102_IV, and the redistribution layer 103_IV in the portion where the connection region S_IV is formed. As described above, when the material of the connection region S_IV has a lower stiffness than the material of the heat sink 106_IV, the cutting process may be easily performed. Furthermore, the first length w_IV and the second length t_IV of the connection region S_IV may be minimized to facilitate the cutting process.

Figure 63:
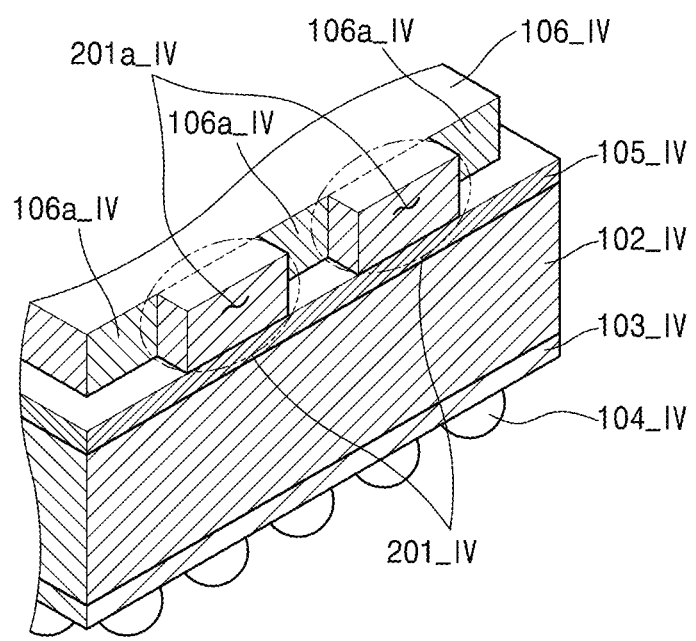
FIG. 63 is an enlarged diagram of one side surface of a semiconductor package according to an embodiment of the present disclosure.

FIG. 63 is an enlarged diagram of one side surface of the semiconductor package 200_IV according to an embodiment of the present disclosure. Referring to FIG. 63, an outer side surface 201a_IV of the protrusion 201_IV of the semiconductor package 200_IV, a side surface of the adhesive film 105_IV, a side surface of the sealing material 102_IV, and a side surface of the redistribution layer 103_IV may be surfaces of the semiconductor package 200_IV that are cut by the cutting process. Thus, the outer side surface 201a_IV of the protrusion 201_IV, the side surface of the adhesive film 105_IV, the side surface of the sealing material 102_IV, and the side surface of the redistribution layer 103_IV may have substantially the same grain. The term "grain" may refer to a surface pattern or surface roughness.

In an embodiment, a side surface 106a_IV of the heat sink 106_IV of the semiconductor package 200_IV may be a surface that is not cut by the cutting process. Thus, grain of the side surface 106a_IV of the heat sink 106_IV may be different from grain of the outer side surface 201a_IV of the protrusion 201_IV, the side surface of the adhesive film 105_IV, the side surface of the sealing material 102_IV, and the side surface of the redistribution layer 103_IV.

Figure 64:
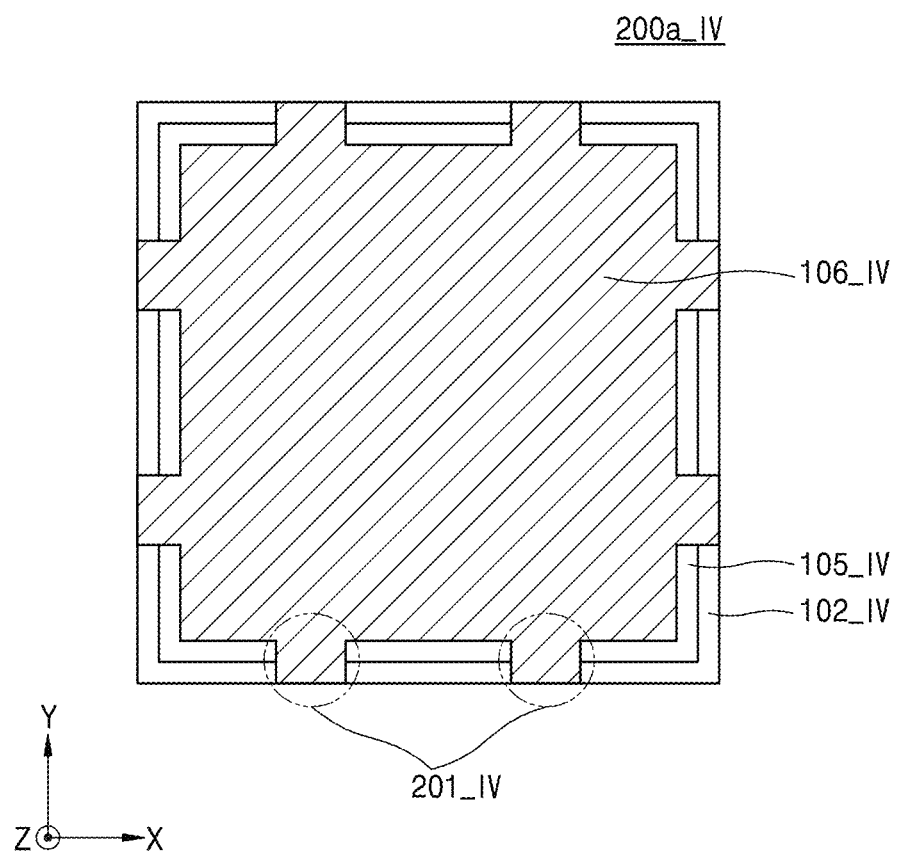
FIG. 64 is a plan view of a semiconductor package according to an embodiment of the present disclosure.

FIG. 64 is a plan view of a semiconductor package 200a_IV according to an embodiment of the present disclosure. The semiconductor package 200a_IV may include a semiconductor chip 101_IV, a sealing material 102_IV, a redistribution layer 103_IV, an external connection terminal 104_IV, an adhesive film 105_IV, and a heat sink 106_IV. Technical characteristics of the semiconductor chip 101_IV, the sealing material 102_IV, the redistribution layer 103_IV, the external connection terminal 104_IV, the adhesive film 105_IV, and the heat sink 106_IV may be substantially the same as those described with reference to FIGS. 51 to 53, and thus, detailed descriptions thereof will be omitted.

Referring to FIG. 64, a footprint of the adhesive film 105_IV may be less than a footprint of the semiconductor package 200a_IV. In addition, the footprint of the adhesive film 105_IV may be less than a footprint of the sealing material 102_IV. As shown in FIG. 64, the footprint of the adhesive film 105_IV may be greater than a footprint of the heat sink 106_IV and may be less than the footprint of the sealing material 102_IV.

In an embodiment, when the semiconductor package 200a_IV is viewed from above, at least one of the adhesive film 105_IV and the sealing material 102_IV may be exposed to the outside and observed. For example, as shown in FIG. 64, when the footprint of the adhesive film 105_IV is greater than the footprint of the heat sink 106_IV and is less than the footprint of the sealing material 102_IV, both the adhesive film 105_IV and the sealing material 102_IV may be exposed to the outside, when the semiconductor package 200a_IV is viewed from above.

However, the present disclosure is not limited to the above description. As shown in FIG. 57, when the footprint of the adhesive film 105_IV is greater than the footprint of the heat sink 106_IV and is substantially equal to the footprint of the sealing material 102_IV, the sealing material 102_IV may not be exposed to the outside, and only the adhesive film 105_IV may be exposed to the outside, when the semiconductor package 200_IV is viewed from above.

In an embodiment, when each of the semiconductor packages 200_IV and 200a_IV is viewed from above, a sum of exposed areas of the adhesive film 105_IV and the sealing material 102_IV may be about 5% to about 40% of an area of an upper surface of each of the semiconductor packages 200_IV and 200a_IV.

Figure 65:
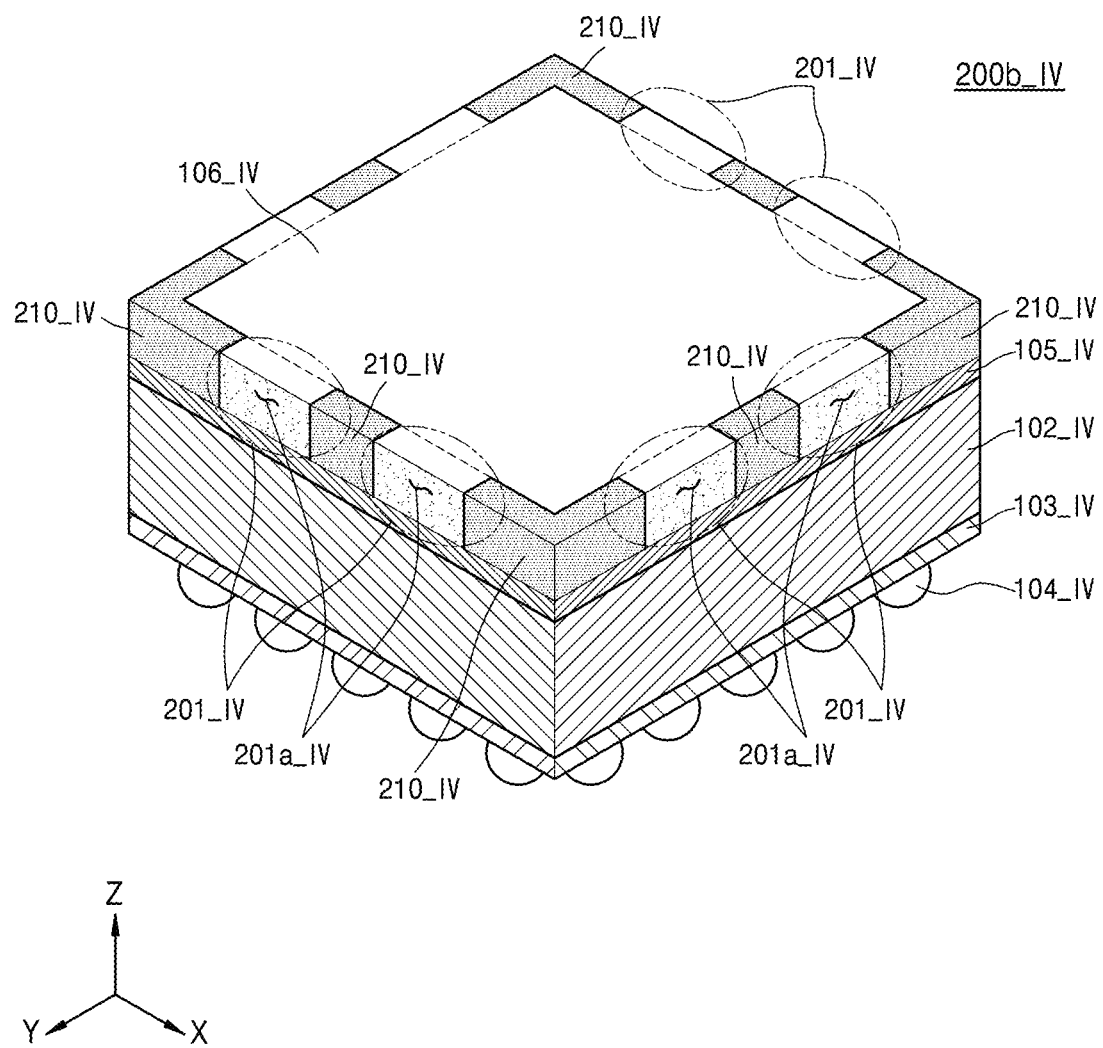
FIGS. 65 and 66 are perspective views of a semiconductor package according to an embodiment of the present disclosure.
Figure 66:
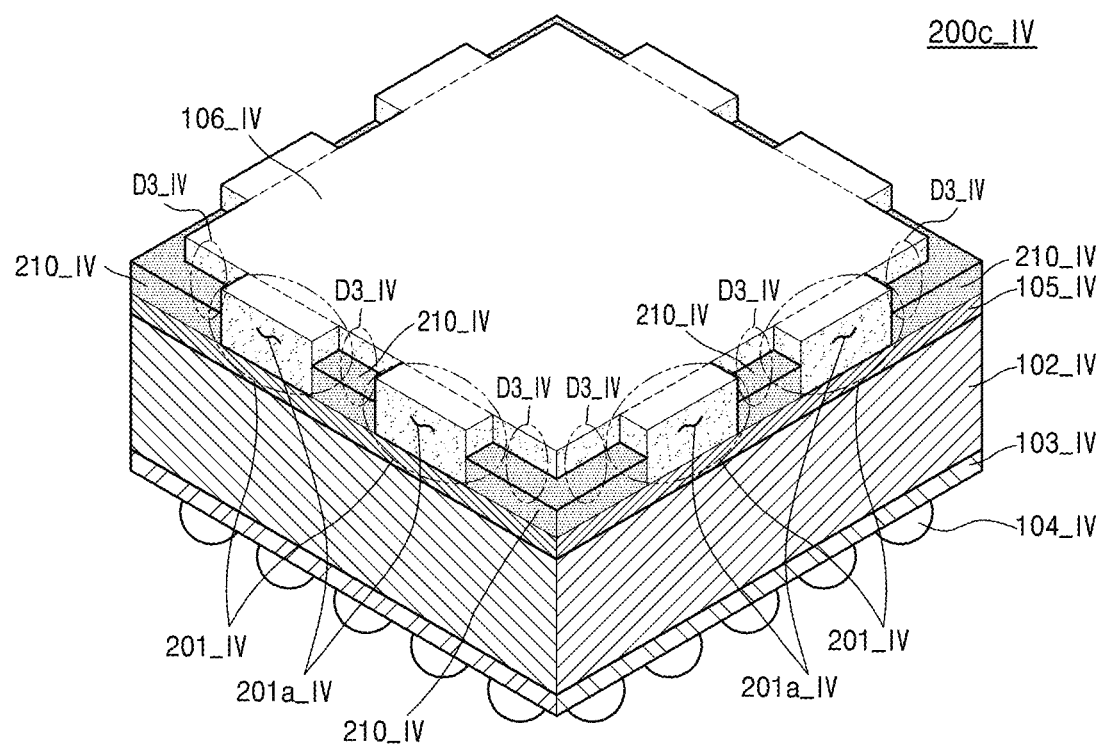

FIGS. 65 and 66 are perspective views of semiconductor packages 200b_IV and 200c_IV according to an embodiment of the present disclosure. Each of the semiconductor packages 200b_IV and 200c_IV may include a semiconductor chip 101_IV, a sealing material 102_IV, a redistribution layer 103_IV, an external connection terminal 104_IV, an adhesive film 105_IV, and a heat sink 106_IV. Technical characteristics of the semiconductor chip 101_IV, the sealing material 102_IV, the redistribution layer 103_IV, the external connection terminal 104_IV, the adhesive film 105_IV, and the heat sink 106_IV may be substantially the same as those described with reference to FIGS. 51 to 53, and thus, detailed descriptions thereof will be omitted.

Referring to FIGS. 65 and 66, each of the semiconductor packages 200b_IV and 200c_IV may further include a heat-dissipation molding unit 210_IV, which is located on the sealing material 102_IV and surrounds the heat sink 106_IV to cover at least a portion of a side surface of the heat sink 106_IV and expose an upper surface of the heat sink 106_IV to the outside. The heat-dissipation molding unit 210_IV may firmly fix the heat sink 106_IV onto the sealing material 102_IV and concentrate heat generated by the semiconductor chip 101_IV into a center region of the heat sink 106_IV, Thus, a heat dissipation effect of the semiconductor packages 200b_IV and 200c_IV may be improved.

In an embodiment, the heat-dissipation molding unit 107_IV may include various materials, such as a metal-based material, a ceramic-based material, a carbon-based material, and a polymer-based material. As an embodiment, the heat-dissipation molding unit 210_IV may be an EMC.

In an embodiment, an outer side surface of the heat-dissipation molding unit 210_IV may be self-aligned to a side surface of each of the semiconductor packages 200b_IV and 200c_IV. In addition, when each of the semiconductor packages 200b_IV and 200c_IV is viewed from above, a sum of footprints of the heat-dissipation molding unit 210_IV, the heat sink 106_IV, and the protrusion 201_IV in each of the semiconductor packages 200b_IV and 200c_IV may be substantially equal to the footprint of each of the semiconductor packages 200b_IV and 200c_IV.

Referring to FIG. 65, the heat-dissipation molding unit 210_IV of the semiconductor package 200b_IV may cover the entire side surface of the heat sink 106_IV. Accordingly, the side surface of the heat sink 106_IV may not be exposed to the outside. In addition, the heat-dissipation molding unit 210_IV may entirely cover an inner side surface of the protrusion 201_IV and expose an outer side surface 201a_IV to the outside. The heat-dissipation molding unit 210_IV may have substantially the same height as the heat sink 106_IV and the protrusion 201_IV. In other words, an upper surface of the heat-dissipation molding unit 210_IV may be self-aligned to an upper surface of the heat sink 106_IV and an upper surface of the protrusion 201_IV.

Referring to FIG. 66, the heat-dissipation molding unit 210_IV of the semiconductor package 200c_IV may cover only a portion of the side surface of the heat sink 106_IV. Accordingly, a portion of the side surface of the heat sink 106_IV may be exposed to the outside. In addition, the heat-dissipation molding unit 210_IV may cover only a portion of the inner side surface of the protrusion 201_IV, and the outer side surface 201a_IV may be exposed to the outside. The height of the heat-dissipation molding unit 210_IV may be less than the height of the heat sink 106_IV and the protrusion 201_IV. Thus, a stepped portion D3_IV may be formed between the upper surface of the heat sink 106_IV and the upper surface of the heat-dissipation molding unit 210_IV.

Figure 67:
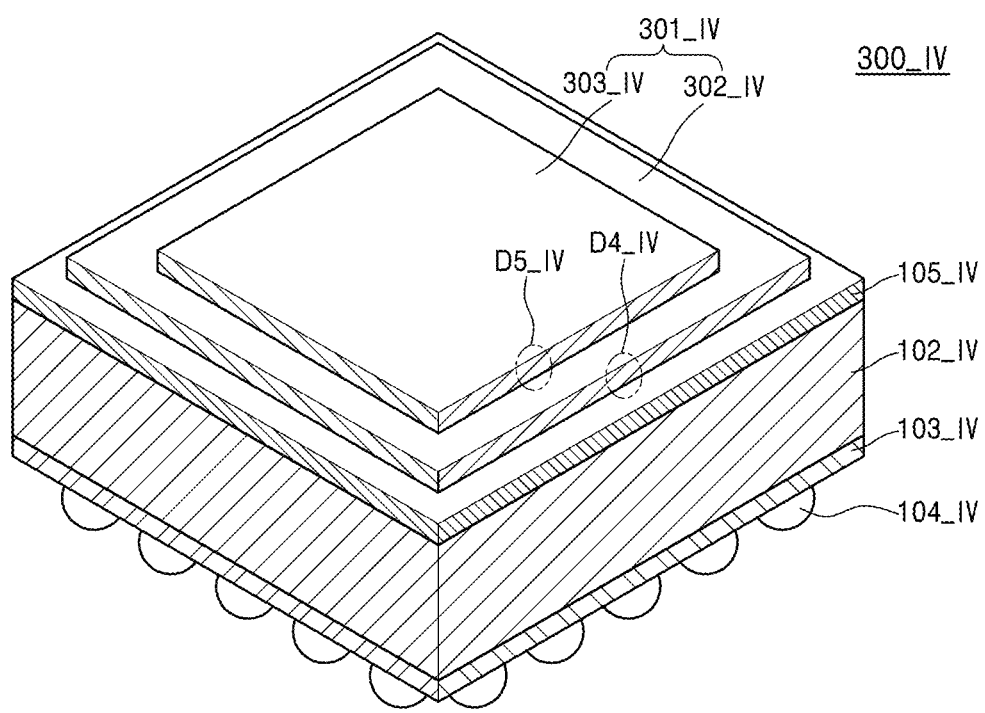
FIG. 67 is a perspective view of a semiconductor package according to an embodiment of the present disclosure.

FIG. 67 is a perspective view of a semiconductor package 300_IV according to an embodiment of the present disclosure. The semiconductor package 300_IV may include a semiconductor chip 101_IV, a sealing material 102_IV, a redistribution layer 103_IV, an external connection terminal 104_IV, and an adhesive film 105_IV. Technical characteristics of the semiconductor chip 101_IV, the sealing material 102_IV, the redistribution layer 103_IV, the external connection terminal 104_IV, and the adhesive film 105_IV may be substantially the same as those described with reference to FIGS. 51 to 53, and thus, detailed descriptions thereof will be omitted.

In an embodiment, the semiconductor package 300_IV may further include a heat sink 301_IV. As shown in FIG. 67, the heat sink 301_IV may include a first heat dissipation layer 302_IV and a second heat dissipation layer 303_IV on the first heat dissipation layer 302_IV. The footprint of the second heat dissipation layer 303_IV may be less than the footprint of the first heat dissipation layer 302_IV. Due to the difference in footprint between the first heat dissipation layer 302_IV and the second heat dissipation layer 303_IV and the height of the second heat dissipation layer 303_IV, the heat sink 301_IV may have a shape of an inverted letter "T".

In an embodiment, the first heat dissipation layer 302_IV and the second heat dissipation layer 303_IV may include substantially the same material. More specifically, the first heat dissipation layer 302_IV and the second heat dissipation layer 303_IV, which include the same material, may be bonded to and integrated with each other.

In an embodiment, the materials of the first heat dissipation layer 302_IV and the second heat dissipation layer 303_IV may be different from each other. For example, the material of the first heat dissipation layer 302_IV may include a metal having higher thermal conductivity than the material of the second heat dissipation layer 303_IV. However, the present disclosure is not limited to the above description, and the material of the second heat dissipation layer 303_IV may include a metal having higher thermal conductivity than the material of the first heat dissipation layer 302_IV.

In an embodiment, the first heat dissipation layer 302_IV and the second heat dissipation layer 303_IV may have substantially the same thickness. However, the present disclosure is not limited to the above description, and the first heat dissipation layer 302_IV and the second heat dissipation layer 303_IV may have different thicknesses. A sum of the thicknesses of the first heat dissipation layer 302_IV and the second heat dissipation layer 303_IV may be in a range of about 280 µm to about 560 µm and may be about 25% to about 40% of a total thickness of the semiconductor package.

Referring to FIG. 67, the footprint of the first heat dissipation layer 302_IV may be less than the footprint of the adhesive film 105_IV, and the footprint of the second heat dissipation layer 303_IV may be less than the footprint of the first heat dissipation layer 302_IV. Thus, the semiconductor package 300_IV may include a stepped portion D4_IV, which is formed due to a height difference between an upper surface of the first heat dissipation layer 302_IV and an upper surface of the adhesive film 105_IV. In addition, the semiconductor package 300_IV may include a stepped portion D5_IV, which is formed due to a height difference between an upper surface of the second heat dissipation layer 303_IV and the upper surface of the first heat dissipation layer 302_IV.

Figure 68:
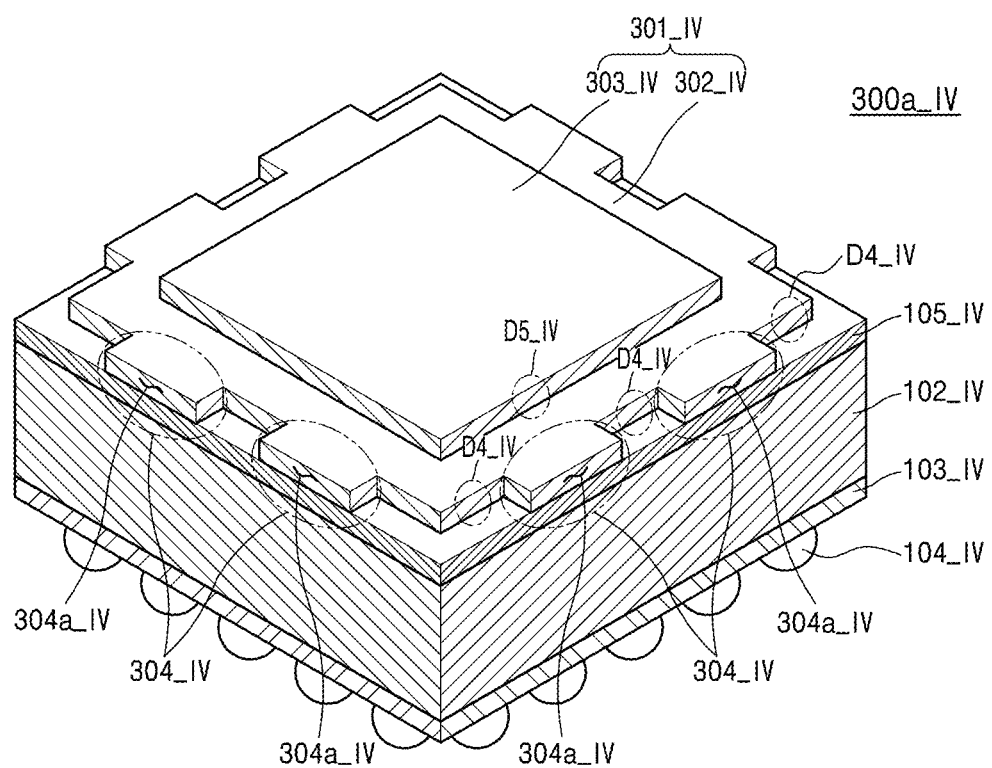
FIG. 68 is a perspective view of a semiconductor package according to an embodiment of the present disclosure.

FIG. 68 is a perspective view of a semiconductor package 300a_IV according to an embodiment of the present disclosure. The semiconductor package 300a_IV may include a semiconductor chip 101_IV, a sealing material 102_IV, a redistribution layer 103_IV, an external connection terminal 104_IV, an adhesive film 105_IV, a first heat dissipation layer 302_IV, and a second heat dissipation layer 303_IV. Technical characteristics of the semiconductor chip 101_IV, the sealing material 102_IV, the redistribution layer 103_IV, the external connection terminal 104_IV, the adhesive film 105_IV, the first heat dissipation layer 302_IV, and the second heat dissipation layer 303_IV may be substantially the same as those described with reference to FIGS. 51 to 53 and 67, and thus, detailed descriptions thereof will be omitted.

In an embodiment, the semiconductor package 300a_IV may further include a protrusion 304_IV, which extends from a side surface of the first heat dissipation layer 302_IV of the heat sink 301_IV to a side surface of the semiconductor package 300a_IV. The protrusion 304_IV may be a portion of the connection region S_IV, which is left after cutting the connection region S_IV of a heat sink group 350_IV (e.g., see FIG. 69) to be described below, through the singulation process on the semiconductor package 300a_IV.

In an embodiment, an upper surface of the protrusion 304_IV may have the same height as an upper surface of the first heat dissipation layer 302_IV. Also, an outer side surface 304a_IV of the protrusion 304_IV may be self-aligned to the side surface of the semiconductor package 300a_IV.

In an embodiment, the plurality of protrusions 304_IV may be formed to extend from one side surface of the first heat dissipation layer 302_IV to one side surface of the semiconductor package 300a_IV. For example, as shown in FIG. 68, a pair of protrusion 304_IV may be formed to extend from the one side surface of the first heat dissipation layer 302_IV to the one side surface of the semiconductor package 300a_IV. However, the number of protrusions 304_IV, which are formed to extend from the one side surface of the first heat dissipation layer 302_IV to the one side surface of the semiconductor package 300a_IV, is not limited thereto and may be variously changed.

Other technical characteristics of the protrusion 304_IV of the semiconductor package 300a_IV illustrated in FIG. 68 may be substantially the same as those of the protrusion 201_IV of the semiconductor package 200_IV described with reference to FIG. 57, and thus, detailed descriptions thereof will be omitted.

Referring to FIG. 68, the semiconductor package 300a_IV may include a stepped portion D4_IV, which is formed due to a height difference between the upper surface of the first heat dissipation layer 302_IV and the upper surface of the adhesive film 105_IV, and may include a stepped portion D5_IV, which is formed due to a height difference between the upper surface of the second heat dissipation layer 303_IV and the upper surface of the first heat dissipation layer 302_IV.

The height of the stepped portion D4_IV, which is formed due to the height difference between the upper surface of the first heat dissipation layer 302_IV and the upper surface of the adhesive film 105_IV, may be substantially equal to the height of the first heat dissipation layer 302_IV, and the height of the stepped portion D5_IV, which is formed due to the height difference between the upper surface of the second heat dissipation layer 303_IV and the upper surface of the first heat dissipation layer 302_IV, may be substantially equal to the height of the second heat dissipation layer 303_IV.

The height of the stepped portion D4_IV, which is formed due to the height difference between the upper surface of the first heat dissipation layer 302_IV and the upper surface of the adhesive film 105_IV, may be less than the height of the stepped portion D5_IV, which is formed due to the height difference between the upper surface of the second heat dissipation layer 303_IV and the upper surface of the first heat dissipation layer 302_IV. In addition, the height of the protrusion 304_IV may be substantially equal to the height of the stepped portion D4_IV, which is formed due to the height difference between the upper surface of the first heat dissipation layer 302_IV and the upper surface of the adhesive film 105_IV. When the height of the protrusion 304_IV is reduced, external force required for a cutting process may be reduced in the singulation process on the semiconductor package 300a_IV. Thus, flexibility in the cutting process may be improved. However, the heights of the stepped portions D4_IV and D5_IV are not limited to the above-described examples and may have various height values. For example, the height of the stepped portion D4_IV, which is formed due to the height difference between the upper surface of the first heat dissipation layer 302_IV and the upper surface of the adhesive film 105_IV, may be greater than or equal to the height of the stepped portion D5_IV, which is formed due to the height difference between the upper surface of the second heat dissipation layer 303_IV and the upper surface of the first heat dissipation layer 302_IV.

Furthermore, a sum of the heights of the stepped portions D4_IV and D5_IV may be about 25% to about 40% of the total thickness of the semiconductor package 300a_IV. Thus, when the total thickness of the semiconductor package 300a_IV is about 1.1 mm to about 1.4 mm, the sum of the heights of the stepped portions D4_IV and D5_IV may be about 280 μm to about 560 μm.

Figure 69:
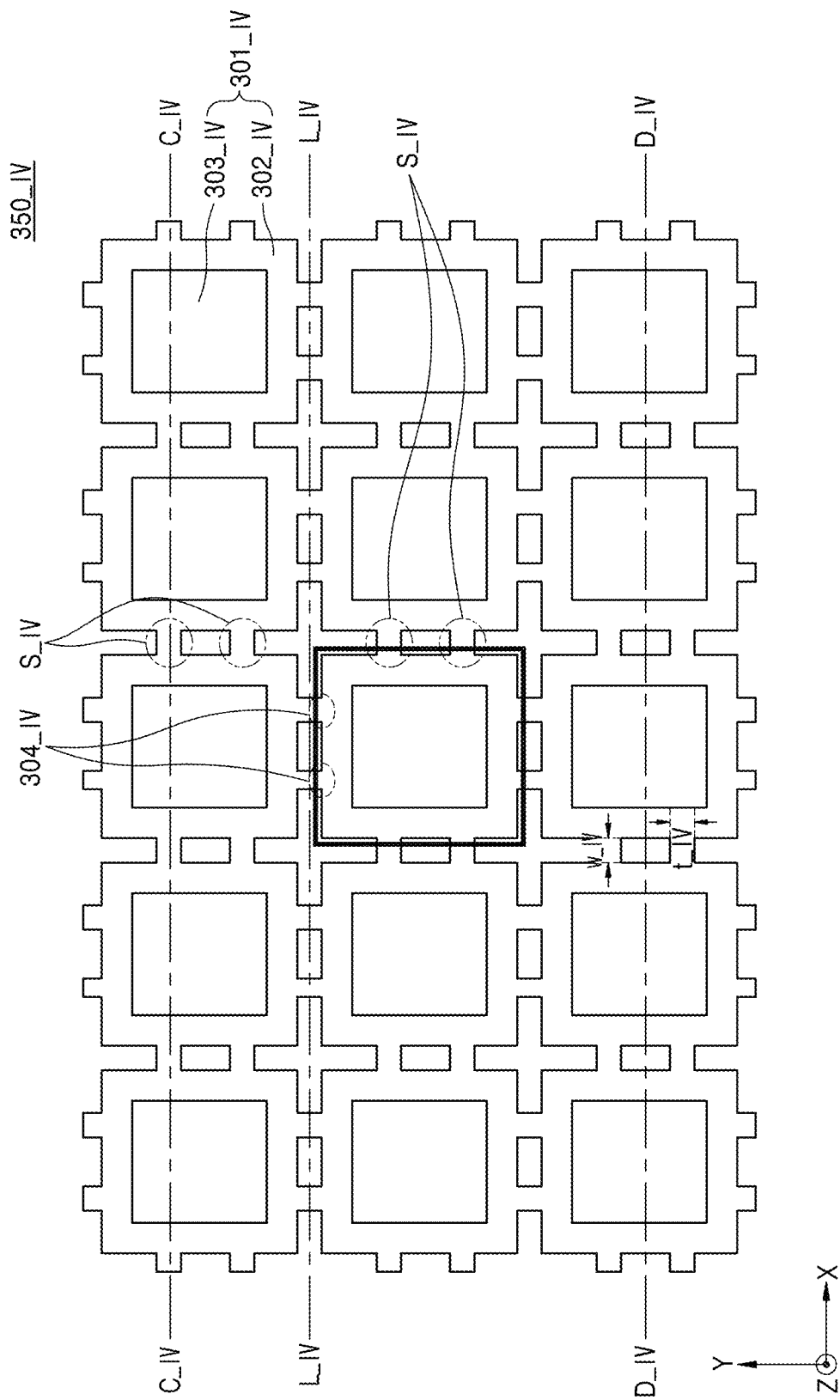
FIG. 69 is a plan view of a heat sink group in which a plurality of heat sinks are connected to each other, according to an embodiment of the present disclosure.

FIG. 69 is a plan view of the heat sink group 350_IV in which the plurality of heat sinks 301_IV are connected to each other, according to an embodiment of the present disclosure.

Referring to FIG. 69, the heat sinks 301_IV may be connected to other heat sinks 301_IV by connection regions S_IV to form a heat sink group 350_IV. More specifically, the heat sink 301_IV may be connected to the side surfaces of the first heat dissipation layers 302_IV of the other heat sinks 301_IV by the connection regions S_IV in four directions of the side surfaces of the first heat dissipation layer 302_IV to form the heat sink group 350_IV.

In an embodiment, the connection region S_IV may have a first length w_IV, which is a length value obtained in the first direction X, and a second length t_IV, which is a length value obtained in a second direction Y that is perpendicular to the first direction X. The first length w_IV and the second length t_IV may be determined as various values.

In an embodiment, before a plurality of semiconductor packages 300a_IV are cut into individual semiconductor packages 300a_IV, the heat sink group 350_IV may be fixedly located on upper surfaces of adhesive films 105_IV of the plurality of semiconductor packages 300a_IV. The heat sinks 301_IV may form the heat sink group 350_IV due to the connection regions S_IV, and thus, the heat sink group 350_IV may be easily arranged and mounted on the upper surfaces of the semiconductor packages 300a_IV. In addition, after the heat sink group 350_IV is located on the adhesive film 105_IV, heat and pressure may be applied to the adhesive film 105_IV. The adhesive film 105_IV may stably fix the heat sink group 350_IV over the plurality of semiconductor packages 300a_IV.

In an embodiment, when the heat sink group 350_IV is stably mounted on the plurality of semiconductor packages 300a_IV, the plurality of semiconductor packages 300a_IV may be cut into the individual semiconductor packages 300a_IV through a cutting process. The cutting line L_IV may be formed on the plurality of connection regions S_IV. The cutting line L_IV may be formed on the connection region S_IV having the first length w_IV and the second length t_IV. Thus, as the first length w_IV and the second length t_IV of the connection region S_IV are reduced, the cutting process of cutting the plurality of semiconductor packages 300a_IV on which the heat sink group 350_IV is mounted, into individual semiconductor packages 300a_IV may be further facilitated.

Furthermore, because the heat sink group 350_IV may be integrally handled, the embodiment in the present disclosure may facilitate processes of processing, delivering, and cutting the heat sink group 350_IV.

Figure 70:
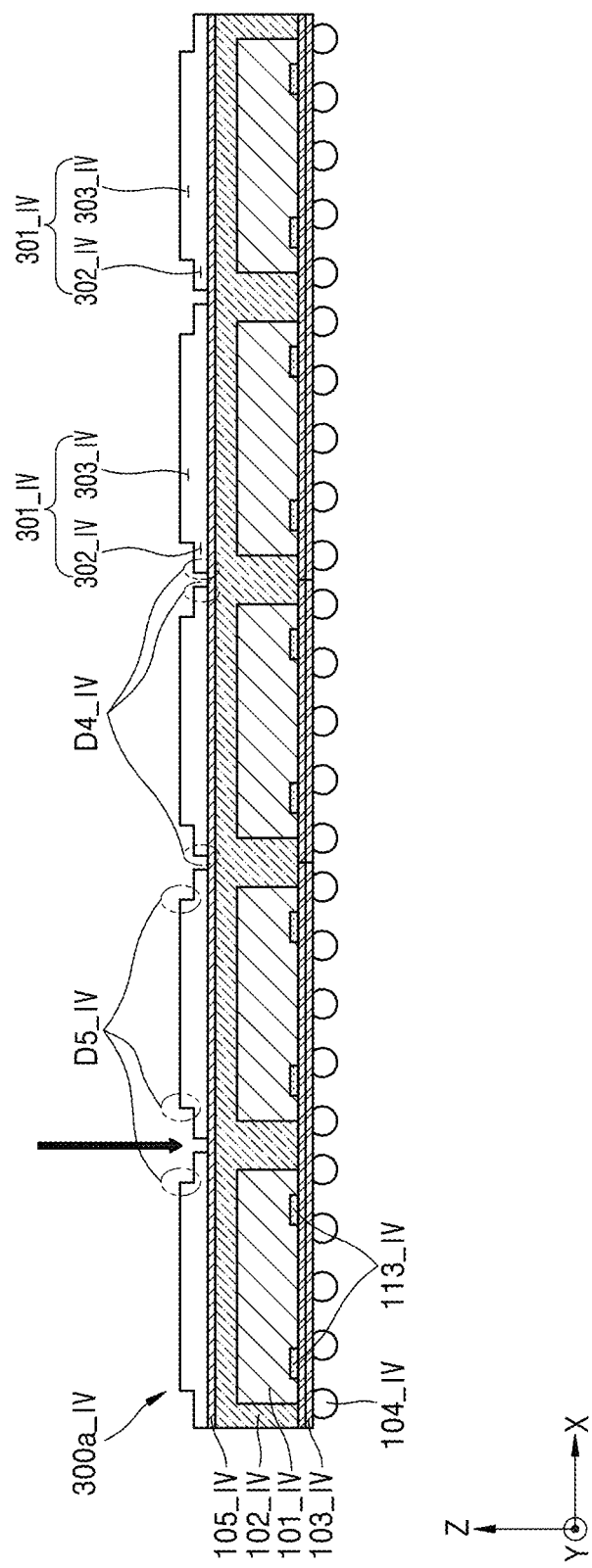
FIG. 70 is a cross-sectional view taken along line C_IV-C_IV of FIG. 69, illustrating a plurality of semiconductor packages on which a heat sink group according to an embodiment of the present disclosure is mounted.
Figure 71:
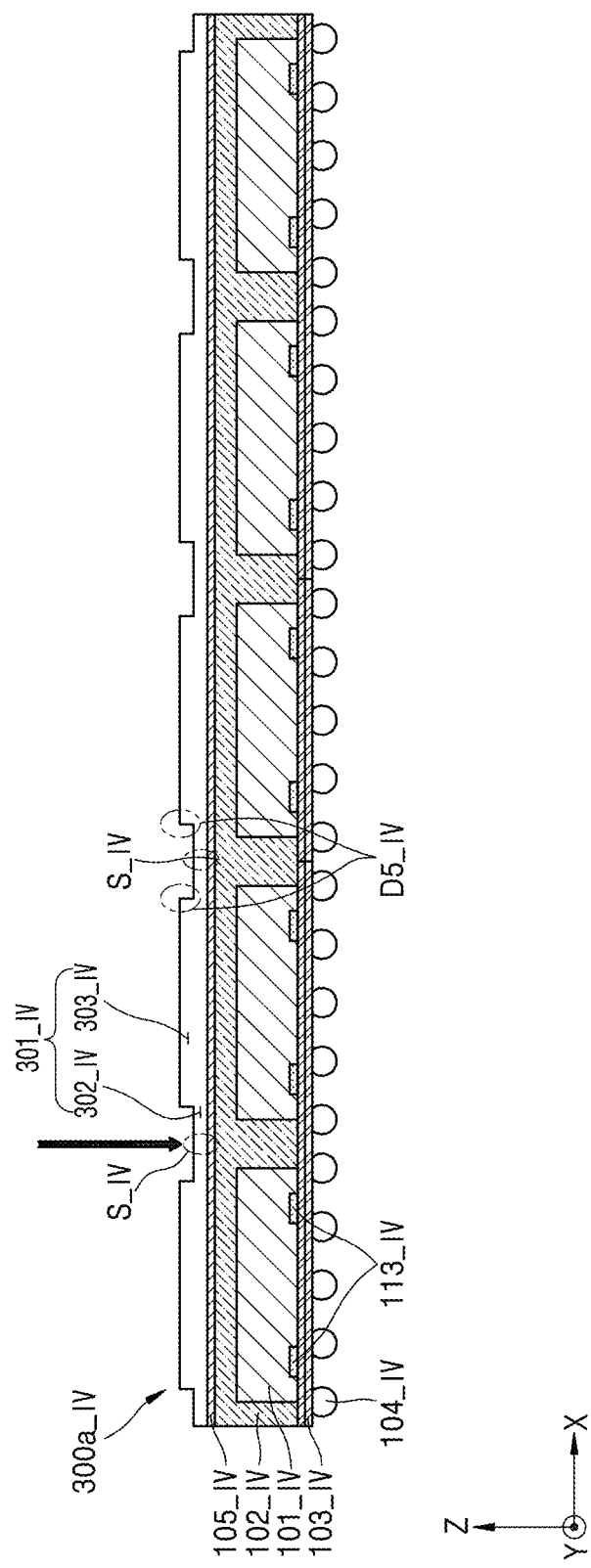
FIG. 71 is a cross-sectional view taken along line D_IV-D_IV of FIG. 69, illustrating a plurality of semiconductor packages on which a heat sink group according to an embodiment of the present disclosure is mounted.

FIG. 70 is a cross-sectional view taken along line C_IV-C_IV of FIG. 69, illustrating the plurality of semiconductor packages 300a_IV on which the heat sink group 350_IV according to an embodiment of the present disclosure is mounted. FIG. 71 is a cross-sectional view taken along line D_IV-D_IV of FIG. 69, illustrating the plurality of semiconductor packages 300a_IV on which the heat sink group 350_IV according to an embodiment of the present disclosure is mounted.

Referring to FIG. 70, in a portion where the connection region S_IV is not formed (i.e., a space between the connection regions S_IV), the semiconductor package 300a_IV may include a stepped portion D4_IV, which is formed due to the height difference between the upper surface of the first heat dissipation layer 302_IV and the upper surface of the adhesive film 105_IV, and include a stepped portion D5_IV, which is formed due to the height difference between the upper surface of the second heat dissipation layer 303_IV and the upper surface of the first heat dissipation layer 302_IV.

Referring to FIG. 71, in a portion where the connection region S_IV is formed, the semiconductor package 300a_IV may include only the stepped portion D5_IV, which is formed due to the height difference between the upper surface of the second heat dissipation layer 303_IV and the upper surface of the first heat dissipation layer 302_IV.

Referring to FIG. 70, in the portion where the connection region S_IV is not formed, the cutting process on the semiconductor packages 300a_IV may include a process of sequentially cutting the adhesive film 105_IV, the sealing material 102_IV, and the redistribution layer 103_IV. In addition, referring to FIG. 71, in the portion where the connection region S_IV is formed, the cutting process on the semiconductor packages 300a_IV may include a process of sequentially cutting the connection region S_IV, the adhesive film 105_IV, the sealing material 102_IV, and the redistribution layer 103_IV. As described above, when the material of the connection region S_IV has a lower stiffness than the material of the heat sink 301_IV, the cutting process may be easily performed. Because the materials of the sealing material 102_IV and the redistribution layer 103_IV include an EMC having a lower stiffness than the material of the connection region S_IV, cutting blades including a wide variety of materials may be chosen in the cutting process on the semiconductor package 300a_IV. In addition, the first length w_IV and the second length t_IV of the connection region S_IV may be minimized to facilitate the cutting process.

Figure 72:
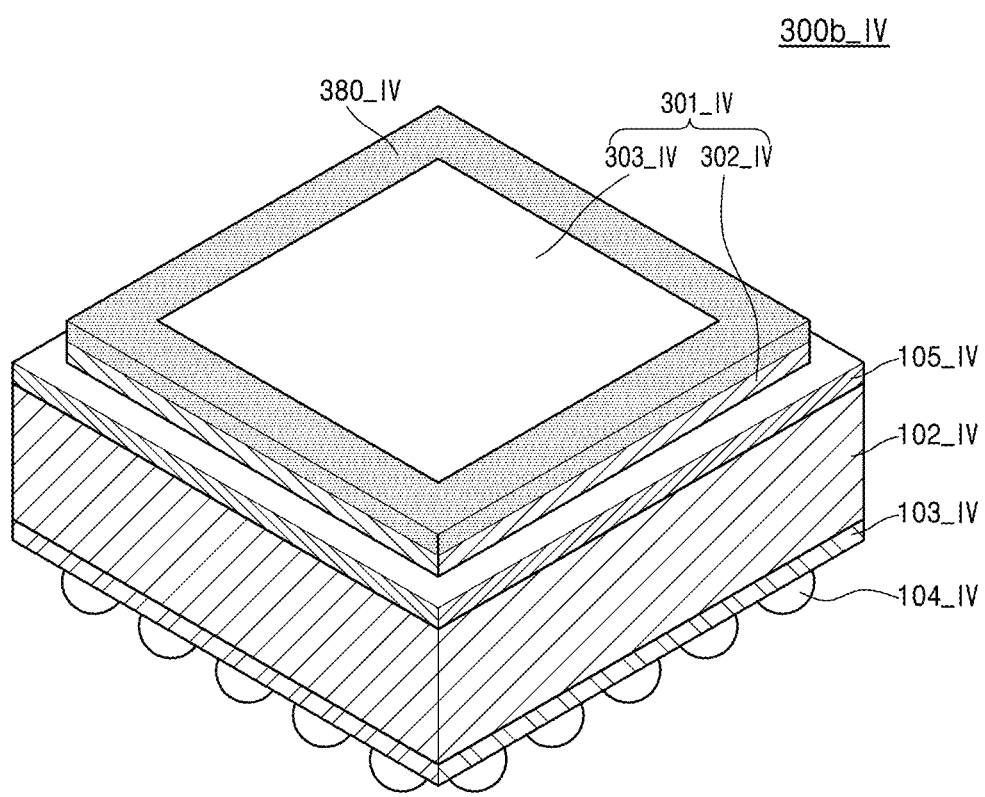
FIGS. 72 and 73 are perspective views of a semiconductor package according to an embodiment of the present disclosure.
Figure 73:
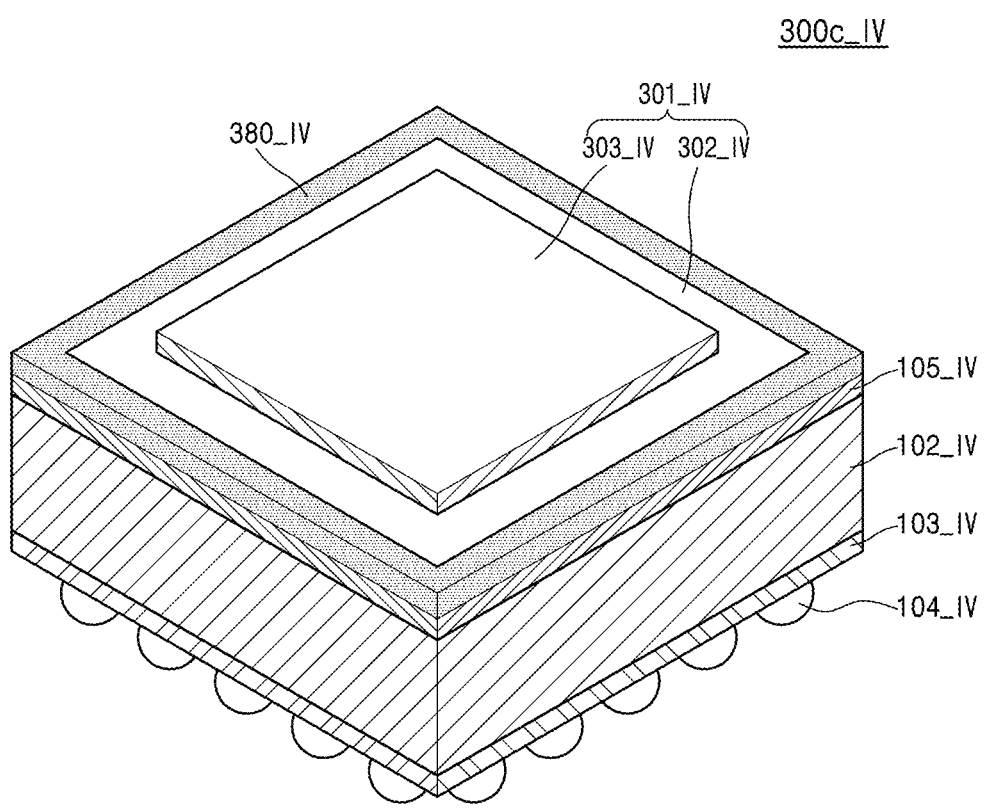

FIGS. 72 and 73 are perspective views of semiconductor packages 300b_IV and 300c_IV according to an embodiment of the present disclosure. Each of the semiconductor packages 300b_IV and 300c_IV may include a semiconductor chip 101_IV, a sealing material 102_IV, a redistribution layer 103_IV, an external connection terminal 104_IV, an adhesive film 105_IV, a first heat dissipation layer 302_IV, and a second heat dissipation layer 303_IV. Technical characteristics of the semiconductor chip 101_IV, the sealing material 102_IV, the redistribution layer 103_IV, the external connection terminal 104_IV, the adhesive film 105_IV, the first heat dissipation layer 302_IV, and the second heat dissipation layer 303_IV may be substantially the same as those described with reference to FIGS. 51 to 53 and 67, and thus, detailed descriptions thereof will be omitted.

In an embodiment, each of the semiconductor packages 300b_IV and 300c_IV may further include a heat-dissipation molding unit 380_IV, which surrounds the heat sink 301_IV to cover at least a portion of a side surface of the heat sink 301_IV and expose at least a portion of an upper surface of the heat sink 301_IV to the outside. The heat-dissipation molding unit 380_IV may firmly fix the heat sink 301_IV onto the sealing material 102_IV and concentrate heat generated by the semiconductor chip 101_IV into a center portion of the heat sink 301_IV. Thus, a heat dissipation effect of the semiconductor packages 300b_IV and 300c_IV may be improved.

Referring to FIG. 72, the heat-dissipation molding unit 380_IV of the semiconductor package 300b_IV may be on an upper surface of the first heat dissipation layer 303_IV and surround and cover a side surface of the second heat dissipation layer 303_IV. Here, a side surface of the first heat dissipation layer 302_IV may be exposed to the outside, but the upper surface of the first heat dissipation layer 302_IV may not be exposed to the outside. In addition, the side surface of the second heat dissipation layer 303_IV may not be exposed to the outside, but an upper surface of the second heat dissipation layer 303_IV may be exposed to the outside. The upper surface of the second heat dissipation layer 303_IV and the upper surface of the heat-dissipation molding unit 380_IV may have the same height, and a sum of footprints of the second heat dissipation layer 303_IV and the heat-dissipation molding unit 380_IV may be substantially equal to a footprint of the first heat dissipation layer 302_IV. Thus, when the semiconductor package 300b_IV is viewed from above, the first heat dissipation layer 302_IV may not be observed.

Referring to FIG. 73, the heat-dissipation molding unit 380_IV of the semiconductor package 300c_IV may be on the adhesive film 105_IV and surround and cover the side surface of the first heat dissipation layer 302_IV. Here, the side and the upper surfaces of the second heat dissipation layer 303_IV may be exposed to the outside. In addition, a portion of the upper surface of the first heat dissipation layer 302_IV may be exposed to the outside, but the side surface of the first heat dissipation layer 302_IV may not be exposed to the outside.

Figure 74:
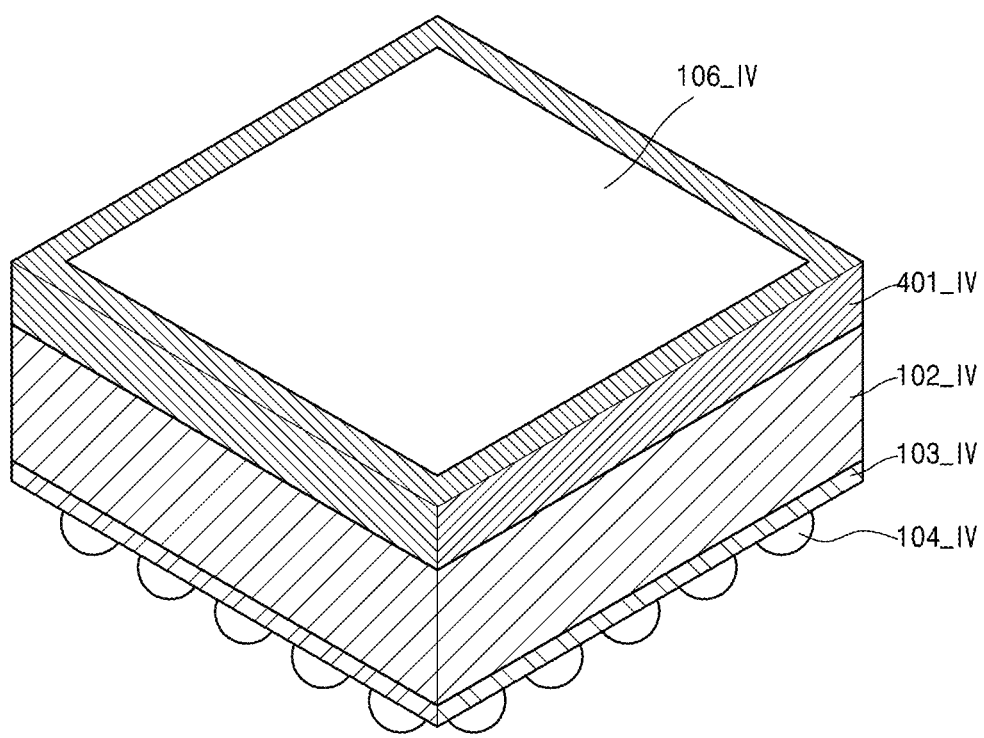
FIG. 74 is a perspective view of a semiconductor package according to an embodiment of the present disclosure.
Figure 75:
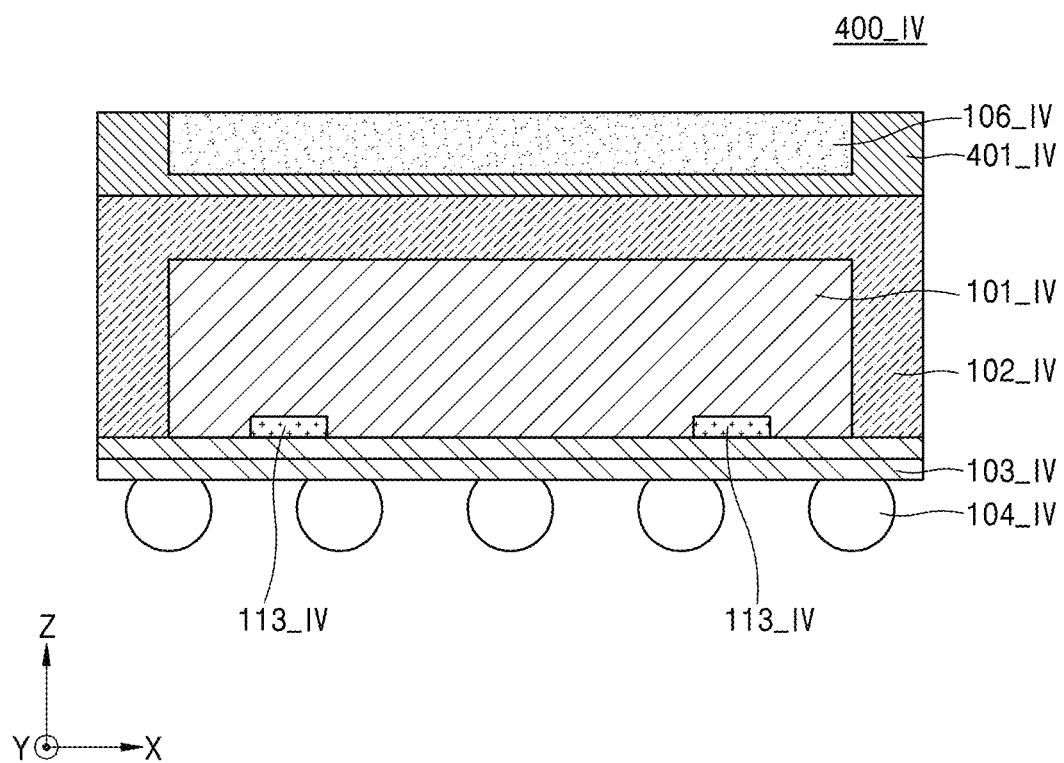
FIG. 75 is a cross-sectional view of a semiconductor package according to an embodiment of the present disclosure.

FIG. 74 is a perspective view of a semiconductor package 400_IV according to an embodiment of the present disclosure, and FIG. 75 is a cross-sectional view of the semiconductor package 400_IV according to an embodiment of the present disclosure.

Referring to FIGS. 74 and 75, the semiconductor package 400_IV may include a semiconductor chip 101_IV, a sealing material 102_IV, a redistribution layer 103_IV, an external connection terminal 104_IV, and a heat sink 106_IV. Technical characteristics of the semiconductor chip 101_IV, the sealing material 102_IV, the redistribution layer 103_IV, the external connection terminal 104_IV, and the heat sink 106_IV may be substantially the same as those described with reference to FIGS. 51 to 53, and thus, detailed descriptions thereof will be omitted.

In an embodiment, the semiconductor package 400_IV may further include an adhesive film 401_IV. A footprint of the adhesive film 401_IV may be greater than a footprint of the heat sink 106_IV, and a width of the adhesive film 401_IV in the first direction X may be greater than a width of the heat sink 106_IV in the first direction X.

In an embodiment, the adhesive film 401_IV may extend upward to the side surface of the heat sink 106_IV to cover at least a portion of the side surface of the heat sink 106_IV. As the adhesive film 401_IV extends upward to the side surface of the heat sink 106_IV, the heat sink 106_IV may be firmly combined with the sealing material 102_IV.

In an embodiment, the adhesive film 401_IV may include a conductive material and a non-conductive material. For example, the material of the adhesive film 401_IV may include at least one of silver, aluminum, silicon dioxide, aluminum nitride, and boron nitride.

Figure 76:
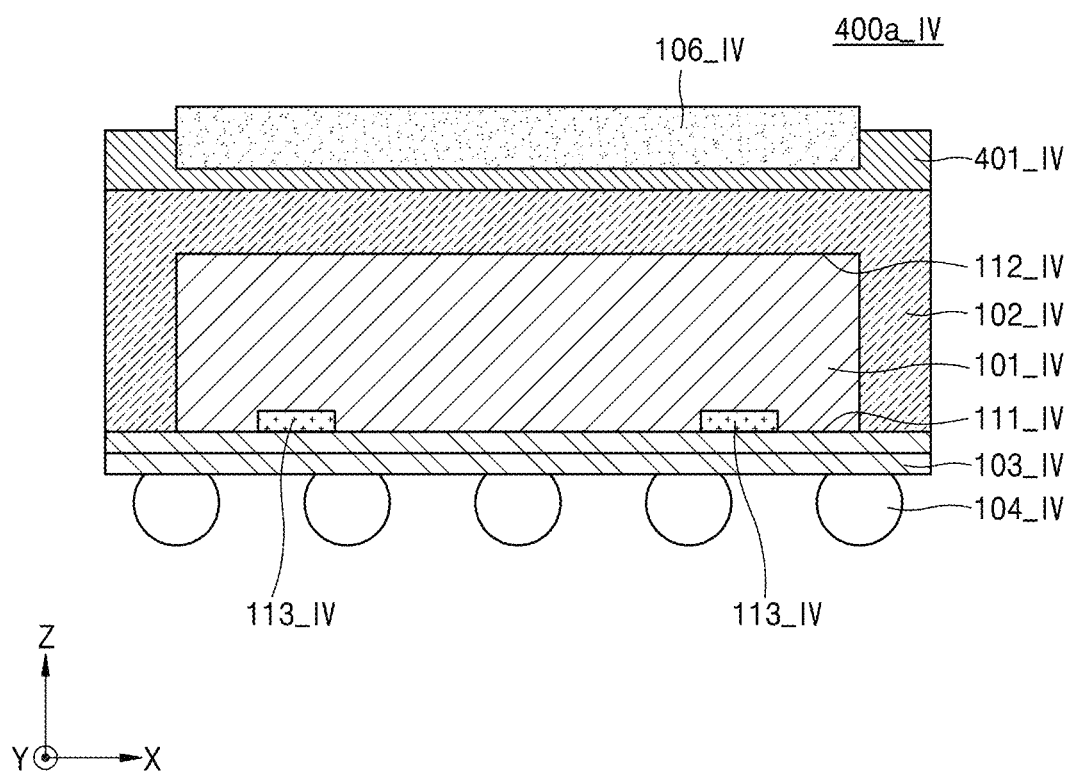
FIGS. 76 and 77 are cross-sectional views of a semiconductor package according to an embodiment of the present disclosure.
Figure 77:
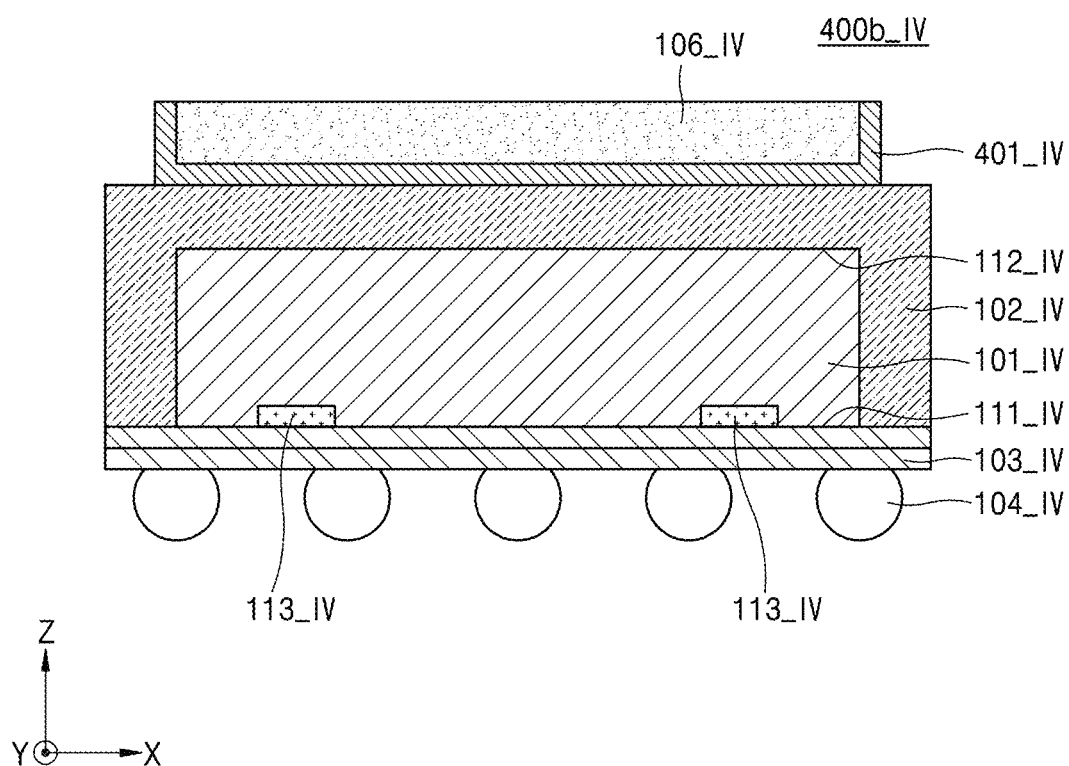

FIGS. 76 and 77 are cross-sectional views of semiconductor packages 400a_IV and 400b_IV according to an embodiment of the present disclosure.

In an embodiment, the adhesive film 401_IV of each of the semiconductor packages 400a_IV and 400b_IV may cover at least a portion of a side surface of a heat sink 106_IV. For example, as shown in FIG. 76, the adhesive film 401_IV may cover only a portion of the side surface of the heat sink 106_IV and expose an upper surface and a remaining portion of the side surface of the heat sink 106_IV, except for the covered portion. As shown in FIG. 77, the adhesive film 401_IV may cover the entire side surface of the heat sink 106_IV and expose only the upper surface of the heat sink 106_IV to the outside.

Referring to FIG. 76, a side surface of the adhesive film 401_IV may be self-aligned to a side surface of the semiconductor package 400a_IV. In addition, when the semiconductor package 400a_IV is viewed from above, a sum of footprints of the heat sink 106_IV and the adhesive film 401_IV may be substantially equal to a footprint of the semiconductor package 400a_IV.

Referring to FIG. 77, the footprint of the adhesive film 401_IV of the semiconductor package 400b_IV may be less than the footprint of the semiconductor package 400b_IV. More specifically, when the semiconductor package 400b_IV is viewed from above, a sum of the footprints of the heat sink 106_IV and the adhesive film 401_IV may be less than the footprint of the semiconductor package 400a_IV.

Figure 78:
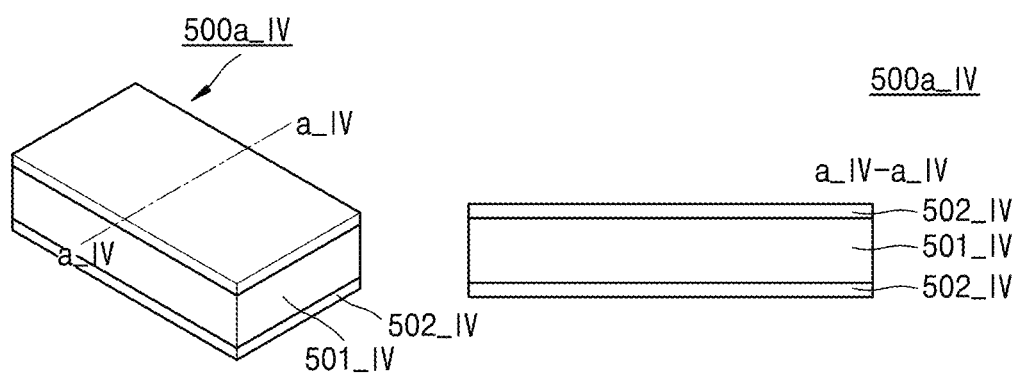
FIG. 78 is a diagram of a heat sink according to an embodiment of the present disclosure.
Figure 79:
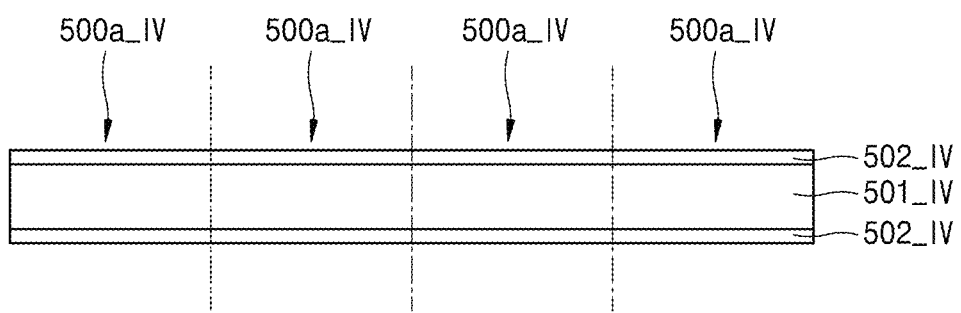
FIG. 79 is a diagram of a process of manufacturing a heat sink, according to an embodiment of the present disclosure.
Figure 80:
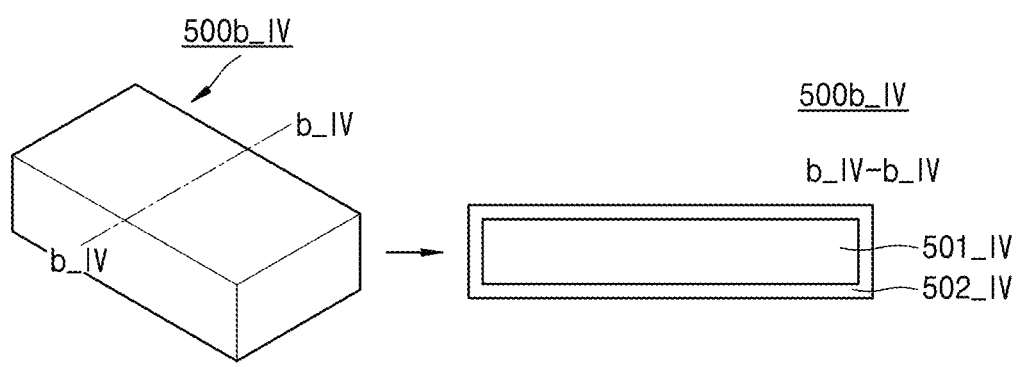
FIG. 80 is a diagram of a heat sink according to an embodiment of the present disclosure.
Figure 81:
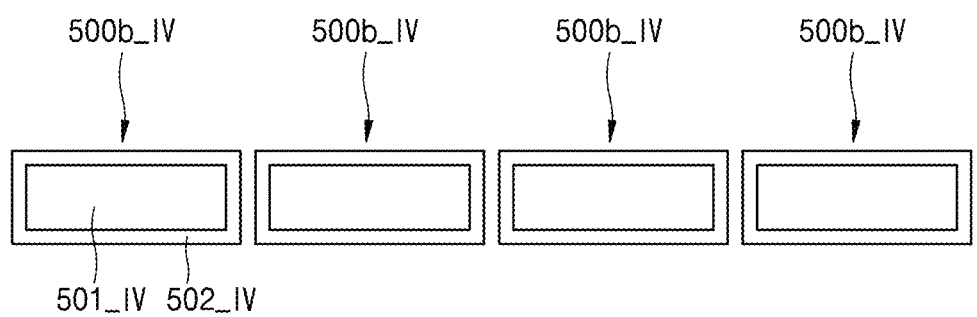
FIG. 81 is a diagram of a process of manufacturing a heat sink, according to an embodiment of the present disclosure.

FIG. 78 is a diagram of a heat sink 500a_IV according to an embodiment of the present disclosure, and FIG. 79 is a diagram of a process of manufacturing the heat sink 500a_IV according to an embodiment of the present disclosure. FIG. 80 is a diagram of a heat sink 500b_IV according to an embodiment of the present disclosure, and FIG. 81 is a diagram of a process of manufacturing the heat sink 500b_IV according to an embodiment of the present disclosure. The heat sinks 500a_IV and 500b_IV according to the present disclosure may be mounted on the adhesive film 105_IV of the semiconductor package 100_IV described with reference to FIG. 51.

In an embodiment, the heat sinks 500a_IV and 500b_IV may include a plurality of materials. For example, the heat sinks 500a_IV and 500b_IV may include a first metal 501_IV and a second metal 502_IV different from the first metal 501_IV. The second metal 502_IV may be a plating layer that is formed on the first metal 501_V by a plating method. The second metal 502_IV, which prevents the oxidation of the first metal 501_IV, may be a metal having a lower oxidation reaction rate than the first metal 501_IV. Because the second metal 502_IV may be plated on a surface of the first metal 501_IV, a reduction in a heat dissipation effect due to an oxide layer produced by the oxidation of the first metal 501_IV may be prevented.

In an embodiment, the first metal 501_IV may be copper, and the second metal may be nickel. Alternatively, the first metal 501_IV may be aluminum, and the second metal may be nickel. However, the embodiments are not limited to these examples, and the first metal 501_IV and the second metal 502_IV may include various metal-based materials.

Referring to FIG. 78, the second metal 502_IV of the heat sink 500a_IV may cover an upper surface and a lower surface of the first metal 501_IV and expose a side surface of the first metal 501_IV to the outside. Thus, when the heat sink 500a_IV is viewed from the side, the first metal 501_IV and the second metal 502_IV may be exposed to the outside and observed.

Referring to FIG. 79, after the first metal 501_IV is manufactured to a wafer-level size or panel-level size, the second metal 502_IV may be formed as a plating layer on the first metal 501_IV by using a plating process. After the first metal 501_IV is plated with the second metal 502_IV, individual heat sinks 500a_IV may be formed using a cutting process. Accordingly, a side surface of the first metal 501_IV may not be plated with the second metal 502_IV.

Referring to FIG. 80, the second metal 502_IV of the heat sink 500b_IV may cover all the upper, lower, and side surfaces of the first metal 501_IV. Thus, the first metal 501_IV may not be exposed to the outside. When the heat sink 500b_IV is viewed from the side, only the second metal 502_IV may be exposed to the outside and observed.

Referring to FIG. 81, after the first metal 501_IV is singulated on a package level, the second metal 502_IV may be formed as a plating layer on the first metal 501_IV by using a plating process. Accordingly, the second metal 502_IV may be plated on all the upper surface, the lower surface, and the side surface of the first metal 501_IV.

In an embodiment, when the second metal 502_IV is plated on the surface of the first metal 501_IV, the thickness of the first metal 501_IV may be about 10 times to about 1000 times the thickness of the second metal 502_IV. As the second metal 502_IV is plated on the surface of the first metal 501_IV, the heat dissipation effect of the heat sinks 500a_IV and 500b_IV may be improved. In addition, because the stiffnesses of the heat sinks 500a_IV and 500b_IV may be increased, the heat sinks 500a_IV and 500b_IV may be prevented from being damaged due to external impact.

In an embodiment, the heat sinks 500a_IV and 500b_IV may include metal oxides or metal nitrides. For example, the heat sinks 500a_IV and 500b_IV may include aluminum oxide or aluminum nitride.

The present disclosure is not limited to the above description, and a heat sink of the present disclosure may include a silicon-based material. The silicon-based material may have a high thermal conductivity and elasticity. Accordingly, the heat sink may absorb external impact and prevent a semiconductor package from being damaged due to the external impact.

Heat sinks of the present disclosure may be cut to a size corresponding to each heat sink and then individually mounted on the semiconductor package. However, the present disclosure is not limited thereto, and the heat sinks of the present disclosure may be manufactured to a wafer-level size or panel-level size, mounted on semiconductor packages, which are manufactured on a wafer level or panel level, and subsequently cut into individual heat sinks through a singulation process.

Figure 82:
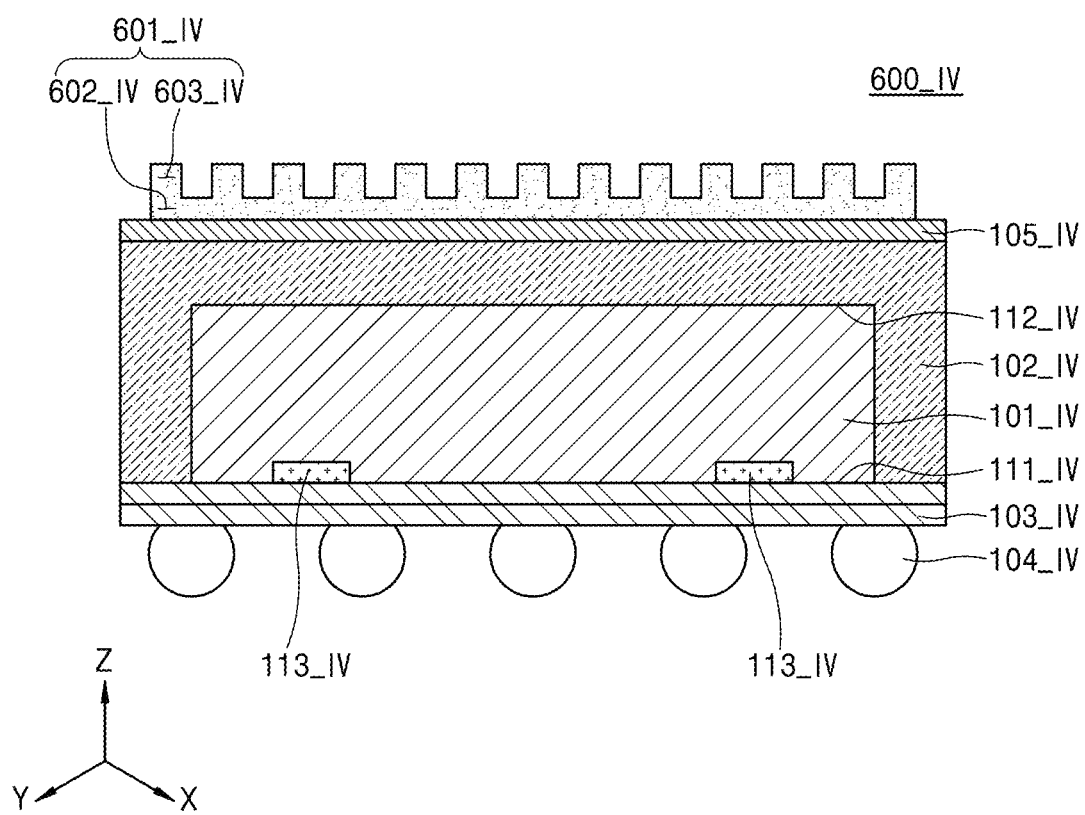
FIG. 82 is a cross-sectional view of a semiconductor package according to an embodiment of the present disclosure.

FIG. 82 is a cross-sectional view of a semiconductor package 600_IV according to an embodiment of the present disclosure. The semiconductor package 600_IV may include a semiconductor chip 101_IV, a sealing material 102_IV, a redistribution layer 103_IV, an external connection terminal 104_IV, an adhesive film 105_IV, and a heat sink 601_IV. Technical characteristics of the semiconductor chip 101_IV, the sealing material 102_IV, the redistribution layer 103_IV, the external connection terminal 104_IV, and the adhesive film 105_IV may be substantially the same as those described with reference to FIGS. 51 to 53, and thus, detailed descriptions thereof will be omitted.

The heat sink 601_IV of the semiconductor package 600_IV may have a rough structure. The dictionary meaning of rough (凹凸) may be concave and convex. The heat sink 601_IV may include a base 602_IV and a plurality of projections 603_IV on the base 602_IV. More specifically, the heat sink 601_IV may include the plurality of projections 603_IV, which are formed to protrude from an upper surface of the base 602_IV having the flat plate shape. The plurality of projections 603_IV may be repeatedly arranged a predetermined distance apart from each other. Thus, the heat sink 601_IV may have a rough structure in which concave and convex portions are repeatedly formed.

In an embodiment, a lower surface of the base 602_IV of the heat sink 601_IV may be fixed to the sealing material 102_IV of the semiconductor package 600 by the adhesive film 105_IV.

Figure 83:
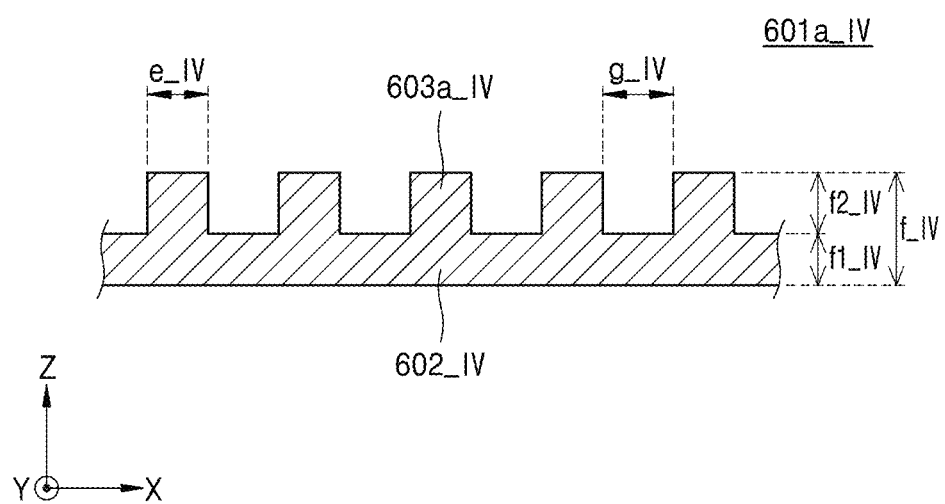
FIGS. 83 and 84 are cross-sectional views of heat sinks according to an embodiment of the present disclosure.
Figure 84:
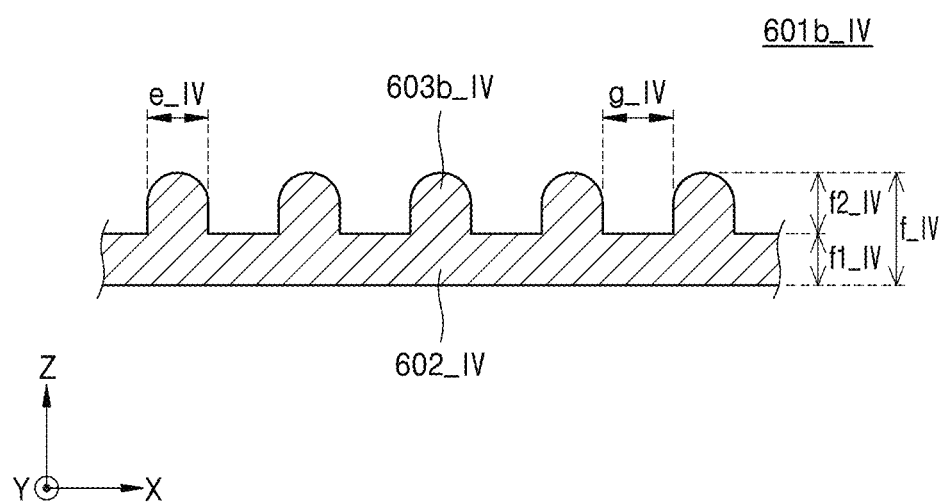

FIGS. 83 and 84 are cross-sectional views of heat sinks 601a_IV and 601b_IV according to an embodiment of the present disclosure.

Referring to FIGS. 83 and 84, a thickness $f_1\_IV$ of the base 602_IV may take up about 40% to about 60% of a total thickness f_IV of the heat sinks 601a_IV and 601b_IV. For example, the thickness $f_1\_IV$ of the base 602_IV of the heat sink 601_IV may be half of the total thickness f_IV of the heat sinks 601a_IV and 601b_IV. When the total thickness f_IV of the heat sinks 601a_IV and 601b_IV is about 400 μm, the thickness of the base 602_IV of the heat sinks 601a_IV and 601b_IV may be about 200 μm.

In an embodiment, projections 603a_IV and 603b_IV of the heat sinks 601a_IV and 601b_IV may be formed a predetermined distance g_IV apart from other projections 603a_IV and 603b_IV, which are adjacent thereto in four directions. The distance g_IV may be about 100 μm to about 300 μm. More specifically, the distance g_IV may be about 200 μm.

In an embodiment, a width e_IV of the projections 603a_IV and 603b_IV of the heat sinks 601a_IV and 601b_IV may be about 100 μm to about 300 μm. More specifically, the width e_IV of the projections 603a_IV and 603b_IV may be about 200 μm.

In an embodiment, a thickness $f_2\_IV$ formed by the projections 603a_IV and 603b_IV of the heat sinks 601a_IV and 601b_IV may take up about 40% to about 60% of the total thickness f_IV of the heat sinks 601a_IV and 601b_IV. In an embodiment, the thickness $f_2\_IV$ of the projections 603a_IV and 603b_IV of the heat sinks 601a_IV and 601b_IV may be half of the total thickness f_IV of the heat sinks 601a_IV and 601b_IV. For example, when the total thickness f_IV of the heat sinks 601a_IV and 601b_IV is about 400 μm, the thickness $f_2\_IV$ of the projections 603a_IV and 603b_IV of the heat sinks 601a_IV and 601b_IV may be about 200 μm.

In an embodiment, the total thickness f_IV of the heat sinks 601a_IV and 601b_IV may be equal to a sum of the thickness $f_1\_IV$ of the base 602_IV and the thickness $f_2\_IV$ of the projections 603a_IV and 603b_IV (i.e., $f\_IV=f_1\_IV+f_2\_IV$). In an embodiment, when the total thickness f_IV of the heat sinks 601a_IV and 601b_IV is about 400 μm, the thickness $f_1\_IV$ of the base 602_IV may be about 160 μm, which is about 40% of the total thickness f_IV of the heat sinks 601a_IV and 601b_IV, and in this case, the thickness $f_2\_IV$ of the projections 603a_IV and 603b_IV may be about 240 μm, which is about 60% of the thickness f_IV of the heat sinks 601a_IV and 601b_IV. When the thickness $f_1\_IV$ of the base 602_IV is about 240 μm that is about 60% of the thickness f_IV of the heat sinks 601a_IV and 601b_IV, the thickness $f_2\_IV$ of the projections 603a_IV and 603b_IV may be about 160 μm, which is about 40% of the thickness f_IV of the heat sinks 601a_IV and 601b_IV. Also, the thickness $f_1\_IV$ of the base 602_IV and the thickness $f_2\_IV$ of the projections 603a_IV and 603b_IV of the heat sinks 601a_IV and 601b_IV may be substantially equal. In an embodiment, each of the thickness $f_1$_IV and the thickness $f_2$_IV may be about 200 µm.

Referring to FIG. 83, an upper portion of the projection 603a_IV of the heat sink 601a_IV may include a planar surface. In addition, referring to FIG. 84, the upper portion of the projection 603b_IV of the heat sink 601b_IV may include a convexly curved surface. However, the present disclosure is not limited to the above description, and a projection of a heat sink may have various other shapes.

Referring to FIG. 83, by sawing a portion of a heat sink having a rectangular parallelepiped shape with a predetermined thickness f_IV by using a sawing device, the heat sink 601a_IV may include a plurality of projections 603a_IV. A sawing blade of the sawing device may have a cutting width corresponding to a distance g_IV between the plurality of projections 603a_IV and a cutting depth corresponding to the thickness $f_2$_IV of the plurality of projections 603a_IV. The sawing device may saw the portion of the heat sink while moving along a cutting lane. Thus, the heat sink 601a_IV may include the plurality of projections 603a_IV described above.

Referring to FIG. 84, after the projections 603a_IV are formed using the above-described sawing device, an additional sawing process for smoothly cutting upper portions of the projections 603a_IV may be performed, and thus, the heat sink 601b_IV may include the projections 603b_IV of which the upper portions have a convexly curved shape.

In an embodiment, the heat sinks 601a_IV and 601b_IV shown in FIGS. 83 and 84 may be formed using an injection molding process other than the sawing process described above.

More specifically, a material for forming the heat sinks 601a_IV and 601b_IV may be into an injection molding heating chamber. The material for the heat sinks 601a_IV and 601b_IV, which is injected into the heating chamber, may melt due to a high temperature of the heating chamber. The molten material may be injected into an injection molding apparatus including injection spaces having shapes corresponding to the heat sinks 601a_IV and 601b_IV of FIGS. 83 and 84. The injection spaces having the shapes corresponding to the heat sinks 601a_IV and 601b_IV may be completely filled with the injected molten material. Subsequently, the injection molding apparatus may cool the molten material in the injection space, and thus, the heat sinks 601a_IV and 601b_IV of FIGS. 83 and 84 may be finally formed. By using the injection molding process, rough structures of the heat sinks 601a_IV and 601b_IV are not limited to shapes shown in FIGS. 83 and 84 and may have various other shapes according to the shape of the injection space of the injection molding apparatus.

The present disclosure is not limited to the above-described sawing process and injection molding process, and the rough structures of the heat sinks 601a_IV and 601b_IV of FIGS. 83 and 84 may be formed using various other processes. As an embodiment, the rough structures of the heat sinks 601a_IV and 601b_IV may be formed due to a chemical reaction. In an embodiment, the rough structures of the heat sinks 601a_IV and 601b_IV may be formed using a process of physically bonding a plurality of projections 603a_IV and 603b_IV, which are separately formed, to the base 602_IV. In this case, the projections 603a_IV and 603b_IV and the base 602_IV of the heat sinks 601a_IV and 601b_IV may include different materials.

In an embodiment, because the heat sinks 601a_IV and 601b_IV may have the rough structures, heat dissipation performance of the semiconductor package 600_IV may be improved. More specifically, by forming the rough structures of the heat sinks 601a_IV and 601b_IV, surface areas of the heat sinks 601a_IV and 601b_IV, which are in contact with external air, may be increased. Thus, the semiconductor package 600_IV on which the heat sinks 601a_IV and 601b_IV are mounted may dissipate heat dissipated by the semiconductor chip 101_IV in the semiconductor package 600_IV more quickly.

Figure 85:
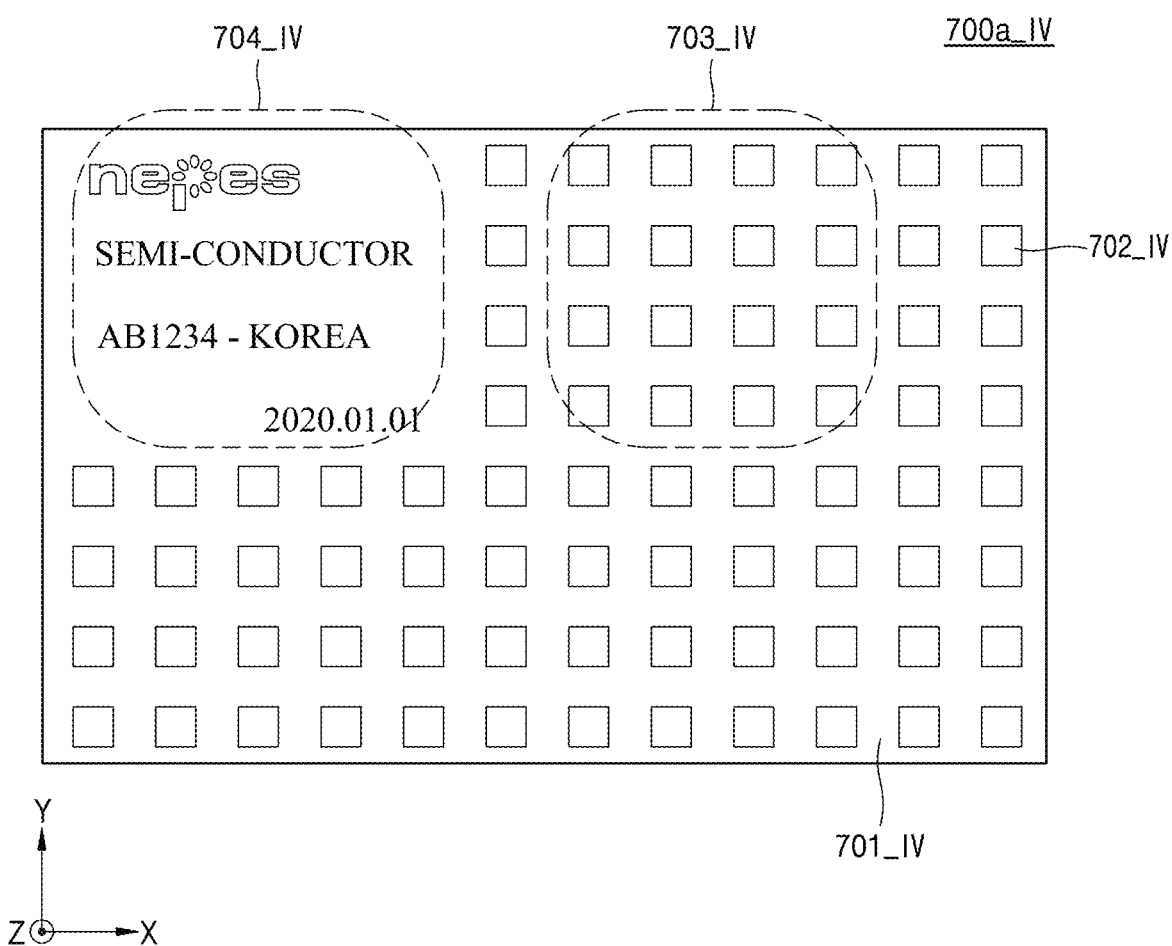
FIGS. 85 to 87 are plan views of heat sinks having rough structures including marking regions in which information about a semiconductor package is marked, according to an embodiment of the present disclosure.
Figure 86:
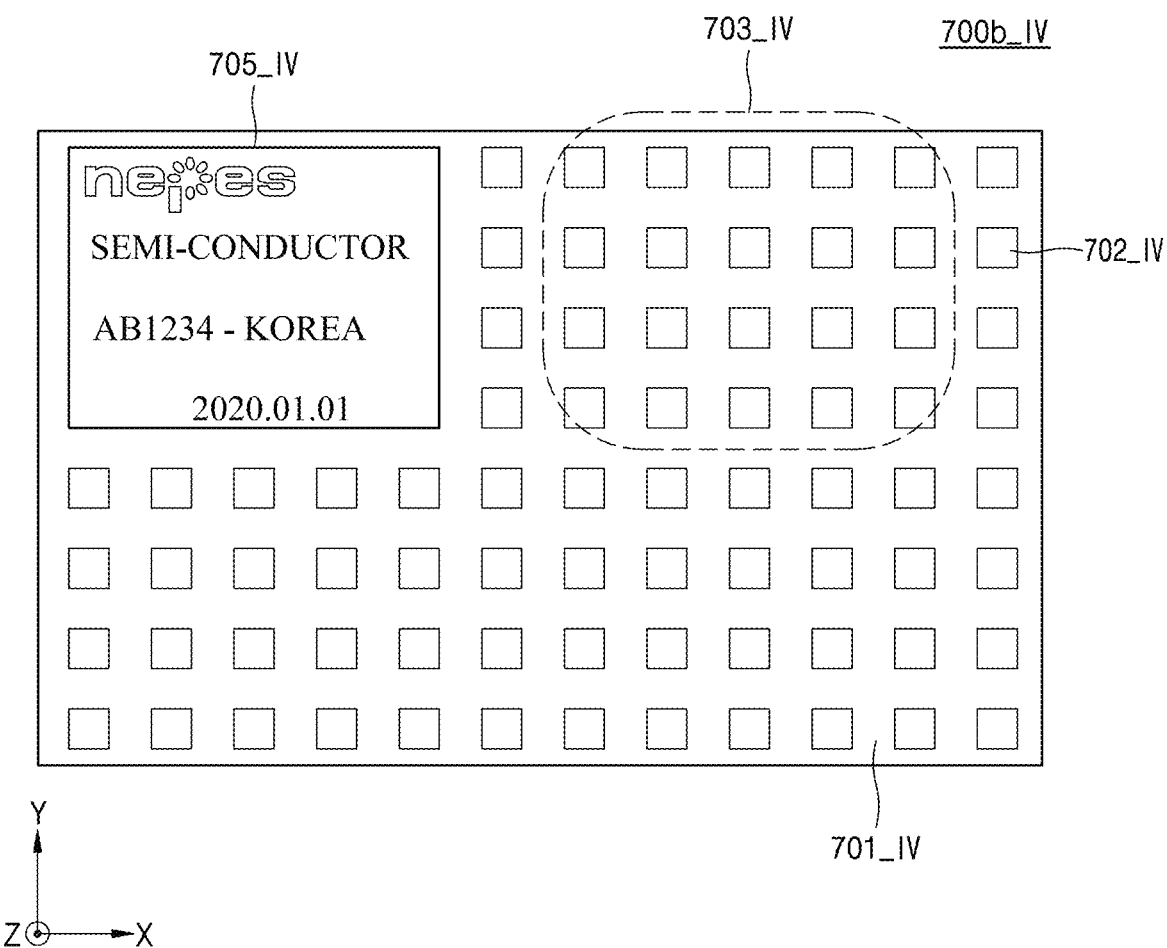
Figure 87:
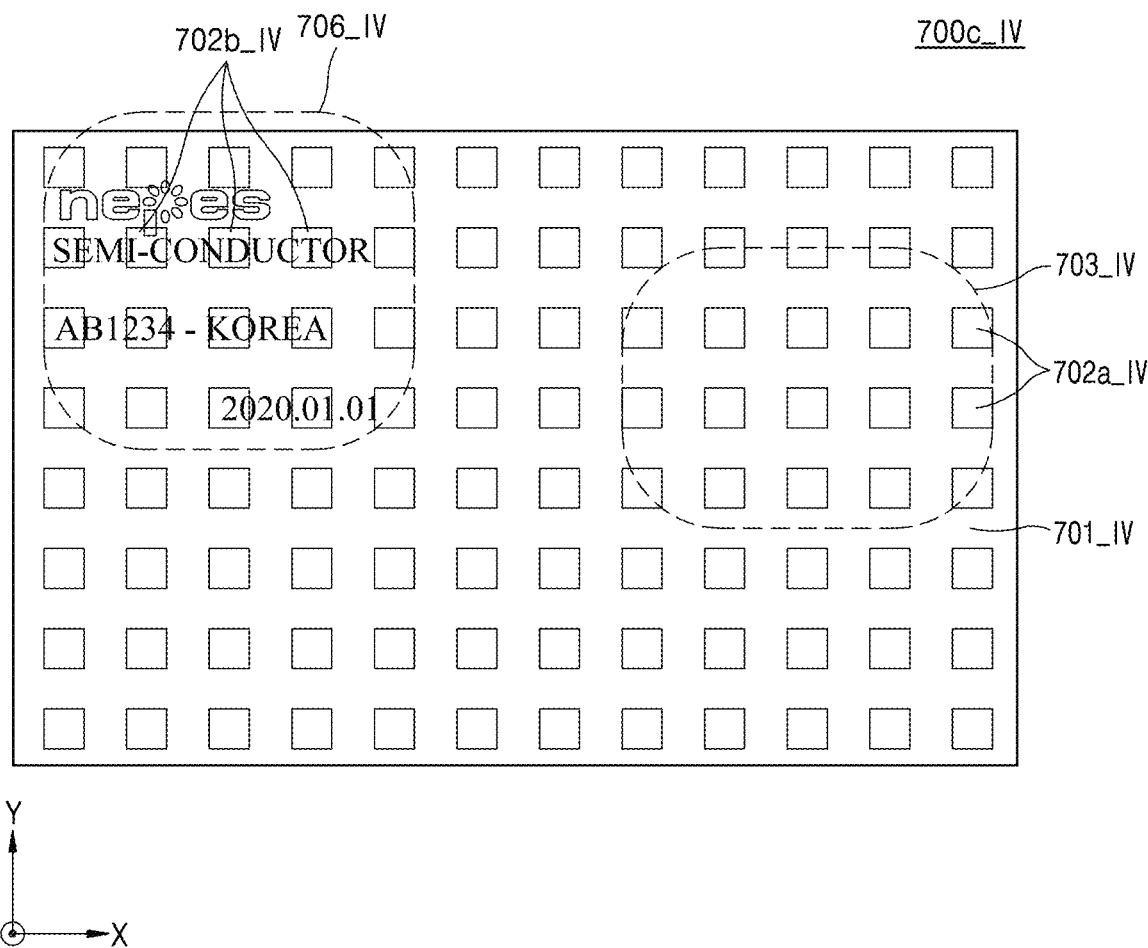

FIGS. 85 to 87 are plan views of heat sinks 700a_IV, 700b_IV, and 700c_IV having rough structures including marking regions in which information about a semiconductor package is marked, according to an embodiment of the present disclosure.

Referring to FIG. 85, as described above the heat sink 700a_IV may include a base 701_IV and a projection 702_IV. Also, the heat sink 700a_IV may include a marking region 704_IV, which is located on the base 701_IV and in which the information about the semiconductor package is marked, and a projection region 703_IV in which a plurality of projections 702_IV protrude from the base 701_IV.

In an embodiment, the projection 702_IV may not be formed in the marking region 704_IV. In other words, a portion of the heat sink 700a_IV may not include a rough structure, and the marking region 704_IV may be formed on a surface of the base 701_IV on which the projection 702_IV is not formed. Thus, the marking region 704_IV may have a smaller height than an upper surface of the projection 702_IV.

In an upper left portion of the heat sink 700a_IV shown in FIG. 85, a planar surface of the base 701_IV on which the projections 702_IV are not formed may include the marking region 704_IV, and information about the semiconductor chip mounted in the semiconductor package may be marked in the marking region 704_IV. However, the marking region 704_IV is not limited to a position shown in FIG. 85 and may be formed at various other positions of the heat sink 700a_IV.

In an embodiment, the information about the semiconductor chip, such as the type, number, and performance of the semiconductor chip, the name and/or logo of a manufacturing company, a manufacturing date, and a serial number, may be marked in the marking region 704_IV of the semiconductor package.

In an embodiment, an ink marking method or a laser marking method may be used to mark the information about the semiconductor package.

More specifically, the information about the semiconductor chip may be marked by using a pad printing method, which is one ink marking method. In the pad printing method, a palette filled with ink may be pushed with a silicone rubber pad in which an embossed or engraved pattern is formed, and brought into contact with a surface of the marking region 704_IV to mark semiconductor information. In the pad printing method, the information about the semiconductor package may be marked at low cost. Also, because the silicone rubber pad has elasticity, the semiconductor information may be clearly marked even in an uneven surface of a heat sink.

Furthermore, the information about the semiconductor chip may be marked by using a laser marking method. In the laser marking method, laser light emitted from a laser device may be condensed on the marking region 704_IV of the heat sink 700a_IV by using the laser device. Thus, letters or numbers may be engraved by hollowing portions of the marking region 704_IV to express the information about the semiconductor chip. Furthermore, the laser device may adjust the intensity of laser light by adjusting the intensity of electric power supplied to the laser device. Thus, thicknesses of the letters and numbers formed in the marking region 704_IV of the heat sink 700a_IV may be adjusted.

The laser marking method may use a conventional $CO_2$ laser device, a YAG laser device, and a diode laser device. The $CO_2$ laser device may include a resonator, which includes nitrogen ($N_2$), carbon dioxide ($CO_2$), and helium (He). When high-frequency energy is applied to the resonator, nitrogen molecules may stimulate carbon dioxide molecules, and thus, the stimulated carbon dioxide molecules may be excited. The excited carbon dioxide molecules release energy to return to a ground state. In this case, the excited carbon dioxide molecules emit infrared (IR) laser light having a wavelength of about 9 μm to about 11 μm.

The YAG laser device may use a YAG crystal as a laser medium. The YAG crystal may include ytterbium (Yb) and aluminum (Al) as main components and have a similar crystal structure to garnet. The YAG laser device may emit laser light by adding various rare-earth elements, such as neodymium (Nd) and ytterbium (Yb), to the YAG crystal.

In the diode laser device, when a forward bias is applied to a diode, electrons and holes may be injected into a p-layer of the diode. The electrons may jump to a valence band and emit laser light when the electrons return to a ground state.

In the present disclosure, the laser devices, which are used to mark information about a semiconductor chip on the marking region 704_IV of the heat sink 700a_IV, are not limited to the $CO_2$ laser device, the YAG laser device, and the diode laser device described above and may further include various other laser devices.

Referring to FIG. 86, heat sink 700b_IV may include the base 701_IV and the projections 702_IV. In addition, the heat sink 700b_IV may include a marking region 705_IV, which is formed to protrude from the projection region 703_IV and the base 701_IV described above.

In an embodiment, the marking region 705_IV may be formed to protrude from an upper surface of the base 701_IV of the heat sink 700b_IV. More specifically, the marking region 705_IV may protrude from the upper surface of the base 701_IV, and the upper surface of the protruding marking region 705_IV may have a flat shape. An area of the upper surface of the marking region 705_IV may be greater than an area of the upper surface of each projection 702_IV and may be less than a footprint of the heat sink 700b_IV. In an embodiment, the marking region 705_IV of the heat sink 700b_IV may take up about 10% to about 80% of the footprint of the heat sink 700b_IV.

In an embodiment, the marking region 705_IV protruding from the base 701_IV may have substantially the same height as the projection 702_IV. Thus, the upper surface of the marking region 705_IV may be coplanar with the upper surfaces of the projections 702_IV of the projection region 703_IV. The height of the marking region 705_IV protruding from the base 701_IV and the height of the projections 702_IV protruding from the base 701_IV may be about 40% to about 60% of a total thickness of the heat sink 700b_IV.

In an embodiment, information about the semiconductor chip may be expressed in the upper surface of the marking region 705_IV by using the ink marking method or laser marking method described above.

Although FIG. 86 illustrates a case in which the marking region 705_IV is formed on an upper left portion of the heat sink 700b_IV, the marking region 705_IV is not limited thereto and may be formed at various other positions of the heat sink 700b_IV.

Due to a shape of the marking region 705_IV protruding from the base 701_IV, a sectional area of the heat sink 700b_IV of FIG. 86 in contact with external air may be increased, and thus, a heat dissipation effect may be excellent.

As shown in FIG. 87, the heat sink 700c_IV may include first projections 702a_IV, which are mounted in the projection region 703_IV and protrude over the base 701_IV, and second projections 702b_IV, which are mounted in a marking region 706_IV and protrude over the base 602_IV. In other words, from among a plurality of projections, a region including the second projection 702b_IV, in which the information about the semiconductor package is marked, may be the marking region 706_IV, and a region including the first projection 702a_IV, in which the information about the semiconductor package is not marked, may be the projection region 703_IV.

In an embodiment, the marking region 706_IV may include continuous letters and numbers indicating the information about the semiconductor package in the upper surfaces of the base 701_IV and the second projections 702b_IV. More specifically, the information about the semiconductor chip may be expressed in the upper surface of the base 701_IV and the upper surface of the second projection 702b_IV, which are located in a lower portion of the marking region 706_IV. The information about the semiconductor chip may be marked by hollowing a portion of the base 701_IV and a portion of the second projection 702b_IV by using a laser device. Also, the information about the semiconductor chip may be marked by painting the portion of the base 701_IV and the portion of the second projection 702b_IV with ink.

In an embodiment, the first projection 702a_IV and the second projections 702b_IV formed in the heat sink 700c_IV may have different thicknesses. More specifically, a thickness by the second projections 702b_IV may be as small as possible so that the marking region 706_IV includes continuous letters and numbers in the upper surfaces of the second projections 702b_IV and the base 701_IV. In this case, as the thickness of the second projections 702b_IV is reduced, in a laser marking method, a change in height of a point on which laser light is condensed may be reduced, and engraved letters and numbers may have orderly shapes. Also, in an ink marking method, a change in length by which the silicone rubber pad should stretch due to elasticity may be reduced.

Thus, in the heat sink 700c_IV of the marking region 706_IV of the present disclosure, a height of the second projections 702b_IV may be substantially lower than a height of the first projections 702a_IV of the projection region 703_IV. In an embodiment, the height of the second projections 702b_IV may be between ¼ and ½ of the height of the first projections 702a_IV. In an embodiment of the present disclosure, when the total thickness of the heat sink 700c_IV is about 400 μm, the thickness of the base 701_IV is about 200 μm, and the height of the first projections 702a_IV is about 200 μm, the height of the second projections 702b_IV may be about twice to about 4 times less than the height of the first projections 702a_IV. Accordingly, the height of the second projections 702b_IV may be about 50 μm to about 100 μm.

Due to the small height of the second projections 702b_IV formed in the marking region 706_IV of the heat sink 700c_IV, the heat sink 700c_IV may form continuous letters and numbers in the base 701_IV and the upper portions of the second projections 702b_IV in the marking region 706_IV and indicate information about the semiconductor package. For example, in the laser marking method, the change in height of the point on which laser light is condensed in the marking region 706_IV may be in a range of about 50 µm to about 100 µm. Thus, the letters and numbers may be continuously marked in orderly shapes in the marking region 706_IV without separately controlling the height of the point on which the laser light is condensed. Even when the height of the point on which the laser light is condensed is controlled, it may be only necessary to control a position of the laser device in a range of about 50 µm to about 100 µm. Accordingly, energy consumption may be low during the driving of the laser device, and time taken to control the driving of the laser device may be reduced.

In the ink marking method, because a change in length by which the silicone rubber pad should stretch due to elasticity may be as small as about 50 µm to about 100 µm, letters and numbers indicating semiconductor information may be marked in more orderly shapes in the upper surfaces of the second projections 702b_IV of the marking region 706_IV and the base 701_IV.

FIGS. 88 to 92 are diagrams illustrating a method of manufacturing a semiconductor package, according to an embodiment of the present disclosure.

Figure 88:
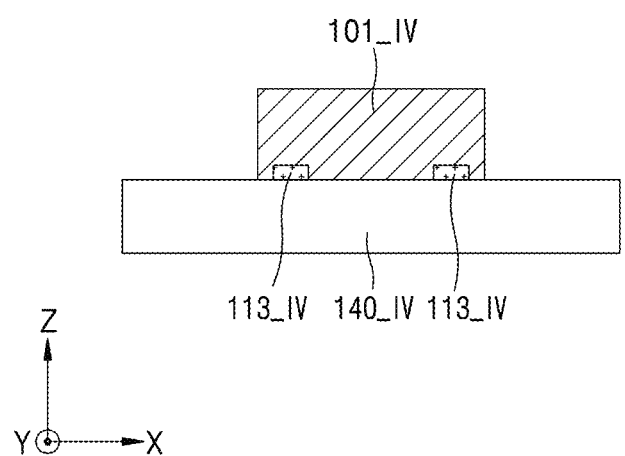
FIGS. 88 to 92 are diagrams illustrating a method of manufacturing a semiconductor package, according to an embodiment of the present disclosure.

Referring to FIG. 88, the method of manufacturing a semiconductor package according to an embodiment of the present disclosure may include adhering the semiconductor chip 101_IV to the upper surface of a glass substrate 140_IV. The semiconductor chip 101_IV may be physically adhered to the upper surface of the glass substrate 140_IV.

Figure 89:
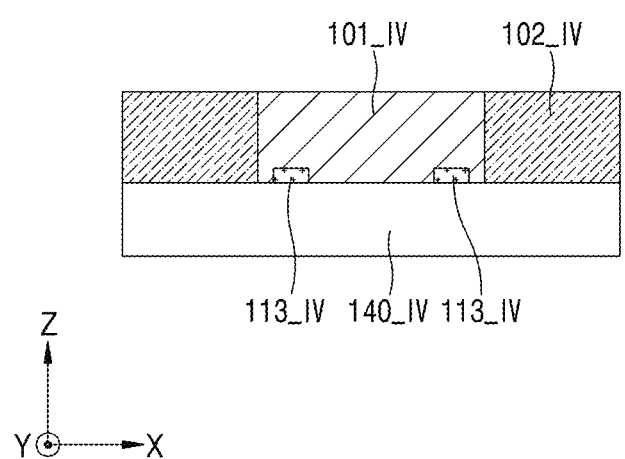

Referring to FIG. 89, the method of manufacturing a semiconductor package according to an embodiment of the present disclosure may include forming the sealing material 102_IV to surround the semiconductor chip 101_IV. For example, the formation of the sealing material 102_IV may include bring an MCF into contact with the upper surface of the semiconductor chip 101_IV and filling a space between the MCF and the glass substrate 140_IV with the sealing material 102_IV. The sealing material 102_IV may cover both the side surface and the upper surface of the semiconductor chip 101_IV, but in an embodiment, the sealing material 102_IV may cover only the side surface of the semiconductor chip 101_IV and expose the upper surface to the outside.

Figure 90:
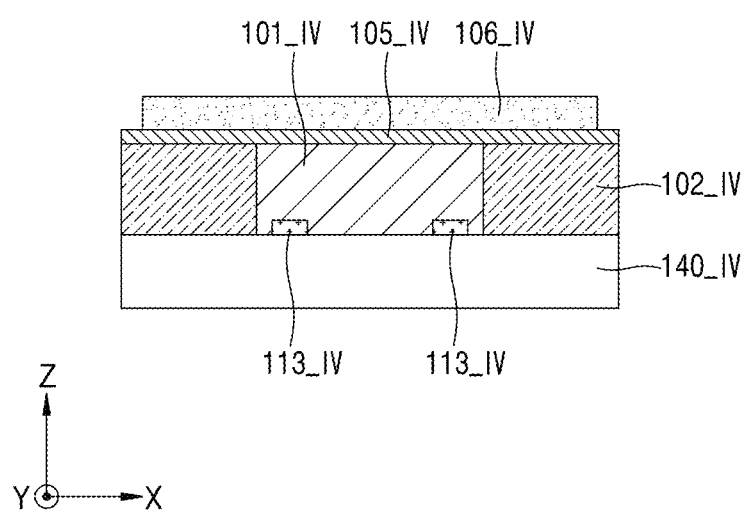

Referring to FIG. 90, the method of manufacturing a semiconductor package according to an embodiment of the present disclosure may include adhering the heat sink 106_IV. The heat sink 106_IV may be adhered to the upper surface of the semiconductor chip 101_IV or the upper surface of the sealing material 102_IV. The adhering of the heat sink 106_IV to the upper surface of the semiconductor chip 101_IV may include a thermal compression bonding method. The thermal compression bonding method may be a method of applying heat and pressure to the adhesive film 105_IV below the heat sink 106_IV using a compression apparatus. The adhesive film 105_IV may stably adhere the heat sink 106_IV to the upper surfaces of the semiconductor chip 101_IV and the sealing material 102_IV, through the thermal compression bonding method.

Figure 91:
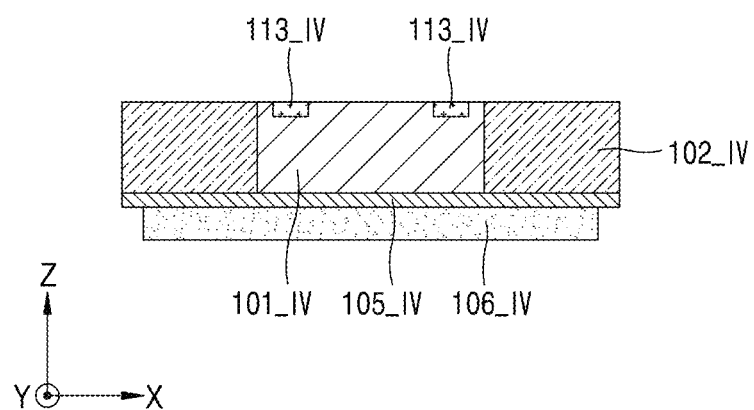

Referring to FIG. 91, the method of manufacturing a semiconductor package according to an embodiment of the present disclosure may include separating the glass substrate 140_IV and inverting the semiconductor package.

Figure 92:
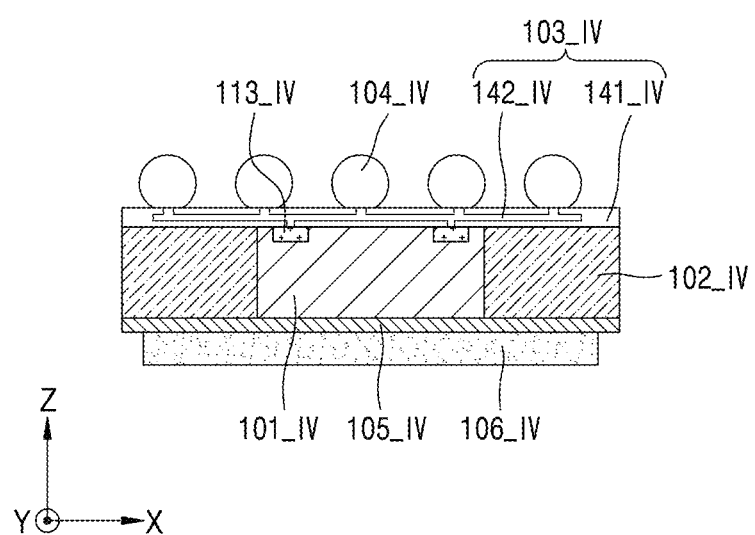

Referring to FIG. 92, the method of manufacturing a semiconductor package according to an embodiment of the present disclosure may include forming the redistribution layer 103_IV. The redistribution layer 103_IV may include an insulating pattern 141_IV and a wiring pattern 142_IV. In an example embodiment, the insulating pattern 141_IV may include a non-photosensitive material, and the insulating pattern 141_IV may be formed on a lower surface of the semiconductor chip 101_IV and then partially removed to expose the chip pad 113_IV of the semiconductor chip 101_IV. After the insulating pattern 141_IV is formed, the wiring pattern 142_IV may be connected to the chip pad 113_IV exposed by an opening of the insulating pattern 141_IV. The wiring pattern 142_IV may be formed by using a plating process, an electroless plating process, an electroplating process, or a combination thereof. The wiring pattern 142_IV may be formed on the insulating pattern 141_IV by using a plating process. After the wiring pattern 142_IV is formed, an additional wiring pattern 142_IV may be formed on the wiring pattern 142_IV. In this case, a portion of the wiring pattern 142_IV may be exposed and connected to an external connection terminal.

Referring to FIG. 92, the method of manufacturing a semiconductor package according to an embodiment of the present disclosure may include adhering the external connection terminal 104_IV. The external connection terminal 104_IV may be a solder ball. The external connection terminal 104_IV may be adhered to the exposed wiring pattern 142_IV through a soldering process.

In an embodiment, the method of manufacturing a semiconductor package according to an embodiment of the present disclosure may include a cutting process to perform the singulation process. The cutting process may divide a plurality of semiconductor packages into individual semiconductor packages. Examples of a cutting device for the cutting process may include a cutting blade, a laser device, and the like.

Figure 93:
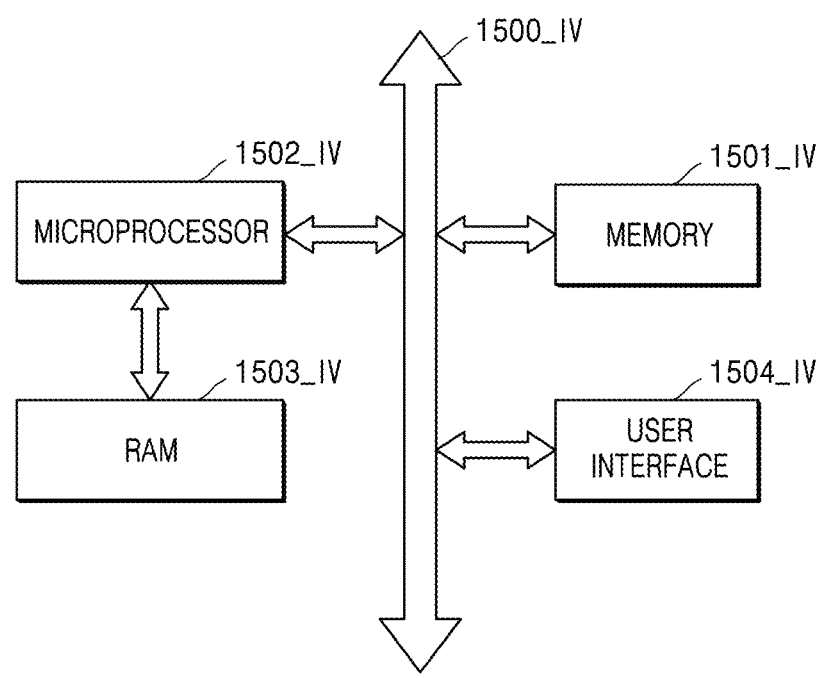
FIG. 93 is a schematic block diagram of an electronic system including a semiconductor package according to an embodiment of the present disclosure.

FIG. 93 is a schematic block diagram of an electronic system including a semiconductor package according to an embodiment of the present disclosure.

Figure 94:
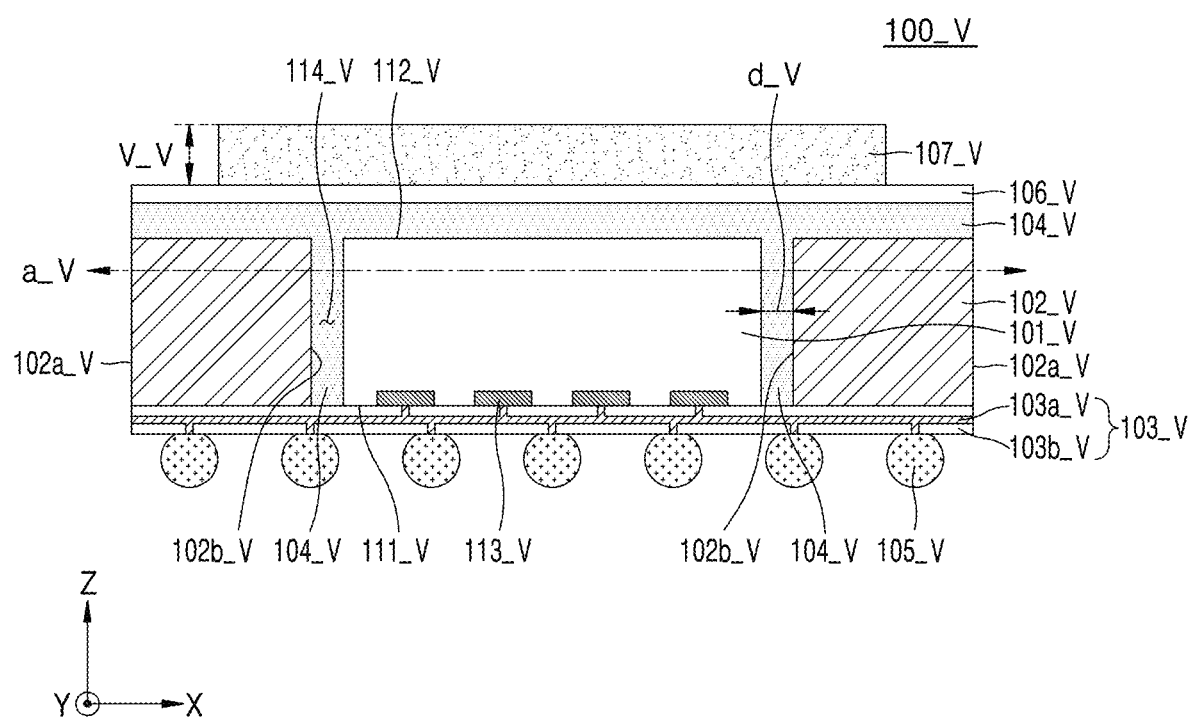
FIG. 94 is a perspective view of a semiconductor package according to an embodiment of the present disclosure.

FIG. 94 is a perspective view of a semiconductor package 100_V according to an embodiment of the present disclosure.

Referring to FIG. 94, the semiconductor package 100_V may include a semiconductor chip 101_V, a metal frame 102_V, a redistribution layer 103_V, a sealing material 104_V, an external connection terminal 105_V, an adhesive film 106_V, and a heat sink 107_V.

Referring to FIG. 94, the semiconductor package 100_V may include the metal frame 102_V. More specifically, the semiconductor package 100_V may include the metal frame 102_V on the redistribution layer 103_V.

In an embodiment, the metal frame 102_V may include a cavity 114_V, which is formed by an inner wall 102b_V of the metal frame 102_V. The semiconductor chip 101_V may be located inside the cavity 114_V of the metal frame 102_V and surrounded by the metal frame 102_V. To prevent an electrical short from occurring between the metal frame 102_V and the semiconductor chip 101_V, the inner wall 102b_V of the metal frame 102_V and the semiconductor chip 101_V may be spaced a predetermined distance d_V apart from each other.

In an embodiment, the sealing material 104_V, which will be described below, may be provided in the space formed between the inner wall 102b_V of the metal frame 102_V and the semiconductor chip 101_V. The sealing material 104_V may prevent a short from occurring between the semiconductor chip 101_V and the metal frame 102_V and fix the semiconductor chip 101_V and the metal frame 102_V to the upper surface of the redistribution layer 103_V.

In an embodiment, an outer wall 102a_V of the metal frame 102_V may be coplanar with the side surface of the semiconductor package 100_V. In other words, the outer wall 102a_V of the metal frame 102_V may be self-aligned to the side surface of the semiconductor package 100_V. Accordingly, when the semiconductor package 100_V is viewed from the side, the outer wall 102a_V of the metal frame 102_V may be exposed to the outside.

As shown in FIG. 94, the thickness of the metal frame 102_V may be substantially equal to the thickness of the semiconductor chip 101_V. However, the present disclosure is not limited thereto, and the thickness of the metal frame 102_V may be smaller or greater than the height of the semiconductor chip 101_V. The shape of the metal frame 102_V will be described in more detail below.

In an embodiment, the distance d_V between the semiconductor chip 101_V and the inner wall 102b_V of the metal frame 102_V may be about 50 μm to about 150 μm. Thus, heat generated by the semiconductor chip 101_V may be transferred to the metal frame 102_V and then may be efficiently dissipated to the outside.

In an embodiment, the semiconductor package 100_V may include the sealing material 104_V. The sealing material 104_V may be mounted on the redistribution layer 103_V to fix the semiconductor chip 101_V and the metal frame 102_V to the redistribution layer 103_V. In addition, the sealing material 104_V may surround and protect the semiconductor chip 101_V. As described above, to prevent the short from occurring between the semiconductor chip 101_V and the metal frame 102_V, the sealing material 104_V may be mounted in the space formed between the inner wall 102b_V of the metal frame 102_V and the semiconductor chip 101_V.

In an embodiment, the sealing material 104_V may include, for example, a silicon-based material, a thermosetting material, a thermoplastic material, an UV treatment material, and the like. As an example, the sealing material 104_V may include a polymer, such as resin, for example, an EMC.

In an embodiment, the sealing material 104_V may cover the side surface (not shown) and the upper surface 112_V of the semiconductor chip 101_V and the inner wall 102b_V and the upper surface of the metal frame 102_V. Here, the adhesive film 106_V, which will be described below, may be in contact with the upper surface of the sealing material 104_V. Referring to FIG. 94, the semiconductor chip 101_V and the metal frame 102_V may have substantially the same thickness, and the upper surface of the semiconductor chip 101_V and the upper surface of the metal frame 102_V may have the same height. Here, the thickness of the sealing material 104_V, which is located on the upper surface of the semiconductor chip 101_V and the upper surface of the metal frame 102_V, may be about 1 μm to about 10 μm.

In an embodiment, the semiconductor package 100_V may include the adhesive film 106_V. The adhesive film 106_V may be provided on the sealing material 104_V. The adhesive film 106_V may be in contact with at least one of the upper surface 112_V of the semiconductor chip 101_V and the upper surface of the sealing material 104_V. For example, as shown in FIG. 94, the adhesive film 106_V may not be in contact with the upper surface of the semiconductor chip 101_V but may be in contact with the upper surface of the sealing material 104_V.

In an embodiment, the adhesive film 106_V may include an epoxy resin having reliable adhesion to the sealing material 104_V and the semiconductor chip 101_V. In addition, the adhesive film 106_V may include a filler material (e.g., silver, aluminum, silicon dioxide, aluminum nitride, and boron nitride) having high thermal conductivity and may include thermally conductive aluminum oxide to maintain desired stiffness. The adhesive film 106_V may have a self-adhesive property and be adhered to an additional thermally-conductive adhesive tape. The adhesive tape may be a both-sided adhesive tape.

In an embodiment, the adhesive film 106_V may fix the heat sink 107_V to the sealing material 104_V of the semiconductor package 100_V. The thickness of the adhesive film 106_V in the semiconductor package 100_V may be in a range of about 5 μm to about 20 μm, more specifically, from about 10 μm to about 14 μm.

In an embodiment, the semiconductor package 100_V may efficiently dissipate heat generated by the semiconductor chip 101_V in the semiconductor package 100_V due to the metal frame 102_V and the heat sink 107_V.

More specifically, heat generated by the semiconductor chip 101_V may be dissipated to the upper surface 112_V and the side surface (not shown) of the semiconductor chip 101_V. The heat dissipated to the upper surface of the semiconductor chip 101_V may sequentially pass though the upper surface 112_V of the semiconductor chip 101_V, the sealing material 104_V, the adhesive film 106_V, and the heat sink 107_V and be dissipated to the outside. In addition, the heat dissipated to the side surface (not shown) of the semiconductor chip 101_V may sequentially pass though the side surface of the semiconductor chip 101_V, the sealing material 104_V, and the metal frame 102_V and be dissipated to the outside.

In the semiconductor package 100_V according to an embodiment of the present disclosure, because the heat sink 107_V having a relatively high thermal conductivity and the outer wall 102a_V of the metal frame 102_V are exposed to the outside, heat generated by the semiconductor chip 101_V, may be efficiently dissipated to the outside.

Figure 95:
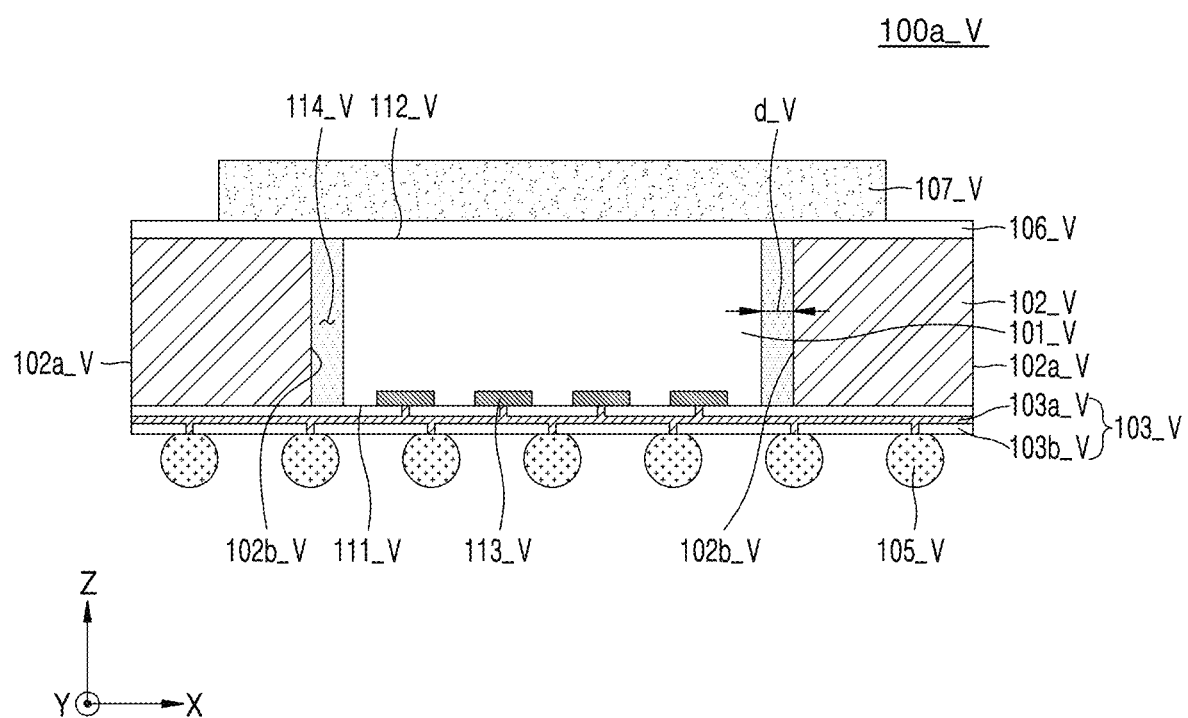
FIG. 95 is a cross-sectional view of a semiconductor package according to an embodiment of the present disclosure.

FIG. 95 is a cross-sectional view of a semiconductor package 100a_V according to an embodiment of the present disclosure. The semiconductor package 100a_V may include a semiconductor chip 101_V, a metal frame 102_V, a redistribution layer 103_V, a sealing material 104_V, an external connection terminal 105_V, an adhesive film 106_V, and a heat sink 107_V. Technical characteristics of the semiconductor chip 101_V, the metal frame 102_V, the redistribution layer 103_V, the sealing material 104_V, the external connection terminal 105_V, the adhesive film 106_V, and the heat sink 107_V may be substantially the same as those described with reference to FIG. 94, and thus, detailed descriptions thereof will be omitted.

Referring to FIG. 95, the sealing material 104_V of the semiconductor package 100a_V may cover the side surface of the semiconductor chip 101_V and the inner wall 102b_V of the metal frame 102_V but may not cover the upper surface 112_V of the semiconductor chip 101_V and the upper surface of the metal frame 102_V. In other words, the upper surface of the semiconductor chip 101_V may be exposed by the sealing material 104_V.

In an embodiment, the upper surface of the semiconductor chip 101_V and the upper surface of the sealing material 104_V may be in contact with the adhesive film 106_V. Thus, the thickness of the semiconductor package 100_V may be reduced, and heat generated by the semiconductor chip 101_V may not pass the sealing material 104_V but sequentially pass through the adhesive film 106_V located on the upper surface 112_V of the semiconductor chip 101_V and the heat sink 107_V located on the adhesive film 106_V and be dissipated to the outside. The heat generated by the semiconductor chip 101_V may not pass through the sealing material 104_V having a lower thermal conductivity than the adhesive film 106_V and the heat sink 107_V. Accordingly, heat transfer resistance may be reduced, and thus, the heat dissipation performance of the semiconductor package 100a_V may be improved.

Figure 96:
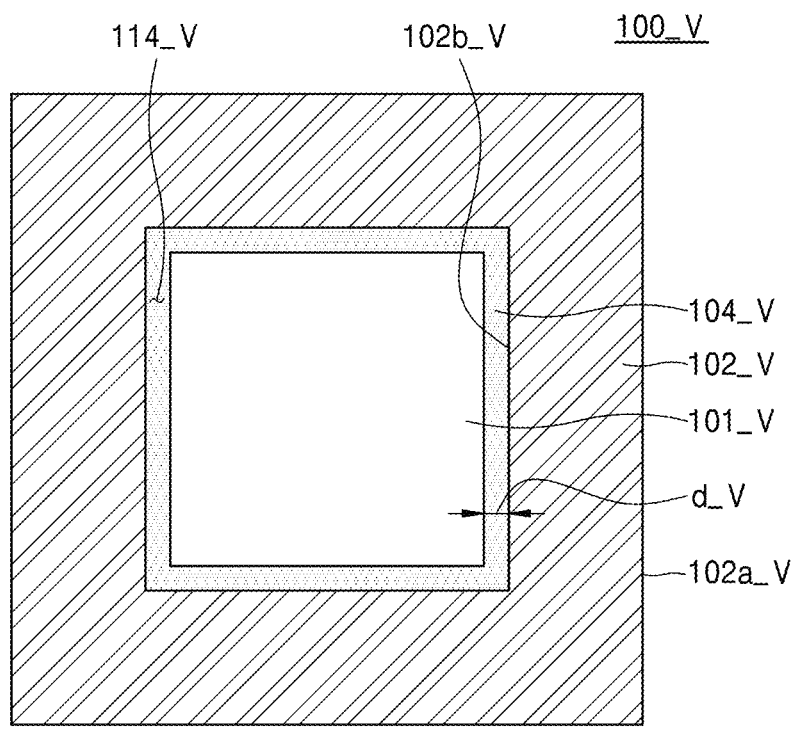
FIG. 96 is a plan view of a semiconductor package taken along line a_V of FIG. 94, illustrating according to an embodiment of the present disclosure.

FIG. 96 is a plan view corresponding to a line a_V of FIG. 94, illustrating the semiconductor package 100_V according to an embodiment of the present disclosure. As described above, the metal frame 102_V of the semiconductor package 100_V may include the cavity 114_V formed by the inner wall 102b_V thereof. The semiconductor chip 101_V may be arranged inside the cavity 114_V of the metal frame 102_V. To prevent an electric short with the metal frame 102_V of the semiconductor chip 101_V, the semiconductor chip 101_V may be located a predetermined distance d_V apart from the inner wall 102b_V of the metal frame 102_V. The sealing material 104_V may be formed in a space between the inner wall 102b_V of the metal frame 102_V and the semiconductor chip 101_V. The sealing material 104_V may prevent an electric short from occurring between the metal frame 102_V and the semiconductor chip 101_V and fix the metal frame 102_V and the semiconductor chip 101_V onto the redistribution layer 103_V.

In an embodiment, as shown in FIG. 96, the metal frame 102_V may have a rectangular parallelepiped shape including the cavity 114_V. However, the metal frame 102_V is not limited to the above-described shape and may have various other shapes. For example, the metal frame 102_V may have a circular pillar shape or polygonal pillar shape including the cavity 114_V.

In an embodiment, as the distance d_V between the semiconductor chip 101_V and the inner wall 102b_V of the metal frame 102_V is reduced, a heat dissipation effect of the semiconductor package 100_V may be further improved. In other words, as the distance d_V is reduced, a volume of a space occupied by the sealing material 104_V having a lower thermal conductivity than the metal frame 102_V may be reduced. Accordingly, transfer resistance of heat generated by the semiconductor chip 101_V may be reduced, and thus, the heat dissipation effect of the semiconductor package 100_V may be improved.

Figure 97:
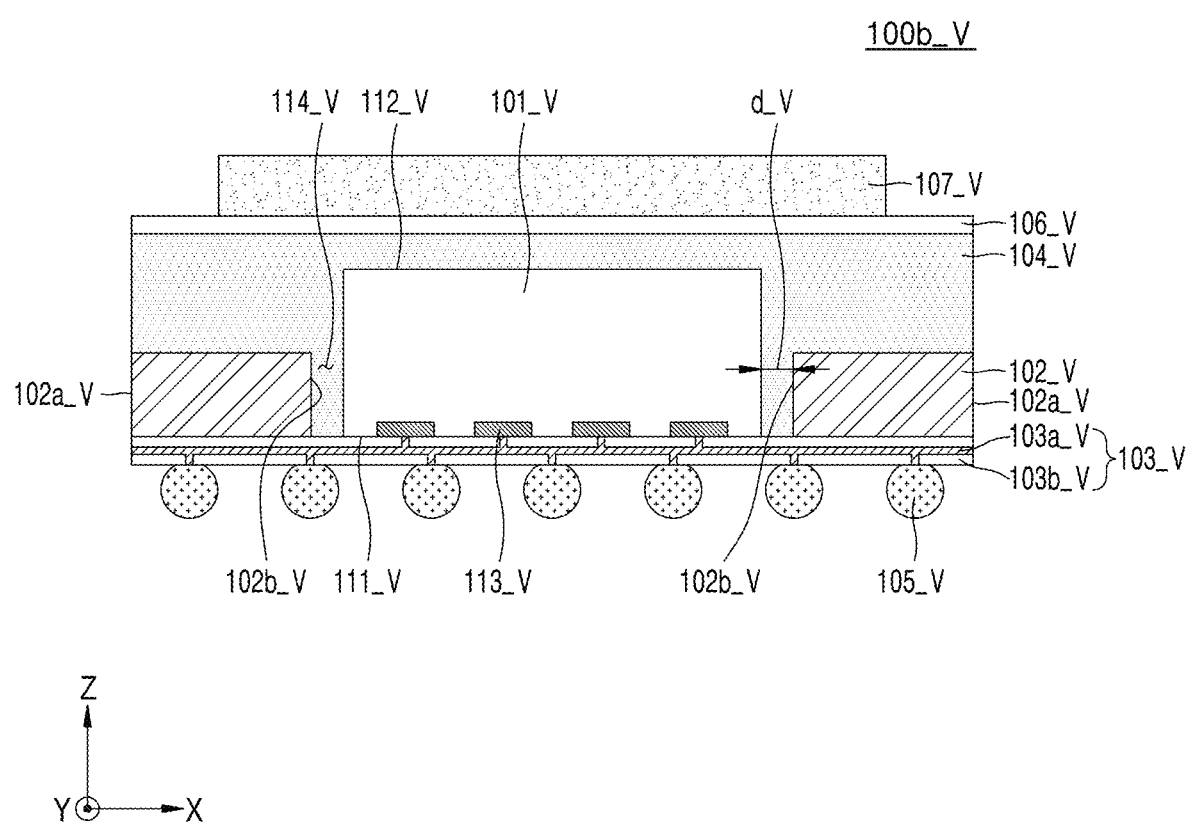
FIG. 97 is a cross-sectional view of a semiconductor package according to an embodiment of the present disclosure.

FIG. 97 is a cross-sectional view of a semiconductor package 100b_V according to an embodiment of the present disclosure. The semiconductor package 100b_V may include a semiconductor chip 101_V, a metal frame 102_V, a redistribution layer 103_V, a sealing material 104_V, an external connection terminal 105_V, an adhesive film 106_V, and a heat sink 107_V. Technical characteristics of the semiconductor chip 101_V, the metal frame 102_V, the redistribution layer 103_V, the sealing material 104_V, the external connection terminal 105_V, the adhesive film 106_V, and the heat sink 107_V may be substantially the same as those described with reference to FIG. 94, and thus, detailed descriptions thereof will be omitted.

In an embodiment, a thickness of the metal frame 102_V of the semiconductor package 100b_V may be less than a thickness of the semiconductor chip 101_V. In other words, the upper surface of the metal frame 102_V may have a smaller height than the upper surface of the semiconductor chip 101_V.

Figure 98:
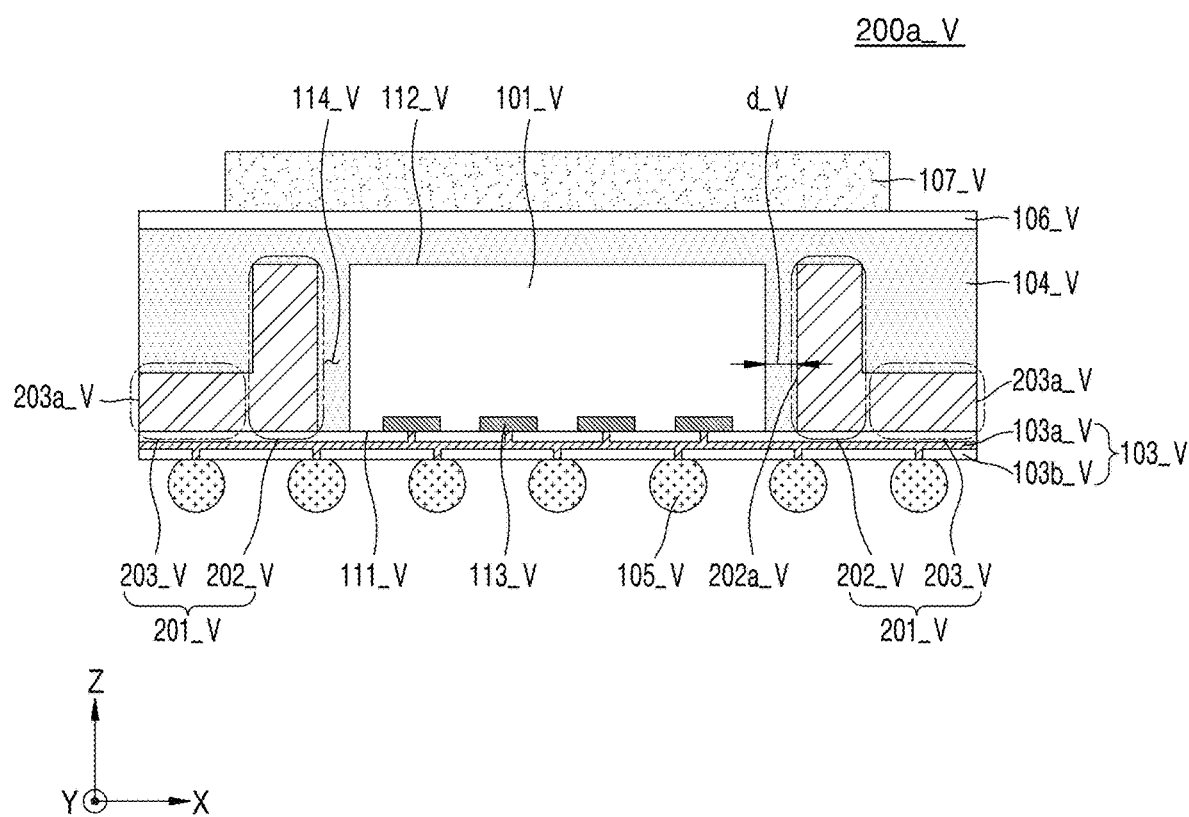
FIGS. 98 and 99 are cross-sectional views of a semiconductor package according to an embodiment of the present disclosure.
Figure 99:
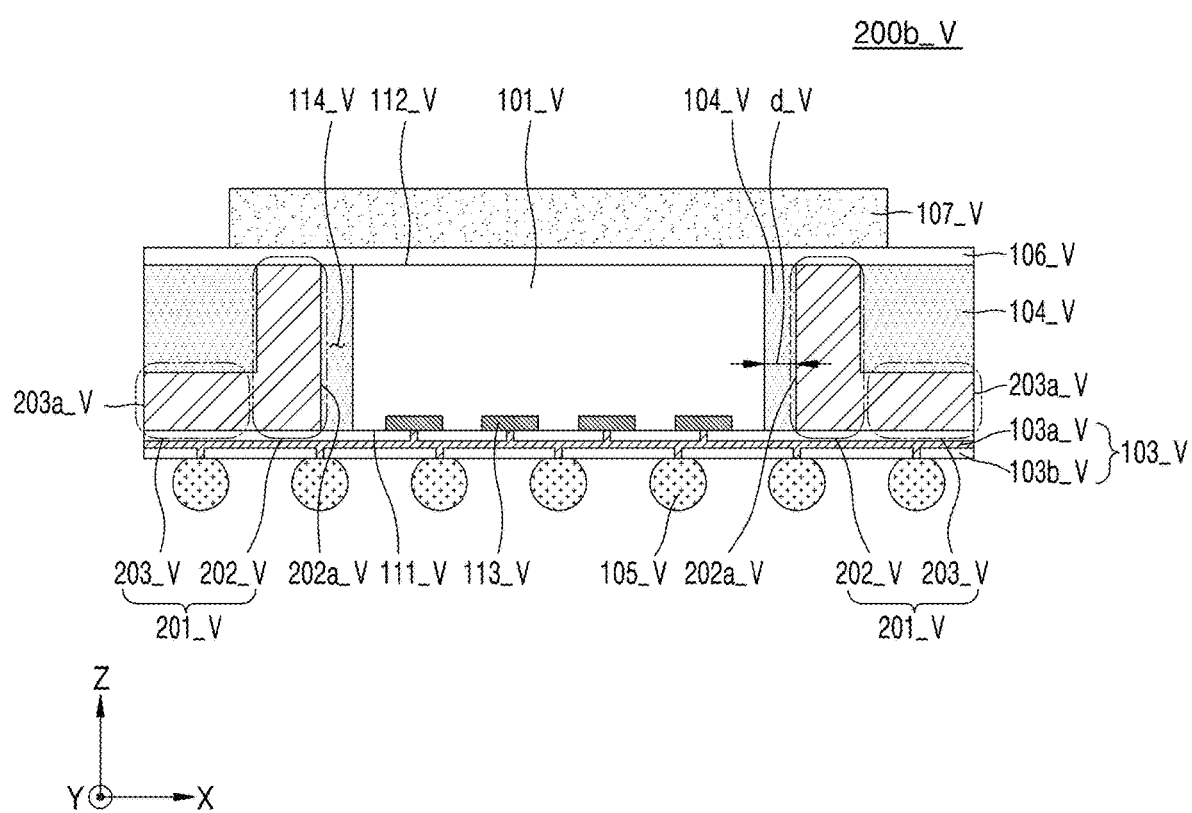

FIGS. 98 and 99 are cross-sectional views of semiconductor packages 200a_V and 200b_V according to an embodiment of the present disclosure. Each of the semiconductor packages 200a_V and 200b_V may include a semiconductor chip 101_V, a metal frame 201_V, a redistribution layer 103_V, a sealing material 104_V, an external connection terminal 105_V, an adhesive film 106_V, and a heat sink 107_V. Technical characteristics of the semiconductor chip 101_V, the redistribution layer 103_V, the sealing material 104_V, the external connection terminal 105_V, the adhesive film 106_V, and the heat sink 107_V may be substantially the same as those described with reference to FIG. 94, and thus, detailed descriptions thereof will be omitted.

Referring to FIGS. 98 and 99, the metal frame 201_V of each of the semiconductor packages 200a_V and 200b_V may include a first region 202_V, which forms an inner wall 202a_V of the metal frame 201_V, and a second region 203_V, which extends outward from the first region 202_V and forms an outer wall 203a_V of the metal frame 201_V. In an embodiment, the thickness of the first region 202_V may be different from the thickness of a second region 203_V. In other words, the upper surface of the first region 202_V and the upper surface of the second region 203_V may have different heights. For example, the thickness of the first region 202_V may be greater than the thickness of the second region 203_V.

In an embodiment, the first region 202_V of the metal frame 201_V may be a region that is not cut in the singulation process on the semiconductor packages 200a_V and 200b_V, and the second region 203_V is a region that is cut in the singulation process of the semiconductor packages 200a_V and 200b_V. In an embodiment of the present disclosure, the material of the first region 202_V may be different from the material of the second region 203_V. For example, the material of the second region 203_V may include a material having a lower stiffness than the material of the first region 202_V. Accordingly, flexibility in the cutting process on the semiconductor packages 200a_V and 200b_V may be increased in the singulation process on semiconductor packages 200a_V and 200b_V. For example, the choice of a cutting blade for cutting the second region 203_V may be widened, and the cutting process on the second region 203_V may be performed rapidly.

In an embodiment, the first region 202_V of the metal frame 201_V may be located in each of the semiconductor packages 200a_V and 200b_V and may not be exposed to the outside. In addition, the outer wall 203a_V of the second region 203_V of the metal frame 201_V may be coplanar with the side surface of each of the semiconductor packages 200a_V and 200b_V. In other words, the outer wall 203a_V of the second region 203_V may be self-aligned to the side surface of each of the semiconductor packages 200a_V and 200b_V. When each of the semiconductor packages 200a_V and 200b_V is viewed from the side, the outer wall 203a_V of the metal frame 201_V may be exposed to the outside.

Referring to FIG. 98, the thickness of the first region 202_V of the metal frame 201_V may be greater than the thickness of the second region 203_V. Also, the thickness of the first region 202_V may be substantially equal to the thickness of the semiconductor chip 101_V, and thus, the upper surface of the first region 202_V and the upper surface of the semiconductor chip 101_V may be located at substantially the same height. The sealing material 104_V may be mounted on the upper surface of the first region 202_V and the upper surface of the semiconductor chip 101_V, and the sealing material 104_V may be in contact with the first region 202_V and the semiconductor chip 101_V.

Referring to FIG. 99, the thickness of the first region 202_V of the metal frame 201_V may be greater than the thickness of the second region 203_V. In addition, the thickness of the first region 202_V may be substantially equal to the thickness of the semiconductor chip 101_V, and thus, the upper surface of the first region 202_V and the upper surface of the semiconductor chip 101_V may be formed at substantially the same height. However, the sealing material 104_V may not be mounted on the upper surface of the first region 202_V and the upper surface of the semiconductor chip 101_V. The adhesive film 106_V may be mounted on the upper surface of the first region 202_V and the upper surface of the semiconductor chip 101_V and may be in contact with the first region 202_V and the semiconductor chip 101_V.

In an embodiment, the thickness of the second region 203_V of the metal frame 201_V may be less than the thickness of the first region 202_V, and thus, flexibility in the cutting process of the semiconductor packages 200a_V and 200b_V may be increased in the singulation process on semiconductor packages 200a_V and 200b_V.

Figure 100:
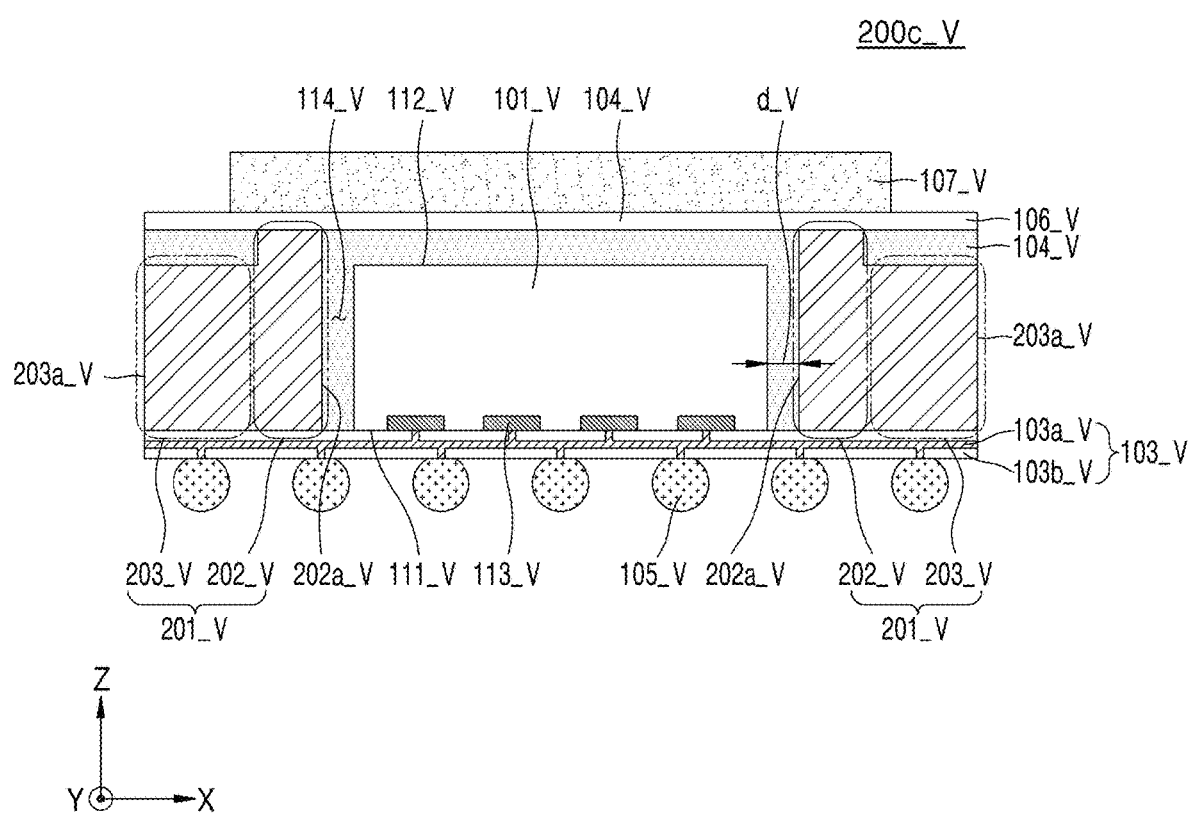
FIGS. 100 and 101 are cross-sectional views of a semiconductor package according to an embodiment of the present disclosure.
Figure 101:
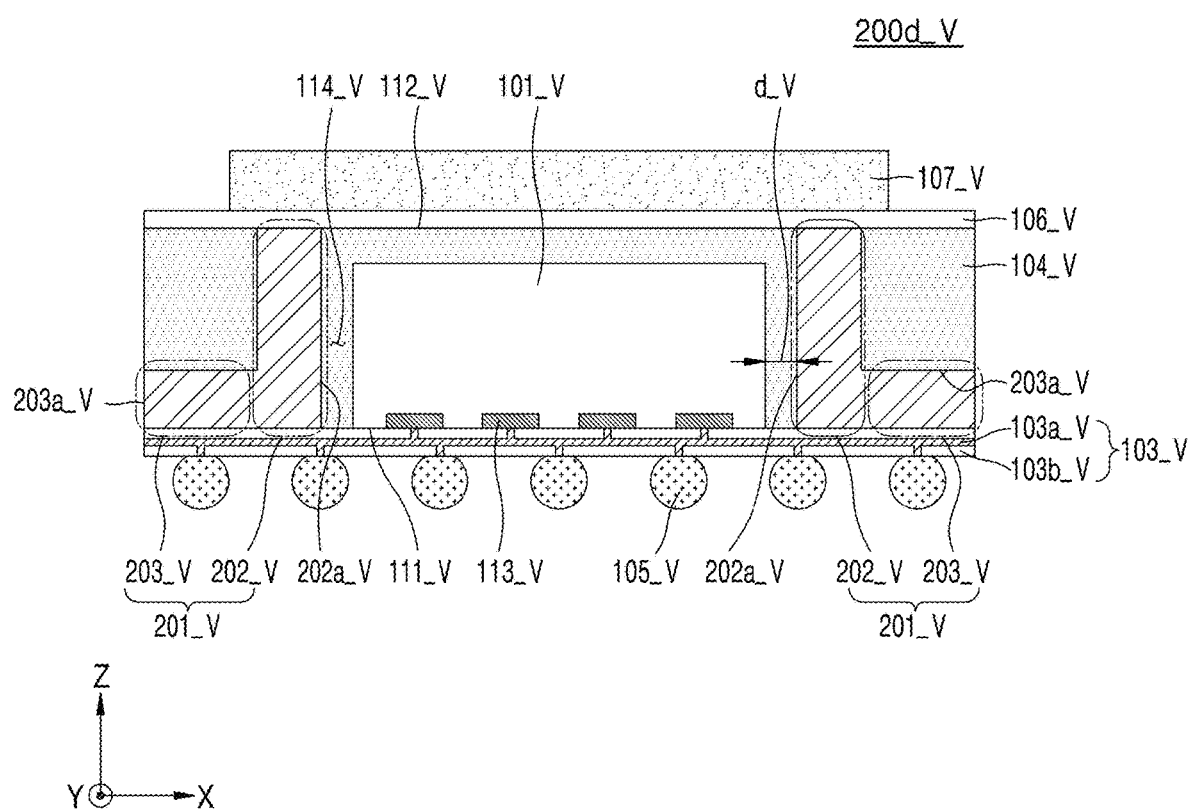

FIGS. 100 and 101 are cross-sectional views of semiconductor packages 200c_V and 200d_V according to an embodiment of the present disclosure. Each of the semiconductor packages 200c_V and 200d_V may include a semiconductor chip 101_V, a metal frame 201_V, a redistribution layer 103_V, a sealing material 104_V, an external connection terminal 105_V, an adhesive film 106_V, and a heat sink 107_V. Technical characteristics of the semiconductor chip 101_V, the redistribution layer 103_V, the sealing material 104_V, the external connection terminal 105_V, the adhesive film 106_V, and the heat sink 107_V may be substantially the same as those described with reference to FIG. 94, and thus, detailed descriptions thereof will be omitted.

Referring to FIGS. 100 and 101, the metal frame 201_V of each of the semiconductor packages 200c_V and 200d_V may include the first region 202_V, which forms the inner wall 202a_V of the metal frame 201_V, and the second region 203_V, which extends outward from the first region 202_V to form the outer wall 203a_V of the metal frame 201_V. In an embodiment, the thickness of the first region 202_V may be different from the thickness of the second region 203_V. In other words, the upper surface of the first region 202_V and the upper surface of the second region 203_V may be located at different heights. For example, the thickness of the first region 202_V may be greater than the thickness of the second region 203_V.

Referring to FIG. 100, the thickness of the first region 202_V of the metal frame 201_V may be greater than the thickness of the second region 203_V. For example, the thickness of the first region 202_V may be substantially equal to a length from the upper surface of the redistribution layer 103_V to the lower surface of the adhesive film 106_V. Accordingly, the upper surface of the first region 202_V may be in contact with the adhesive film 106_V. In addition, the thickness of the second region 203_V may be substantially equal to the thickness of the semiconductor chip 101_V, and thus, the upper surface of the second region 203_V and the upper surface of the semiconductor chip 101_V may be located at substantially the same height. The sealing material 104_V may be mounted on the upper surface of the second region 203_V.

Referring to FIG. 101, the thickness of the first region 202_V of the metal frame 201_V may be greater than the thickness of the second region 203_V. For example, the thickness of the first region 202_V may be substantially equal to a length from the upper surface of the redistribution layer 103_V to the lower surface of the adhesive film 106_V. Accordingly, the upper surface of the first region 202_V may be in contact with the adhesive film 106_V. Also, the thickness of the second region 203_V may be less than the thickness of the semiconductor chip 101_V. In other words, the upper surface of the second region 203_V may be located at a lower height than the upper surface of the semiconductor chip 101_V. In addition, the sealing material 104_V may be mounted on the upper surface of the second region 203_V.

In an embodiment, the thickness of the second region 203_V of the metal frame 201_V may be less than the thickness of the first region 202_V, and thus, flexibility in the cutting process of the semiconductor packages 200c_V and 200d_V may be increased in the singulation process on the semiconductor packages 200c_V and 200d_V.

In an embodiment, the first region 202_V and the second region 203_V described above may be separate elements. Also, the first region 202_V and the second region 203_V may be in contact with each other and integrated with each other.

Figure 102:
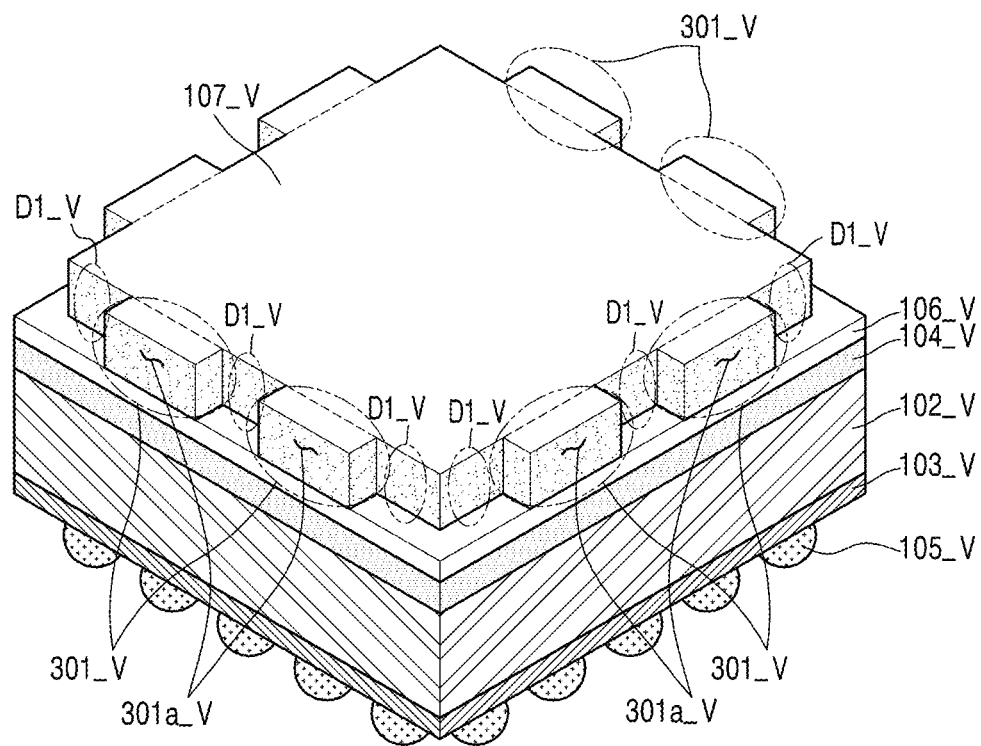
FIG. 102 is a perspective view of a semiconductor package according to an embodiment of the present disclosure.

FIG. 102 is a perspective view of a semiconductor package 300_V according to an embodiment of the present disclosure. The semiconductor package 300_V may include a semiconductor chip 101_V, a metal frame 102_V, a sealing material 104_V, a redistribution layer 103_V, an external connection terminal 105_V, an adhesive film 106_V, and a heat sink 107_V. Technical characteristics of the semiconductor chip 101_V, the metal frame 102_V, the redistribution layer 103_V, a sealing material 104_V, the external connection terminal 105_V, the adhesive film 106_V, and the heat sink 107_V may be substantially the same as those described with reference to FIG. 94 and thus, detailed descriptions thereof will be omitted.

In an embodiment, the semiconductor package 300_V may further include a protrusion 301_V, which extends from the side surface of the heat sink 107_V to the side surface of the semiconductor package 300_V. After a connection region S_V of a heat sink group (refer to 350_V in FIG. 103), which will be described below, is cut by using a singulation process of the semiconductor package 300_V, the protrusion 301_V may be a region of the connection region S_V.

In an embodiment, the upper surface of the protrusion 301_V may have the same height as the upper surface of the heat sink 107_V. Also, the outer side surface 301a_V of the protrusion 301_V may be self-aligned to the side surface of the semiconductor package 300_V. In addition, the protrusion 301_V may be integrated with the heat sink 107_V.

In an embodiment, a plurality of protrusions 301_V may be formed to extend from one side surface of the heat sink 107_V to one side surface of the semiconductor package 300_V. For example, as shown in FIG. 102, two the protrusions 301_V may be formed to extend from the one side surface of the heat sink 107_V to the one side surface of the semiconductor package 300_V. However, the number of protrusions 301_V extending from the one side surface of the heat sink 107_V to the one side surface of the semiconductor package 300_V is not limited to the above description and may vary.

In an embodiment, when a plurality of protrusions 301_V are formed to extend from the one side surface of the heat sink 107_V to the one side surface of the semiconductor package 300_V, a stepped portion D1_V may be formed between the plurality of protrusions 301_V due to a height difference between the upper surface of the heat sink 107_V and the upper surface of the adhesive film 106_V. The number of stepped portions D1_V formed at the one side surface of the heat sink 107_V may vary according to the number of protrusions 301_V formed at the one side surface of the heat sink 107_V. For example, referring to FIG. 102, when two protrusions 301_V are formed at the one side surface of the heat sink 107_V, three stepped portions D1_V may be formed at the one side surface of the heat sink 107_V.

In an embodiment, one protrusion 301_V may be formed to extend from the one side surface of the heat sink 107_V to the one side surface of the semiconductor package 300_V. When one protrusion 301_V is formed at the one side surface of the heat sink 107_V, two stepped portions D1_V may be formed at the one side surface of the heat sink 107_V.

In an embodiment, the material of the protrusion 301_V may be different from the material of the heat sink 107_V. For example, the material of the protrusion 301_V may have a lower stiffness than the material of the heat sink 107_V. In an embodiment, the protrusion 301_V may include a metal-based material, a ceramic-based material, a carbon-based material, and a polymer-based material. Accordingly, the cutting of the connection region S_V may be easily performed in a singulation process on the semiconductor package 300_V, which will be described below.

Figure 104:
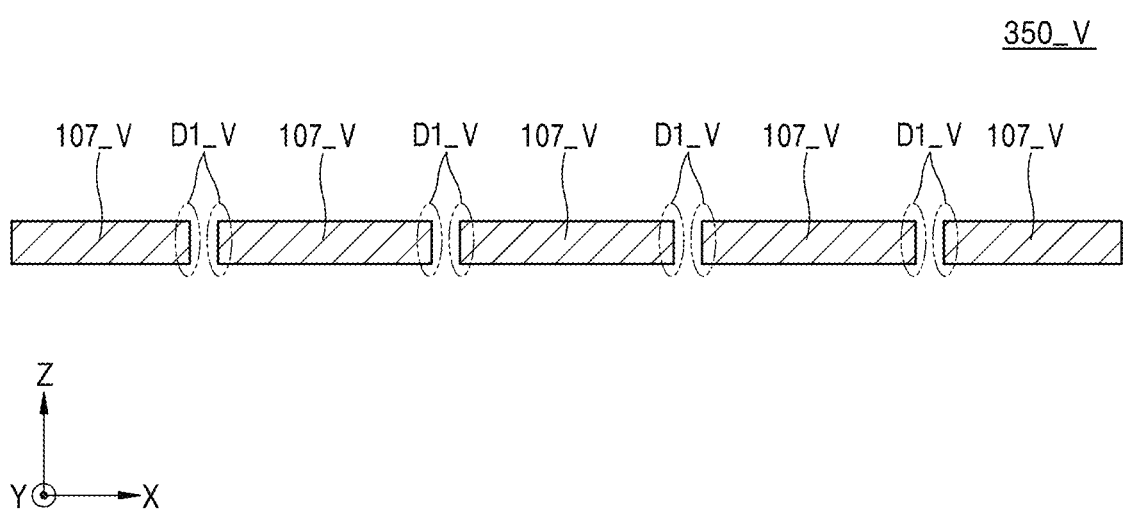
FIG. 104 is a cross-sectional view taken along line b_V of FIG. 103, illustrating a heat sink group according to an embodiment of the present disclosure.
Figure 105:
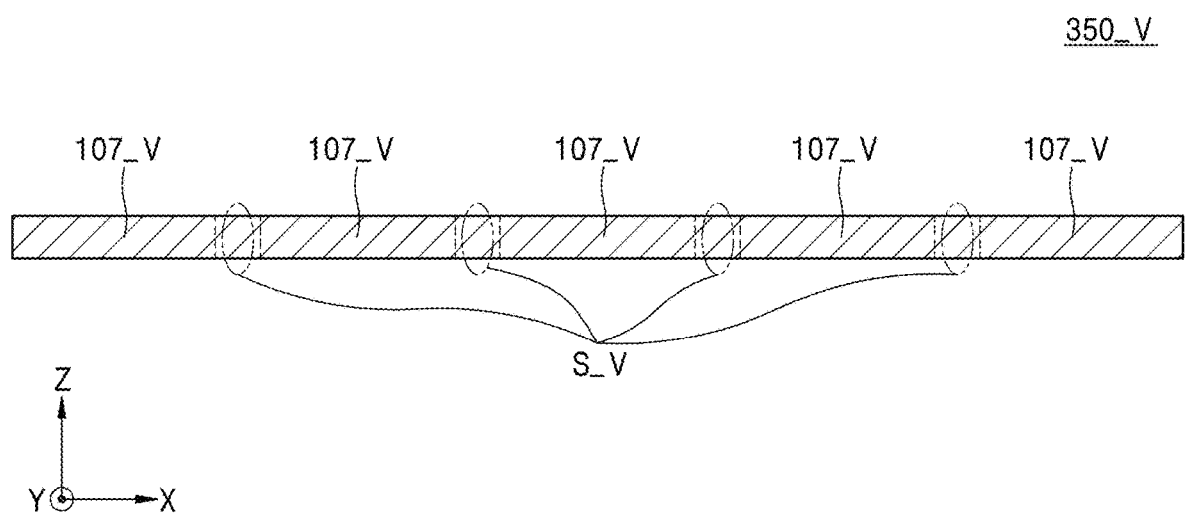
FIG. 105 is a cross-sectional view taken along line c_V of FIG. 103, illustrating a heat sink group according to an embodiment of the present disclosure.

Referring to FIG. 104, the stepped portion D1_V may be formed in a portion where the connection region S_V are not formed (i.e., a space between the connection regions S_V) due to a height difference between the upper surface of the heat sink 107_V and the upper surface of the adhesive film 106_V. Also, referring to FIG. 105, the stepped portion D1_V may not be formed in a portion where the connection region S_V is formed.

Figure 103:
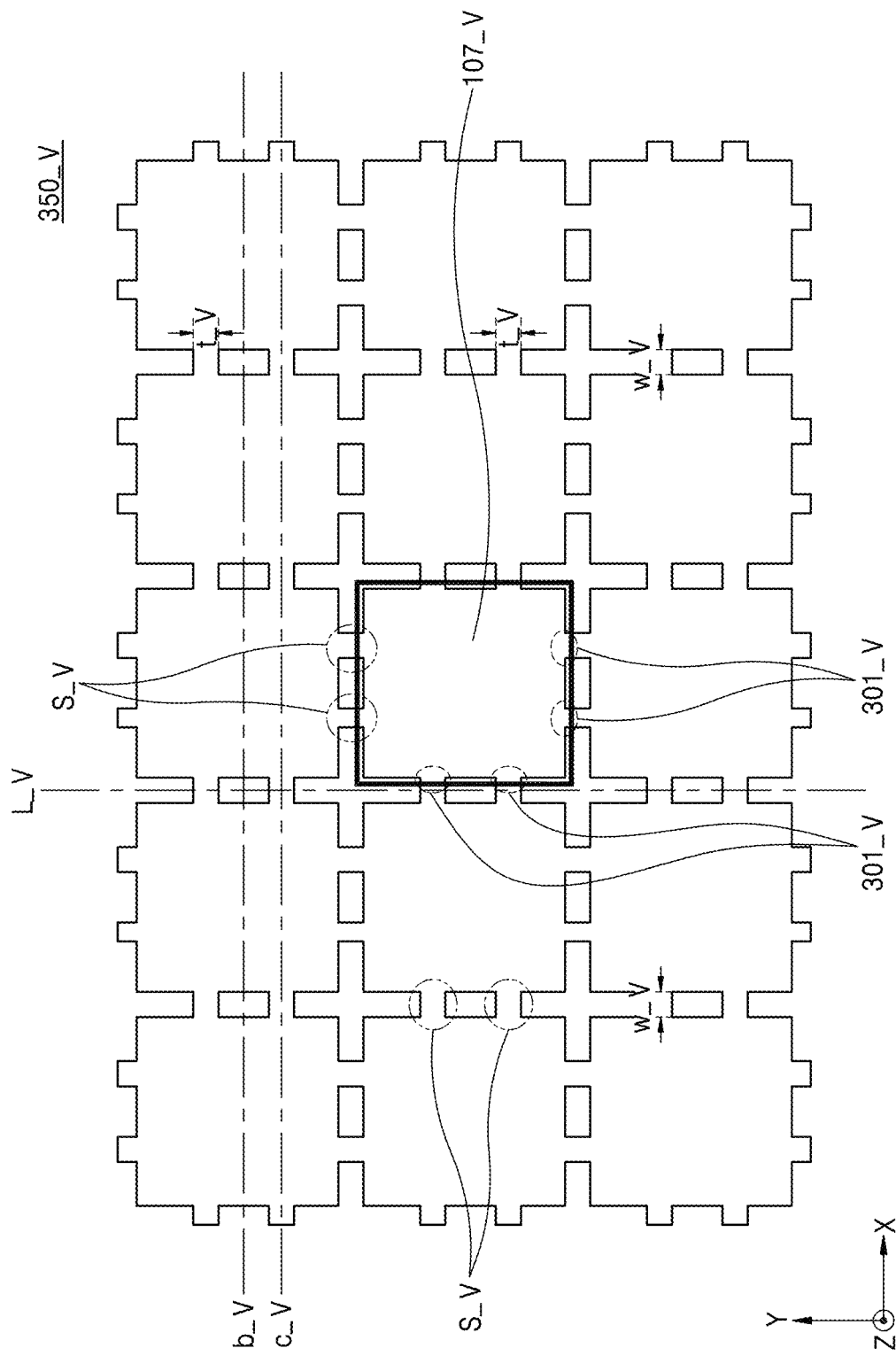
FIG. 103 is a plan view of a heat sink group in which a plurality of heat sinks are connected to each other, according to an embodiment of the present disclosure.
Figure 106:
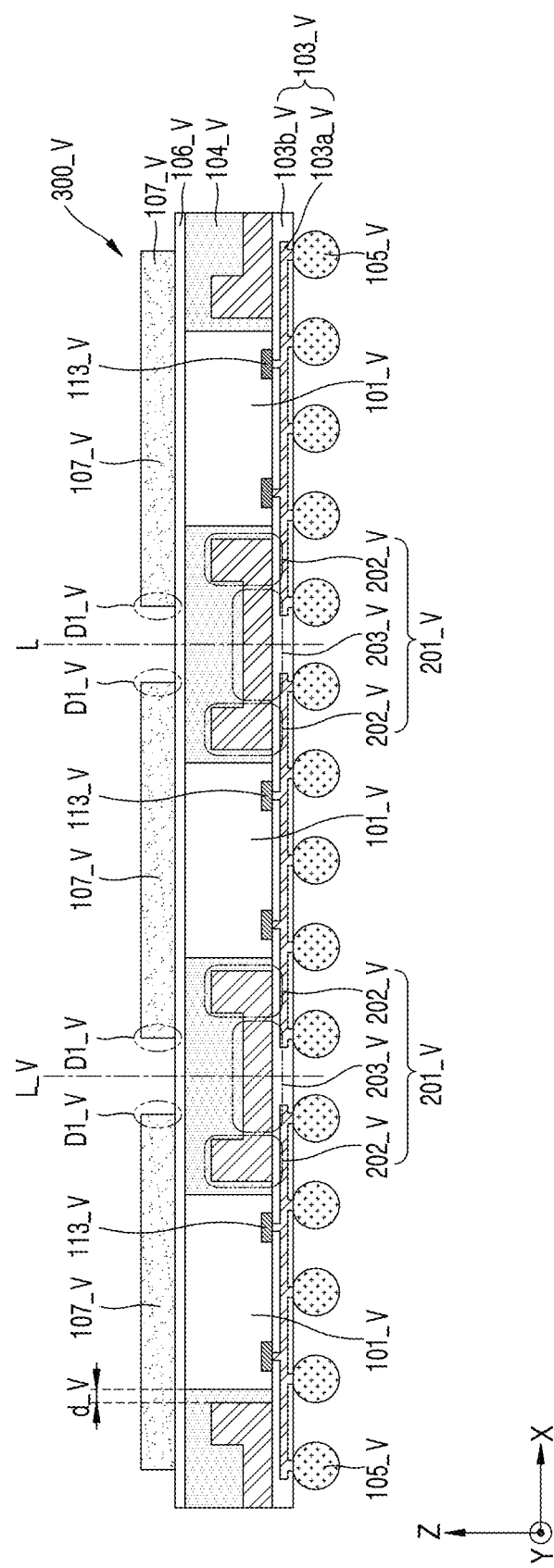
FIG. 106 is a cross-sectional view taken along line b_V of FIG. 103, illustrating a plurality of semiconductor packages on which a heat sink group according to an embodiment of the present disclosure is mounted.
Figure 107:
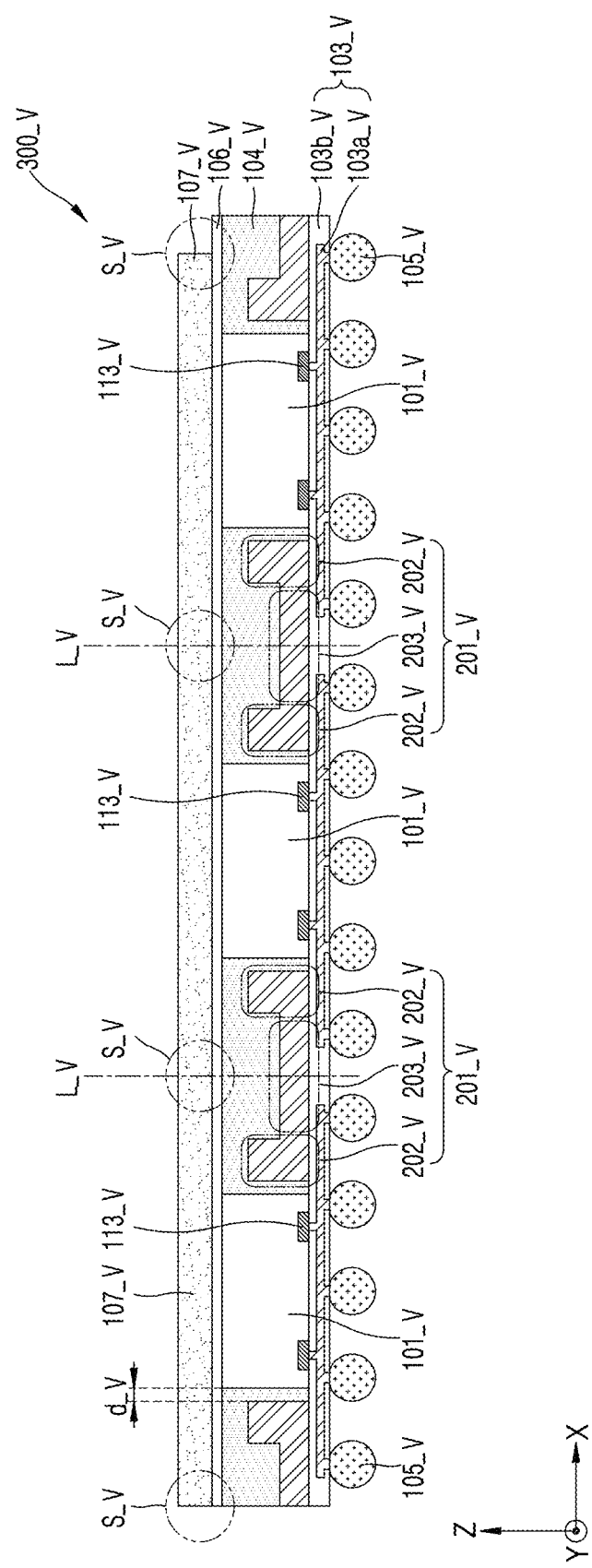
FIG. 107 is a cross-sectional view taken along line c_V of FIG. 103, illustrating a plurality of semiconductor packages on which a heat sink group according to an embodiment of the present disclosure is mounted.

FIG. 106 is a cross-sectional view taken along line b_V of FIG. 103, illustrating the plurality of semiconductor packages 300_V on which the heat sink group 350_V is mounted, according to an embodiment of the present disclosure. FIG. 107 is a cross-sectional view taken along line c_V of FIG. 103, illustrating the plurality of semiconductor packages 300_V on which the heat sink group 350_V is mounted, according to an embodiment of the present disclosure.

Referring to FIG. 106, a cutting process on the semiconductor packages 300_V may include sequentially cutting the adhesive film 106_V, the sealing material 104_V, the second region 203_V of the metal frame 201_V, and the redistribution layer 103_V in a portion where the connection region S_V is not formed. Referring to FIG. 107, the cutting process on the semiconductor packages 300_V may include sequentially cutting the connection region S_V, the adhesive film 106_V, the sealing material 104_V, the second region 203_V of the metal frame 201_V, and the redistribution layer 103_V in a portion where the connection region S_V is formed.

In an embodiment, when a material of the connection region S_V has a lower stiffness than a material of the heat sink 107_V, the cutting process on the semiconductor packages 300_V may be easily performed. In addition, the first length w_V and the second length t_V of the connection region S_V may be minimized to facilitate the cutting process.

In an embodiment, because the second region 203_V of the metal frame 201_V may include a material having a lower stiffness than a material of the first region 202_V, the cutting process on the semiconductor packages 300_V may be easily performed. In an embodiment, because a thickness of the second region 203_V of the metal frame 201_V may be less than a thickness of the first region 202_V, the cutting process on the semiconductor packages 300_V may be easily performed.

Figure 108:
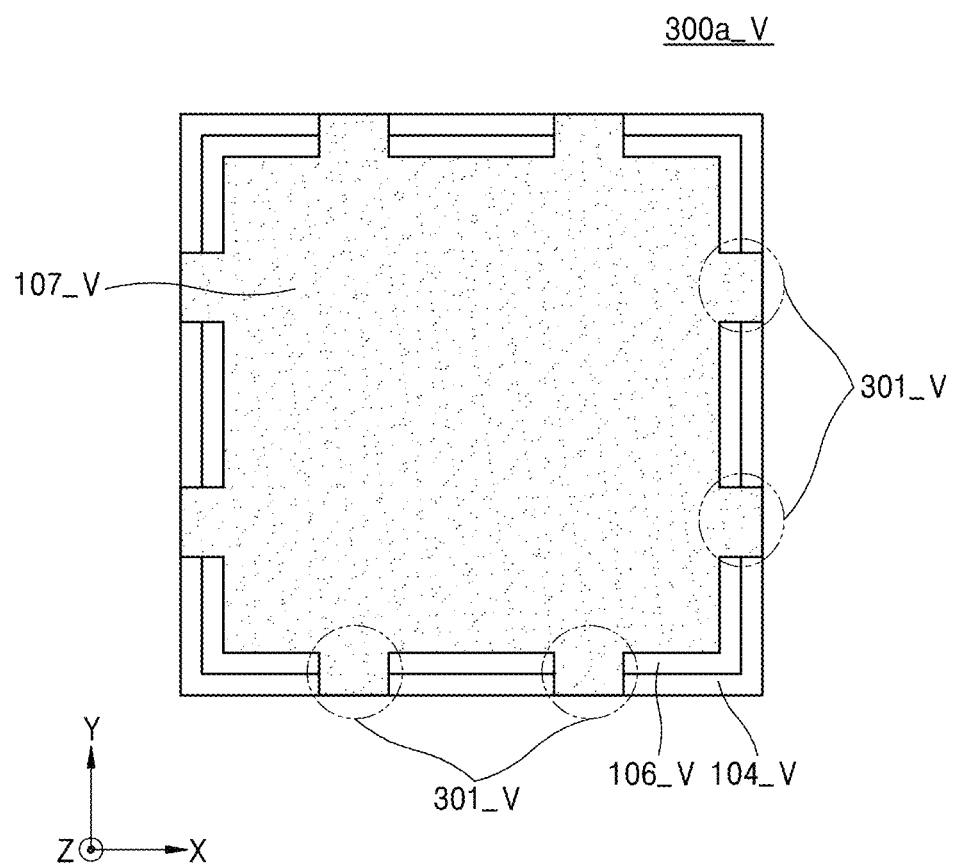
FIG. 108 is a plan view of a semiconductor package according to an embodiment of the present disclosure.

FIG. 108 is a plan view of a semiconductor package 300a_V according to an embodiment of the present disclosure. The semiconductor package 300a_V may include a semiconductor chip 101_V, a metal frame 102_V, a redistribution layer 103_V, a sealing material 104_V, an external connection terminal 105_V, an adhesive film 106_V, and a heat sink 107_V. Technical characteristics of the semiconductor chip 101_V, the metal frame 102_V, the redistribution layer 103_V, the sealing material 104_V, the external connection terminal 105_V, the adhesive film 106_V, and the heat sink 107_V may be substantially the same as those described with reference to FIG. 94, and thus, detailed descriptions thereof will be omitted.

Referring to FIG. 108, the footprint of the adhesive film 106_V may be less than the footprint of the semiconductor package 300a_V. Also, the footprint of the adhesive film 106_V may be less than the footprint of the sealing material 104_V. As shown in FIG. 108, the footprint of the adhesive film 106_V may be greater than the footprint of the heat sink 107_V and less than the footprint of the sealing material 104_V.

In an embodiment, when the semiconductor package 300a_V is viewed from above, at least one of the adhesive film 106_V and the sealing material 104_V may be exposed to the outside and observed. For example, as shown in FIG. 108, when the footprint of the adhesive film 106_V is greater than the footprint of the heat sink 107_V and less than the footprint of the sealing material 104_V, both the adhesive film 106_V and the sealing material 104_V may be exposed to the outside in a view of the semiconductor package 300a_V from above.

However, the present disclosure is not limited to the above. As shown in FIG. 102, when the footprint of the adhesive film 106_V is greater than the footprint of the heat sink 107_V and substantially equal to the footprint of the sealing material 104_V, in the view of the semiconductor package 300_V from above, the sealing material 104_V may not be exposed to the outside, and only the adhesive film 106_V may be exposed to the outside.

In an embodiment, when each of the semiconductor packages 300_V and 300a_V is viewed from above, an exposed area of the adhesive film 106_V and the sealing material 104_V may be about 5% to about 40% of an area of the upper surface of each of the semiconductor packages 300_V and 300a_V.

Figure 109:
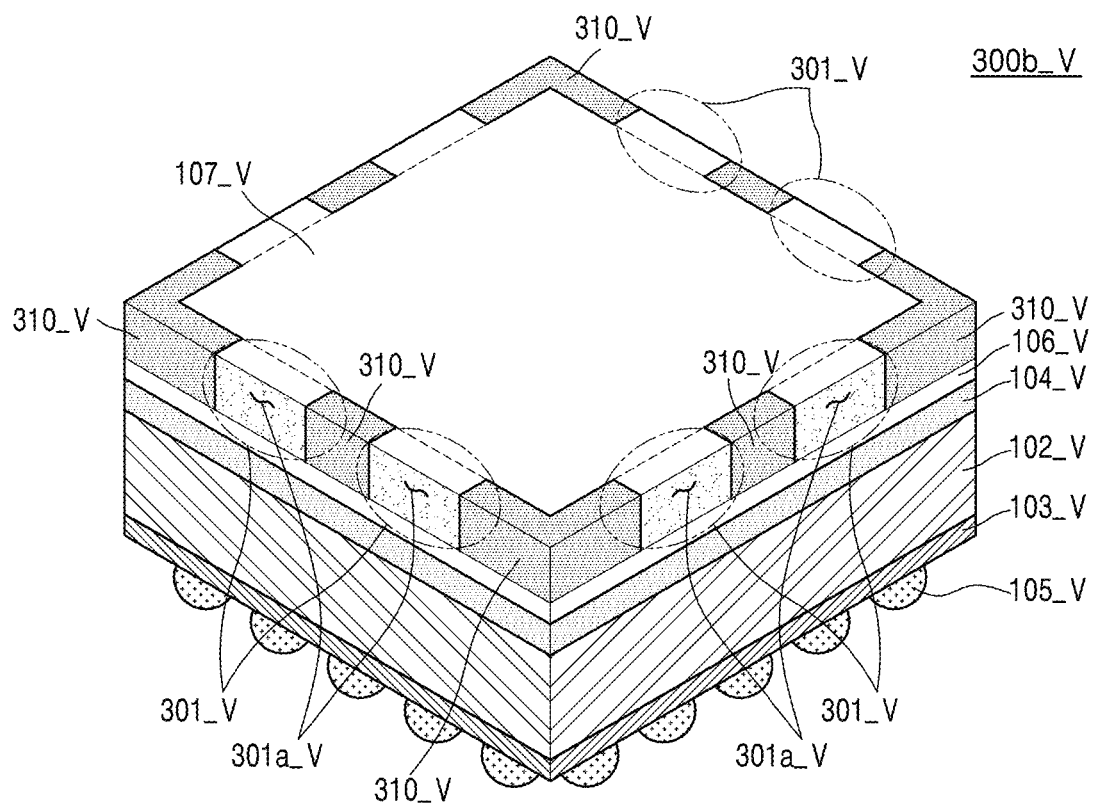
FIGS. 109 and 110 are perspective views of a semiconductor package according to an embodiment of the present disclosure.
Figure 110:
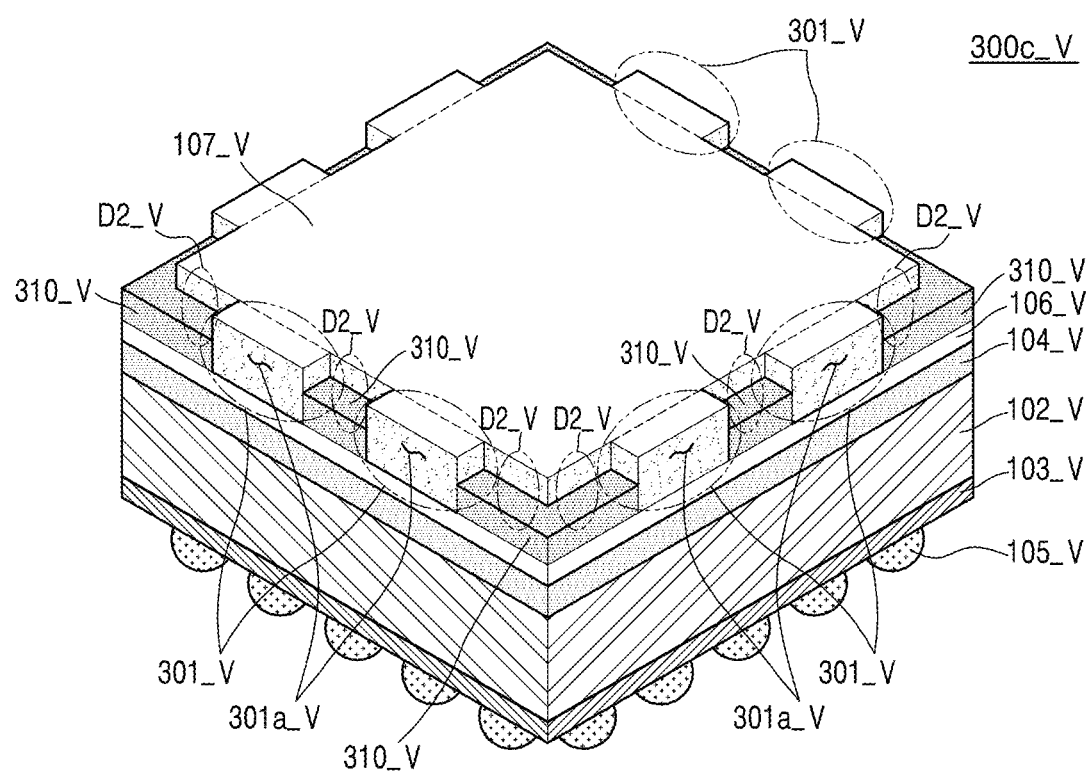

FIGS. 109 and 110 are perspective views of semiconductor packages 300b_V and 300c_V according to an embodiment of the present disclosure. Each of the semiconductor packages 300b_V and 300c_V may include a semiconductor chip 101_V, a metal frame 102_V, a redistribution layer 103_V, a sealing material 104_V, an external connection terminal 105_V, an adhesive film 106_V, and a heat sink 107_V. Technical characteristics of the semiconductor chip 101_V, the metal frame 102_V, the redistribution layer 103_V, the sealing material 104_V, the external connection terminal 105_V, the adhesive film 106_V, and the heat sink 107_V may be substantially the same as those described with reference to FIG. 94, and thus, detailed descriptions thereof will be omitted.

Referring to FIGS. 109 and 110, each of the semiconductor packages 300b_V and 300c_V may further include a heat-dissipation molding unit 310_V, which surrounds the heat sink 107_V to cover at least a portion of the side surface of the heat sink 107_V and at least a portion of the inner side surface of the protrusion 301_V on the sealing material 104_V and expose the upper surface of the heat sink 107_V and the upper surface of the protrusion 301_V to the outside. The heat-dissipation molding unit 310_V may be self-aligned to the side surface of each of the semiconductor packages 300b_V and 300c_V.

In the present disclosure, the heat-dissipation molding unit 310_V of each of the semiconductor packages 300b_V and 300c_V may securely fix the heat sink 107_V onto the sealing material 104_V, and concentrate heat generated by the semiconductor chip 101_V into a central portion of the heat sink 107_V, and thus, a heat dissipation effect of each of the semiconductor packages 300b_V and 300c_V may be improved.

In an embodiment, the heat-dissipation molding unit 310_V may include various materials, such as a metal-based material, a ceramic-based material, a carbon-based material, and a polymer-based material. In an embodiment, the heat-dissipation molding unit 310_V may be an EMC.

In an embodiment, as described above, the outer side surface of the heat-dissipation molding unit 310_V may be self-aligned to the side surface of each of the semiconductor packages 300b_V and 300c_V. When each of the semiconductor packages 300b_V and 300c_V is viewed from above, a sum of the footprints of the heat-dissipation molding unit 310_V, the heat sink 107_V, and the protrusion 301_V of each of the semiconductor packages 300b_V and 300c_V may be substantially equal to the footprint of each of the semiconductor packages 300b_V and 300c_V.

Referring to FIG. 109, the heat-dissipation molding unit 310_V of the semiconductor package 300b_V may cover the entire side surface of the heat sink 107_V. Accordingly, the side surface of the heat sink 107_V may not be exposed to the outside. In addition, the heat-dissipation molding unit 310_V may cover the entire inner side surface of the protrusion 301_V, and the outer side surface 301a_V may be exposed to the outside. The thickness of the heat-dissipation molding unit 310_V may be substantially equal to the thickness of the heat sink 107_V and the protrusion 301_V. In other words, the upper surface of the heat-dissipation molding unit 310_V may be self-aligned to the upper surface of the heat sink 107_V and the upper surface of the protrusion 301_V.

Referring to FIG. 110, the heat-dissipation molding unit 310_V of the semiconductor package 300c_V may cover only a portion of the side surface of the heat sink 107_V. Accordingly, the portion of the side surface of the heat sink 107_V may be exposed to the outside. Also, the heat-dissipation molding unit 310_V may cover only a portion of the inner side surface of the protrusion 301_V and expose the outer side surface 301a_V to the outside. The thickness of the heat-dissipation molding unit 310_V may be less than the thickness of the heat sink 107_V and the protrusion 301_V. Accordingly, a stepped portion D2_V may be formed between the upper surface of the heat sink 107_V and the upper surface of the heat-dissipation molding unit 310_V.

Figure 111:
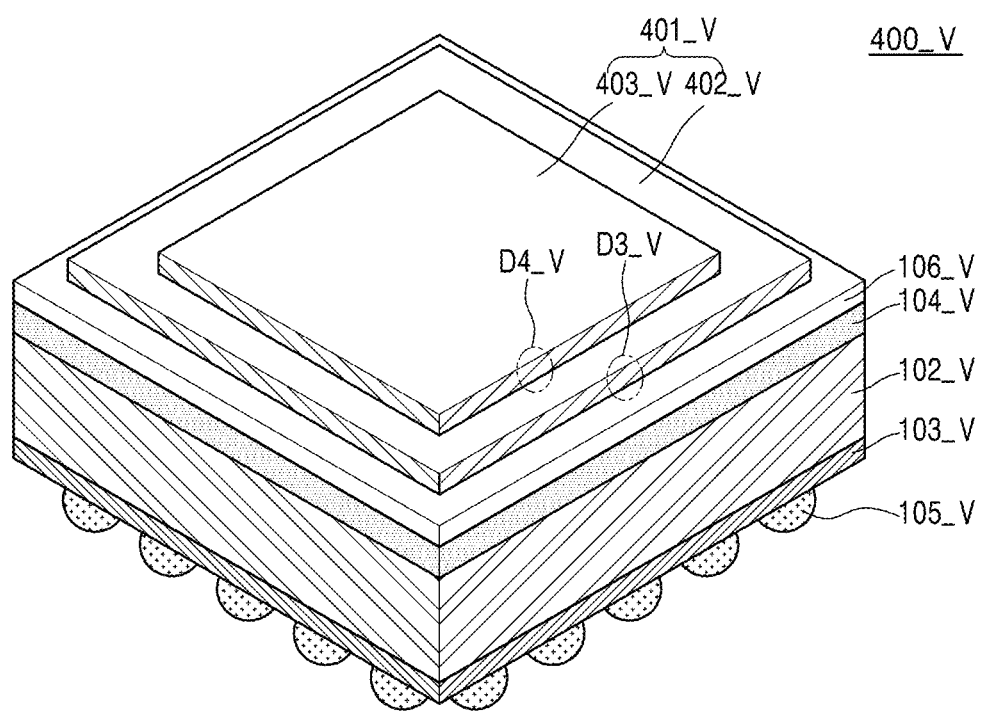
FIG. 111 is a perspective view of a semiconductor package according to an embodiment of the present disclosure.

FIG. 111 is a perspective view of a semiconductor package 400_V according to an embodiment of the present disclosure. The semiconductor package 400_V may include a semiconductor chip 101_V, a metal frame 102_V, a redistribution layer 103_V, a sealing material 104_V, an external connection terminal 105_V, and an adhesive film 106_V. Technical characteristics of the semiconductor chip 101_V, the metal frame 102_V, the redistribution layer 103_V, the sealing material 104_V, the external connection terminal 105_V, and the adhesive film 106_V may be substantially the same as those described with reference to FIG. 94, and thus, detailed descriptions thereof will be omitted.

In an embodiment, the semiconductor package 400_V may further include a heat sink 401_V. As shown in FIG. 111, the heat sink 401_V may include a first heat dissipation layer 402_V and a second heat dissipation layer 403_V on the first heat dissipation layer 402_V. The footprint of the second heat dissipation layer 403_V may be less than the footprint of the first heat dissipation layer 402_V. The heat sink 401_V may have a shape of an inverted letter "T", due to the difference in footprint between the first heat dissipation layer 402_V and the second heat dissipation layer 403_V and the height of the second heat dissipation layer 403_V.

In an embodiment, the first heat dissipation layer 402_V and the second heat dissipation layer 403_V may include substantially the same material. More specifically, the first and second heat dissipation layers 402_V and 403_V, which include the same material, may be bonded to and integrated with each other.

In an embodiment, the materials of the first heat dissipation layer 402_V and the second heat dissipation layer 403_V may be different from each other. For example, the material of the first heat dissipation layer 402_V may include a metal having higher thermal conductivity than the material of the second heat dissipation layer 403_V. However, the present disclosure is not limited to the above description, and the material of the second heat dissipation layer 403_V may include a metal having a higher thermal conductivity than the material of the first heat dissipation layer 402_V.

In an embodiment, the first heat dissipation layer 402_V and the second heat dissipation layer 403_V may have substantially the same thickness. However, the present disclosure is not limited to the above description, and the first heat dissipation layer 402_V and the second heat dissipation layer 403_V may have different thicknesses. A sum of the thicknesses of the first heat dissipation layer 402_V and the second heat dissipation layer 403_V may be in a range of about 280 μm to about 560 μm and may be about 25% to about 40% of the total thickness of the semiconductor package 400_V.

Referring to FIG. 111, the footprint of the first heat dissipation layer 402_V may be less than the footprint of the adhesive film 106_V, and the footprint of the second heat dissipation layer 403_V may be less than the footprint of the first heat dissipation layer 402_V. Thus, the semiconductor package 400_V may include a stepped portion D3_V, which is formed due to a height difference between the upper surface of the first heat dissipation layer 402_V and the upper surface of the adhesive film 106_V. In addition, the semiconductor package 400_V may include a stepped portion D4_V, which is formed due to a height difference between the upper surface of the second heat dissipation layer 403_V and the upper surface of the first heat dissipation layer 402_V.

Figure 112:
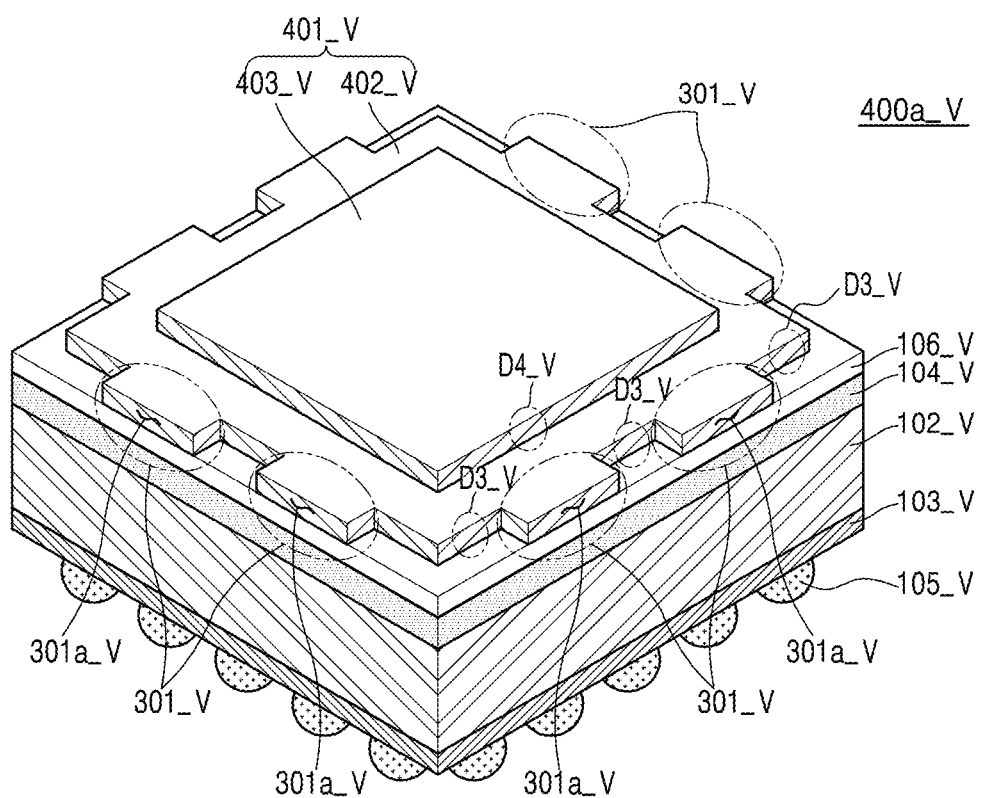
FIG. 112 is a perspective view of a semiconductor package according to an embodiment of the present disclosure.

FIG. 112 is a perspective view of a semiconductor package 400a_V according to an embodiment of the present disclosure. The semiconductor package 400a_V may include a semiconductor chip 101_V, a metal frame 102_V, a redistribution layer 103_V, a sealing material 104_V, an external connection terminal 105_V, an adhesive film 106_V, and a heat sink 401_V. Technical characteristics of the semiconductor chip 101_V, the metal frame 102_V, the redistribution layer 103_V, the sealing material 104_V, the external connection terminal 105_V, the adhesive film 106_V, and the heat sink 401_V may be substantially the same as those described with reference to FIG. 94, and thus, detailed descriptions thereof will be omitted.

In an embodiment, the semiconductor package 400a_V may further include the protrusion 301_V, which extends from the side surface of the first heat dissipation layer 402_V of the heat sink 401_V to the side surface of the semiconductor package 400a_V. The protrusion 301_V may be a portion of the connection region S_V, which is left after the connection region S_V of the heat sink group described with reference to FIG. 10 is cut by the singulation process on the semiconductor package 400a_V.

In an embodiment, the upper surface of the protrusion 301_V may have the same height as the upper surface of the first heat dissipation layer 402_V. In addition, the outer side surface 301a_V of the protrusion 301_V may be self-aligned to the side surface of the semiconductor package 400a_V.

In an embodiment, the plurality of protrusions 301_V may be formed to extend from one side surface of the first heat dissipation layer 402_V to one side surface of the semiconductor package 400a_V. For example, as shown in FIG. 112, a pair of protrusions 301_V may be formed to extend from the one side surface of the first heat dissipation layer 402_V to the one side surface of the semiconductor package 400a_V. However, the number of protrusions 301_V, which are formed to extend from the one side surface of the first heat dissipation layer 402_V to the one side surface of the semiconductor package 400a_V, is not limited thereto and may be variously changed.

Other characteristics of the protrusion 301_V of the semiconductor package 400a_V shown in FIG. 111 are substantially the same as those of the protrusion 301_V of the semiconductor package 300_V, which have been described with reference to FIG. 102, and thus, a detailed description thereof will be omitted.

Referring to FIG. 112, the semiconductor package 400a_V may include the stepped portion D3_V, which is formed due to a height difference between the upper surface of the first heat dissipation layer 402_V and the upper surface of the adhesive film 106_V, and the stepped portion D4_V, which is formed due to a height difference between the upper surface of the second heat dissipation layer 403_V and the upper surface of the first heat dissipation layer 402_V.

In an embodiment, the height of the stepped portion D4_V, which is formed due to the height difference between the upper surface of the first heat dissipation layer 402_V and the upper surface of the adhesive film 106_V, may be substantially equal to the height of the first heat dissipation layer 402_V, and the height of the stepped portion D4_V, which is formed due to a height difference between the upper surface of the second heat dissipation layer 403_V and the upper surface of the first heat dissipation layer 402_V, may be substantially equal to the height of the second heat dissipation layer 403_V.

In an embodiment, the height of the stepped portion D3_V, which is formed due to the height difference between the upper surface of the first heat dissipation layer 402_V and the upper surface of the adhesive film 106_V, may be less than the height of the stepped portion D4_V, which is formed due to the height difference between the upper surface of the second heat dissipation layer 403_V and the upper surface of the first heat dissipation layer 402_V. In addition, the thickness of the protrusion 301_V may be substantially equal to the height of the stepped portion D3_V, which is formed due to the height difference between the upper surface of the first heat dissipation layer 402_V and the upper surface of the adhesive film 106_V. When the thickness of the protrusion 301_V is reduced, external force required for cutting the semiconductor package 400a_V may be reduced in the singulation process on the semiconductor package 400a_V. Accordingly, flexibility in the cutting process on the semiconductor packages 400a_V may be increased. However, the heights of the stepped portions D3_V and D4_V are not limited to the above description and may have various height values. For example, the height of the stepped portion D3_V, which is formed due to the height difference between the upper surface of the first heat dissipation layer 402_V and the upper surface of the adhesive film 106_V, may be greater than or equal to the height of the stepped portion D4_V, which is formed due to the height difference between the upper surface of the second heat dissipation layer 403_V and the upper surface of the first heat dissipation layer 402_V.

Furthermore, a sum of the heights of the stepped portions D3_V and D4_V may be about 25% to about 40% of the total thickness of the semiconductor package 400a_V. Thus, when the total thickness of the semiconductor package 400a_V is in a range of about 1.1 mm to about 1.4 mm, the sum of the heights of the stepped portions D3_V and D4_V may be in a range of about 280 μm to about 560 μm.

Figure 113:
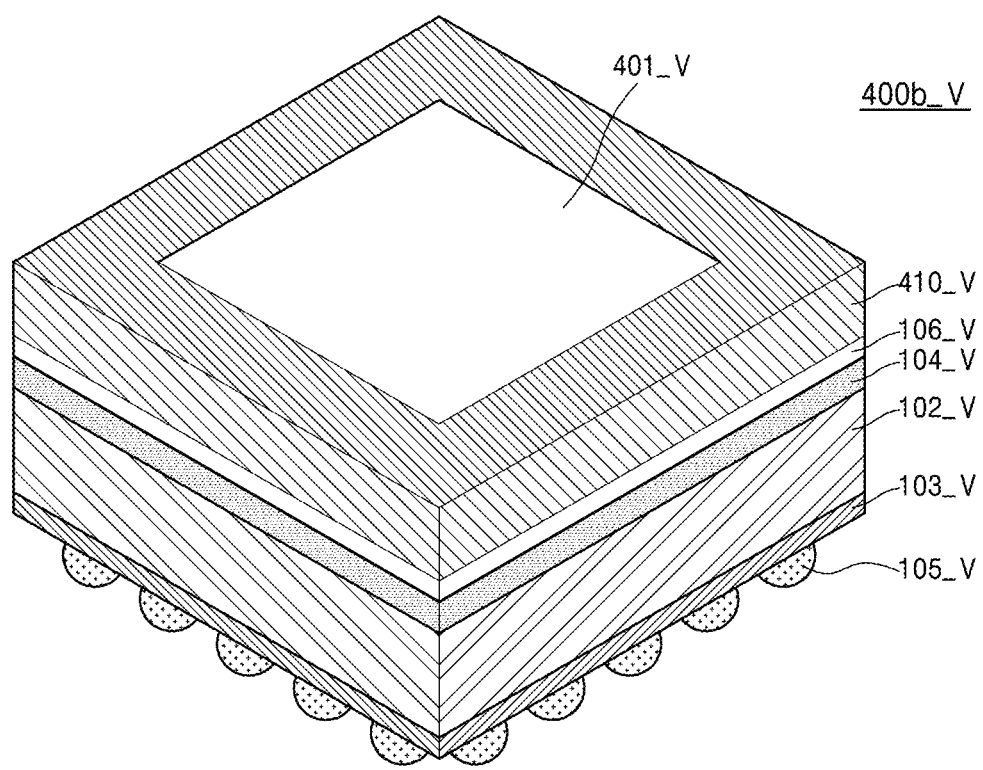
FIG. 113 is a perspective view of a semiconductor package according to an embodiment of the present disclosure.

FIG. 113 is a perspective view of a semiconductor package 400b_V according to an embodiment of the present disclosure. The semiconductor package 400a_V may include a semiconductor chip 101_V, a metal frame 102_V, a redistribution layer 103_V, a sealing material 104_V, an external connection terminal 105_V, an adhesive film 106_V, and a heat sink 401_V. Technical characteristics of the semiconductor chip 101_V, the metal frame 102_V, the redistribution layer 103_V, the sealing material 104_V, the external connection terminal 105_V, the adhesive film 106_V, and the heat sink 401_V may be substantially the same as those described with reference to FIG. 111 and thus, detailed descriptions thereof will be omitted.

In an embodiment, the semiconductor package 400b_V may further include a heat-dissipation molding unit 410_V. The heat-dissipation molding unit 410_V may securely fix the heat sink 401_V to the sealing material 104_V and concentrate heat generated by the semiconductor chip 101_V into a center region of the heat sink 107_V. Thus, a heat dissipation effect of the semiconductor package 400b_V may be improved.

In an embodiment, the heat-dissipation molding unit 410_V may include various materials, such as a metal-based material, a ceramic-based material, a carbon-based material, and a polymer-based material. For example, the heat-dissipation molding unit 410_V may include an EMC.

In an embodiment, the heat-dissipation molding unit 410_V may surround the first heat dissipation layer 402_V to cover the upper surface and the side surfaces of the first heat dissipation layer 402_V. In addition, the heat-dissipation molding unit 410_V may surround and cover the side surface of the second heat dissipation layer 403_V and expose the upper surface of the second heat dissipation layer 403_V.

In an embodiment, the upper surface of the heat-dissipation molding unit 410_V may be self-aligned to the upper surface of the second heat dissipation layer 403_V. In other words, the upper surface of the heat-dissipation molding unit 410_V may have the same height as the upper surface of the second heat dissipation layer 403_V. In addition, the side surface of the heat-dissipation molding unit 410_V may be self-aligned to the side surface of the semiconductor package 400b_V.

Figure 114:
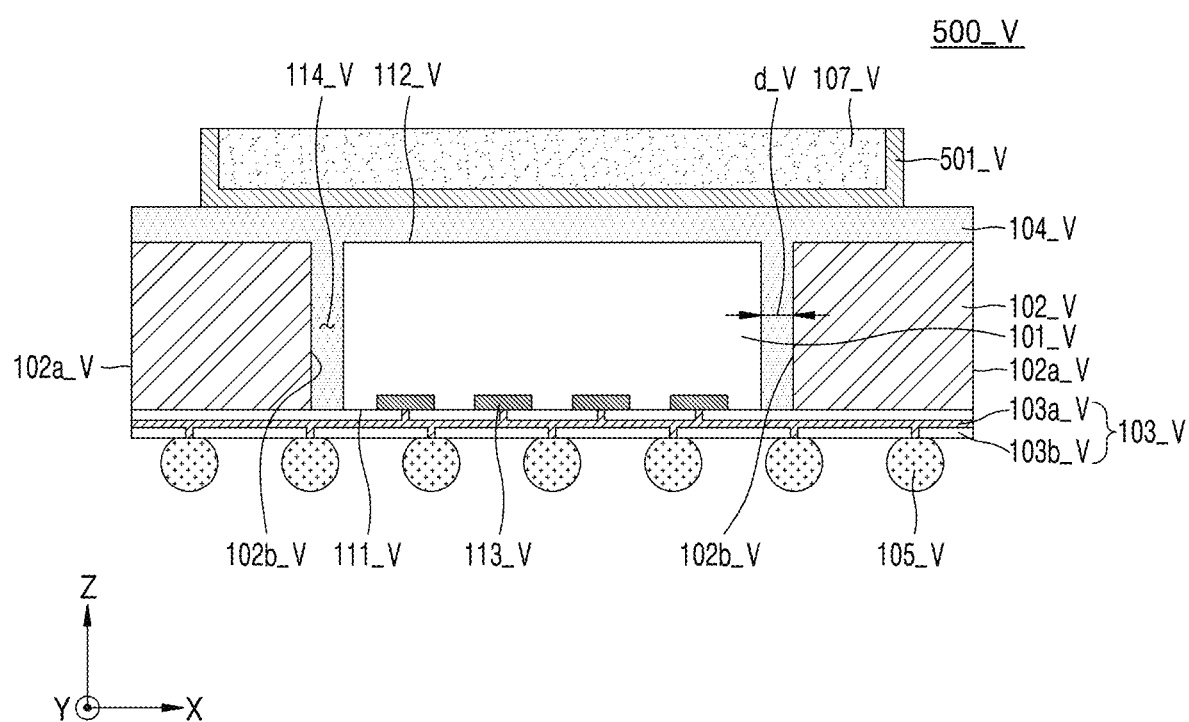
FIG. 114 is a cross-sectional view of a semiconductor package according to an embodiment of the present disclosure.

FIG. 114 is a cross-sectional view of a semiconductor package 500_V according to an embodiment of the present disclosure. Referring to FIG. 114, the semiconductor package 500_V may include a semiconductor chip 101_V, a metal frame 102_V, a redistribution layer 103_V, a sealing material 104_V, an external connection terminal 105_V, and a heat sink 107_V. Technical characteristics of the semiconductor chip 101_V, the metal frame 102_V, the redistribution layer 103_V, the sealing material 104_V, the external connection terminal 105_V, and the heat sink 107_V may be substantially the same as those described with reference to FIG. 94, and thus, detailed descriptions thereof will be omitted.

In an embodiment, the semiconductor package 500_V may further include an adhesive film 501_V. A footprint of the adhesive film 501_V may be greater than a footprint of the heat sink 107_V, and a width of the adhesive film 501_V in a first direction X may be greater than a width of the heat sink 107_V in the first direction X.

In an embodiment, the adhesive film 501_V may extend upward to the side surface of the heat sink 107_V and cover at least a portion of the side surface of the heat sink 107_V. As the adhesive film 501_V extends upward to the side surface of the heat sink 107_V, the heat sink 107_V may be firmly combined with the sealing material 104_V.

In an embodiment, the adhesive film 501_V may include a conductive material and a non-conductive material. For example, the material of the adhesive film 501_V may include at least one of silver, aluminum, silicon dioxide, aluminum nitride, and boron nitride.

In an embodiment, the adhesive film 501_V of the semiconductor package 500_V may entirely cover the side surface of the heat sink 107_V, and thus, the side surface of the heat sink 107_V may not be exposed to the outside. In addition, the adhesive film 501_V may expose the upper surface of the heat sink 107_V to the outside.

Figure 115:
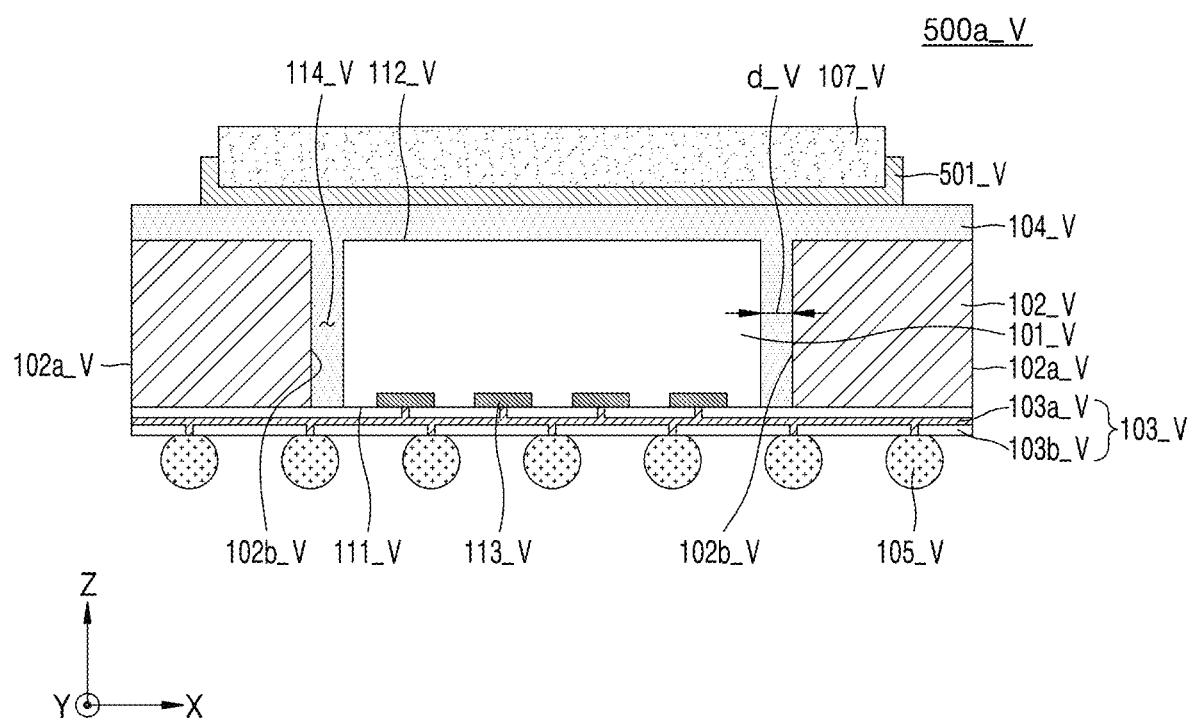
FIG. 115 is a cross-sectional view of a semiconductor package according to an embodiment of the present disclosure.
Figure 116:
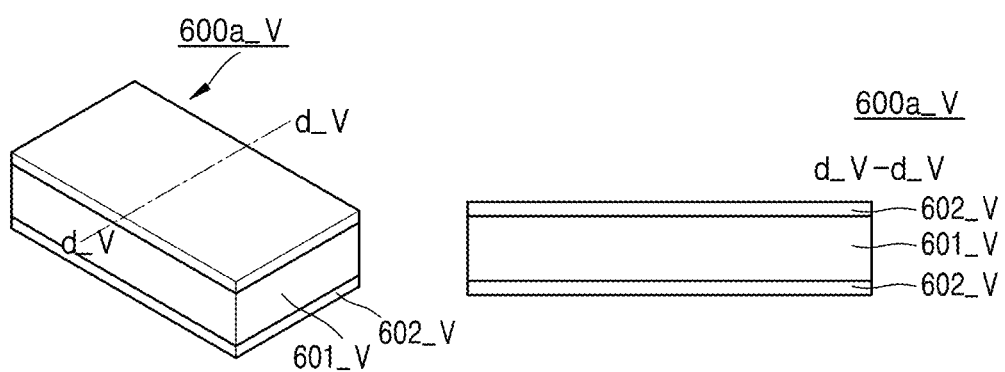
FIG. 116 is a diagram of a heat sink according to an embodiment of the present disclosure.
Figure 117:
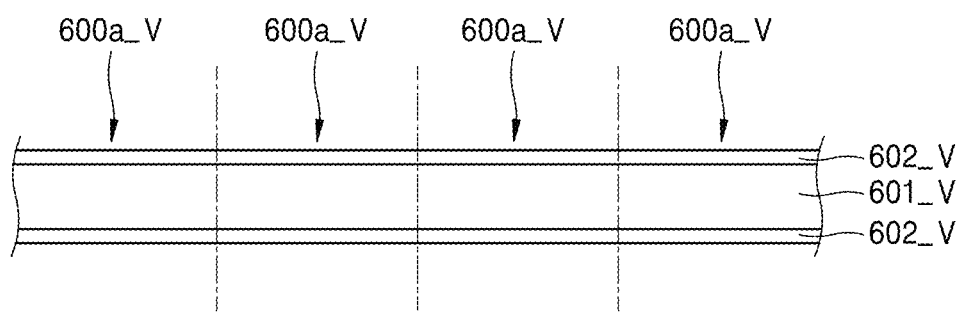
FIG. 117 is a diagram of a process of manufacturing a heat sink, according to an embodiment of the present disclosure.
Figure 118:
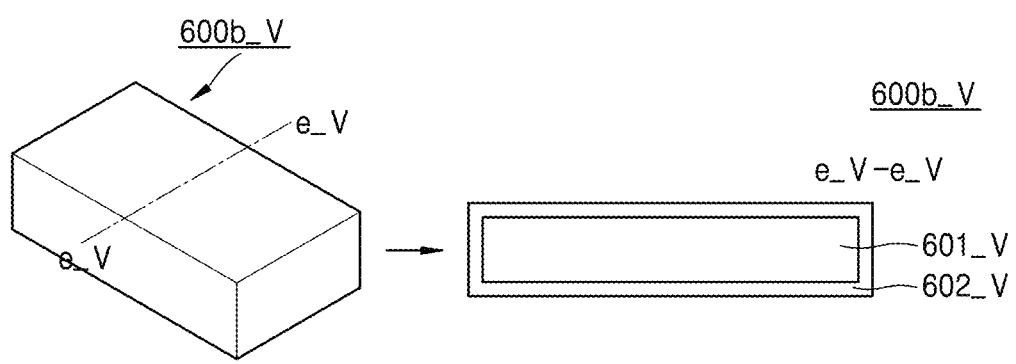
FIG. 118 is a diagram of a heat sink according to an embodiment of the present disclosure.
Figure 119:
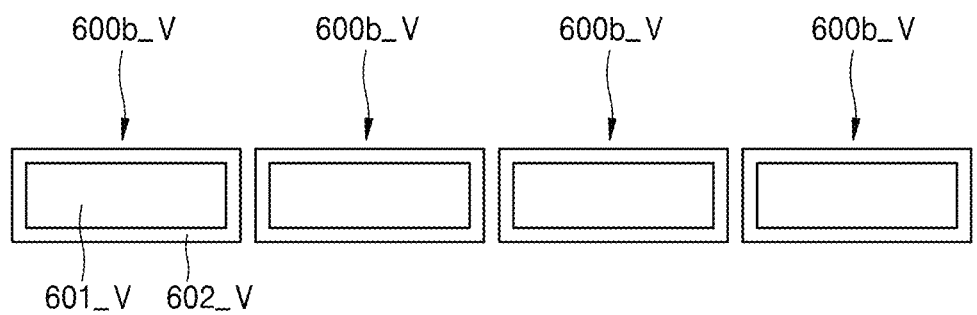
FIG. 119 is a diagram of a process of manufacturing a heat sink, according to an embodiment of the present disclosure.

FIG. 115 is a cross-sectional view of a semiconductor package 500a_V according to an embodiment of the present disclosure. In an embodiment, the adhesive film 501_V of the semiconductor package 500a_V may cover at least a portion of the side surface of the heat sink 107_V. Thus, only a portion of the side surface of the heat sink 107_V may be exposed to the outside. As shown in FIG. 115, the adhesive film 501_V may cover only a portion of the side surface of the heat sink 107_V and expose a remaining portion of the heat sink 107_V, except for the upper surface and the portion of the side surface of the heat sink 107_V.

Referring to FIGS. 114 and 115, a width of the adhesive film 501_V in the first direction X may be less than a width of each of the semiconductor packages 500_V and 500a_V in the first direction X and be greater than a width of the heat sink 107_V in the first direction X. When each of the semiconductor packages 500_V and 500a_V are viewed in a plan view, a sum of footprints of the heat sink 107_V and the adhesive film 501_V may be less than a footprint of each of the semiconductor packages 500_V and 500a_V.

However, the present disclosure is not limited to the above description. Unlike as shown in FIGS. 114 and 115, the width of the adhesive film 501_V in the first direction X may be substantially equal to the width of the semiconductor package in the first direction X and be greater than the width of the heat sink 107_V in the first direction X. In this case, when the semiconductor package 500a_V is viewed in a plan view, the sum of the footprint of the heat sink 107_V and the adhesive film 501_V may be substantially equal to the footprint of the semiconductor package.

Figure 120:
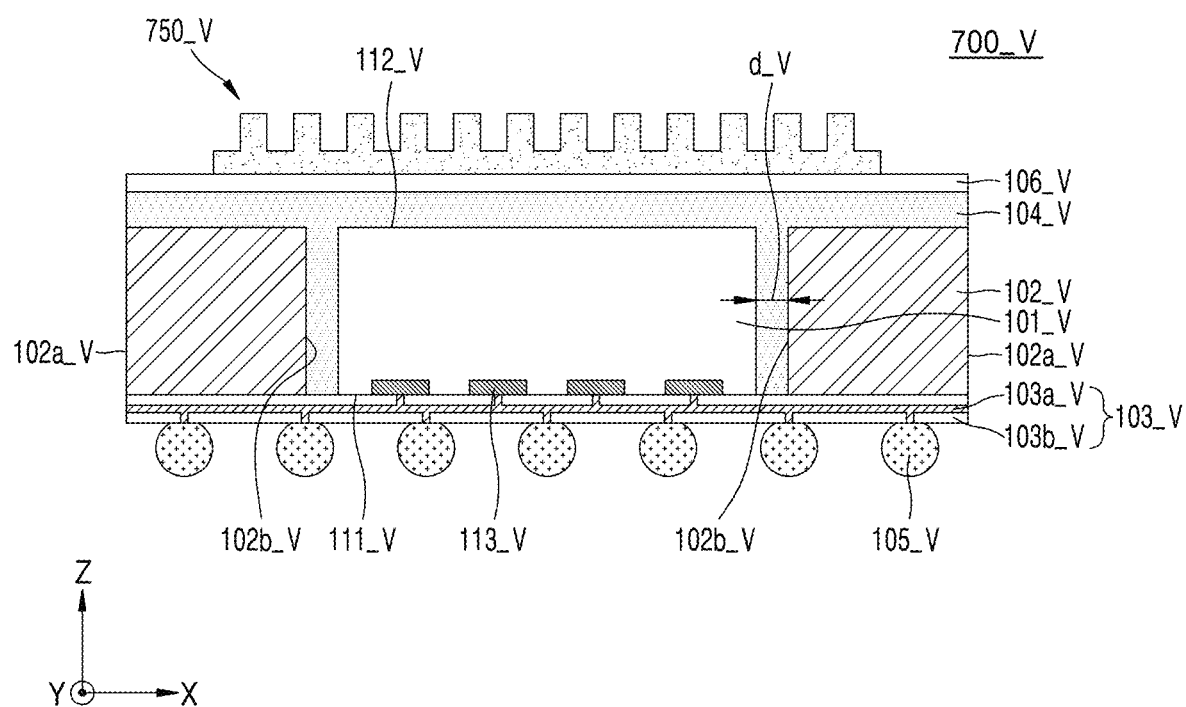
FIGS. 120 and 121 are cross-sectional views of a semiconductor package according to an embodiment of the present disclosure.
Figure 121:
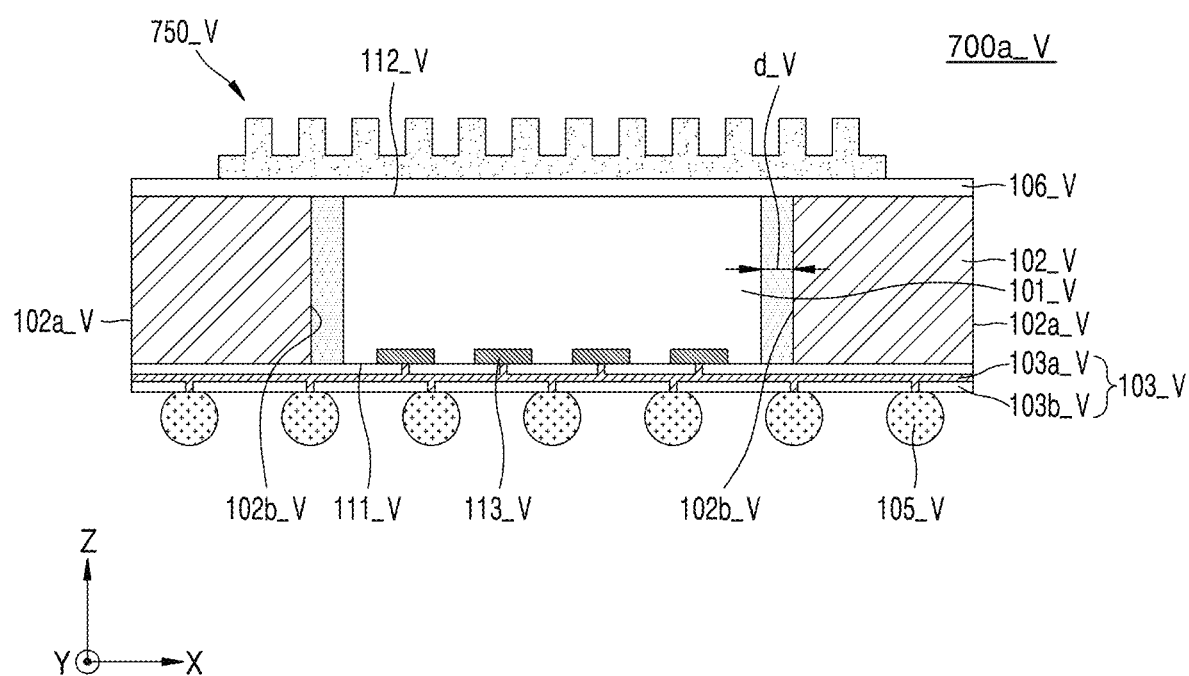

FIGS. 120 and 121 are cross-sectional views of semiconductor packages 700_V and 700a_V according to an embodiment of the present disclosure. Each of the semiconductor packages 700_V and 700a_V may include a semiconductor chip 101_V, a metal frame 102_V, a redistribution layer 103_V, a sealing material 104_V, an external connection terminal 105_V, an adhesive film 106_V, and a heat sink 750_V. Technical characteristics of the semiconductor chip 101_V, the metal frame 102_V, the redistribution layer 103_V, the sealing material 104_V, the external connection terminal 105_V, and the adhesive film 106_V may be substantially the same as those described with reference to FIG. 94, and thus, detailed descriptions thereof will be omitted.

Figure 122:
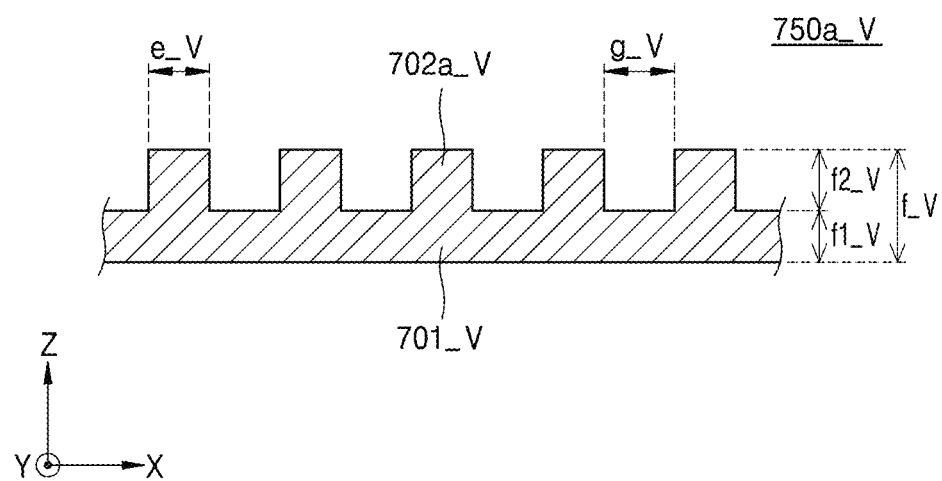
FIGS. 122 and 123 are cross-sectional views of a heat sink according to an embodiment of the present disclosure.
Figure 123:
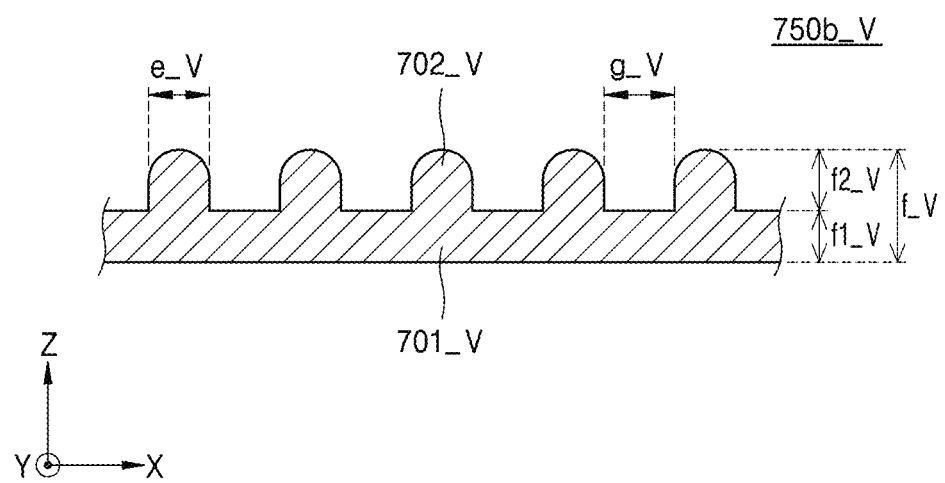
Figure 124:
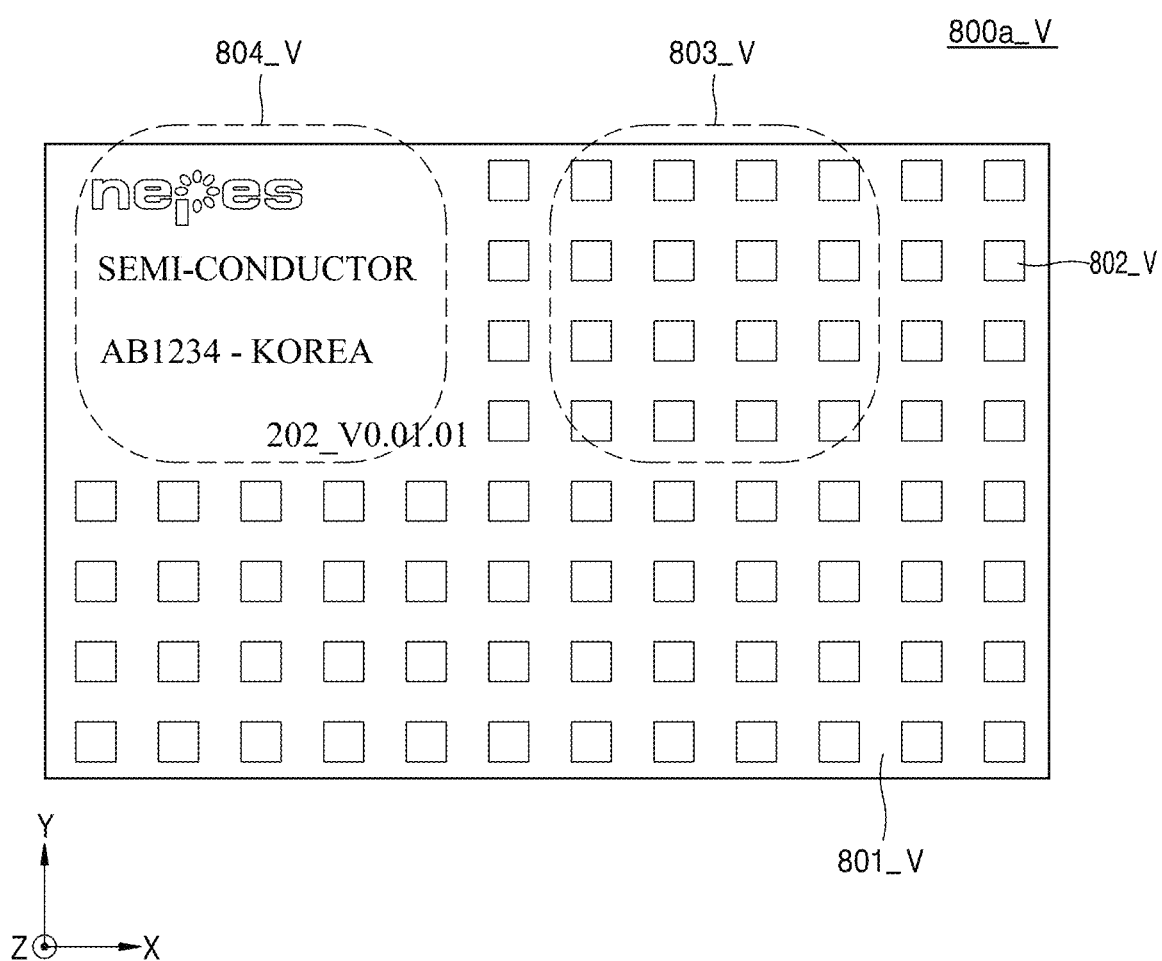
FIGS. 124 to 126 are plan views of heat sinks having rough structure including marking regions in which information about a semiconductor package is marked, according to an embodiment of the present disclosure.
Figure 125:
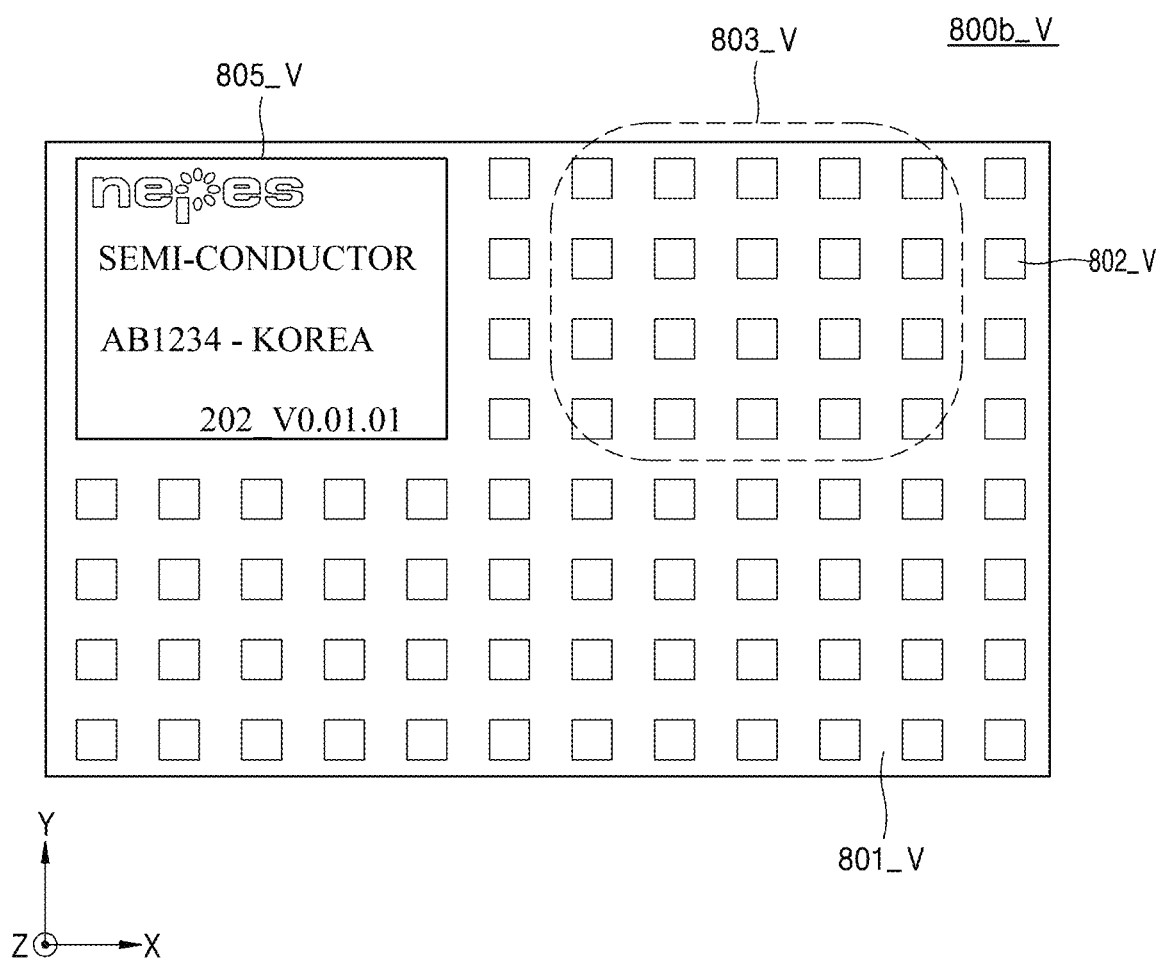
Figure 126:
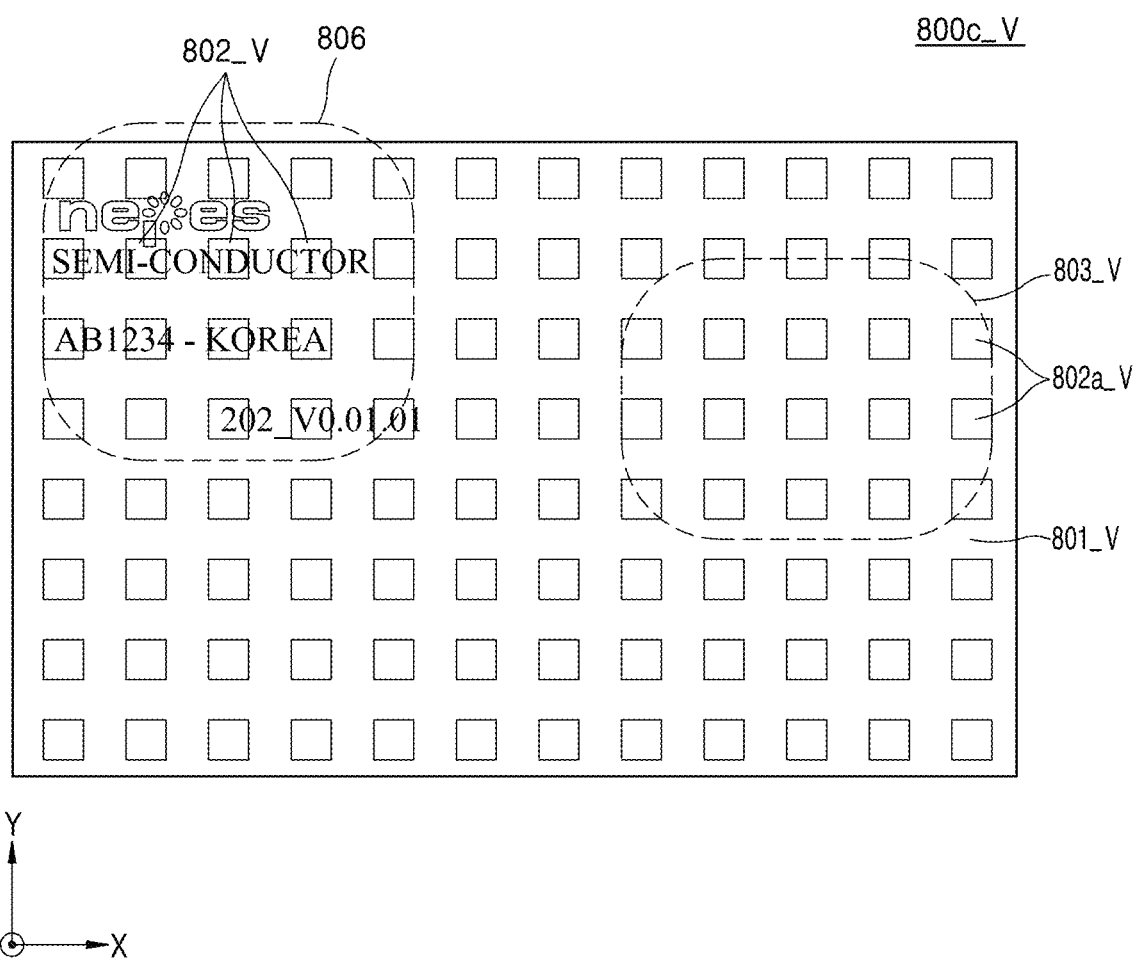
Figure 127:
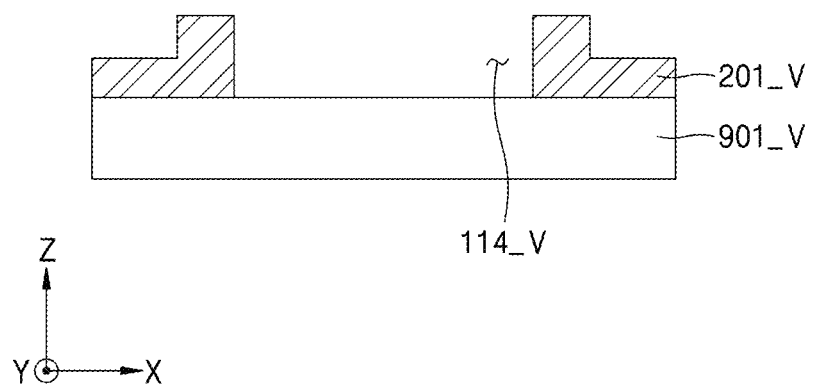
FIGS. 127 to 135 are diagrams illustrating a method of manufacturing a semiconductor package according to an embodiment of the present disclosure.
Figure 128:
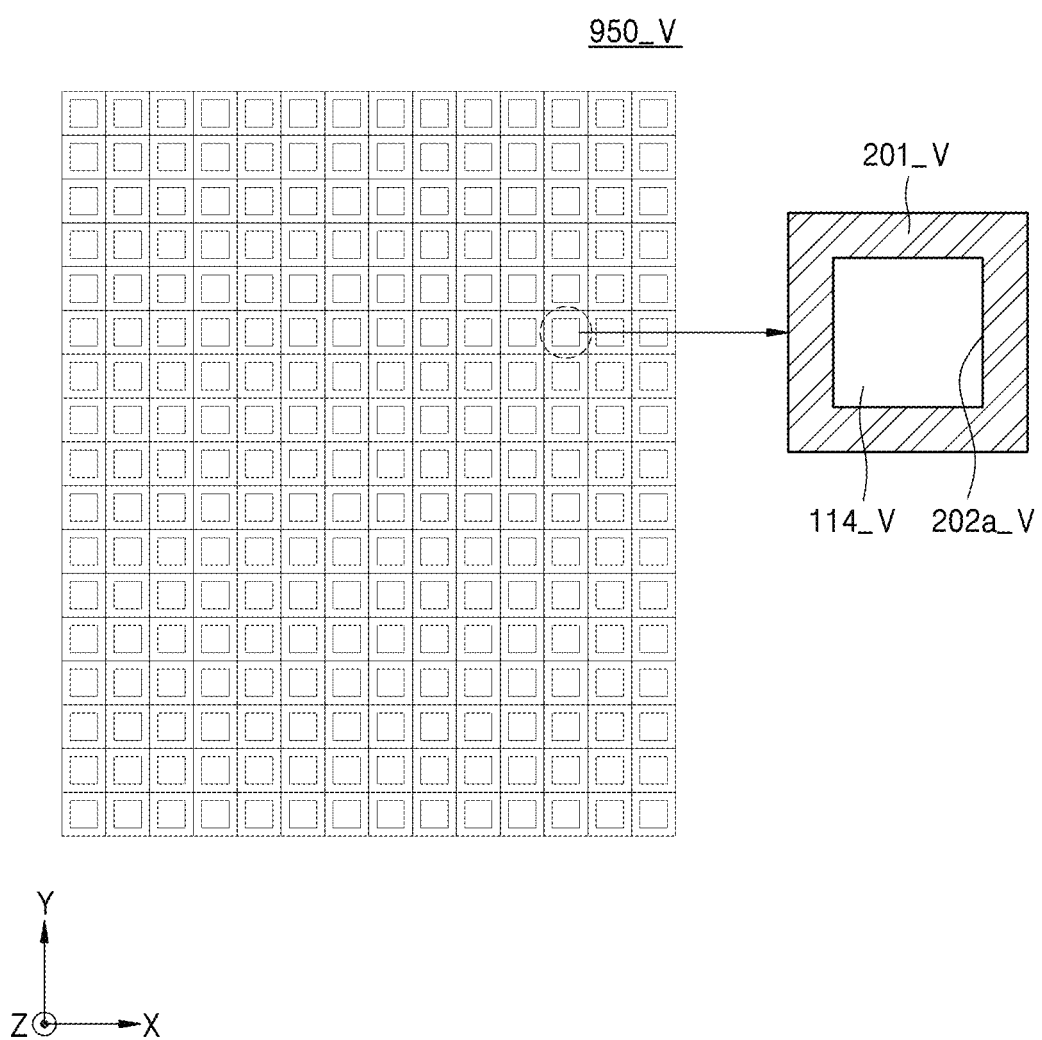
Figure 129:
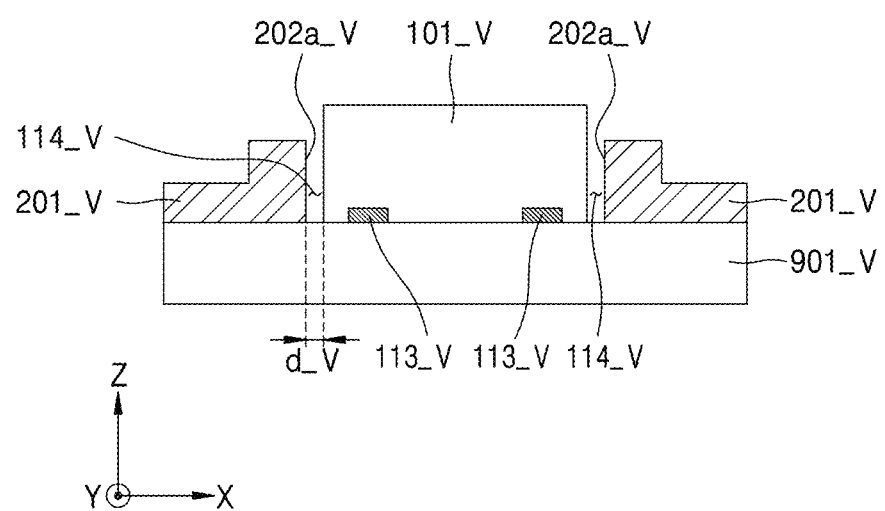
Figure 130:
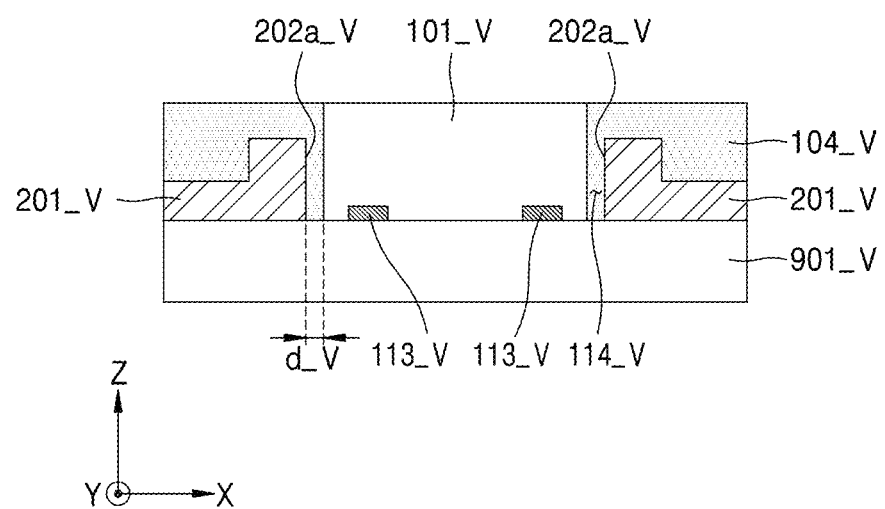
Figure 131:
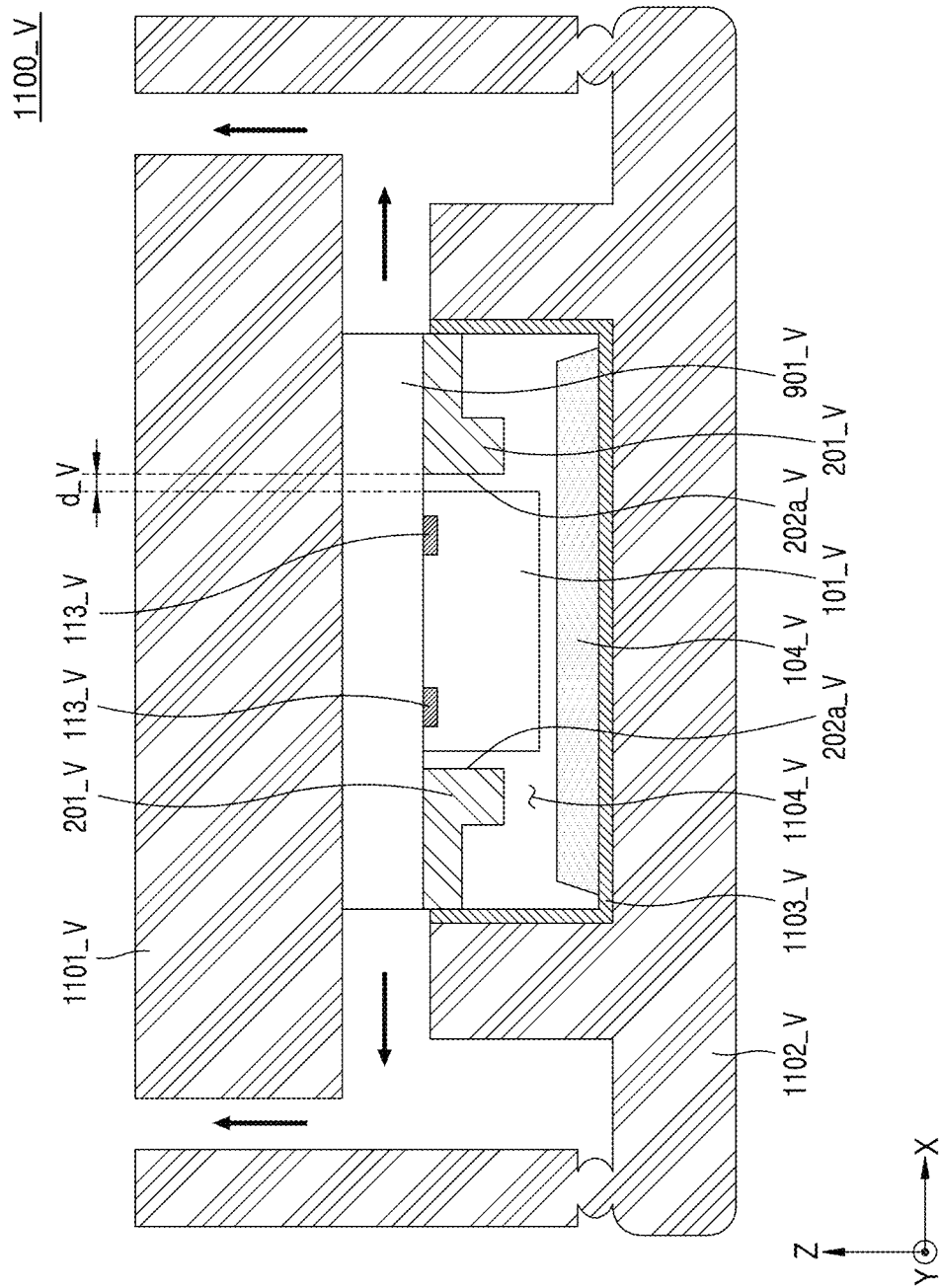

The heat sink 750_V of each of the semiconductor packages 700_V and 700a_V may have a rough structure. The dictionary meaning of rough (凹凸) may be concave and convex. The heat sink 750_V may include a base 701_V (e.g., see FIGS. 122 and 123) and a plurality of projections 702a_V and 702b_V (e.g., see FIGS. 122 and 123) on the base 701_V. More specifically, the heat sink 750_V may include the plurality of projections 702a_V and 702b_V, which are formed to protrude from the upper surface of the base 701_V having the flat plate shape. The plurality of projections 702a_V and 702b_V may be repeatedly arranged a predetermined distance apart from each other. Thus, the heat sink 750_V may have a rough structure in which concave and convex portions are repeatedly formed.

In an embodiment, the lower surface of the base 701_V of the heat sink 750_V may be fixed to the sealing material 104_V of each of the semiconductor packages 700_V and 700a_V by the adhesive film 106_V.

Referring to FIG. 120, the thickness of the metal frame 102_V of the semiconductor package 700_V may be substantially equal to the thickness of the semiconductor chip 101_V. The sealing material 104_V may be mounted on the upper surface of the metal frame 102_V and the upper surface of the semiconductor chip 101_V. Accordingly, the adhesive film 106_V may be in contact with the upper surface of the sealing material.

Referring to FIG. 121, the thickness of the metal frame 102_V of the semiconductor package 700a_V may be substantially equal to the thickness of the semiconductor chip 101_V. The sealing material 104_V may not be mounted on the upper surface of the metal frame 102_V and the upper surface of the semiconductor chip 101_V. Thus, the adhesive film 106_V may be in contact with the upper surface of the semiconductor chip 101_V and the upper surface of the metal frame 102_V. Accordingly, the thickness of the semiconductor package 700a_V shown in FIG. 121 may be less than the thickness of the semiconductor package 700_V of FIG. 120.

Figure 132:
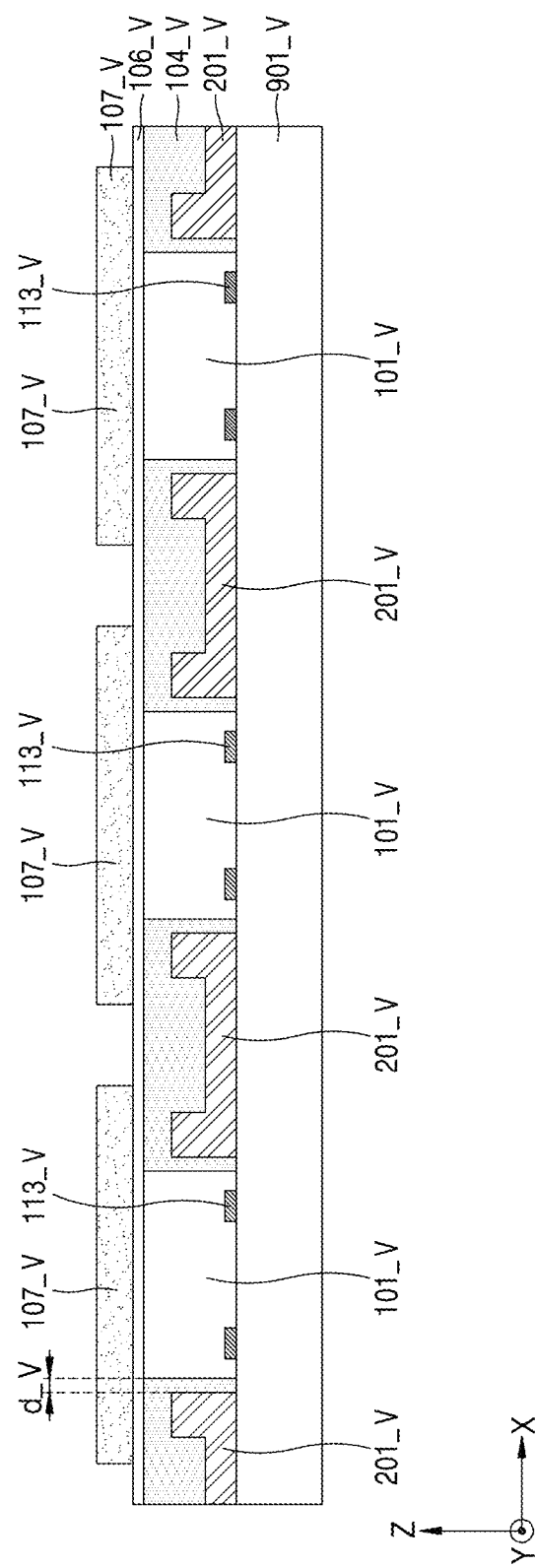
Figure 133:
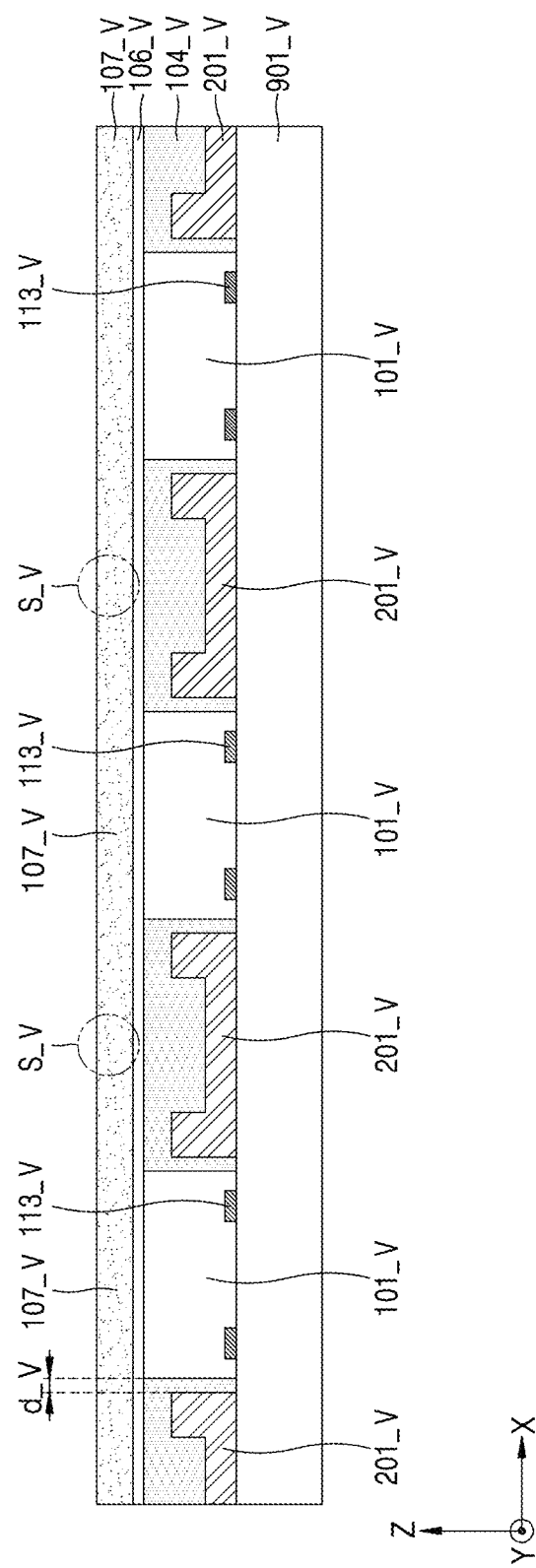

FIGS. 132 and 133 are diagrams illustrating an operation of adhering the heat sink 107_V to a semiconductor package, according to an embodiment of the present disclosure. Referring to FIGS. 132 and 133, the method of manufacturing a semiconductor package according to an embodiment of the present disclosure may include adhering the heat sink 107_V to the semiconductor package.

Referring to FIGS. 132 and 133, the heat sink 107_V may be adhered to the upper surface of the semiconductor chip 101_V or the upper surface of the sealing material 104_V. A method of bring the heat sink 107_V into contact with the upper surface of the semiconductor chip 101_V or the upper surface of the sealing material 104_V may include a thermal compression bonding method. The thermal compression bonding method may be a method of applying heat and pressure to the adhesive film 106_V below the heat sink 107_V using a compression apparatus. The adhesive film 106_V may stably adhere the heat sink 107_V to the upper surfaces of the semiconductor chip 101_V and the sealing material 104_V through the thermal compression bonding method.

Referring to FIG. 132, the heat sink 107_V may be cut to a size corresponding to a size of each semiconductor package and then individually mounted on the semiconductor package. In an embodiment, when the semiconductor package is produced by mounting the heat sink 107_V that is cut to the size corresponding to each semiconductor package, the semiconductor package 100_V described with reference to FIG. 94 may be produced.

Referring to FIG. 133, the heat sink group 350_V described with reference to FIG. 103 may be loaded on the semiconductor package. The heat sink group 350_V may have a size corresponding to a wafer-level or panel-level structure. After the loading of the heat sink group 350_V, a singulation process may be performed on the semiconductor packages. In this case, the semiconductor package 300_V described with reference to FIG. 102 may be manufactured.

Figure 134:
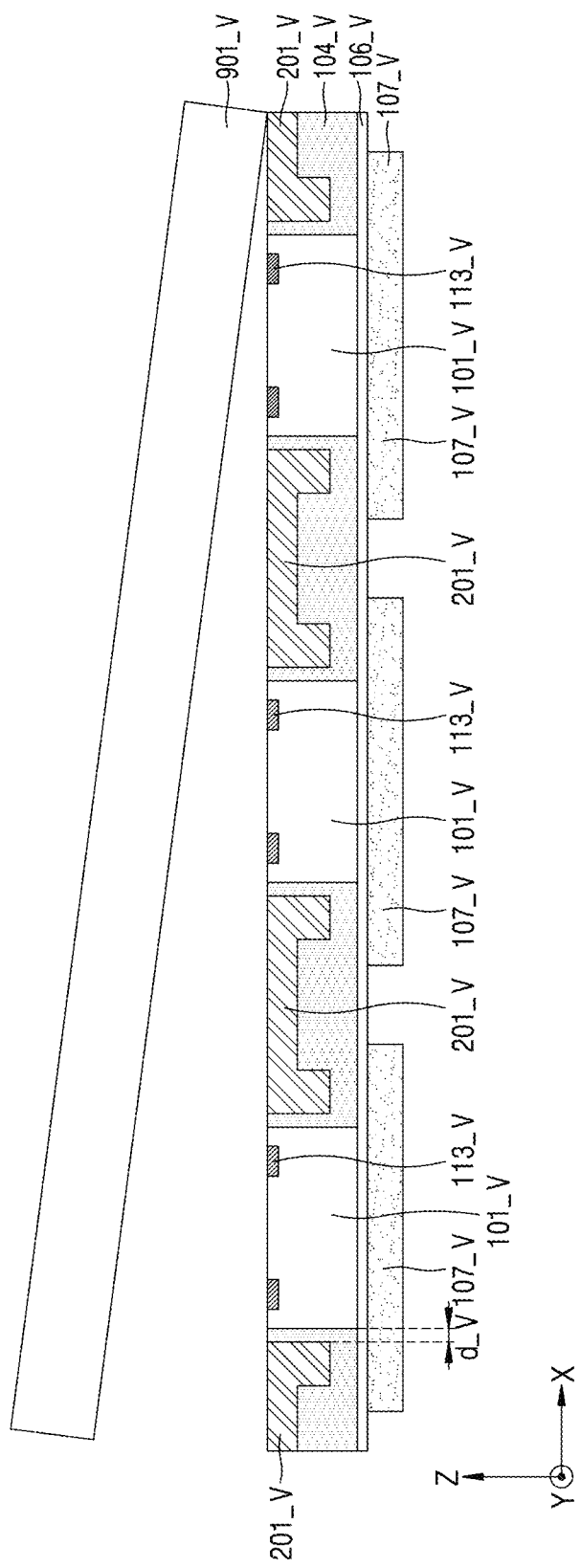
Figure 135:
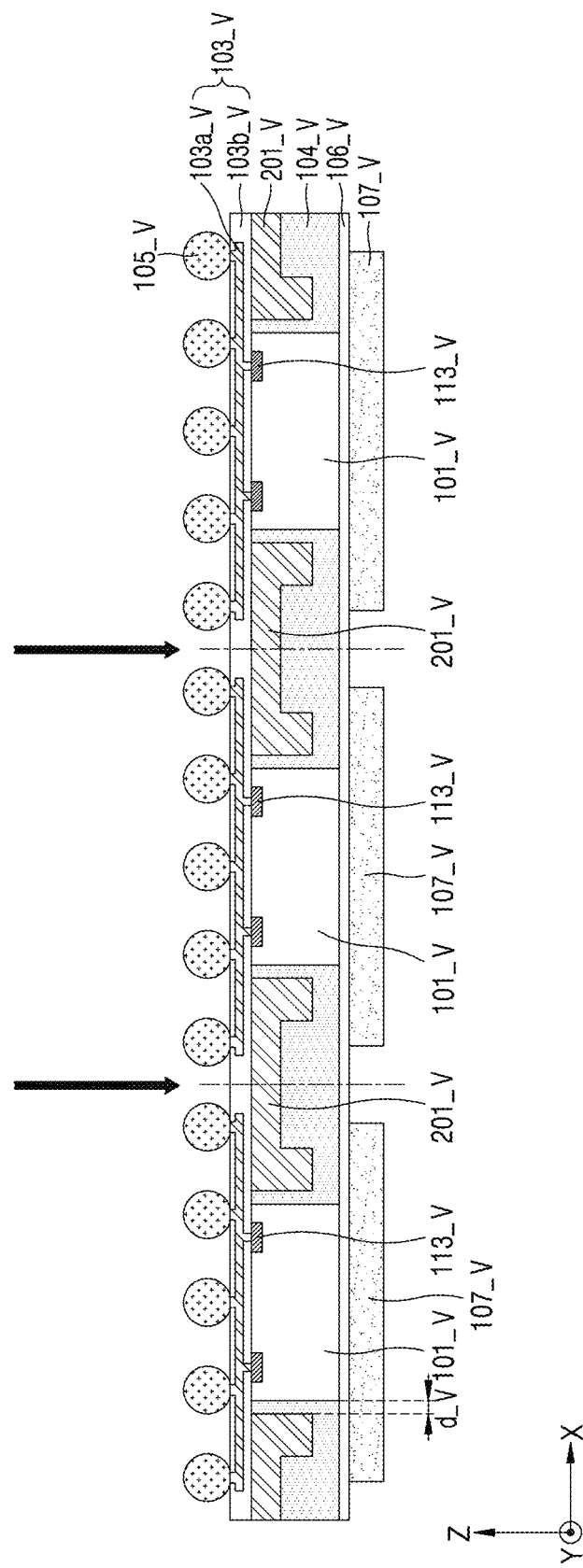
Figure 136:
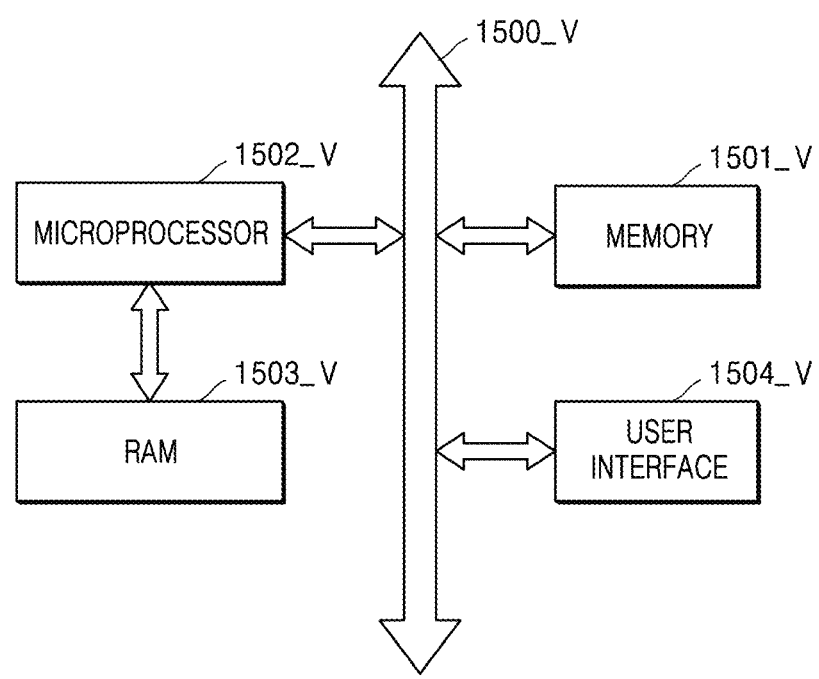
FIG. 136 is a schematic block diagram of an electronic system including a semiconductor package, according to an embodiment of the present disclosure.

FIG. 134 is a diagram of an operation of removing the glass substrate 901_V and inverting the semiconductor package, according to an embodiment of the present disclosure. Referring to FIG. 134, the method of manufacturing a semiconductor package according to an embodiment of the present disclosure may include separating the glass substrate 901_V and inverting the semiconductor package.

Typical example embodiments of the present disclosure are disclosed in the above description and the drawings. Although specific terms are employed, they are used in a generic and descriptive sense only and not for purposes of limitation. It will be understood by those of ordinary skill in the art that various changes in form and details may be made to the disclosed embodiments without departing from the spirit and scope of the present disclosure as defined by the following claims.

What is claimed is:

1. A semiconductor package comprising:
a semiconductor chip comprising a chip pad;
a redistribution layer electrically connected to the chip pad of the semiconductor chip;
an external connection terminal electrically connected to the redistribution layer;
a sealing material configured to cover the semiconductor chip and fix the semiconductor chip and the redistribution layer;
an adhesive film on an upper surface of the sealing material;
a heat sink formed on an upper surface of the adhesive film and having a stepped portion at a periphery thereof; and
a heat-dissipation molding unit,
wherein the heat sink comprises:
a first heat dissipation layer formed on the upper surface of the adhesive film;
a second heat dissipation layer formed on an upper surface of the first heat dissipation layer; and
a protrusion formed on a side surface of the first heat dissipation layer; and
wherein the heat-dissipation molding unit:
is formed on the upper surface of the adhesive film and covers the upper surface and the side surface of the first heat dissipation layer,
covers a side surface of the second heat dissipation layer while exposing an upper surface of the second heat dissipation layer, and
covers an upper surface of the protrusion.

2. The semiconductor package of claim 1, wherein the protrusion is self-aligned to a side surface of the semiconductor package.

3. The semiconductor package of claim 2, wherein a footprint of the first heat dissipation layer is greater than a footprint of the second heat dissipation layer.

4. The semiconductor package of claim 3, wherein the stepped portion of the heat sink comprises:
a first stepped portion formed between the adhesive film and the first heat dissipation layer; and
a second stepped portion formed between the first heat dissipation layer and the second heat dissipation layer.

5. The semiconductor package of claim 4, wherein the heat-dissipation molding unit exposes a side surface of the protrusion that is self-aligned to the side surface of the semiconductor package, and
a footprint formed by the heat sink and the heat-dissipation molding unit is equal to a footprint of the semiconductor package.

6. The semiconductor package of claim 5, wherein a material of the heat-dissipation molding unit has a lower stiffness than a material of the protrusion.

7. The semiconductor package of claim 6, wherein the heat-dissipation molding unit comprises an epoxy molding compound.

8. The semiconductor package of claim 7, wherein a height of the first stepped portion is less than a height of the second stepped portion.

9. The semiconductor package of claim 8, wherein a sum of the heights of the first stepped portion and the second stepped portion is about 25% to about 40% of a thickness of the semiconductor package.

10. A semiconductor package comprising:
a semiconductor chip comprising a chip pad;
a redistribution layer electrically connected to the chip pad of the semiconductor chip;
an external connection terminal electrically connected to the redistribution layer;
a sealing material configured to cover the semiconductor chip and fix the semiconductor chip and the redistribution layer;
an adhesive film on an upper surface of the sealing material;
a heat sink on an upper surface of the adhesive film; and
a heat-dissipation molding unit surrounding a side surface of the heat sink,
wherein a height of the heat-dissipation molding unit is equal to a height of the heat sink,
an upper surface of the heat-dissipation molding unit is self-aligned to an upper surface of the heat sink to expose the upper surface of the heat sink to an outside,
wherein, the heat sink comprises:
a first heat dissipation layer formed on the upper surface of the adhesive film;
a second heat dissipation layer formed on an upper surface of the first heat dissipation layer; and
a protrusion formed on a side surface of the first heat dissipation layer; and
wherein the heat-dissipation molding unit:
is formed on the upper surface of the adhesive film and covers the upper surface and the side surface of the first heat dissipation layer,
covers a side surface of the second heat dissipation layer while exposing an upper surface of the second heat dissipation layer, and
covers an upper surface of the protrusion.

11. The semiconductor package of claim 10, wherein a side surface of the heat-dissipation molding unit is self-aligned to a side surface of the semiconductor package, and
a footprint formed by the heat-dissipation molding unit and the heat sink is equal to a footprint of the semiconductor package.

12. The semiconductor package of claim 11, wherein
the heat sink has a rectangular parallelepiped shape, and
a footprint of the heat sink is equal to a footprint of the semiconductor chip.

13. The semiconductor package of claim 12, wherein
a thickness of the heat sink is about 25% to about 40% of a thickness of the semiconductor package.

14. A semiconductor package comprising:
a semiconductor chip comprising a chip pad;
a redistribution layer electrically connected to the chip pad of the semiconductor chip;
an external connection terminal electrically connected to the redistribution layer;
a sealing material configured to cover the semiconductor chip and fix the semiconductor chip and the redistribution layer;
an adhesive film on an upper surface of the sealing material; and
a heat sink on an upper surface of the adhesive film,
wherein the adhesive film extends to a side surface of the heat sink and covers the side surface of the heat sink, and
the adhesive film is self-aligned to an upper surface of the heat sink and exposes the upper surface of the heat sink,
wherein, the heat sink comprises:
a first heat dissipation layer formed on the upper surface of the adhesive film;
a second heat dissipation layer formed on an upper surface of the first heat dissipation layer; and
a protrusion formed on a side surface of the first heat dissipation layer; and
wherein the heat-dissipation molding unit:
is formed on the upper surface of the adhesive film and covers the upper surface and the side surface of the first heat dissipation layer,
covers a side surface of the second heat dissipation layer while exposing an upper surface of the second heat dissipation layer, and
covers an upper surface of the protrusion.

15. The semiconductor package of claim 14, wherein
a footprint formed by the heat sink and the adhesive film extending to the side surface of the heat sink is equal to a footprint of the semiconductor package.

16. The semiconductor package of claim 15, wherein
a footprint of the heat sink is equal to a footprint of the semiconductor chip.

17. The semiconductor package of claim 16, wherein
a thickness formed by the heat sink and the adhesive film is about 25% to about 40% of a thickness of the semiconductor package.

* * * * *